(12) United States Patent
Shinohara et al.

(10) Patent No.: US 9,106,256 B2
(45) Date of Patent: Aug. 11, 2015

(54) DATA PROCESSING DEVICE AND DATA PROCESSING METHOD FOR ENCODING/DECODING INFORMATION BITS

(75) Inventors: Yuji Shinohara, Kanagawa (JP); Atsushi Kikuchi, Kanagawa (JP); Makiko Yamamoto, Tokyo (JP); Takashi Yokokawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 157 days.

(21) Appl. No.: 13/818,709

(22) PCT Filed: Aug. 25, 2011

(86) PCT No.: PCT/JP2011/069110
§ 371 (c)(1),
(2), (4) Date: Jun. 7, 2013

(87) PCT Pub. No.: WO2012/029614
PCT Pub. Date: Mar. 8, 2012

(65) Prior Publication Data
US 2013/0254617 A1    Sep. 26, 2013

(30) Foreign Application Priority Data
Sep. 3, 2010    (JP) ................. 2010-197393

(51) Int. Cl.
*H03M 13/00*    (2006.01)
*H03M 13/05*    (2006.01)
(Continued)

(52) U.S. Cl.
CPC ........... *H03M 13/05* (2013.01); *H03M 13/036* (2013.01); *H03M 13/1165* (2013.01);
(Continued)

(58) Field of Classification Search
CPC ...................................... H03M 13/13
USPC ........................ 714/752, 807, 755
See application file for complete search history.

(56) References Cited

U.S. PATENT DOCUMENTS 6,757,122 B1 *   6/2004   Kuznetsov et al. ............. 360/53
8,176,383 B2 *   5/2012   Song et al. ..................... 714/758
(Continued)

FOREIGN PATENT DOCUMENTS

EP    2 214 320 A1    8/2010
EP    2 477 335 A2    7/2012
(Continued)

OTHER PUBLICATIONS

U.S. Appl. No. 14/111,045, filed Oct. 10, 2013, Shinohara, et al.
(Continued)

*Primary Examiner* — Esaw Abraham
(74) *Attorney, Agent, or Firm* — Oblon, McClelland, Maier & Neustadt, L.L.P.

(57) ABSTRACT

A data processing device and a data processing method capable of improving the resistance to error of data. An LDPC encoder performs encoding using an LDPC code having a code length of 4320 bits and a coded rate of one of four types including ½, 7/12, ⅔, ¾. A parity check matrix H of the LDPC code is configured by arranging elements of 1's of an information matrix, which are determined based on a parity check matrix initial value table of the parity check matrix H representing positions of elements of 1's of the information matrix corresponding to an information length according to the code length and the coded rate for every 72 columns, in a column direction at a period of 72 columns. The parity check matrix initial value table, for example, is used for digital broadcasting for mobile terminals.

10 Claims, 134 Drawing Sheets

(51) Int. Cl.
  *H03M 13/03* (2006.01)
  *H03M 13/11* (2006.01)
  *H03M 13/25* (2006.01)
  *H03M 13/27* (2006.01)
  *H03M 13/29* (2006.01)
  *H03M 13/35* (2006.01)
  *H04L 27/36* (2006.01)
  *H03M 13/15* (2006.01)

(52) U.S. Cl.
  CPC .......... *H03M13/255* (2013.01); *H03M 13/271* (2013.01); *H03M 13/2707* (2013.01); *H03M 13/2906* (2013.01); *H03M 13/356* (2013.01); *H03M 13/6552* (2013.01); *H04L 27/36* (2013.01); *H03M 13/152* (2013.01)

(56) References Cited

U.S. PATENT DOCUMENTS

| | | | |
|---|---|---|---|
| 8,255,782 B2 * | 8/2012 | Song et al. | 714/801 |
| 8,433,984 B2 * | 4/2013 | Khandekar et al. | 714/779 |
| 8,566,667 B2 * | 10/2013 | Hu et al. | 714/758 |
| 2010/0281329 A1 | 11/2010 | Yokokawa et al. | |
| 2012/0185757 A1 | 7/2012 | Jeong et al. | |
| 2013/0254617 A1 | 9/2013 | Shinohara et al. | |

FOREIGN PATENT DOCUMENTS

| | | |
|---|---|---|
| WO | 2009 069628 | 6/2009 |
| WO | 2011 105287 | 9/2011 |
| WO | 2011 105288 | 9/2011 |
| WO | 2011 105289 | 9/2011 |
| WO | WO 2012/050020 A1 | 4/2012 |

OTHER PUBLICATIONS

U.S. Appl. No. 14/112,972, filed Oct. 21, 2013, Shinohara, et al.
Extended European Search Report issued Feb. 18, 2014 in Patent Application No. 11821631.6.
ETSI EN 302 755 V1.1.1, "Digital Video Broadcasting (DVB); Frame Structure Channel Coding and Modulation for a Second Generation Digital Terrestrial Television Broadcasting System (DVB-T2)", vol. 302 755, No. V1.1.1, XP-002616959, Sep. 1, 2009, 167 pages.
U.S. Appl No. 13/883,118, filed May 2, 2013, Yamamoto, et al.
U.S. Appl. No. 13/820,808, filed Mar. 5, 2013, Shinohara, et al.
U.S. Appl. No. 13/997,695, filed Jun. 25, 2013, Shinohara, et al.
U.S. Appl. No. 13/997,853, filed Jun. 25, 2013, Shinohara, et al.
ETSI EN 302 755 V1.1.1,"Digital Video Broadcasting (DVB); Frame structure channel coding and modulation for a second generation digital terrestrial television broadcasting system (DVB-T2)," pp. 117-125, (Sep. 2009).
ETSI EN 302 307 V1.1.2,"Digital Video Broadcasting (DVB); Second generation framing structure, channel coding and modulation systems for Broadcasting, Interactive Services, News Gathering and other broadband satellite applications," Total 74 Pages, (Jun. 2006).
International Search Report Issued Sep. 27, 2011 in PCT/JP11/69110 Filed Aug. 25, 2011.
U.S. Appl. No. 14/386,830, filed Sep. 22, 2014, Shinohara, et al.
U.S. Appl. No. 14/386,868, filed Sep. 22, 2014, Shinohara, et al.
U.S. Appl. No. 14/412,718, filed Jan. 5, 2015, Shinohara, et al.

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX $H_T$

FIG. 13

| Nominal CODED RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

NUMBER OF COLUMNS OF EACH COLUMN WEIGHT

FIG. 25

| REQUIRED NUMBER OF MEMORY COLUMNS mb | b=1 (FIRST TO THIRD INTERCHANGE MODES) | b=2 FOURTH INTERCHANGE MODE | WRITE STARTING POSITION OF mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 2 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 4 | 5 | 6 | 7 | 8 | 9 | | | | | | | | | | | | |
| 20 | | 1024QAM | 0 | 1 | 3 | 4 | 5 | 6 | 7 | 15 | 16 | 20 | 22 | 22 | 27 | 27 | 28 | 32 | | | | | | | | |
| 24 | | 4096QAM | 0 | 5 | 8 | 8 | 8 | 8 | 10 | 10 | 13 | 14 | 16 | 21 | 23 | 25 | 26 | 28 | 30 | | | | | | | |
| | | | 0 | 8 | 8 | 8 | 8 | 8 | 10 | 10 | 12 | 13 | 16 | 17 | 19 | 21 | 22 | 23 | 26 | 28 | 37 | 39 | 40 | 41 | 41 | 41 |

FIG. 26

| REQUIRED NUMBER OF MEMORY COLUMNS mb | b=1 (FIRST TO THIRD INTERCHANGE MODES) | b=2 FOURTH INTERCHANGE MODE | WRITE STARTING POSITION OF mb COLUMNS | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | QPSK | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | |
| 8 | 256QAM | 16QAM | 0 | 0 | 0 | 1 | 7 | 20 | 20 | 21 | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 7 | 7 | 7 | 7 | 8 | 8 | 10 | 10 | | | | |
| 24 | | 4096QAM | 0 | 0 | 0 | 0 | 0 | 0 | 0 | 1 | 1 | 1 | 2 | 2 | 3 | 7 | 7 | 9 | 9 | 10 | 10 | 10 | 10 | 10 | 10 | 11 |

FIG. 28

EQUIVALENT REDUCTION MODEL OF Flutter

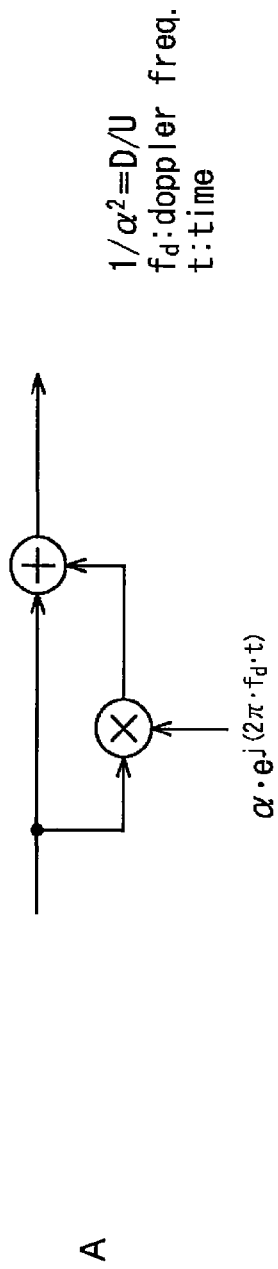

$\alpha \cdot e^{j(2\pi \cdot f_d \cdot t)}$ $1/\alpha^2 = D/U$
$f_d$: doppler freq.
$t$: time

A

IN THIS CHANNEL, OFDM SYMBOL IS TRANSMITTED, AND AFTER FFT IS PERFORMED ON RECEPTION SIDE, simulation USING MODEL CUT BY 1 carrier IS PERFORMED.

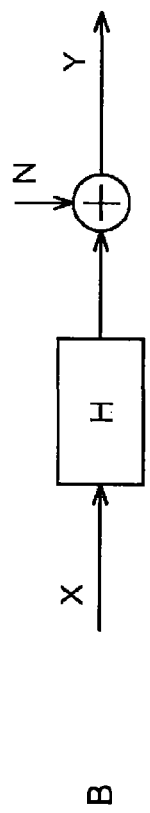

$$Y = \underbrace{\left[1 + \alpha \cdot \exp\left[j2\pi \cdot m \cdot f_d \cdot T_s + j2\pi \cdot \frac{(N_u-1) \cdot f_d \cdot T_u}{N_u}\right] \cdot \frac{\text{sinc}(\pi \cdot f_d \cdot T_u)}{\text{sinc}(\pi \cdot f_d \cdot T_u/N_u)}\right]}_{H} \cdot X + N$$

$$E[N^2] = \underbrace{\alpha^2 \cdot \left[1 - \left|\frac{\text{sinc}(\pi \cdot f_d \cdot T_u)}{\text{sinc}(\pi \cdot f_d \cdot T_u/N_u)}\right|^2\right]}_{\text{APPROXIMATE POWER OF }|C|\text{ TO AWGN}}$$

m: symbol number
Ts: symbol length (sec)
Tu: effective symbol length (sec)
Nu: number of OFDM carriers

PARITY CHECK MATRIX INITIAL VALUE TABLE OF N=4320 AND r=1/4

PARITY CHECK MATRIX INITIAL VALUE TABLE OF N=4320 AND r=1/3

PARITY CHECK MATRIX INITIAL VALUE TABLE OF N=4320 AND r=5/12

PARITY CHECK MATRIX INITIAL VALUE TABLE OF N=4320 AND r=1/2

PARITY CHECK MATRIX INITIAL VALUE TABLE OF N=4320 AND r=7/12

PARITY CHECK MATRIX INITIAL VALUE TABLE OF N=4320 AND r=2/3

PARITY CHECK MATRIX INITIAL VALUE TABLE OF N=4320 AND r=3/4

PARITY CHECK MATRIX INITIAL VALUE TABLE OF N=4320 AND r=5/6

PARITY CHECK MATRIX INITIAL VALUE TABLE OF N=4320 AND r=11/12

```
0 300 314 326 336 344 351 355 357
0 124 215 280
0 121 213 279
0 118 211 278
0 115 209 277
0 112 207 276
0 109 205 275
0 106 203 274
0 103 201 273
0 100 199 272
0 78  197 271
```

| CODED RATE | MINIMUM CYCLE LENGTH | CAPABILITY THRESHOLD (Eb/No) |
|---|---|---|
| 1/4 | 8 | 0.15 |
| 1/3 | 8 | 0.08 |
| 5/12 | 6 | 0.36 |
| 1/2 | 6 | 0.70 |
| 7/12 | 6 | 1.09 |
| 2/3 | 6 | 1.54 |
| 3/4 | 6 | 2.08 |
| 5/6 | 6 | 2.83 |
| 11/12 | 6 | 3.85 |

FIG. 48

| rate | X | KX | Y | KY | M |
|------|---|-----|---|------|------|
| 1/4  | 13 | 360 | 5 | 720  | 3240 |
| 1/3  | 13 | 360 | 4 | 1080 | 2880 |
| 5/12 | 13 | 360 | 4 | 1440 | 2520 |
| 1/2  | 13 | 360 | 4 | 1800 | 2160 |
| 7/12 | 13 | 360 | 4 | 2160 | 1800 |
| 2/3  | 13 | 360 | 4 | 2520 | 1440 |
| 3/4  | 13 | 720 | 4 | 2880 | 1080 |
| 5/6  | 13 | 360 | 4 | 2880 | 720  |
| 11/12 | 9 | 360 | 4 | 3600 | 360  |

FIG. 49

| REQUIRED NUMBER OF MEMORY COLUMNS mb | b=1 | b=2 | WRITE STARTING POSITION OF mb COLUMNS |||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 0 | 1 | 0 | | | | | | | | | | | | | | | | | | | | |
| 6 | 64QAM | | 0 | 0 | 1 | 1 | 0 | 0 | | | | | | | | | | | | | | | | | |
| 8 | | 16QAM | 0 | 8 | 10 | 10 | 25 | 54 | 62 | 69 | | | | | | | | | | | | | | | |
| 12 | | 64QAM | 0 | 2 | 10 | 12 | 15 | 17 | 20 | 21 | 23 | 25 | 26 | 30 | | | | | | | | | | | | |

FIG. 53

64QAM r1/4 4K

A CODE BITS

| Gb1 | Gb2 | Gb2 | Gb3 | Gb3 | Gb3 | Gb3 | Gb3 | Gb3 | Gb3 | Gb3 | Gb3 |
|---|---|---|---|---|---|---|---|---|---|---|---|
| b0 | b1 | b2 | b3 | b4 | b5 | b6 | b7 | b8 | b9 | b10 | b11 |

B SYMBOL BITS

| Gy1 | Gy1 | Gy2 | Gy2 | Gy3 | Gy3 | Gy1 | Gy1 | Gy2 | Gy2 | Gy3 | Gy3 |
|---|---|---|---|---|---|---|---|---|---|---|---|
| y0 | y1 | y2 | y3 | y4 | y5 | y6 | y7 | y8 | y9 | y10 | y11 |

FIG. 56

64QAM r1/3 4K

A  CODE BITS

| Gb1 | Gb2 | Gb2 | Gb2 | Gb3 | Gb3 | Gb3 | Gb3 | Gb3 | Gb3 | Gb3 | Gb3 |
|-----|-----|-----|-----|-----|-----|-----|-----|-----|-----|-----|-----|
| b0  | b1  | b2  | b3  | b4  | b5  | b6  | b7  | b8  | b9  | b10 | b11 |

B  SYMBOL BITS

| y0  | y1  | y2  | y3  | y4  | y5  | y6  | y7  | y8  | y9  | y10 | y11 |
|-----|-----|-----|-----|-----|-----|-----|-----|-----|-----|-----|-----|
| Gy1 | Gy1 | Gy2 | Gy2 | Gy3 | Gy3 | Gy1 | Gy1 | Gy2 | Gy2 | Gy3 | Gy3 |

FIG. 59

64QAM r5/12 4K

A CODE BITS

B SYMBOL BITS

FIG. 61
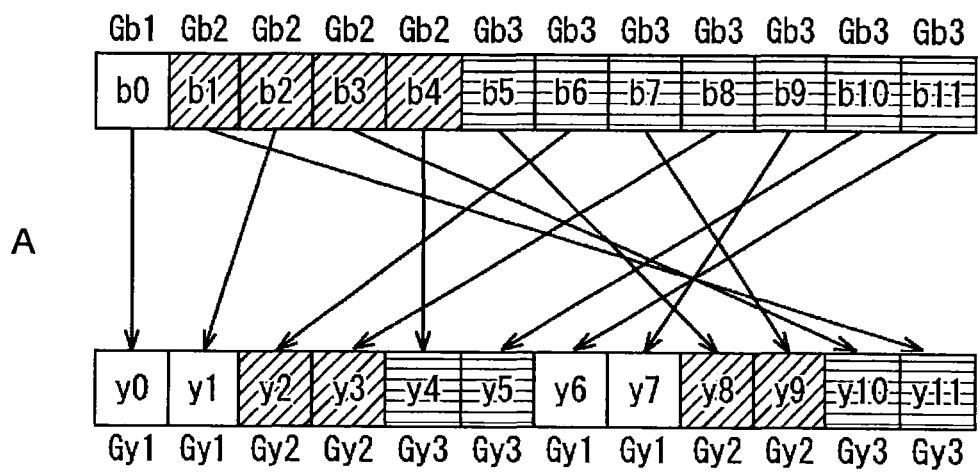
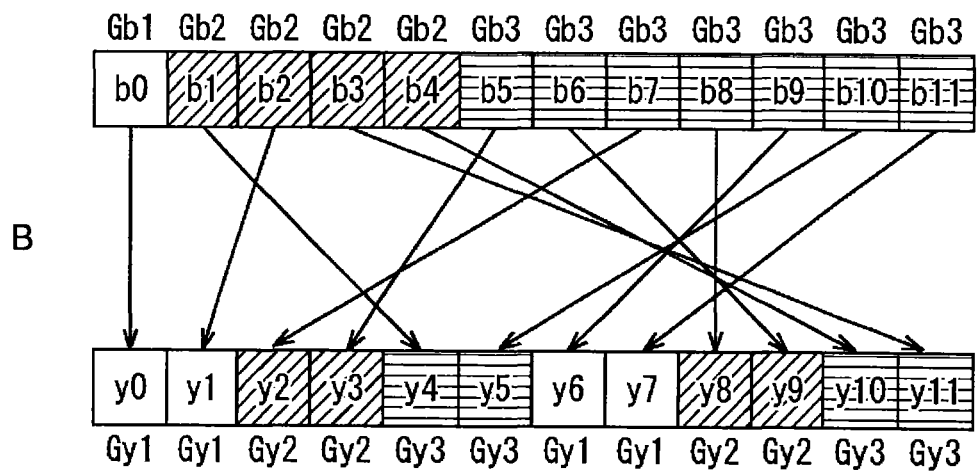

FIG. 62

64QAM r1/2 4K

A CODE BITS

| Gb1 | Gb2 | Gb2 | Gb2 | Gb2 | Gb2 | Gb3 | Gb3 | Gb3 | Gb3 | Gb3 | Gb3 |
|---|---|---|---|---|---|---|---|---|---|---|---|
| b0 | b1 | b2 | b3 | b4 | b5 | b6 | b7 | b8 | b9 | b10 | b11 |

B SYMBOL BITS

| Gy1 | Gy1 | Gy2 | Gy2 | Gy3 | Gy3 | Gy1 | Gy1 | Gy2 | Gy2 | Gy3 | Gy3 |
|---|---|---|---|---|---|---|---|---|---|---|---|
| y0 | y1 | y2 | y3 | y4 | y5 | y6 | y7 | y8 | y9 | y10 | y11 |

FIG. 65

64QAM r7/12 4K

A CODE BITS

B SYMBOL BITS

FIG. 68

64QAM r2/3 4K

FIG. 71

64QAM r3/4 4K

A CODE BITS

B SYMBOL BITS

FIG. 74

64QAM r5/6 4K

A CODE BITS

B SYMBOL BITS

FIG. 77
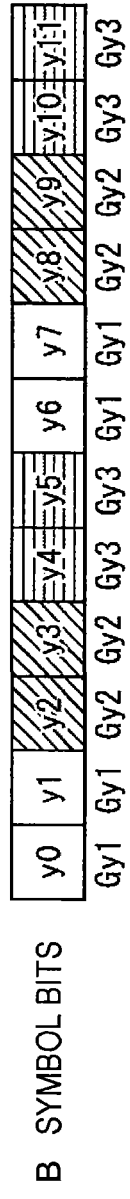

FIG. 80

16QAM r1/4 4K

| | Gb1 | Gb2 | Gb3 | Gb3 | Gb3 | Gb3 | Gb3 | Gb3 |
|---|---|---|---|---|---|---|---|---|
| A CODE BITS | b0 | b1 | b2 | b3 | b4 | b5 | b6 | b7 |

| | | | | | | | | |
|---|---|---|---|---|---|---|---|---|
| B SYMBOL BITS | y0 | y1 | y2 | y3 | y4 | y5 | y6 | y7 |
| | Gy1 | Gy1 | Gy2 | Gy2 | Gy1 | Gy1 | Gy2 | Gy2 |

FIG. 88
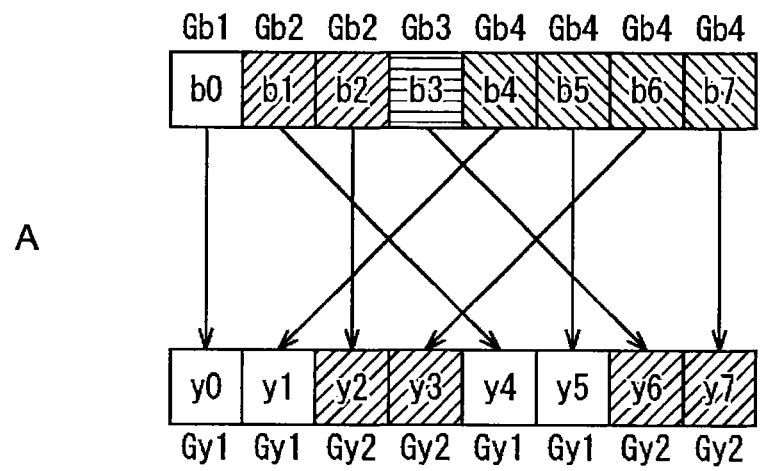
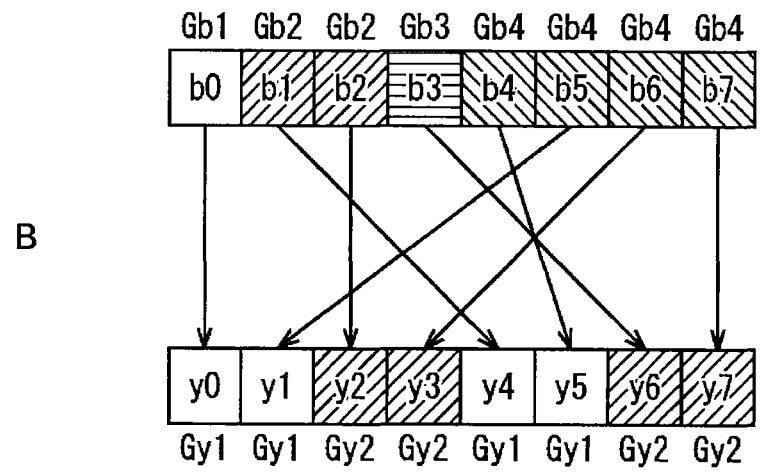

FIG. 97
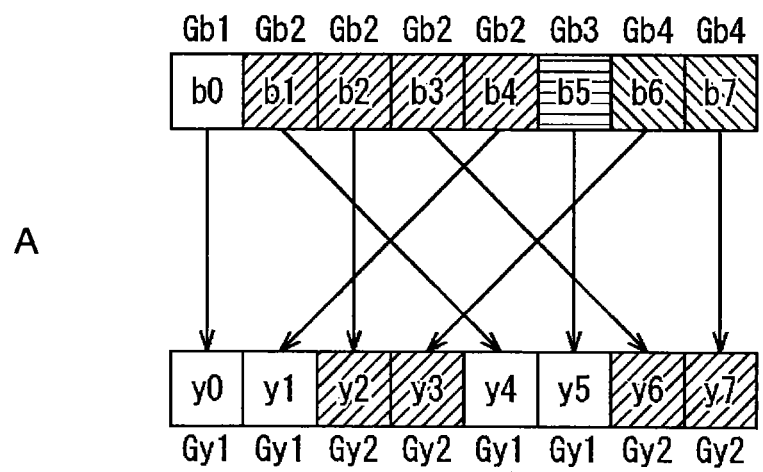
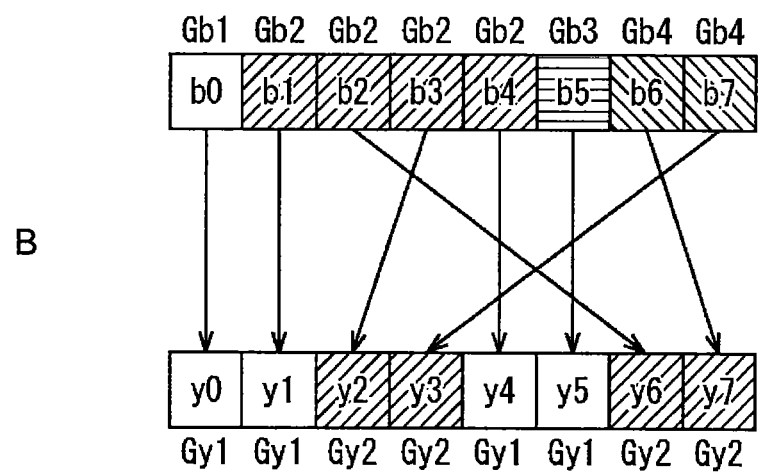

FIG. 100
16QAM r3/4 4K
A
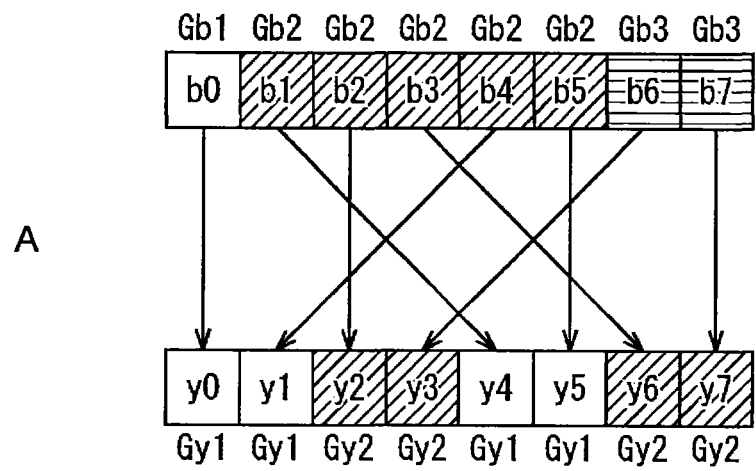
B
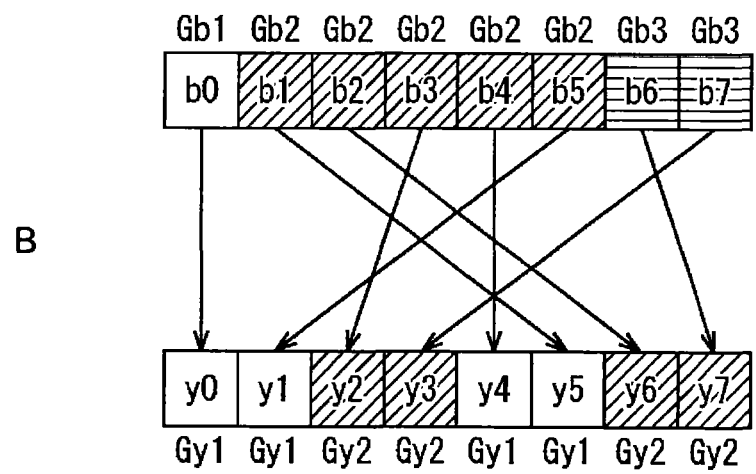

FIG. 125

PARITY CHECK MATRIX INITIAL VALUE TABLE OF N=4320 AND rate=1/2

PARITY CHECK MATRIX INITIAL VALUE TABLE OF N=4320 AND rate=7/12

PARITY CHECK MATRIX INITIAL VALUE TABLE OF N=4320 AND rate=2/3

PARITY CHECK MATRIX INITIAL VALUE TABLE OF N=4320 AND rate=3/4

```
3 14 207 304 349 414 577 587 748 761 772 855 920 976 1009 1058 1069
4 61 81 86 136 146 257 392 402 594 812 959 972 1037 1055 1064 1076
0 68 160 237 437 512 624 629 652 702 818 858 943 998 1035 1044 1064
10 42 159 215 254 320 373 382 410 492 630 887 889 911 916 975 1069
12 32 298 302 318 425 558 621 670 779 964 967 970 975 1054 1067 1072
124 381 715 981
503 610 633 1030
321 874 900 1020
509 817 902 978
3 118 688 911
515 644 848 1067
13 75 721 970
9 464 756 1023
26 219 304 672
5 310 410 695
0 7 267 1040
76 822 873 1043
7 129 1010 1065
115 156 714 1003
163 480 505 1079
238 601 743 1046
216 702 738 912
13 20 166 979
11 14 261 1051
186 476 595 843
13 237 451 532
7 11 594 738
10 225 495 851
520 675 1018 1045
9 352 514 543
60 917 1071 1074
471 556 673 1062
345 350 1043 1076
5 539 788 1061
704 851 883 1049
211 233 242 1072
9 1047 1057 1076
18 172 473 1042
365 488 921 968
211 216 554 824
1 709 923 1074
576 647 901 963
71 676 1053 1073
265 738 958 969
66 274 774 811
```

| CODED RATE | MINIMUM CYCLE LENGTH | CAPABILITY THRESHOLD (Eb/NO) |
|---|---|---|
| 1/2 | 6 | 0.55 |
| 7/12 | 6 | 1.00 |
| 2/3 | 6 | 1.45 |
| 3/4 | 6 | 2.02 |

| rate | X | KX | Y | KY | M |
|---|---|---|---|---|---|
| 1/2 | 19 | 360 | 4 | 1800 | 2160 |
| 7/12 | 17 | 360 | 4 | 2160 | 1800 |
| 2/3 | 18 | 360 | 4 | 2520 | 1440 |
| 3/4 | 17 | 360 | 4 | 2880 | 1080 |

DATA PROCESSING DEVICE AND DATA PROCESSING METHOD FOR ENCODING/DECODING INFORMATION BITS

TECHNICAL FIELD

The present invention relates to a data processing device and a data processing method, and, more particularly, for example, to a data processing device and a data processing method that are capable of improving the resistance to data error.

BACKGROUND ART

An LDPC (Low Density Parity Check) code has a high error correction capability and, recently, for example, has been started to be widely used for a transmission system that includes satellite digital broadcasting such as a DVB (Digital Video Broadcasting)-S.2 (for example, see Non-patent Document 1) that is employed in Europe. In addition, the LDPC code is reviewed for the employment thereof to next-generation terrestrial digital broadcasting.

According to recent researches, it can be understood, by using the LDPC code, similarly to a Turbo code or the like, a capability close to the Shannon limit can be acquired as the code length increases. In addition, since the LDPC code has a property that a minimal distance is in proportion to the code length, the LDPC has a good block error probability characteristic as its characteristic and has an advantage that a so-called error floor phenomenon, which is observed in the decoding characteristics of the Turbo code or the like, does not occur mostly.

Hereinafter, the LDPC code will be described more specifically. The LDPC code is a linear code and, here, will be described as being two dimensions, which is not necessary.

The LDPC code has a distinctive characteristic that a parity check matrix that defines the LDPC code is sparse. Here, a sparse matrix is a matrix in which the number of "1"s of elements of the matrix is very small (a matrix in which most of the elements are "0"s).

FIG. 1 illustrates an example of a parity check matrix H of an LDPC code.

In the parity check matrix H illustrated in FIG. 1, the weight (the number of "1"s) (column weight) of each column is "3", and the weight (row weight) of each row is "6".

In encoding (LDPC encoding) according to the LDPC code, for example, a generation matrix G is generated based on the parity check matrix H, and a code word (LDPC code) is generated by multiplying information bits of two dimensions by the generation matrix G.

More specifically, an encoding device that performs LDPC encoding, first, calculates a generation matrix G that satisfies Equation $GH^T=0$ with $H^T$ that is a transposed matrix of the parity check matrix H. Here, in a case where the generation matrix G is a K×N matrix, the encoding device generates a code word c (=uG) formed by N bits by multiplying the generation matrix G by a bit row (vector u) of information bits formed by K bits. The code word (LDPC code) that is generated by the encoding device is received on the reception side through a predetermined communication channel.

The decoding of the LDPC code is an algorithm proposed by Gallager calling it propabilistic decoding and can be performed in accordance with a message passing algorithm that is based on belief propagation on a so-called Tanner graph that is formed by a variable node (also called a message node) and a check node. Hereinafter, the variable node and the check node will be simply referred to as nodes as is appropriate.

FIG. 2 illustrates the sequence of decoding an LDPC code.

Hereinafter, a real value (received LLR) that is acquired by representing the likelihood of "0" of the value of the i-th code bit of the LDPC code (one code word) that is received on the reception side as a log likelihood ratio will be also referred to as a received value $u_{0i}$, as is appropriate. In addition, a message that is output from a check node is denoted by $u_j$, and a message that is output from a variable node is denoted by $v_i$.

First, in the decoding of an LDPC code, as illustrated in FIG. 2, in Step S11, the LDPC code is received, the message (check node message) $u_j$ is initialized to "0", a variable k that takes an integer as a counter of a repetition process is initialized to "0", and the process proceeds to Step S12. In Step S12, based on a received value $u_{0i}$ that is acquired by receiving the LDPC code, a message (variable node message) $v_i$ is acquired by performing a calculation (variable node calculation) represented in Equation (1), and a message $u_j$ is acquired by performing a calculation (check node calculation) represented in Equation (2) based on the message $v_i$.

[Equation 1]

$$v_i = u_{0i} + \sum_{j=1}^{d_v-1} u_j \qquad (1)$$

[Equation 2]

$$\tanh\left(\frac{u_j}{2}\right) = \prod_{i=1}^{d_c-1} \tanh\left(\frac{v_i}{2}\right) \qquad (2)$$

Here, $d_v$ and $d_c$ represented in Equations (1) and (2) are parameters that represent the numbers of "1"s of the parity check matrix H in the vertical direction (column) and the horizontal direction (row), which can be arbitrarily selected, and, for example, in the case of a (3, 6) code, $d_v=3$, and $d_c=6$.

In addition, in the variable node calculation represented in Equation (1) and the check node calculation represented in Equation (2), each message input from a branch (edge) (a line joining the variable node and the check node) to which a message is to be output is not set as the calculation target, and accordingly, the calculation ranges are 1 to $d_v-1$ and 1 to $d_c-1$. The check node calculation represented in Equation (2) is actually performed by arranging a table of a function $R(v_1, v_2)$ represented in Equation (3) that is defined as one output for two inputs $v_1$ and $v_2$ in advance and consecutively (recursively) using the table as represented in Equation (4).

[Equation 3]

$$x = 2 \tan h^{-1}\{\tan h(v_1/2)\tan h(v_2/2)\} = R(v_1, v_2) \qquad (3)$$

[Equation 4]

$$u_j = R(v_1, R(v_2, R(v_3, \ldots R(v_{d_o-2}, v_{d_o-1})))) \qquad (4)$$

Additionally, in Step S12, a variable k is incremented by one, and the process proceeds to Step S13. In Step S13, it is determined whether or not the variable k is greater than a predetermined repetition decoding number of times C. In Step S13, in a case where the variable k is determined not to be greater than C, the process is returned to Step S12, and the same process is repeated.

On the other hand, in a case where the variable k is determined to be greater than C in Step S13, the process proceeds to Step S14, a message $v_i$ as a decoding result that is finally output is acquired by performing a calculation represented in Equation (5) and is output, whereby the decoding process of the LDPC code ends.

[Equation 5]

$$v_i = u_{0i} + \sum_{j=1}^{d_v} u_j \qquad (5)$$

Here, the calculation represented in Equation (5), differently from the variable node calculation represented in Equation (1), is performed by using messages $u_j$ supplied from all the branches that are connected to the variable node.

FIG. 3 illustrates an example of the parity check matrix H of a (3, 6) LDPC code (coded rate of ½, code length of 12).

In the parity check matrix H illustrated in FIG. 3, similarly to that illustrated in FIG. 1, the weight of a column is 3, and the weight of a row is 6.

FIG. 4 illustrates a Tanner graph of the parity check matrix H illustrated in FIG. 3.

Here, in FIG. 4, a node that is denoted by a plus sign "+" is a check node, and a node that is denoted by an equal sign "=" is a variable node. The check node and the variable node correspond to a row and a column of the parity check matrix H. A line joined between a check node and a variable node is a branch (edge) and corresponds to "1" of the element of the parity check matrix.

In other words, in a case where an element of the j-th row and the i-th column of the parity check matrix is "1", in FIG. 4, an i-th variable node (a node of "=") from the top and a j-th check node (a node of "+") from the top are connected through a branch. A branch represents that a code bit corresponding to the variable node has a restraint condition corresponding to the check node.

In a sum product algorithm that is a decoding method of an LDPC code, a variable node calculation and a check node calculation are repeatedly performed.

FIG. 5 illustrates a variable node calculation that is performed in a variable node.

In the variable node, a message $v_i$ that corresponds to a branch that is a calculation target is acquired by the variable node calculation that is represented in Equation (1) using messages $u_1$ and $u_2$ supplied from the remaining branches connected to the variable node and a received value $u_{0i}$. Messages that correspond to the other branches are acquired in the same manner.

FIG. 6 illustrates a check node calculation that is performed in a check node.

Here, the check node calculation represented in Equation (2) can be rewritten into Equation (6) by using the relation of an equation of $a \times b = \exp\{\ln(|a|) + \ln(|b|)\} \times \text{sign}(a) \times \text{sign}(b)$. Here, $\text{sign}(x)$ is 1 when $x \geq 0$, and is $-1$ when $x < 0$.

[Equation 6]

$$\begin{aligned}
u_j &= 2\tanh^{-1}\left(\prod_{i=1}^{d_c-1} \tanh\left(\frac{v_i}{2}\right)\right) \\
&= 2\tanh^{-1}\left[\begin{array}{l} \exp\left\{\sum_{i=1}^{d_c-1} \ln\left(\left|\tanh\left(\frac{v_i}{2}\right)\right|\right)\right\} \times \\ \prod_{i=1}^{d_c-1} \text{sign}\left(\tanh\left(\frac{v_i}{2}\right)\right) \end{array}\right] \\
&= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]
\end{aligned} \qquad (6)$$

In a case where $x \geq 0$, when a function $\phi(x)$ is defined as an equation of $\phi(x) = \ln(\tan h(x/2))$, an equation of $\phi^{-1}(x) = 2 \tan h^{-1}(e^{-x})$ is satisfied, and accordingly, Equation (6) can be transformed into Equation (7).

[Equation 7]

$$u_j = \phi^{-1}\left(\sum_{i=1}^{d_c-1} \phi(|v_i|)\right) \times \prod_{i=1}^{d_c-1} \text{sign}(v_i) \qquad (7)$$

In a check node, the check node calculation represented in Equation (2) is performed based on Equation (7).

In other words, in a check node, as illustrated in FIG. 6, a message $u_j$ that corresponds to a branch that is a calculation target can be acquired through the check node calculation represented in Equation (7) using messages $v_1$, $v_2$, $v_3$, $v_4$, and $v_5$ supplied from the remaining branches connected to the check node. Messages corresponding to the other branches are acquired in the same manner.

In addition, the function $\phi(x)$ represented in Equation (7) can be represented as an equation of $\phi(x) = \ln((e^x+1)/(e^x-1))$, and $\phi(x) = \phi^{-1}(x)$ for $x > 0$. In order to implement the functions $\phi(x)$ and $\phi^{-1}(x)$ in hardware, there are cases where the functions are implemented using LUTs (Look Up Tables), and the LUTs are the same for both the functions.

CITATION LIST

Non-Patent Document

Non-patent Document 1: DVB-S.2: ETSI EN 302 307 V1.1.2 (2006-06)

SUMMARY OF THE INVENTION

Problems to be Solved by the Invention

An LDPC code is employed in DVB-S.2 that is a standard of satellite digital broadcasting or DVB-T.2 that is a standard of next-generation terrestrial digital broadcasting. In addition, the LDPC code is planned to be employed in DVB-C.2 that is a standard of next-generation CATV (Cable Television) digital broadcasting.

In digital broadcasting that is compliant with a DVB standard such as DVB-S.2, an LDPC code is set (symbolized) as a symbol of orthogonal modulation (digital modulation) such as QPSK (Quadrature Phase Shift Keying), and the symbol is mapped into a signal point and is transmitted.

In the symbolization of the LDPC code, interchange of code bits of the LDPC code is performed in units of two or more code bits, and the code bits after the interchange are regarded as bits of a symbol.

As systems for interchanging the code bits for the symbolization of an LDPC code, various systems are proposed, and, for example, such a system is defined also in DVB-T.2.

However, DVB-T.2 is a standard of digital broadcasting that is dedicatedly used for fixed terminals such as television receivers installed at homes or the like and may not be appropriate for digital broadcasting that is dedicatedly used for mobile terminals.

In other words, the circuit scale of a mobile terminal needs to be smaller than that of a fixed terminal, and low power consumption of the mobile terminal needs to be achieved. Accordingly, in digital broadcasting that is dedicatedly used for mobile terminals, in order to decrease a load that is necessary for a process such as decoding an LDPC code or the like in a mobile terminal, for example, there are cases where the number of times of repetition of the decoding of an LDPC code (the number C of times of repetition) or the code length of the LDPC code is limited more than that of digital broadcasting that is dedicatedly used for fixed terminals.

However, even under such a limitation, resistance to error needs to be maintained to some degree.

The present invention is contrived in consideration of such a situation and is to improve the resistance to error of data such as an LDPC code.

Solutions to Problems

According to a first aspect of the present invention, there is provided a data processing device or a method of processing data including an encoding means that performs encoding using an LDPC code having a code length of 4320 bits and a coded rate of ½ or performing encoding using an LDPC code having a code length of 4320 bits and a coded rate of ½, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and the parity check matrix initial value table is formed as follows:

---

142 150 213 247 507 538 578 828 969 1042 1107 1315 1509 1584 1612 1781 1934 2106 2117
3 17 20 31 97 466 571 580 842 983 1152 1226 1261 1392 1413 1465 1480 2047 2125
49 169 258 548 582 839 873 881 931 995 1145 1209 1639 1654 1776 1826 1865 1906 1956
148 393 396 486 568 806 909 965 1203 1256 1306 1371 1402 1534 1664 1736 1844 1947 2055
185 191 263 290 384 769 981 1071 1202 1357 1554 1723 1769 1815 1842 1880 1910 1926 1991
424 444 923 1679
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928
101 238 964 1393
304 460 1497 1588
151 192 1075 1614
297 313 677 1303
329 447 1348 1832
582 831 984 1900.

---

According to a second aspect of the present invention, there is provided a data processing device or a method of processing data including an encoding means that performs encoding using an LDPC code having a code length of 4320 bits and a coded rate of 7/12 or performing encoding using an LDPC code having a code length of 4320 bits and a coded rate of 7/12, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and the parity check matrix initial value table is formed as follows:

---

96 246 326 621 668 748 874 965 1022 1108 1117 1142 1300 1469 1481 1627 1702
22 79 122 127 339 359 516 587 1025 1143 1294 1478 1484 1594 1651 1681 1794
80 426 429 506 599 810 892 1016 1117 1246 1277 1281 1316 1384 1713 1729 1753
15 145 182 305 451 563 570 635 781 827 983 1123 1204 1244 1311 1317 1348
11 157 164 292 301 360 636 859 871 895 1138 1164 1206 1268 1454 1613 1783
455 610 1123 1603
631 914 1424 1461
149 507 1275 1468
5 1078 1415 1735
169 772 775 1516
1207 1315 1683 1688
19 1053 1221 1260
933 1095 1597 1628
893 1209 1360 1740
1222 1486 1675 1737
897 1074 1651 1728
115 730 1363 1752
1552 1672 1734 1795
75 1087 1371 1712
123 438 839 1074
4 203 1407 1798
441 476 658 1400
380 1341 1741 1774
974 1487 1664 1756
7 273 834 1658
798 1475 1653 1686
12 1237 1539 1709
211 1494 1618 1624
367 1036 1390 1587
18 166 1645 1679
530 1092 1571 1707
588 1593 1689 1707
980 1104 1522 1701
1025 1510 1552 1683
270 340 1326 1770.

---

According to a third aspect of the present invention, there is provided a data processing device or a method of processing data including an encoding means that performs encoding using an LDPC code having a code length of 4320 bits and a coded rate of ⅔ or performing encoding using an LDPC code having a code length of 4320 bits and a coded rate of ⅔, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and the parity check matrix initial value table is formed as follows:

---

56 291 315 374 378 665 682 713 740 884 923 927 1193 1203 1293 1372 1419 1428
1 17 113 402 406 504 559 597 686 697 817 878 983 1007 1034 1142 1231 1431
2 205 350 428 538 605 866 973 1008 1182 1252 1303 1319 1337 1346 1387 1417 1422
50 158 244 424 455 597 830 889 900 945 978 1040 1052 1059 1101 1150 1254 1382
41 53 269 316 449 604 704 752 937 952 1021 1031 1044 1068 1104 1265 1327 1348

601 911 1020 1260
151 674 732 1240
1099 1250 1348 1366
1115 1124 1394 1414
66 250 875 1040
525 603 916 1402
529 561 913 1089
1110 1243 1280 1372
137 656 1316 1369
5 458 1043 1381
1122 1171 1187 1335
18 130 312 1209
30 534 705 1294
272 727 955 1192
925 1287 1385 1437
11 446 1281 1408
614 716 787 1340
615 1147 1411 1416
284 865 1151 1414
202 689 1088 1144
459 633 838 941
46 301 1229 1367
476 1031 1120 1418
138 336 560 1419
168 357 536 938
1001 1052 1162 1414
349 1039 1353 1426
146 203 530 549
510 545 979 1108
479 1069 1106 1244
743 1019 1275 1348
427 721 1023 1435
73 842 1296 1435
323 1106 1140 1428
1074 1235 1353 1391.

According to a fourth aspect of the present invention, there is provided a data processing device or a method of processing data including an encoding means that performs encoding using an LDPC code having a code length of 4320 bits and a coded rate of ¾ or performing encoding using an LDPC code having a code length of 4320 bits and a coded rate of ¾, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and the parity check matrix initial value table is formed as follows:

3 14 207 304 349 414 577 587 748 761 772 855 920 976 1009 1058 1069
4 61 81 86 136 146 257 392 402 594 812 959 972 1037 1055 1064 1076
0 68 160 237 437 512 624 629 652 702 818 858 943 998 1035 1044 1064
10 42 159 215 254 320 373 382 410 492 630 887 889 911 916 975 1069
12 32 298 302 318 425 558 621 670 779 964 967 970 975 1054 1067 1072
124 381 715 981
503 610 633 1030
321 874 900 1020
509 817 902 978
3 118 688 911
515 644 848 1067
13 75 721 970
9 464 756 1023
26 219 304 672
5 310 410 695
0 7 267 1040

76 822 873 1043
7 129 1010 1065
115 156 714 1003
163 480 505 1079
238 601 743 1046
216 702 738 912
13 20 166 979
11 14 261 1051
186 476 595 843
13 237 451 532
7 11 594 738
10 225 495 851
520 675 1018 1045
9 352 514 543
60 917 1071 1074
471 556 673 1062
345 350 1043 1076
5 539 788 1061
704 851 883 1049
211 233 242 1072
9 1047 1057 1076
18 172 473 1042
365 488 921 968
211 216 554 824
1 709 923 1074
576 647 901 963
71 676 1053 1073
265 738 958 969
66 274 774 811.

According to a fifth aspect of the present invention, there is provided a data processing device that performs decoding of an LDPC (Low Density Parity Check) code, the data processing device including: a decoding means that performs decoding of an LDPC code having a code length of 4320 bits and a coded rate of ½, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and wherein the parity check matrix initial value table is formed as follows:

142 150 213 247 507 538 578 828 969 1042 1107 1315 1509 1584 1612 1781 1934 2106 2117
3 17 20 31 97 466 571 580 842 983 1152 1226 1261 1392 1413 1465 1480 2047 2125
49 169 258 548 582 839 873 881 931 995 1145 1209 1639 1654 1776 1826 1865 1906 1956
148 393 396 486 568 806 909 965 1203 1256 1306 1371 1402 1534 1664 1736 1844 1947 2055
185 191 263 290 384 769 981 1071 1202 1357 1554 1723 1769 1815 1842 1880 1910 1926 1991
424 444 923 1679
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928

-continued

```
101 238 964 1393
304 460 1497 1588
151 192 1075 1614
297 313 677 1303
329 447 1348 1832
582 831 984 1900.
```

According to a sixth aspect of the present invention, there is provided a data processing device that performs decoding of an LDPC (Low Density Parity Check) code, the data processing device including: a decoding means that performs decoding of an LDPC code having a code length of 4320 bits and a coded rate of 7/12, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and wherein the parity check matrix initial value table is formed as follows:

```
96 246 326 621 668 748 874 965 1022 1108 1117 1142
1300 1469 1481 1627 1702
22 79 122 127 339 359 516 587 1025 1143 1294 1478
1484 1594 1651 1681 1794
80 426 429 506 599 810 892 1016 1117 1246 1277 1281
1316 1384 1713 1729 1753
15 145 182 305 451 563 570 635 781 827 983 1123
1204 1244 1311 1317 1348
11 157 164 292 301 360 636 859 871 895 1138 1164
1206 1268 1454 1613 1783
455 610 1123 1603
631 914 1424 1461
149 507 1275 1468
5 1078 1415 1735
169 772 775 1516
1207 1315 1683 1688
19 1053 1221 1260
933 1095 1597 1628
893 1209 1360 1740
1222 1486 1675 1737
897 1074 1651 1728
115 730 1363 1752
1552 1672 1734 1795
75 1087 1371 1712
123 438 839 1074
4 203 1407 1798
441 476 658 1400
380 1341 1741 1774
974 1487 1664 1756
7 273 834 1658
798 1475 1653 1686
12 1237 1539 1709
211 1494 1618 1624
367 1036 1390 1587
18 166 1645 1679
530 1092 1571 1707
588 1593 1689 1707
980 1104 1522 1701
1025 1510 1552 1683
270 340 1326 1770.
```

According to a seventh aspect of the present invention, there is provided a data processing device that performs decoding of an LDPC (Low Density Parity Check) code, the data processing device including: a decoding means that performs decoding of an LDPC code having a code length of 4320 bits and a coded rate of 2/3, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and wherein the parity check matrix initial value table is formed as follows:

```
56 291 315 374 378 665 682 713 740 884 923 927 1193
1203 1293 1372 1419 1428
1 17 113 402 406 504 559 597 686 697 817 878 983
1007 1034 1142 1231 1431
2 205 350 428 538 605 866 973 1008 1182 1252 1303
1319 1337 1346 1387 1417 1422
50 158 244 424 455 597 830 889 900 945 978 1040
1052 1059 1101 1150 1254 1382
41 53 269 316 449 604 704 752 937 952 1021 1031
1044 1068 1104 1265 1327 1348
601 911 1020 1260
151 674 732 1240
1099 1250 1348 1366
1115 1124 1394 1414
66 250 875 1040
525 603 916 1402
529 561 913 1089
1110 1243 1280 1372
137 656 1316 1369
5 458 1043 1381
1122 1171 1187 1335
18 130 312 1209
30 534 705 1294
272 727 955 1192
925 1287 1385 1437
11 446 1281 1408
614 716 787 1340
615 1147 1411 1416
284 865 1151 1414
202 689 1088 1144
459 633 838 941
46 301 1229 1367
476 1031 1120 1418
138 336 560 1419
168 357 536 938
1001 1052 1162 1414
349 1039 1353 1426
146 203 530 549
510 545 979 1108
479 1069 1106 1244
743 1019 1275 1348
427 721 1023 1435
73 842 1296 1435
323 1106 1140 1428
1074 1235 1353 1391.
```

According to an eighth aspect of the present invention, there is provided a data processing device that performs decoding of an LDPC (Low Density Parity Check) code, the data processing device including: a decoding means that performs decoding of an LDPC code having a code length of 4320 bits and a coded rate of 3/4, wherein a parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and wherein the parity check matrix initial value table is formed as follows:

```
3 14 207 304 349 414 577 587 748 761 772 855 920
976 1009 1058 1069
4 61 81 86 136 146 257 392 402 594 812 959 972 1037
1055 1064 1076
```

```
0 68 160 237 437 512 624 629 652 702 818 858 943
998 1035 1044 1064
10 42 159 215 254 320 373 382 410 492 630 887 889
911 916 975 1069
12 32 298 302 318 425 558 621 670 779 964 967 970
975 1054 1067 1072
124 381 715 981
503 610 633 1030
321 874 900 1020
509 817 902 978
3 118 688 911
515 644 848 1067
13 75 721 970
9 464 756 1023
26 219 304 672
5 310 410 695
0 7 267 1040
76 822 873 1043
7 129 1010 1065
115 156 714 1003
163 480 505 1079
238 601 743 1046
216 702 738 912
13 20 166 979
11 14 261 1051
186 476 595 843
13 237 451 532
7 11 594 738
10 225 495 851
520 675 1018 1045
9 352 514 543
60 917 1071 1074
471 556 673 1062
345 350 1043 1076
5 539 788 1061
704 851 883 1049
211 233 242 1072
9 1047 1057 1076
18 172 473 1042
365 488 921 968
211 216 554 824
1 709 923 1074
576 647 901 963
71 676 1053 1073
265 738 958 969
66 274 774 811.
```

According to the first to fourth aspects of the present invention, encoding is performed using an LDPC code having a code length of 4320 bits and a coded rate of ½, 7/12, ⅔, or ¾.

According to the fifth to eighth aspects of the present invention, decoding of an LDPC code having a code length of 4320 bits and a coded rate of ½, 7/12, ⅔, or ¾ is performed.

A parity check matrix of the LDPC code is configured by arranging elements of 1's of an information matrix, which are determined based on a parity check matrix initial value table of the parity check matrix representing positions of elements of 1's of the information matrix corresponding to an information length according to the code length and the coded rate for every 72 columns, in a column direction at a period of 72 columns, and the parity check matrix initial value table of the LDPC code having a coded rate of ½ is formed as follows:

```
142 150 213 247 507 538 578 828 969 1042 1107 1315
1509 1584 1612 1781 1934 2106 2117
3 17 20 31 97 466 571 580 842 983 1152 1226 1261
1392 1413 1465 1480 2047 2125
49 169 258 548 582 839 873 881 931 995 1145 1209
1639 1654 1776 1826 1865 1906 1956
148 393 396 486 568 806 909 965 1203 1256 1306 1371
1402 1534 1664 1736 1844 1947 2055
185 191 263 290 384 769 981 1071 1202 1357 1554
1723 1769 1815 1842 1880 1910 1926 1991
424 444 923 1679
```

```
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928
101 238 964 1393
304 460 1497 1588
151 192 1075 1614
297 313 677 1303
329 447 1348 1832
582 831 984 1900.
```

In addition, the parity check matrix initial value table of the LDPC code having a coded rate of 7/12 is formed as follows:

```
96 246 326 621 668 748 874 965 1022 1108 1117 1142
1300 1469 1481 1627 1702
22 79 122 127 339 359 516 587 1025 1143 1294 1478
1484 1594 1651 1681 1794
80 426 429 506 599 810 892 1016 1117 1246 1277 1281
1316 1384 1713 1729 1753
15 145 182 305 451 563 570 635 781 827 983 1123
1204 1244 1311 1317 1348
11 157 164 292 301 360 636 859 871 895 1138 1164
1206 1268 1454 1613 1783
455 610 1123 1603
631 914 1424 1461
149 507 1275 1468
5 1078 1415 1735
169 772 775 1516
1207 1315 1683 1688
19 1053 1221 1260
933 1095 1597 1628
893 1209 1360 1740
1222 1486 1675 1737
897 1074 1651 1728
115 730 1363 1752
1552 1672 1734 1795
75 1087 1371 1712
123 438 839 1074
4 203 1407 1798
441 476 658 1400
380 1341 1741 1774
974 1487 1664 1756
7 273 834 1658
798 1475 1653 1686
12 1237 1539 1709
211 1494 1618 1624
367 1036 1390 1587
18 166 1645 1679
530 1092 1571 1707
588 1593 1689 1707
980 1104 1522 1701
1025 1510 1552 1683
270 340 1326 1770.
```

In addition, the parity check matrix initial value table of the LDPC code having a coded rate of ⅔ is formed as follows:

```
56 291 315 374 378 665 682 713 740 884 923 927 1193
1203 1293 1372 1419 1428
```

-continued

```
1 17 113 402 406 504 559 597 686 697 817 878 983
1007 1034 1142 1231 1431
2 205 350 428 538 605 866 973 1008 1182 1252 1303
1319 1337 1346 1387 1417 1422
50 158 244 424 455 597 830 889 900 945 978 1040
1052 1059 1101 1150 1254 1382
41 53 269 316 449 604 704 752 937 952 1021 1031
1044 1068 1104 1265 1327 1348
601 911 1020 1260
151 674 732 1240
1099 1250 1348 1366
1115 1124 1394 1414
66 250 875 1040
525 603 916 1402
529 561 913 1089
1110 1243 1280 1372
137 656 1316 1369
5 458 1043 1381
1122 1171 1187 1335
18 130 312 1209
30 534 705 1294
272 727 955 1192
925 1287 1385 1437
11 446 1281 1408
614 716 787 1340
615 1147 1411 1416
284 865 1151 1414
202 689 1088 1144
459 633 838 941
46 301 1229 1367
476 1031 1120 1418
138 336 560 1419
168 357 536 938
1001 1052 1162 1414
349 1039 1353 1426
146 203 530 549
510 545 979 1108
479 1069 1106 1244
743 1019 1275 1348
427 721 1023 1435
73 842 1296 1435
323 1106 1140 1428
1074 1235 1353 1391.
```

Furthermore, the parity check matrix initial value table of the LDPC code having a coded rate of ¾ is formed as follows:

```
3 14 207 304 349 414 577 587 748 761 772 855 920
976 1009 1058 1069
4 61 81 86 136 146 257 392 402 594 812 959 972 1037
1055 1064 1076
0 68 160 237 437 512 624 629 652 702 818 858 943
998 1035 1044 1064
10 42 159 215 254 320 373 382 410 492 630 887 889
911 916 975 1069
12 32 298 302 318 425 558 621 670 779 964 967 970
975 1054 1067 1072
124 381 715 981
503 610 633 1030
321 874 900 1020
509 817 902 978
3 118 688 911
515 644 848 1067
13 75 721 970
9 464 756 1023
26 219 304 672
5 310 410 695
0 7 267 1040
76 822 873 1043
7 129 1010 1065
115 156 714 1003
163 480 505 1079
238 601 743 1046
216 702 738 912
13 20 166 979
11 14 261 1051
186 476 595 843
```

```
13 237 451 532
7 11 594 738
10 225 495 851
520 675 1018 1045
9 352 514 543
60 917 1071 1074
471 556 673 1062
345 350 1043 1076
5 539 788 1061
704 851 883 1049
211 233 242 1072
9 1047 1057 1076
18 172 473 1042
365 488 921 968
211 216 554 824
1 709 923 1074
576 647 901 963
71 676 1053 1073
265 738 958 969
66 274 774 811.
```

Here, the data processing device may be an independent device or an internal block configuring one device.

Effects of the Invention

According to the first to eighth aspects, the resistance to error can be improved.

BRIEF DESCRIPTION OF DRAWINGS

FIG. 3 is a diagram that illustrates an example of a parity check matrix of an LDPC code.

FIG. 13 is a diagram that illustrates a parity check matrix of an LDPC code that is defined in the standard of DVB-S.2.

FIG. 25 is a diagram that illustrates the number of columns of a memory 31 that is necessary for column twist interleaving and addresses of write starting positions thereof.

FIG. 26 is a diagram that illustrates the number of columns of the memory 31 that is necessary for column twist interleaving and addresses of write starting positions thereof.

FIG. 28 is a diagram that illustrates a model of a communication channel employed in a simulation.

FIG. 35 is a diagram that illustrates an example of an initial value table of a parity check matrix having a coded rate of ¼ and a code length of 4320.

FIG. 36 is a diagram that illustrates an example of an initial value table of a parity check matrix having a coded rate of ⅓ and a code length of 4320.

FIG. 37 is a diagram that illustrates an example of an initial value table of a parity check matrix having a coded rate of 5/12 and a code length of 4320.

FIG. 38 is a diagram that illustrates an example of an initial value table of a parity check matrix having a coded rate of ½ and a code length of 4320.

FIG. 39 is a diagram that illustrates an example of an initial value table of a parity check matrix having a coded rate of 7/12 and a code length of 4320.

FIG. 40 is a diagram that illustrates an example of an initial value table of a parity check matrix having a coded rate of ⅔ and a code length of 4320.

FIG. 41 is a diagram that illustrates an example of an initial value table of a parity check matrix having a coded rate of ¾ and a code length of 4320.

FIG. 42 is a diagram that illustrates an example of an initial value table of a parity check matrix having a coded rate of ⅚ and a code length of 4320.

FIG. 43 is a diagram that illustrates an example of an initial value table of a parity check matrix having a coded rate of 11/12 and a code length of 4320.

FIG. 48 is a diagram that illustrates a parity check matrix of an LDPC code having a code length of 4320.

FIG. 49 is a diagram that illustrates the number of columns of the memory 31 that is necessary for column twist interleaving and addresses of write starting positions thereof.

FIG. 53 is a diagram that illustrates code bit groups and symbol bit groups in a case where an LDPC code having a code length of 4k and a coded rate of ¼ is modulated in 64 QAM, and a multiple b is two.

FIG. 56 is a diagram that illustrates a code bit group and a symbol bit group in a case where an LDPC code having a code length of 4k and a coded rate of ⅓ is modulated in 64 QAM, and the multiple b is two.

FIG. 59 is a diagram that illustrates a code bit group and a symbol bit group in a case where an LDPC code having a code length of 4k and a coded rate of 5/12 is modulated in 64 QAM, and the multiple b is two.

FIG. 61 is a diagram that illustrates the interchange of code bits according to the allocation rule in a case where an LDPC code having a code length of 4k and a coded rate of 5/12 is modulated in 64 QAM, and the multiple b is two.

FIG. 62 is a diagram that illustrates a code bit group and a symbol bit group in a case where an LDPC code having a code length of 4k and a coded rate of ½ is modulated in 64 QAM, and the multiple b is two.

FIG. 65 is a diagram that illustrates a code bit group and a symbol bit group in a case where an LDPC code having a code length of 4k and a coded rate of 7/12 is modulated in 64 QAM, and the multiple b is two.

FIG. 68 is a diagram that illustrates a code bit group and a symbol bit group in a case where an LDPC code having a code length of 4k and a coded rate of 2/3 is modulated in 64 QAM, and the multiple b is two.

FIG. 71 is a diagram that illustrates a code bit group and a symbol bit group in a case where an LDPC code having a code length of 4k and a coded rate of 3/4 is modulated in 64 QAM, and the multiple b is two.

FIG. 74 is a diagram that illustrates a code bit group and a symbol bit group in a case where an LDPC code having a code length of 4k and a coded rate of 5/6 is modulated in 64 QAM, and the multiple b is two.

FIG. 77 is a diagram that illustrates a code bit group and a symbol bit group in a case where an LDPC code having a code length of 4k and a coded rate of 11/12 is modulated in 64 QAM, and the multiple b is two.

FIG. 80 is a diagram that illustrates a code bit group and a symbol bit group in a case where an LDPC code having a code length of 4k and a coded rate of 1/4 is modulated in 16 QAM, and the multiple b is two.

FIG. 88 is a diagram that illustrates the interchange of code bits according to the allocation rule in a case where an LDPC code having a code length of 4k and a coded rate of 5/12 is modulated in 16 QAM, and the multiple b is two.

FIG. 97 is a diagram that illustrates the interchange of code bits according to the allocation rule in a case where an LDPC code having a code length of 4k and a coded rate of ⅔ is modulated in 16 QAM, and the multiple b is two.

FIG. 100 is a diagram that illustrates the interchange of code bits according to the allocation rule in a case where an LDPC code having a code length of 4k and a coded rate of ¾ is modulated in 16 QAM, and the multiple b is two.

FIG. 120 is a diagram that illustrates a simulation result of a BER in a case where an LDPC code having a code length of 4k and a coded rate of 7/12 is modulated in 16 QAM, and the multiple b is two.

FIG. 121 is a diagram that illustrates a simulation result of a BER in a case where an LDPC code having a code length of 4k and a coded rate of ⅔ is modulated in 16 QAM, and the multiple b is two.

FIG. 122 is a diagram that illustrates a simulation result of a BER in a case where an LDPC code having a code length of 4k and a coded rate of ¾ is modulated in 16 QAM, and the multiple b is two.

FIG. 123 is a diagram that illustrates a simulation result of a BER in a case where an LDPC code having a code length of 4k and a coded rate of ⅚ is modulated in 16 QAM, and the multiple b is two.

FIG. 124 is a diagram that illustrates a simulation result of a BER in a case where an LDPC code having a code length of 4k and a coded rate of 11/12 is modulated in 16 QAM, and the multiple b is two.

FIG. 125 is a diagram that illustrates an example of an initial value table of a parity check matrix having a coded rate of ½ and a code length of 4320.

FIG. 126 is a diagram that illustrates an example of an initial value table of a parity check matrix having a coded rate of 7/12 and a code length of 4320.

FIG. 127 is a diagram that illustrates an example of an initial value table of a parity check matrix having a coded rate of ⅔ and a code length of 4320.

FIG. 128 is a diagram that illustrates an example of an initial value table of a parity check matrix having a coded rate of ¾ and a code length of 4320.

FIG. 129 is a diagram that illustrates a minimal cycle length and a performance threshold of a parity check matrix of an LDPC code having a code length of 4320.

FIG. 130 is a diagram that illustrates a parity check matrix of an LDPC code having a code length of 4320.

FIG. 131 is a diagram that illustrates a simulation result of a BER.

Figure 132:
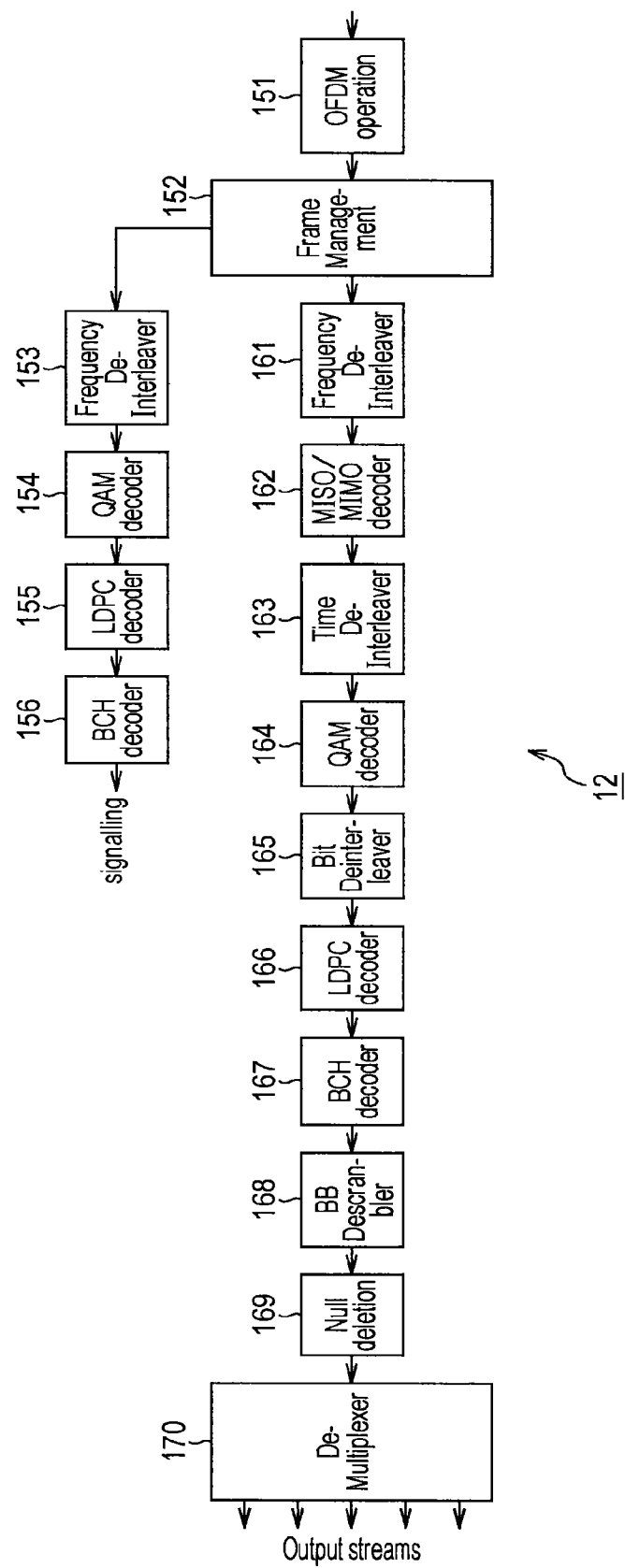

FIG. 132 is a block diagram that illustrates a configuration example of a reception device 12.

Figure 133:
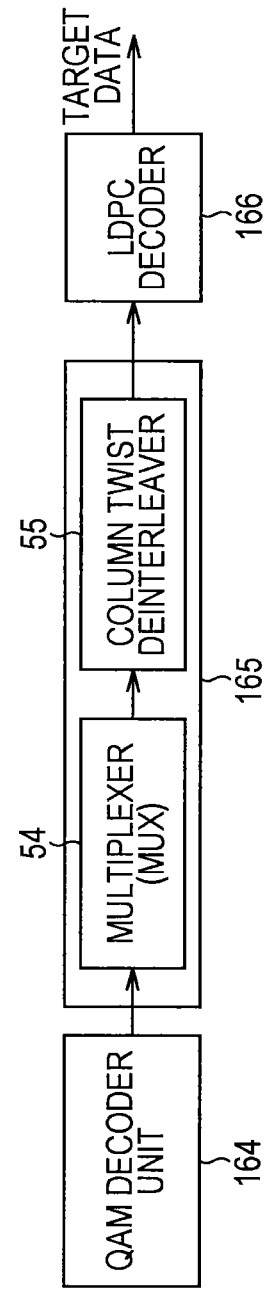

FIG. 133 is a block diagram that illustrates a configuration example of a bit deinterleaver 165.

Figure 134:
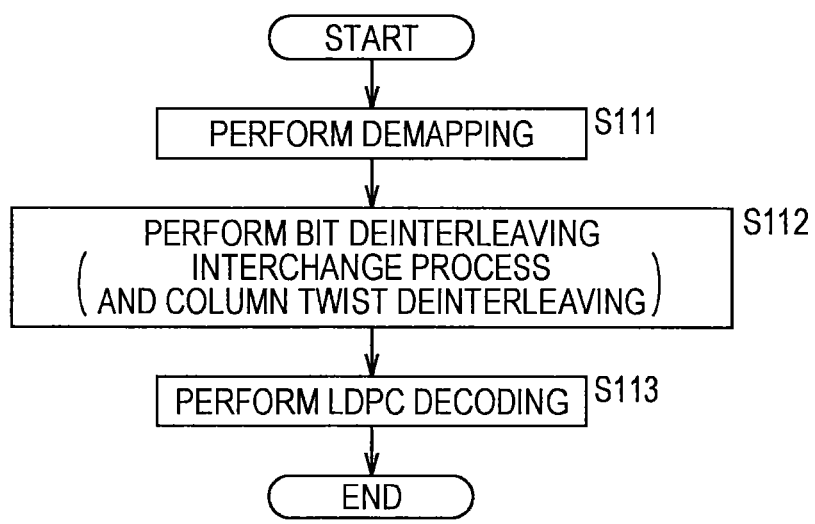

FIG. 134 is a flowchart of a process that is performed by a QAM decoder 164, the bit deinterleaver 165, and an LDPC decoder 166.

Figure 135:
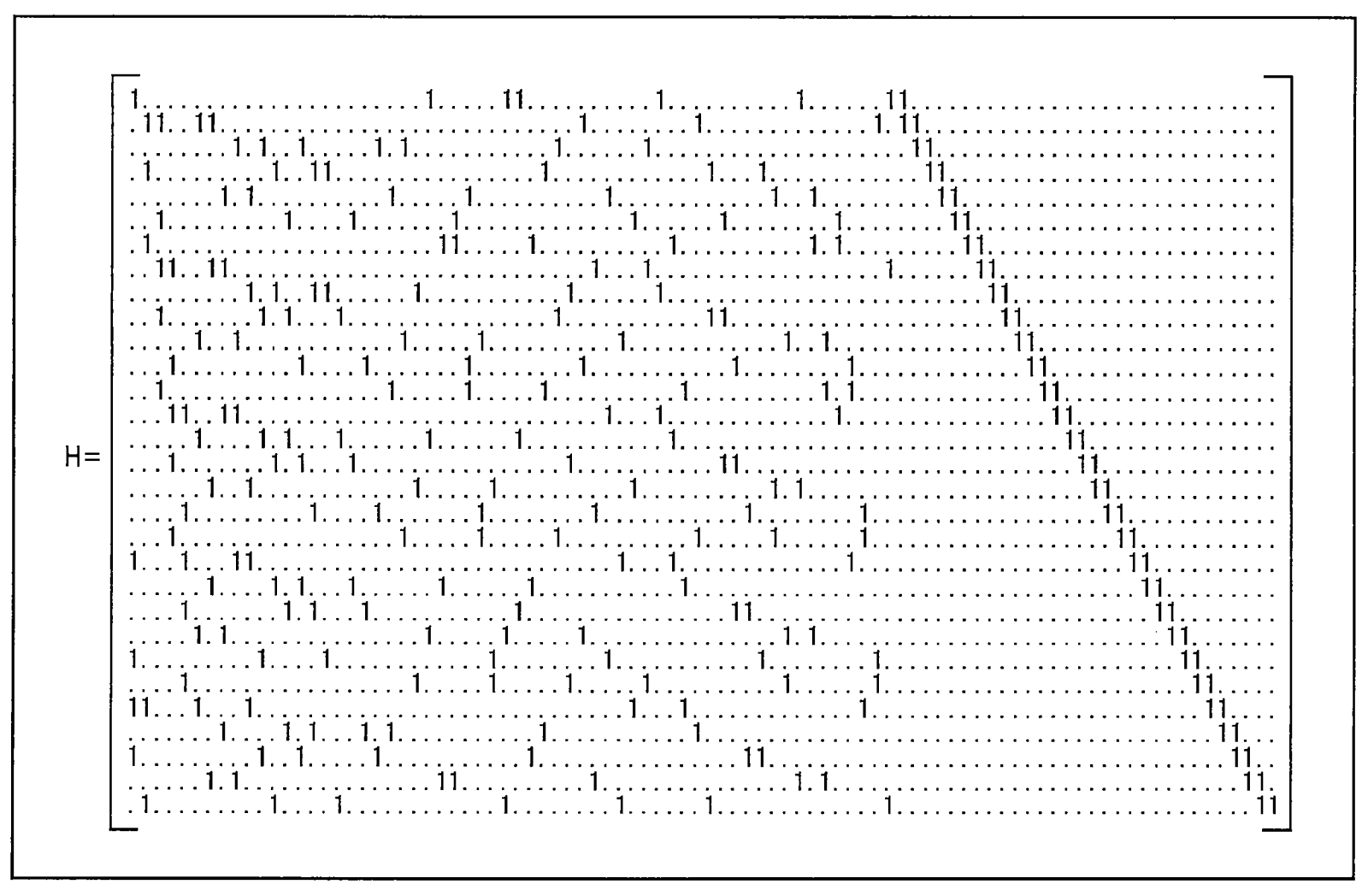

FIG. 135 is a diagram that illustrates an example of a parity check matrix of an LDPC code.

Figure 136:
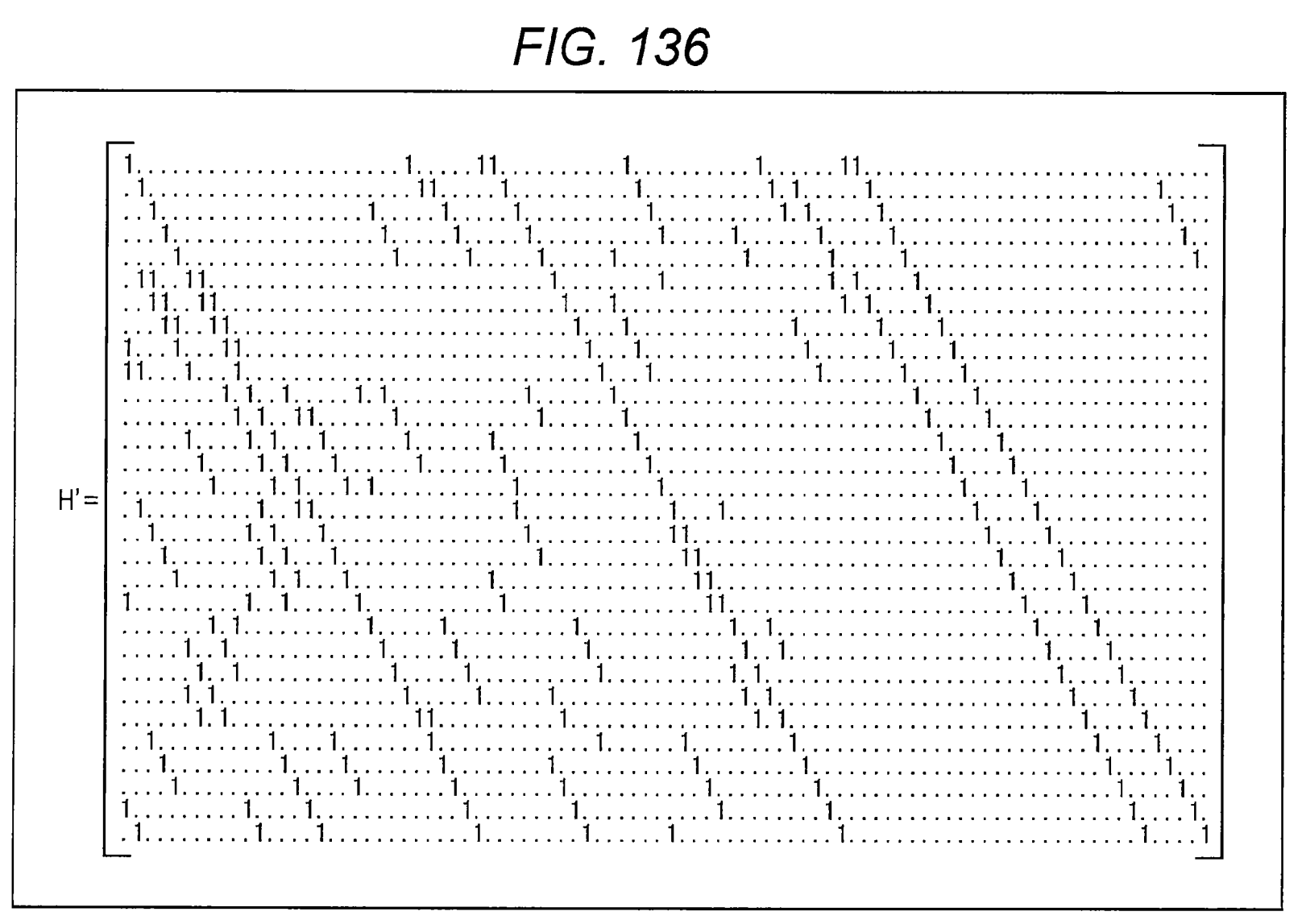

FIG. 136 is a diagram that illustrates a matrix (transformed parity check matrix) that is acquired by performing row replacement and column replacement for a parity check matrix.

Figure 137:
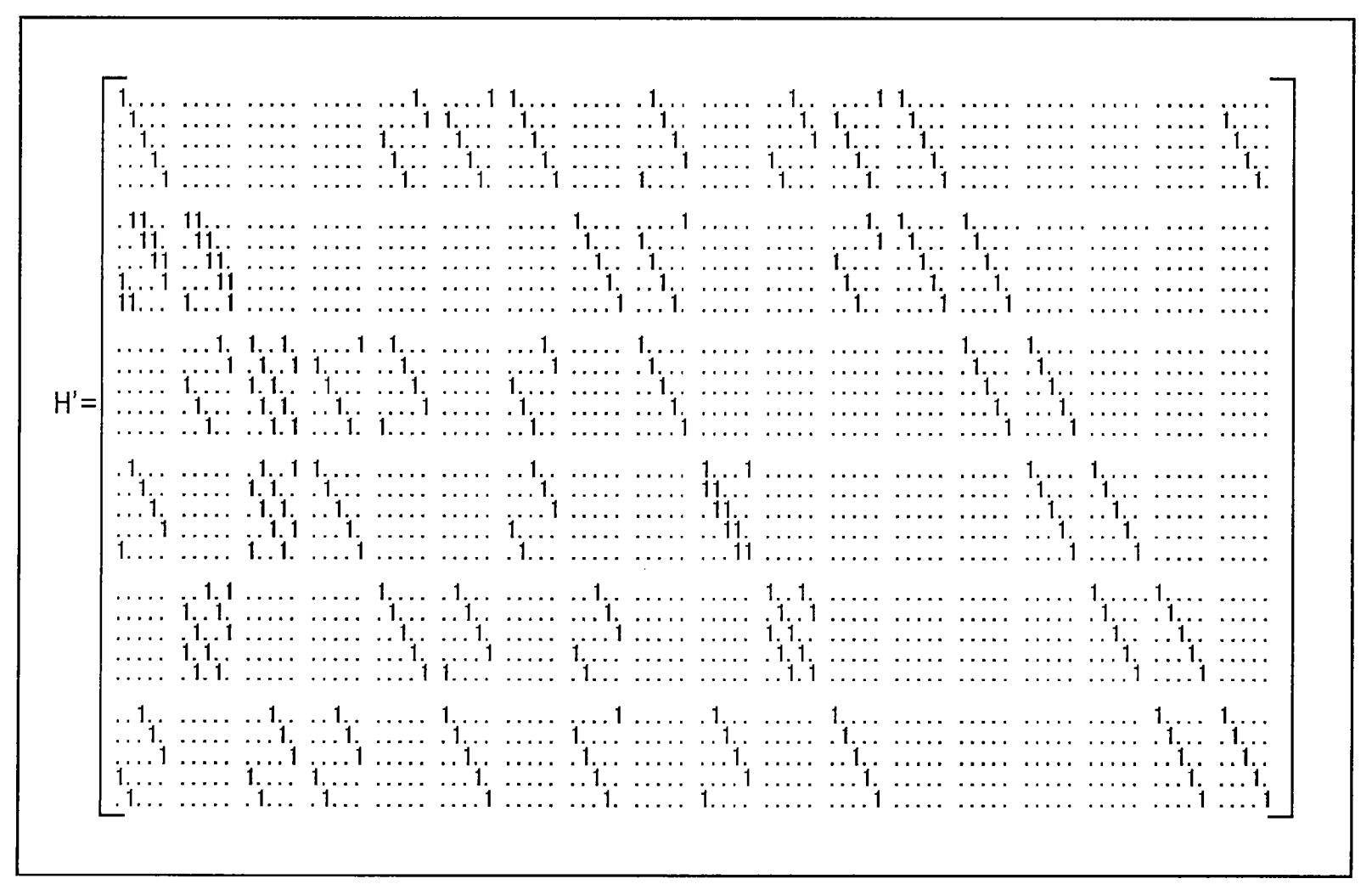

FIG. 137 is a diagram that illustrates a transformed parity check matrix that is divided in units of 5×5.

Figure 138:
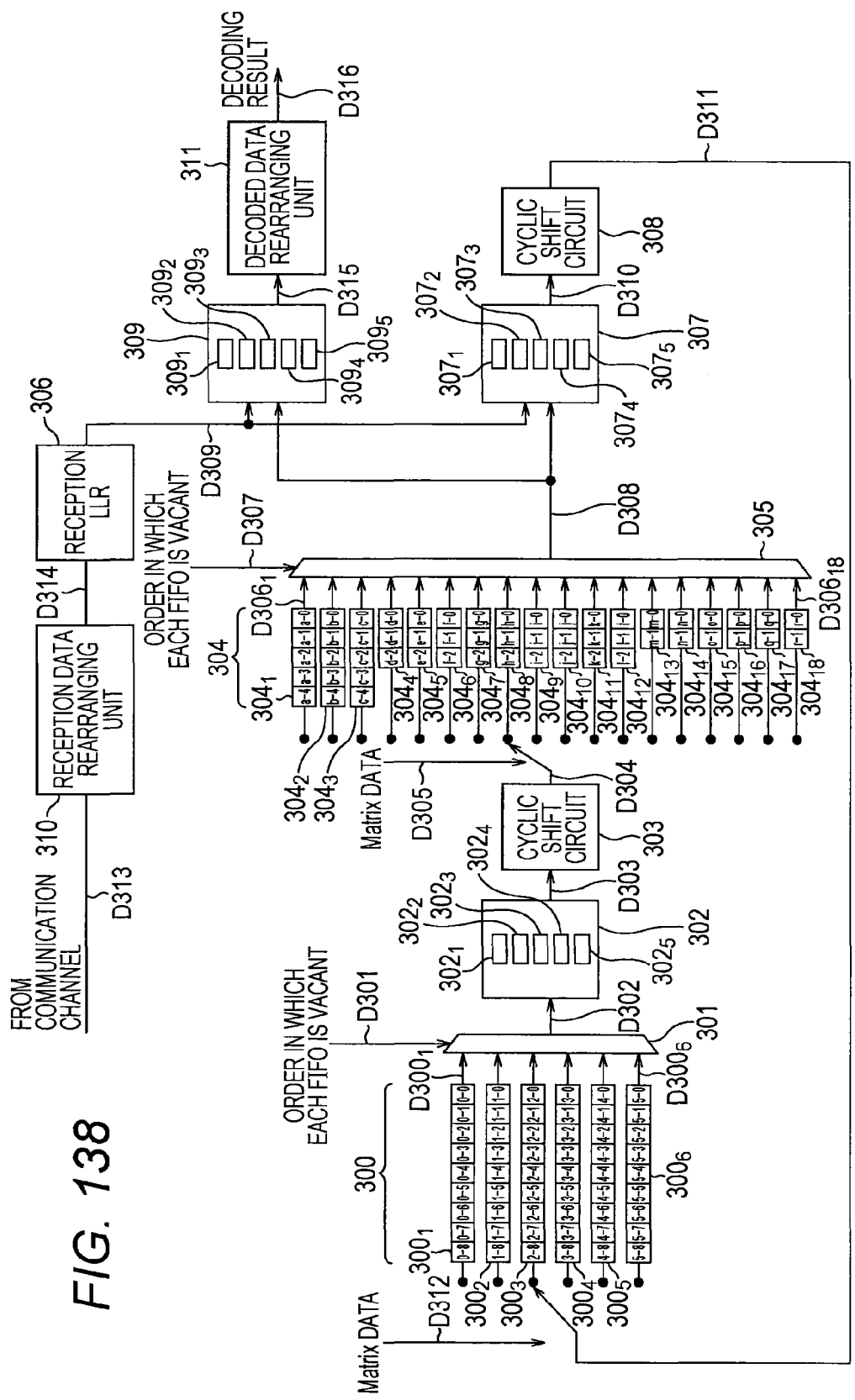

FIG. 138 is a block diagram that illustrates a configuration example of a decoding device that performs P node calculations altogether.

Figure 139:
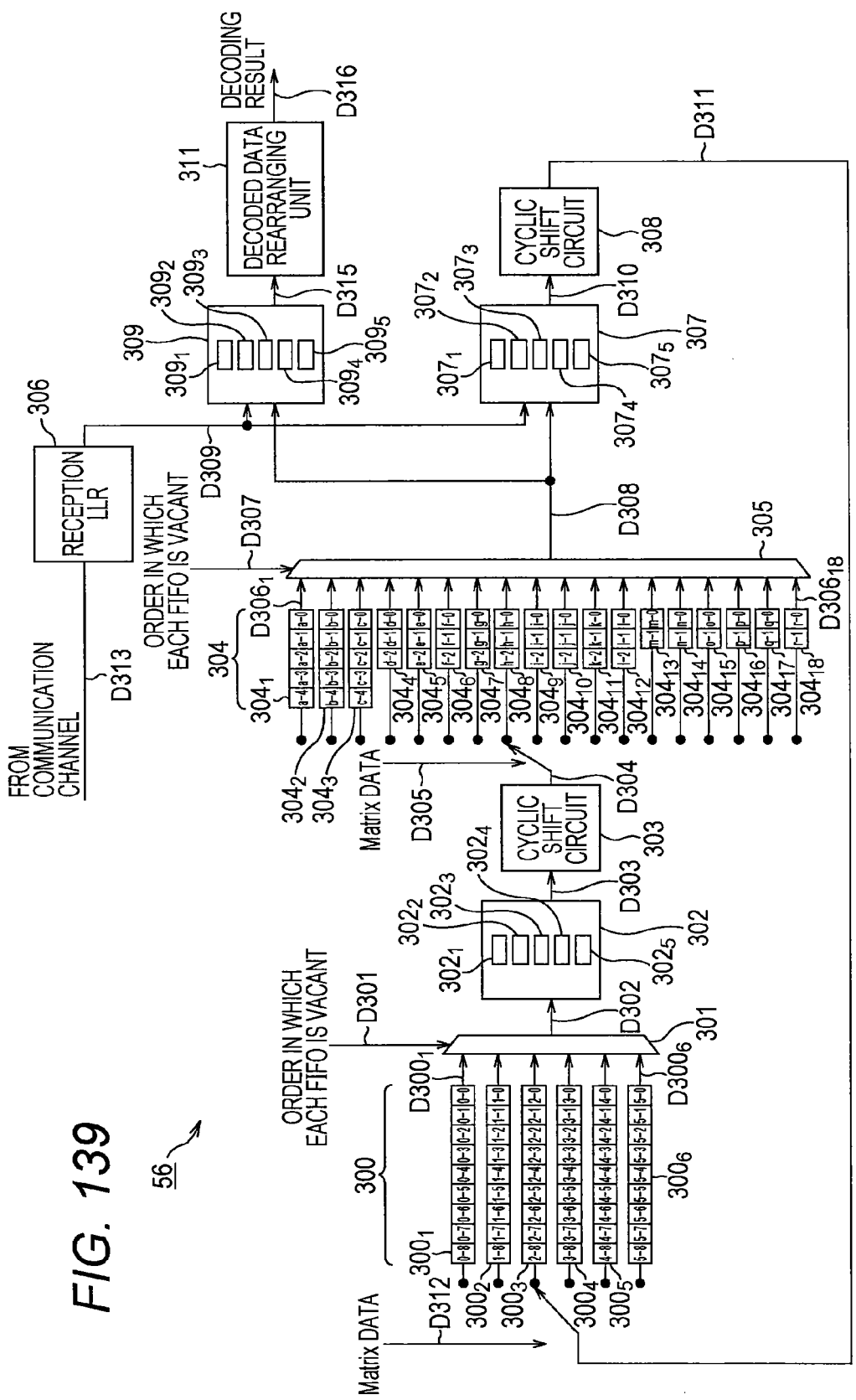

FIG. 139 is a block diagram that illustrates a configuration example of an LDPC decoder 166.

Figure 140:
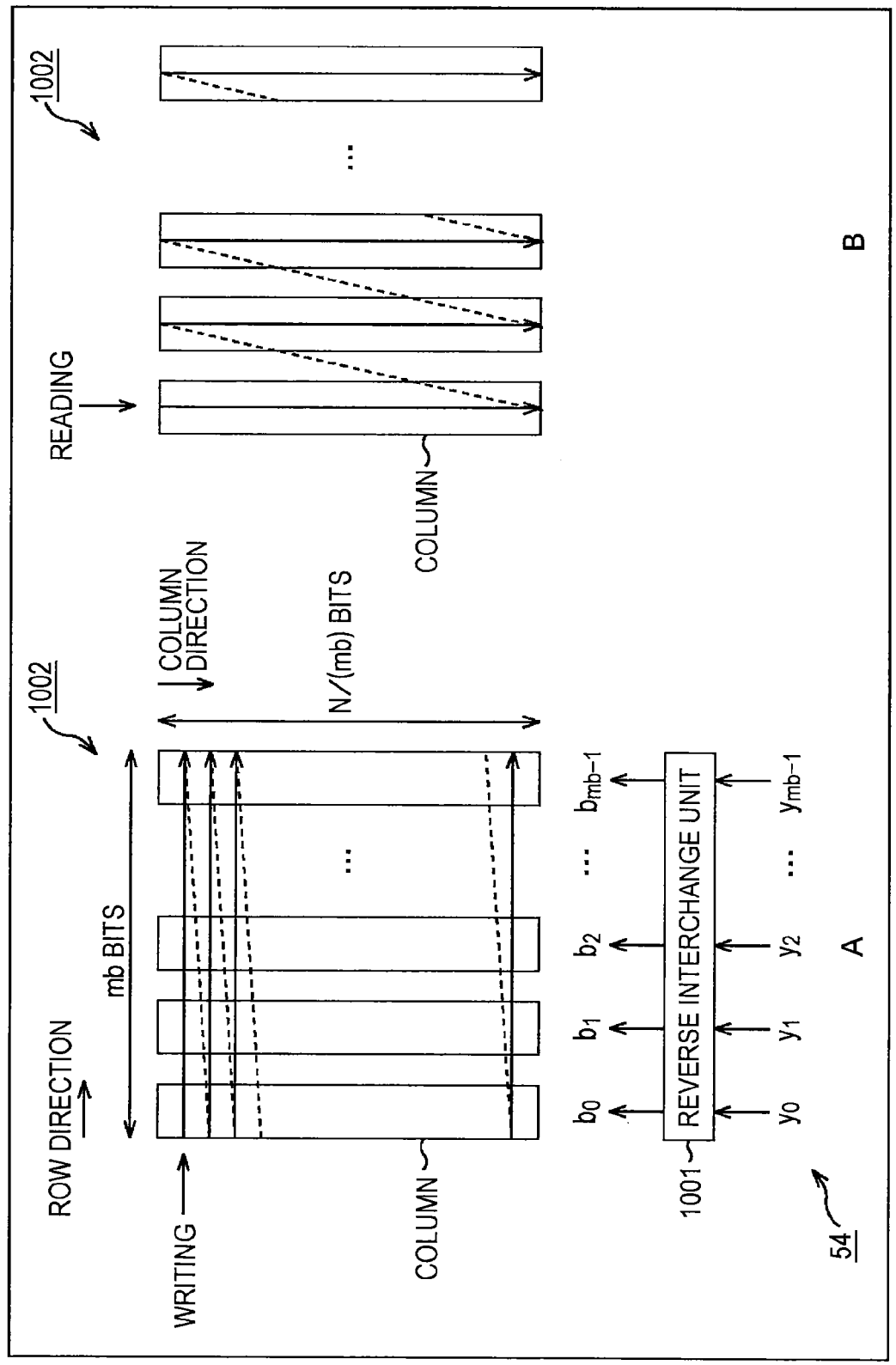

FIG. 140 is a diagram that illustrates the process of a multiplexer 54 that configures the bit deinterleaver 165.

Figure 141:
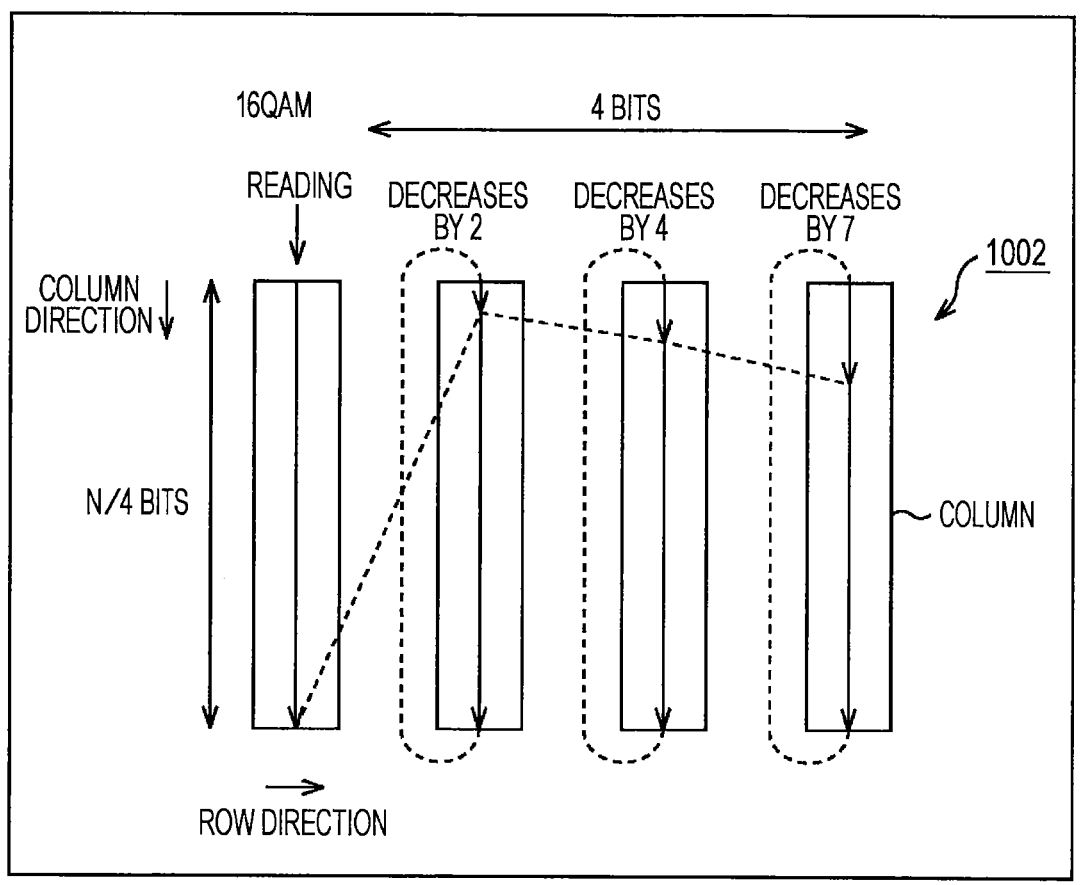

FIG. 141 is a diagram that illustrates the process of a column twist deinterleaver 55.

Figure 142:
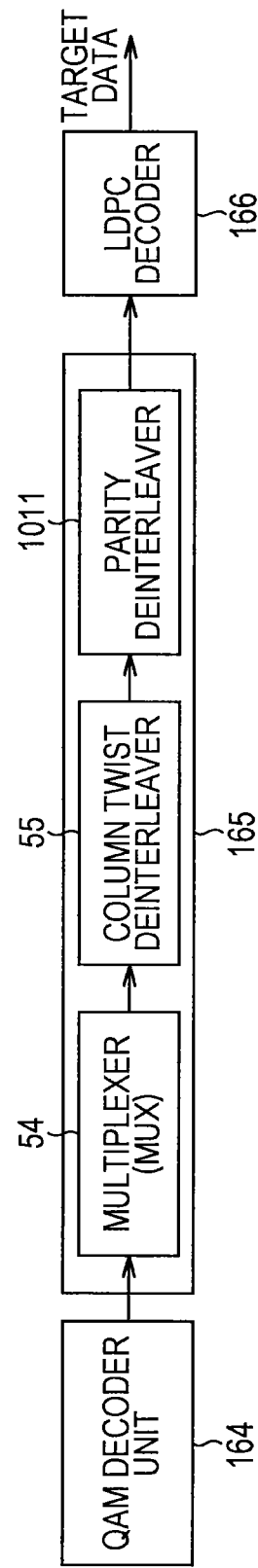

FIG. 142 is a block diagram that illustrates another configuration example of the bit deinterleaver 165.

Figure 143:
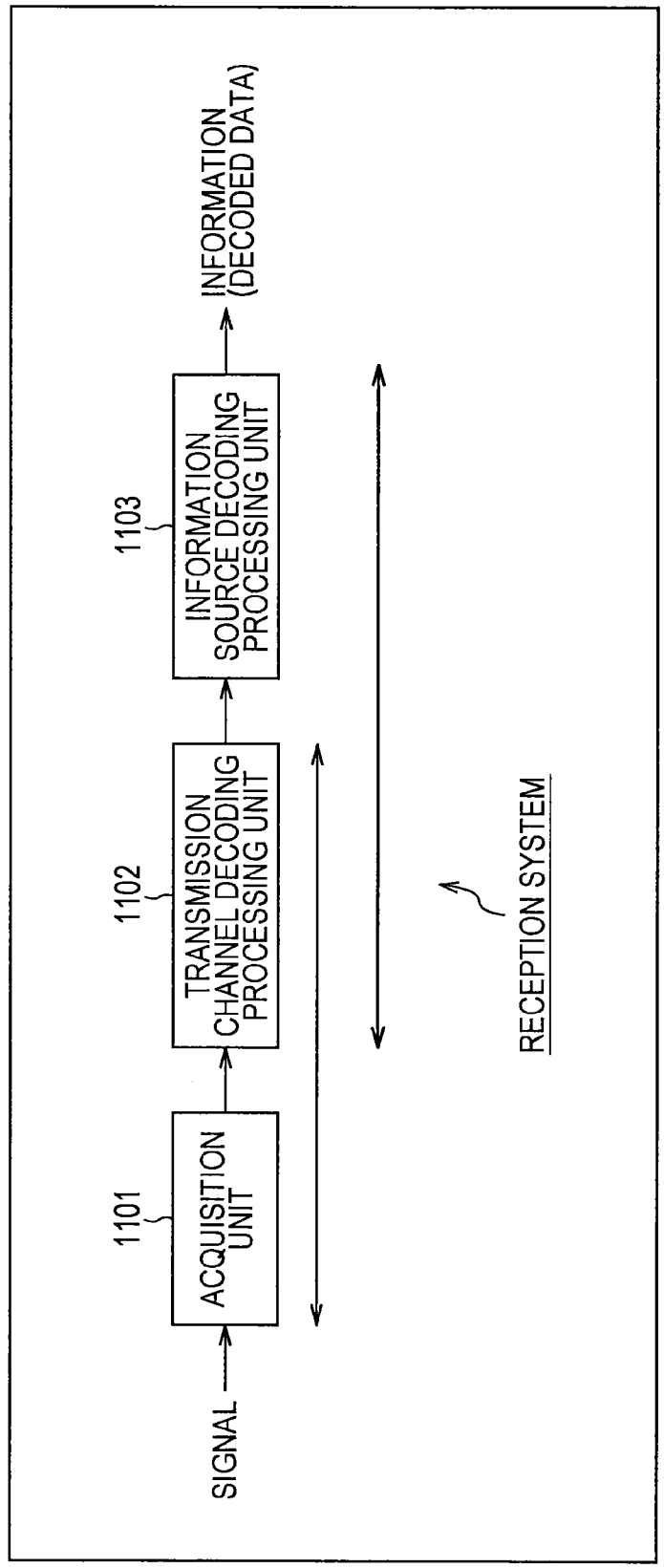

FIG. 143 is a block diagram that illustrates a first configuration example of a reception system to which the reception device 12 can be applied.

Figure 144:
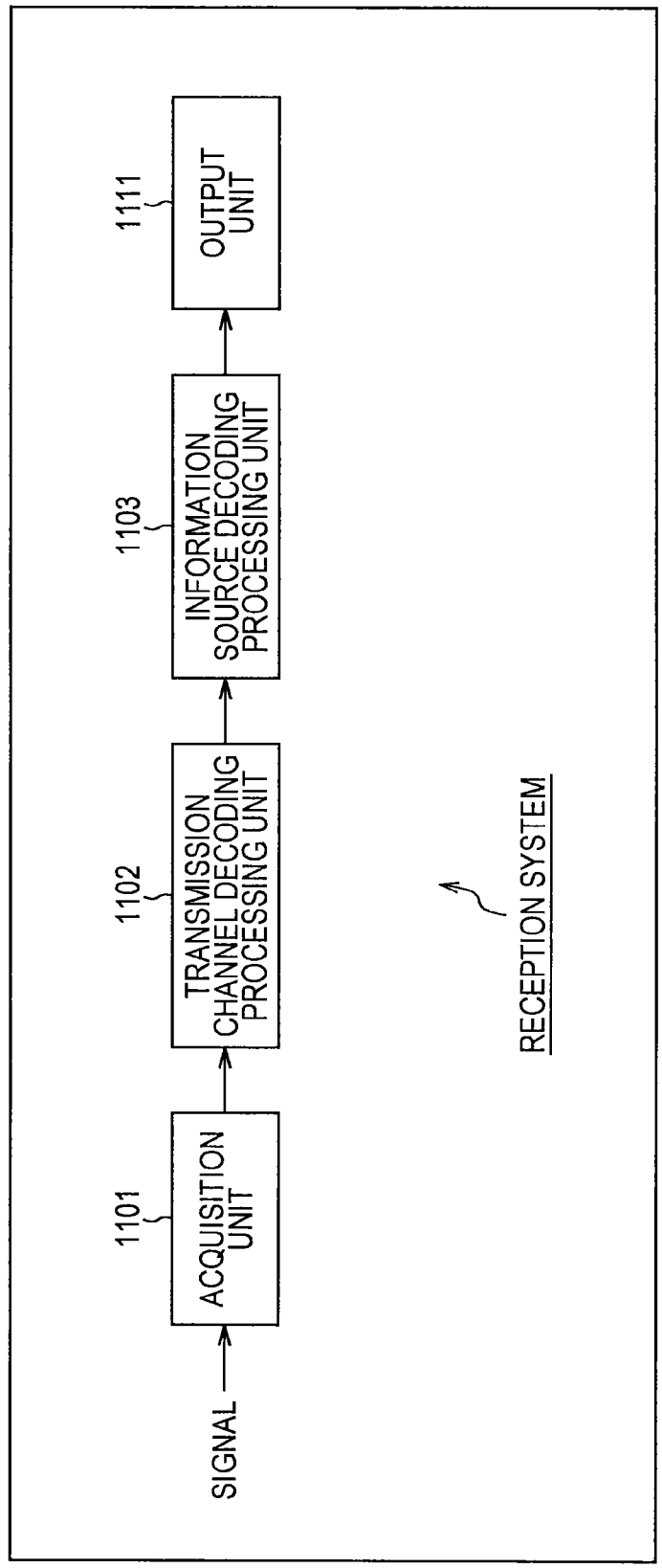

FIG. 144 is a block diagram that illustrates a second configuration example of a reception system to which the reception device 12 can be applied.

Figure 145:
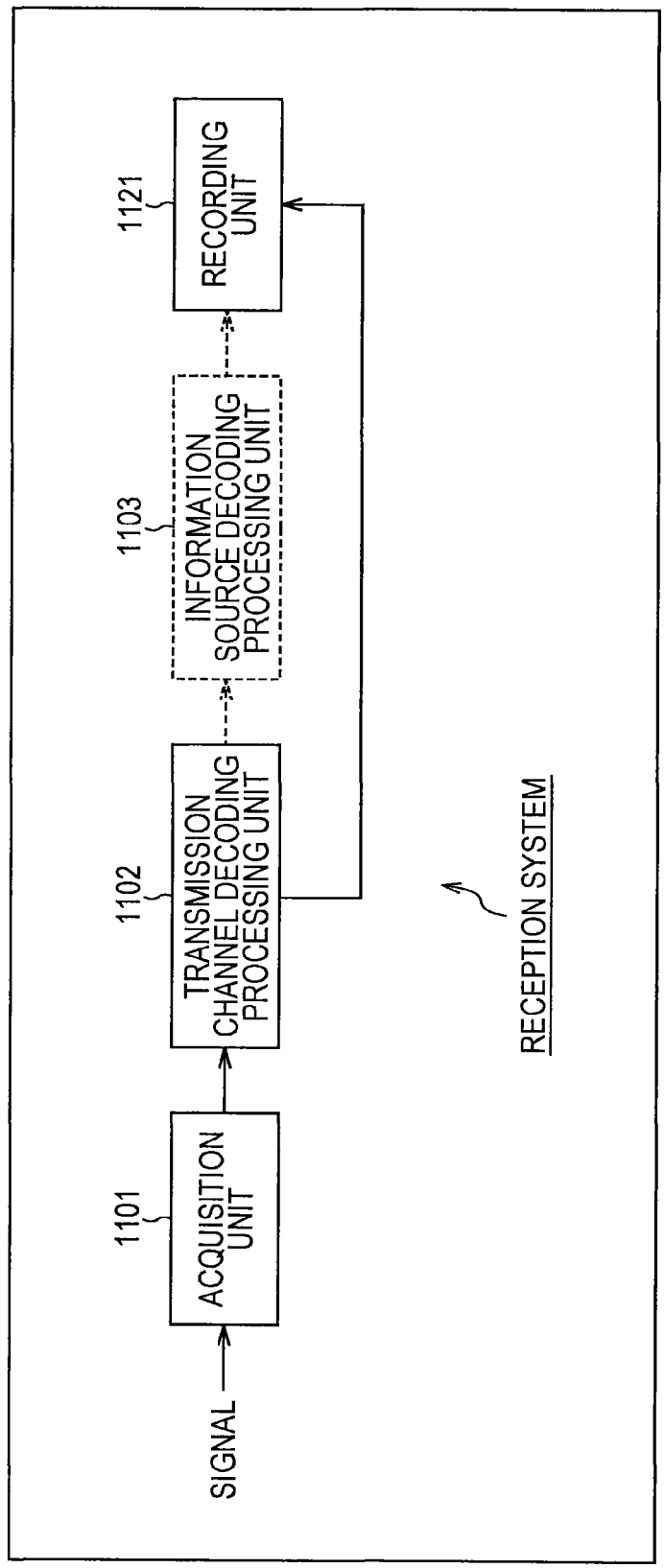

FIG. 145 is a block diagram that illustrates a third configuration example of a reception system to which the reception device 12 can be applied.

Figure 146:
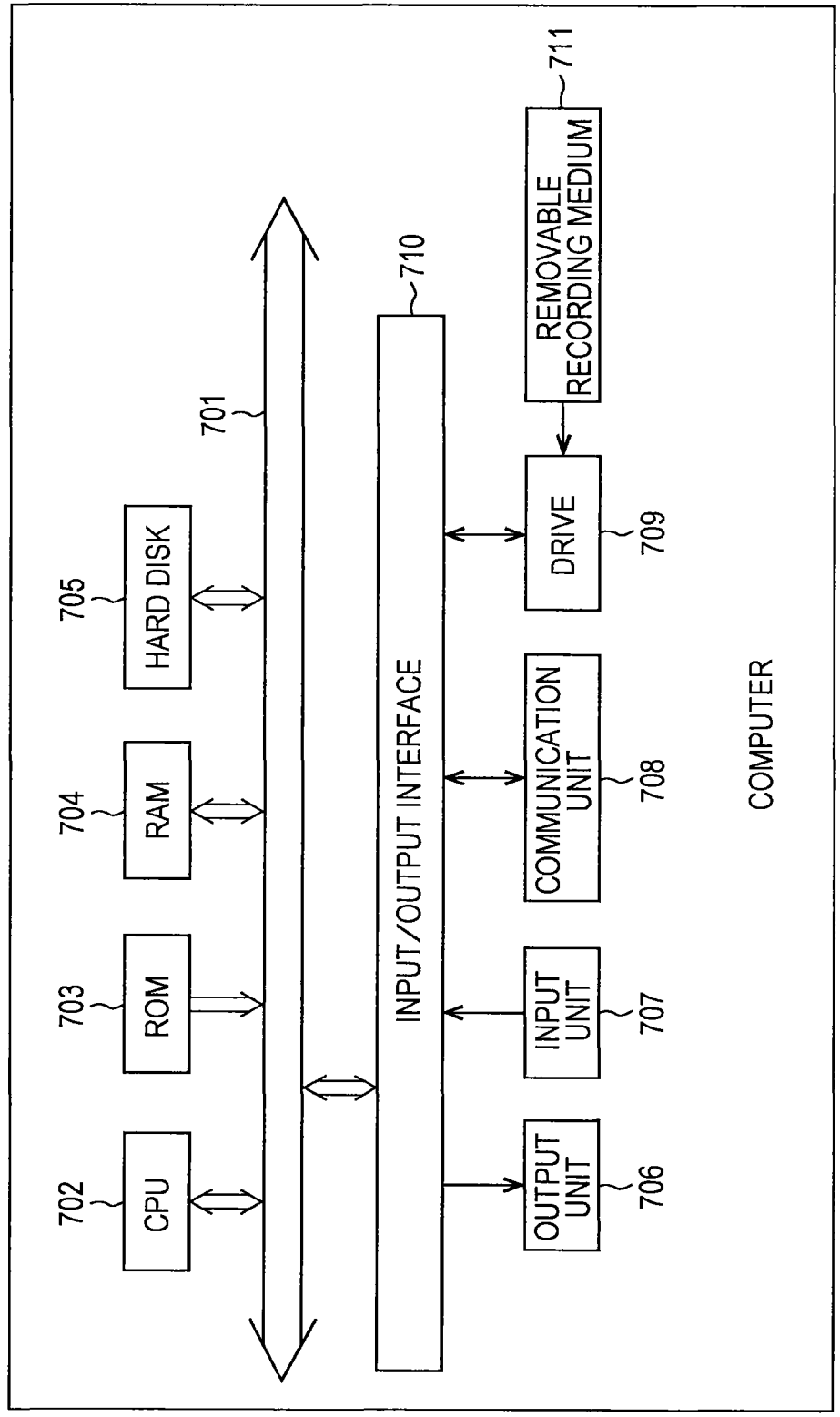

FIG. 146 is a block diagram that illustrates a configuration example of a computer according to an embodiment of the present invention.

MODE FOR CARRYING OUT THE INVENTION

Configuration Example of Transmission System According to Present Invention

Figure 7:
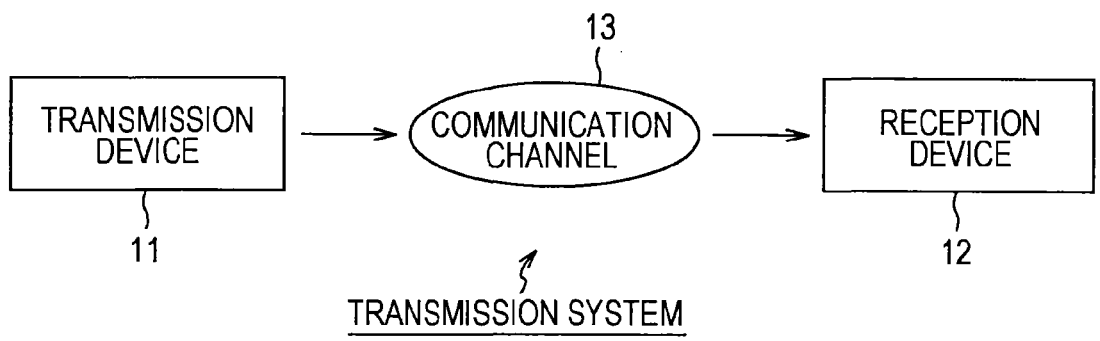
FIG. 7 is a diagram that illustrates a configuration example of a transmission system according to an embodiment of the present invention.

FIG. 7 illustrates a configuration example of a transmission system (here, a system represents a logical aggregation of a plurality of devices regardless whether or not the devices of the configurations are disposed in the same casing) according to an embodiment of the present invention.

In FIG. 7, the transmission system is configured by a transmission device 11 and a reception device 12.

The transmission device 11 sends (broadcasts) (transmits) a program that is dedicatedly used for a fixed terminal or a mobile terminal. In other words, the transmission device 11, for example, encodes target data that is a transmission target such as video data or audio data as a program that is dedicatedly used for a fixed terminal or a mobile terminal in an LDPC code and transmits the LDPC code, for example, through a communication channel 13 that is a ground wave.

The reception device 12, for example, is a mobile terminal, receives the LDPC code that is transmitted from the transmission device 11 through the communication channel 13, decodes the LDPC code into the target data, and outputs the target data.

Here, the LDPC code that is used in the transmission system illustrated in FIG. 7 is known to show an extremely high capability in an AWGN (Additive White Gaussian Noise) communication channel.

However, in the communication channel 13 of a ground wave or the like, there is a case where a burst error or erasure occurs. For example, in an OFDM (Orthogonal Frequency Division Multiplexing) system, under a multi-path environment in which a D/U (Desired to Undesired Ratio) is 0 dB (the power of undesired=echo is the same as the power of desired=main path), there is a case where the power of a specific symbol is zero (erasure) in accordance with a delay of an echo (a path other than the main path).

In addition, also in a flutter (a communication channel to which an echo of a Doppler frequency is added with a delay of zero), in a case where the D/U is 0 dB, there is a case where the power of all the symbols of the OFDM at specific time is zero (erasure) due to the Doppler frequency.

Furthermore, there is a case where a burst error occurs based on the status of a wiring formed from a reception unit (not illustrated in the figure) on the reception device 12 side such as an antenna that receives a signal transmitted from the transmission device 11 to the reception device 12 or the instability of the power of the reception device 12.

Figure 1:
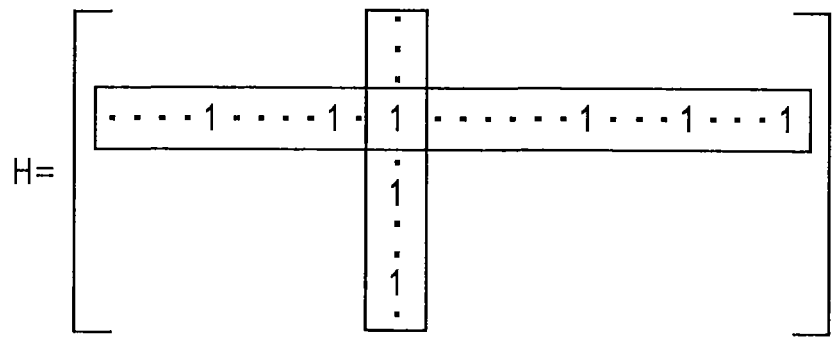
FIG. 1 is a diagram that illustrates a parity check matrix H of an LDPC code.
Figure 2:
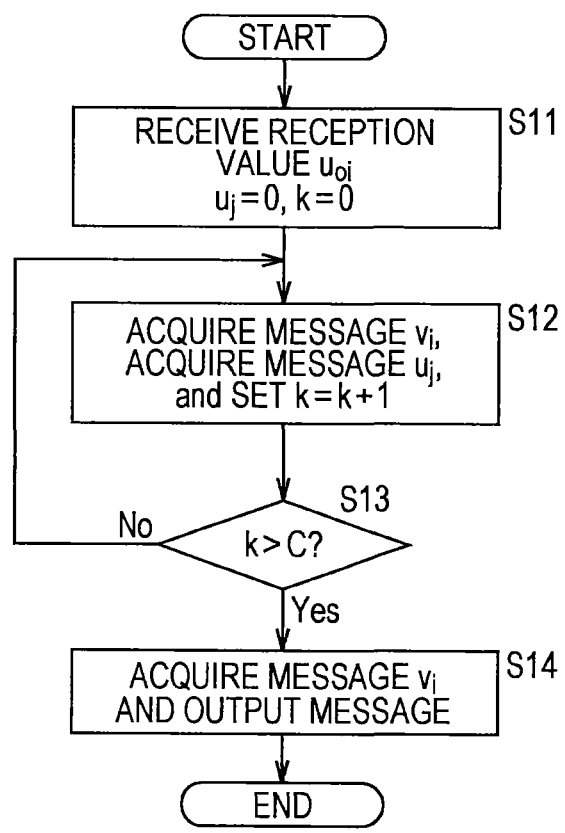
FIG. 2 is a flowchart that illustrates the sequence of decoding an LDPC code.
Figure 4:
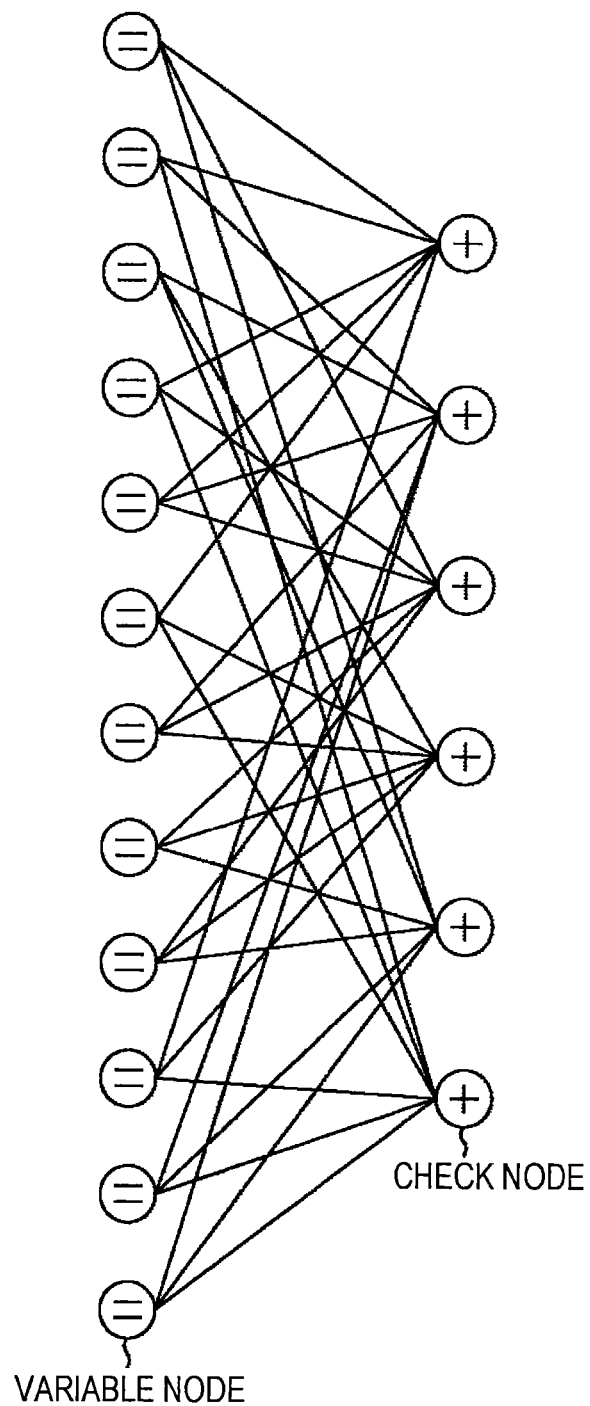
FIG. 4 is a diagram that illustrates a Tanner graph of a parity check matrix.
Figure 5:
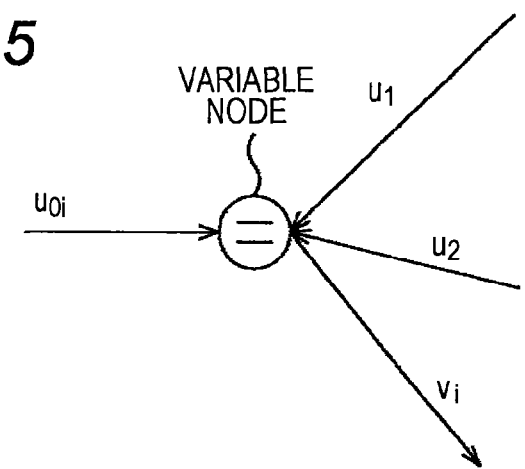
FIG. 5 is a diagram that illustrates a vibration node.
Figure 6:
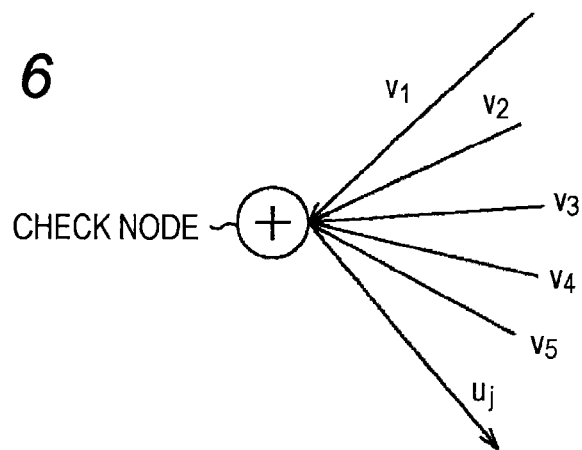
FIG. 6 is a diagram that illustrates a check node.

Meanwhile, in the decoding of an LDPC code, in a column of the parity check matrix H and, further, in a variable node that corresponds to the code bit of the LDPC code, as illustrated in FIG. 5 described above, the variable node calculation represented in Equation (1) is performed which accompanies the addition of the code bit (the received value $u_{0i}$ thereof) of the LDPC code, and accordingly, when an error occurs in the code bit that is used for the variable node calculation, the accuracy of a requested message decreases.

In addition, in the decoding of an LDPC code, at a check node, the check node calculation represented in Equation (7) is performed using messages acquired at the variable nodes connected to the check node, and accordingly, when the number of check nodes having errors (including erasure) that occur at the same time at a plurality of variable nodes (code bits of the LDPC code that correspond thereto) connected thereto increases, the decoding capability is degraded.

In other words, for example, when two or more variable nodes connected to a check node have been erased at the same time, the check node returns a message of an equal probability for a probability of a value of zero and a probability of a value of one to all the variable nodes. In such a case, the check node that returns the message of an equal probability does not contribute to one decoding process (one set of a variable node calculation and a check node calculation), and, as a result, the number of repetitions of the decoding process needs to be large, whereby the decoding capability is degraded, and the power consumption of the reception device 12 that decodes the LDPC code increases.

Therefore, in the transmission system illustrated in FIG. 7, the resistance to a burst error or erasure is improved while the capability in the AWGN communication channel is maintained.

Configuration Example of Transmission Device 11

Figure 8:
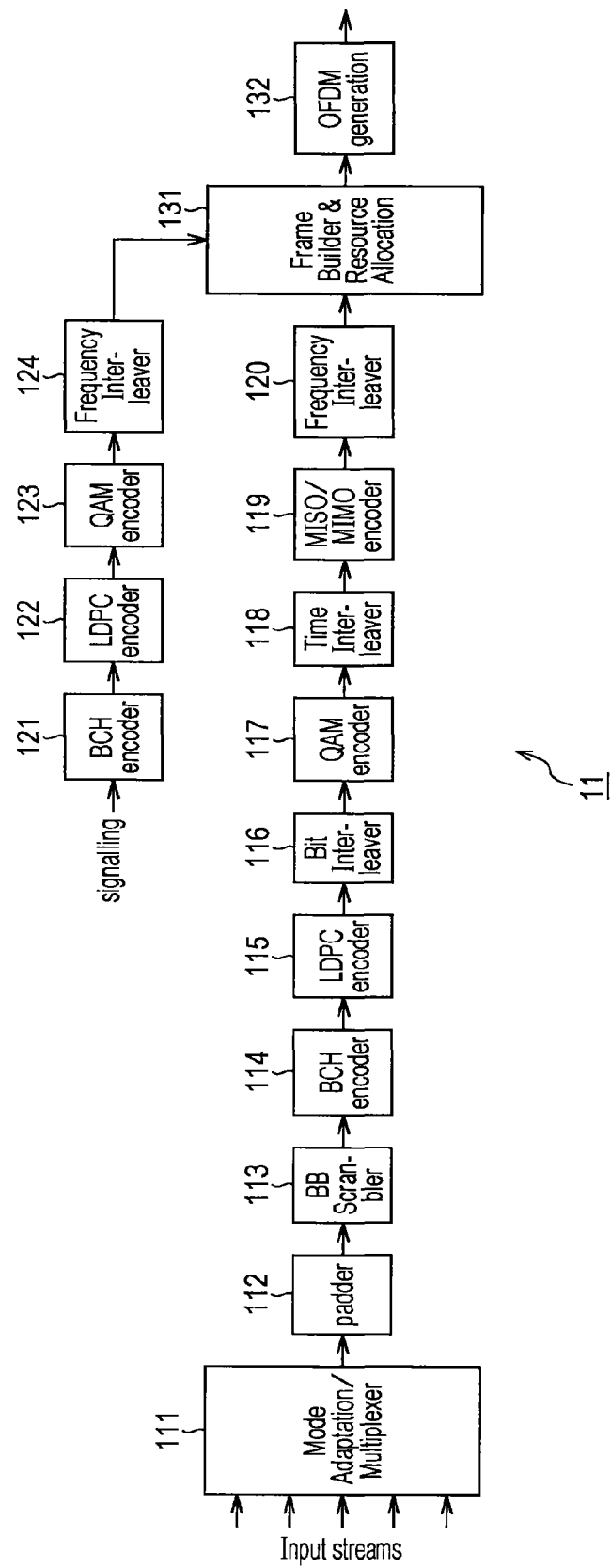
FIG. 8 is a block diagram that illustrates a configuration example of a transmission device 11.

FIG. 8 is a block diagram that illustrates a configuration example of the transmission device 11 illustrated in FIG. 7.

In the transmission device 11, one or more input streams as target data are supplied to a mode adaptation/multiplexer 111.

The mode adaptation/multiplexer 111 performs mode selection and multiplexing of one or more input streams supplied thereto and supplies data acquired as a result thereof to a padder 112.

The padder 112 performs zero filling (insertion of Null), which is necessary, for the data supplied from the mode adaptation/multiplexer 111 and supplies data acquired as a result thereof to a BB scrambler 113.

The BB scrambler 113 performs an energy diffusion process for the data supplied from the padder 112 and supplies data acquired as a result thereof to a BCH encoder 114.

The BCH encoder 114 performs BCH encoding for the data supplied from the BB scrambler 113 and supplies data acquired as a result thereof to an LDPC encoder 115 as LDPC target data that is a target for LDPC encoding.

The LDPC encoder 115 performs LDPC encoding for the LDPC target data supplied from the BCH encoder 114 in accordance with a parity check matrix in which a parity matrix that is a part of the LDPC code corresponding to a parity bit has a staircase structure and outputs an LDPC code in which the LDPC target data is set as information bits.

In other words, the LDPC encoder 115 performs LDPC encoding for encoding the LDPC target data in an LDPC code such as an LDPC code, for example, defined in the standard of DVB-T.2 and outputs the LDPC code acquired as a result thereof.

Here, in the standard of the DVB-T.2, an LDPC code defined in the standard of DVB-S.2 is employed except for a case where a code length is 16200 bits, and a coded rate is ⅗. The LDPC code defined in the standard of the DVB-T.2 is an IRA (Irregular Repeat Accumulate) code, and a parity matrix of the parity check matrix of the LDPC code has a staircase structure. The parity matrix and the staircase structure will be described below. The IRA code, for example, is described in, "Irregular Repeat-Accumulate Codes," H. Jin, A. Khandekar, and R. J. McEliece, in Proceedings of second International Symposium on Turbo codes and Related Topics, pp. 1-8, September 2000.

The LDPC code that is output from the LDPC encoder 115 is supplied to a bit interleaver 116.

The bit interleaver 116 performs bit interleaving to be described below for the LDPC code supplied from the LDPC encoder 115 and supplies the LDPC code after the bit interleaving to a QAM encoder 117.

The QAM encoder 117 performs orthogonal modulation (multi-value modulation) by mapping the LDPC code supplied from the bit interleaver 116 into a signal point of the orthogonal modulation that represents one symbol in units (symbol units) of code bits of the LDPC code of one bit or more.

In other words, the QAM encoder 117 performs orthogonal modulation by mapping the LDPC code supplied from the bit interleaver 116 into a signal point defined in a modulation mode used for performing orthogonal modulation of the LDPC code on an IQ plane (IQ constellation) defined by an I axis representing an I component that is in phase with a carrier wave and a Q axis representing a Q component orthogonal to the carrier wave.

Here, as modulation modes of the orthogonal modulation performed by the QAM encoder 117, for example, there are modulation modes that include modulation modes defined in the standard of DVB-T, in other words, for example, there are QPSK (Quadrature Phase Shift Keying), 16 QAM (Quadrature Amplitude Modulation), 64 QAM, 256 QAM, 1024 QAM, and 4096 QAM. In the QAM encoder 117, the modulation mode of the orthogonal modulation, for example, is set in advance, for example, in accordance with an operation of an operator of the transmission device 11. In addition, in the QAM encoder 117, for example, 4 PAM (Pulse Amplitude Modulation) and any other type of orthogonal modulation can be performed.

Data (symbols mapped into signal points) acquired by the process performed in the QAM encoder 117 is supplied to a time interleaver 118.

The time interleaver 118 performs time interleaving (interleaving in the time direction) in units of symbols for the data (symbols) supplied from the QAM encoder 117 and supplies data acquired as a result thereof to an MISO/MIMO encoder 119.

The MISO/MIMO encoder 119 performs time-space encoding for the data (symbols) supplied from the time interleaver 118 and supplies resultant data to a frequency interleaver 120.

The frequency interleaver 120 performs frequency interleaving (interleaving in the frequency direction) in units of symbols for the data (symbols) supplied from the MISO/MIMO encoder 119 and supplies resultant data to a frame builder/resource allocation unit 131.

Meanwhile, for example, control data (signalling) used for transmission control such as a preamble called L1 or the like is supplied to a BCH encoder 121.

The BCH encoder 121 performs BCH encoding for the control data supplied thereto, similarly to the BCH encoder 114, and supplies data acquired as a result thereof to an LDPC encoder 122.

The LDPC encoder 122 performs LDPC encoding for the data supplied from the BCH encoder 121 as LDPC target data, similarly to the LDPC encoder 115, and supplies an LDPC code acquired as a result thereof to a QAM encoder 123.

The QAM encoder 123, similarly to the QAM encoder 117, maps the LDPC code supplied from the LDPC encoder 122 in units (in units of symbols) of code bits of one or more bits of the LDPC code into a signal point of orthogonal modulation representing one symbol, performs orthogonal modulation for resultant data, and supplies data (symbols) acquired as a result thereof to a frequency interleaver 124.

The frequency interleaver 124, similarly to the frequency interleaver 120, performs frequency interleaving for the data (symbols) supplied from the QAM encoder 123 in units of symbols and supplies resultant data to the frame builder/resource allocation unit 131.

The frame builder/resource allocation unit 131 inserts pilot symbols at necessary positions of the data (symbols) supplied from the frequency interleavers 120 and 124, configures a frame configured by symbols of a predetermined number using the resultant data (symbols) and supplies the frame to an OFDM generation unit 132.

The OFDM generation unit 132 generates an OFDM signal corresponding to the frame supplied from the frame builder/resource allocation unit 131 based on the frame and transmits the OFDM signal through the communication channel 13 (FIG. 7).

Figure 9:
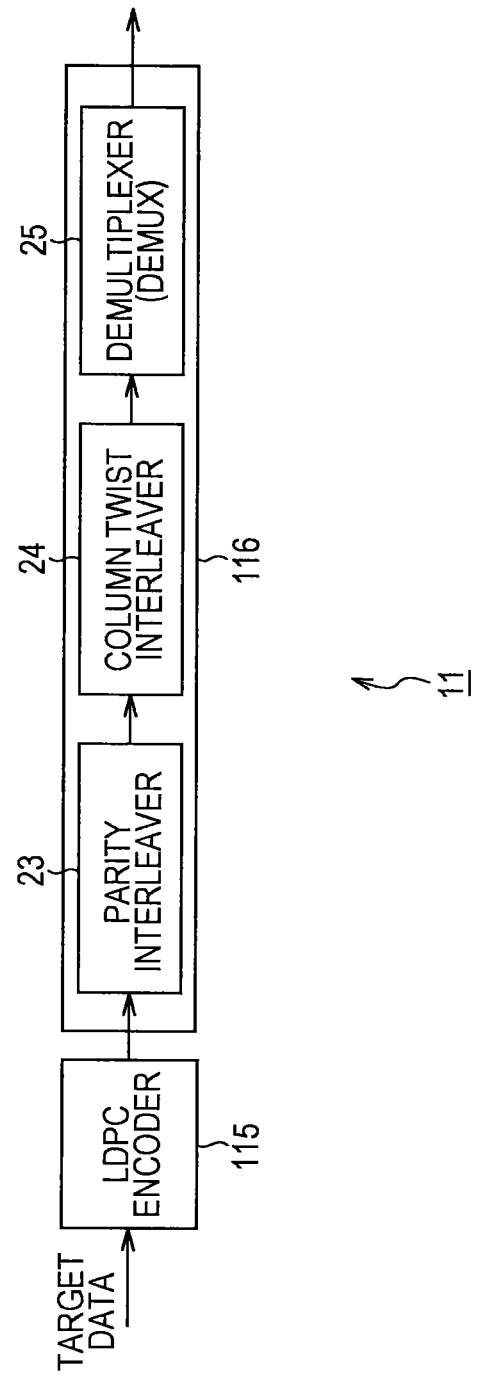
FIG. 9 is a block diagram that illustrates a configuration example of a bit interleaver 116.

FIG. 9 illustrates a configuration example of the bit interleaver 116 illustrated in FIG. 8.

The bit interleaver 116 is a data processing device that interleaves data and is configured by a parity interleaver 23, a column twist interleaver 24, and a demultiplexer (DEMUX) 25.

The parity interleaver 23 performs parity interleaving in which a parity bit of the LDPC code supplied from the LDPC encoder 115 is interleaved at a position of another parity bit and supplies an LDPC code after the parity interleaving to the column twist interleaver 24.

The column twist interleaver 24 performs column twist interleaving for the LDPC code supplied from the parity interleaver 23 and supplies the LDPC code after the column twist interleaving to the demultiplexer 25.

In other words, in the QAM encoder 117 illustrated in FIG. 8, the LDPC code is transmitted with the code bits of one or more bits of the LDPC code being mapped into a signal point representing one symbol of the orthogonal modulation.

In the column twist interleaver 24, for example, column twist interleaving as will be described below is performed as a sorting process in which the code bits of the LDPC code supplied from the parity interleaver 23 are sorted such that a plurality of code bits of the LDPC code that correspond to "1" that is present in one arbitrary row of the parity check matrix used by the LDPC encoder 115 are not included in one symbol.

The demultiplexer 25 acquires an LDPC code of which the resistance to the AWGN is improved by performing an interchange process in which the positions of two or more code bits of the LDPC code that form a symbol are interchanged for the LDPC code supplied from the column twist interleaver 24. Then, the demultiplexer 25 supplies two or more code bits of the LDPC code acquired by the interchange process to the QAM encoder 117 (FIG. 8) as a symbol.

Figure 10:
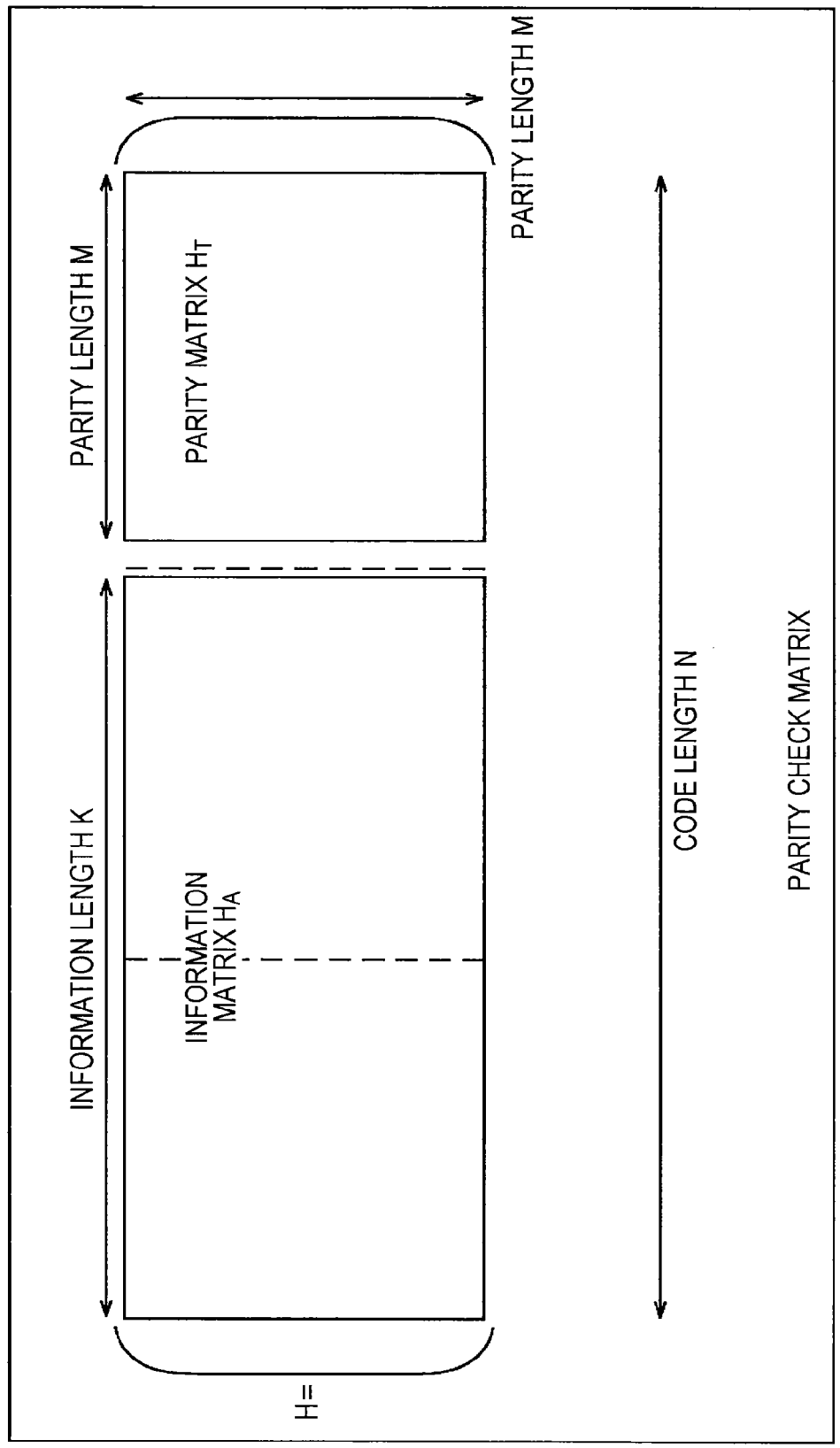
FIG. 10 is a diagram that illustrates a parity check matrix.

Next, FIG. 10 illustrates a parity check matrix H that is used for encoding an LDPC by the LDPC encoder 115 illustrated in FIG. 8.

The parity check matrix H has an LDGM (Low-Density Generation Matrix) structure and can be represented in Equation $H=[H_A|H_T]$ (a matrix in which elements of an information matrix $H_A$ are set as left-side elements, and elements of a parity matrix $H_T$ are set as right-side elements) by using the information matrix $H_A$ of the part of the code bits of the LDPC code that corresponds to information bits and the parity matrix $H_T$ that corresponds to the parity bits.

Here, out of the code bits of one LDPC code (one code word), the number of information bits and the number of parity bits are referred to as an information length K and a parity length M, respectively, and the number of the code bits of one LDPC code is referred to as a code length N (=K+M).

The information length K and the parity length M with respect to a specific LDPC code of a code length N are determined based on the coded rate. In addition, the parity check matrix H is a matrix of M rows×N columns. In addition, the information matrix $H_A$ is a matrix of M×K, and the parity matrix $H_T$ is a matrix of M×M.

Figure 11:
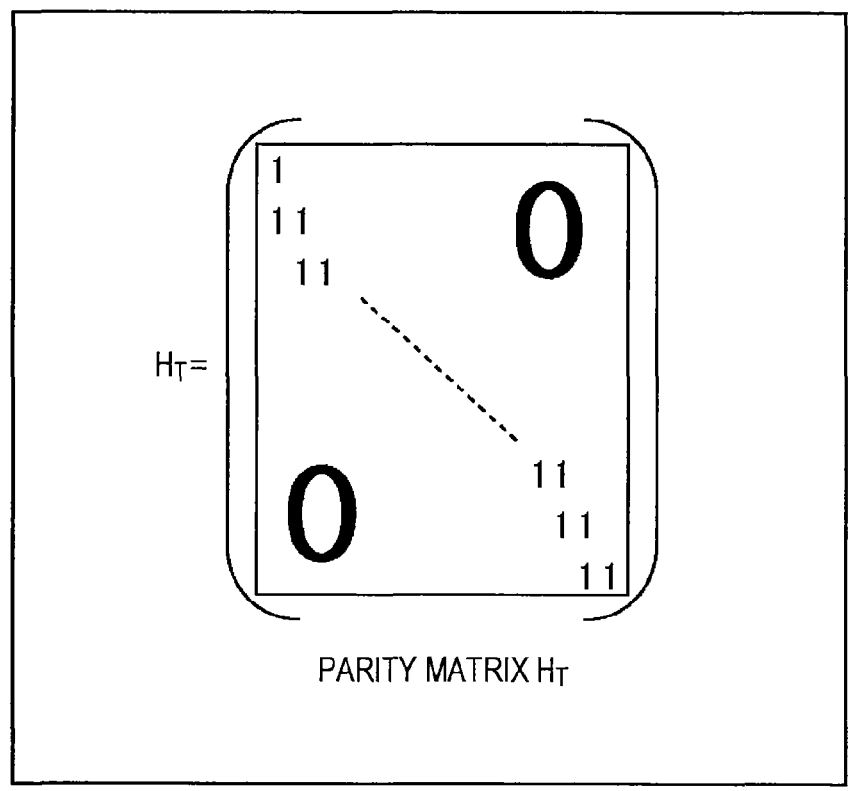
FIG. 11 is a diagram that illustrates a parity matrix.

FIG. 11 illustrates a parity matrix $H_T$ of a parity check matrix H of an LDPC code defined in the standard of DVB-T.2 (and DVB-S.2).

In the parity matrix $H_T$ of the parity check matrix H of an LDPC code defined in the standard of DVB-T.2, as illustrated in FIG. 11, elements of 1's have a staircase structure in which the elements are aligned in a staircase pattern in a sense. The row weight of the parity matrix $H_T$ is 1 for a first row and 2 for all the remaining rows. In addition, the column weight is 1 for the last column and is 2 for all the remaining columns.

As above, the LDPC code of the parity check matrix H in which the parity matrix $H_T$ has a staircase structure can be easily generated by using the parity check matrix H.

In other words, the LDPC code (one code word) is represented as a row vector c, and column vector acquired by transposing the row vector is represented as $c^T$. In the row vector c that is an LDPC code, the part of information bits is represented as a row vector A, and the part of parity bits is represented as a row vector T.

In such a case, the row vector c can be represented in Equation c=[A|T] (a row vector in which the elements of the row vector A are set as left-side elements, and the elements of the row vector T are set as right-side elements) using the row vector A as information bits and the row vector T as parity bits.

The parity check matrix H and the row vector c=[A|T] as an LDPC code need to satisfy Equation $Hc^T=0$, and the row vector T as parity bits configuring the row vector c=[A|T] satisfying Equation $Hc^T=0$ can be acquired sequentially (in turns) by setting the elements of each row to 0 in order from the elements of the first row of the column vector $Hc^T$ represented in Equation $Hc^T=0$ in a case where the parity matrix $H_T$ of the parity check matrix $H=[H_A|H_T]$ has a staircase structure illustrated in FIG. 11.

Figure 12:
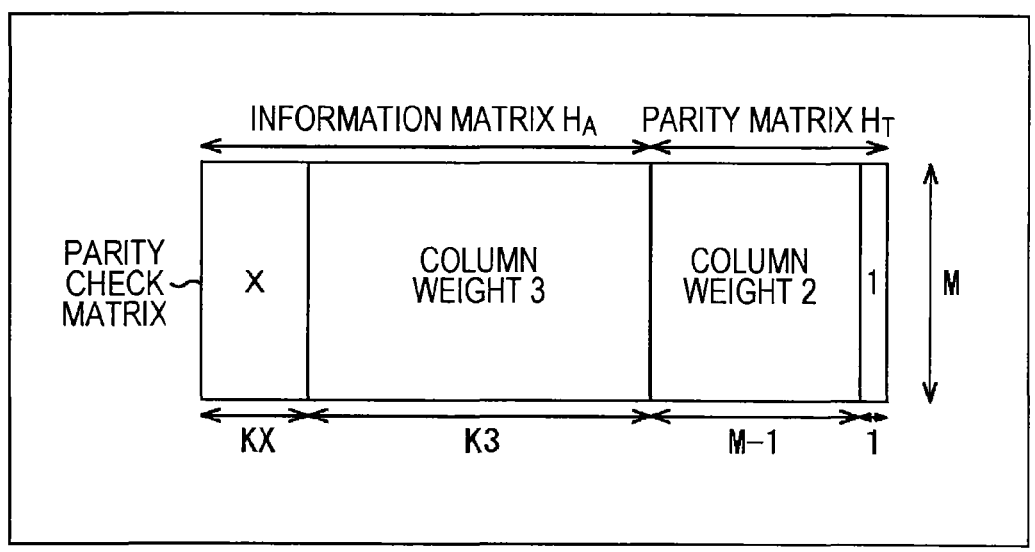
FIG. 12 is a diagram that illustrates a parity check matrix of an LDPC code that is defined in the standard of DVB-S.2.

FIG. 12 is a diagram that illustrates the parity check matrix H of an LDPC code that is defined in the standard of DVB-T.2.

In the parity check matrix H of the LDPC code defined in the standard of DVB-T.2, the column weight is set to X for KX columns from the first column, the column weight is set to 3 for the subsequent K3 columns, the column weight is set to 2 for the subsequent (M−1) columns, and the column weight is set to 1 for the last 1 column.

Here, KX+K3+M−1+1 is the same as the code length N.

FIG. 13 is a diagram that illustrates column numbers KX, K3, and M and the column weight X for each coded rate r of the LDPC code defined in the standard of DVB-T.2.

In the standard of DVB-T.2, LDPC codes of code lengths N of 64800 bits and 16200 bits are defined.

For the LDPC code of which the code length N is 64800 bits, 11 coded rates (nominal rates) of ¼, ⅓, ⅖, ½, ⅗, ⅔, ¾, ⅘, ⅚, ⅞, and 9/10 are defined, and, for the LDPC code of which the code length N is 16200 bits, 10 coded rates of ¼, ⅓, ⅖, ½, ⅗, ⅔, ¾, ⅘, ⅚, and ⅞ are defined.

Hereinafter, the code length N of 64800 bits is also referred to as 64k bits, and the code length N of 16200 bits is also referred to as 16k bits.

In an LDPC code, it is known that a code bit corresponding to larger column weight of the parity check matrix H has a lower error rate.

In the parity check matrix H defined in the standard of DVB-T.2 illustrated in FIGS. 12 and 13, as a column is located on the further front side (left side), the column weight tends to be large, and, accordingly, in an LDPC code corresponding to the parity check matrix H, a code bit located on the further front side is stronger for error (has resistance to error), and the last code bit tends to be weak for error.

Figure 14:
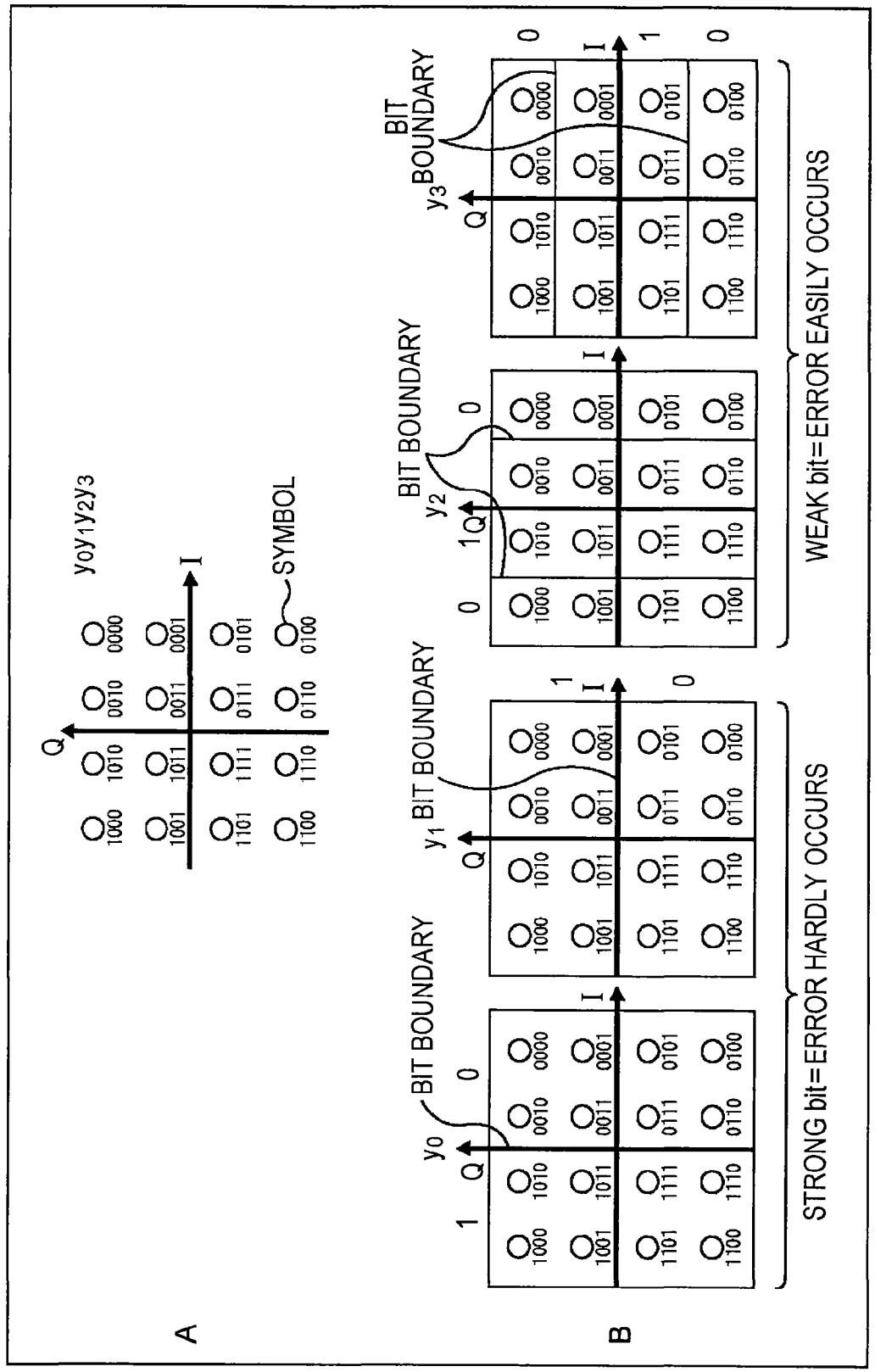
FIG. 14 is a diagram that illustrates the arrangement of signal points of 16 QAM.

FIG. 14 illustrates the arrangement of 16 symbols (signal points corresponding thereto) on an IQ plane in a case where 16 QAM is performed by the QAM encoder 117 illustrated in FIG. 8.

In other words, A of FIG. 14 illustrates symbols of the 16 QAM defined in DVB-T.2.

In the 16 QAM, one symbol is represented using four bits, and $16=(2^4)$ symbols are present. The 16 symbols are arranged with the origin point of the IQ plane set as the center thereof such that the I direction×the Q direction has a form of 4×4 squares.

When an (i+1)-th bit from the most significant bit of a bit row represented by one symbol is denoted by a bit $y_i$, four bits represented by one symbol of the 16 QAM can be represented as bits $y_0$, $y_1$, $y_2$, and $y_3$ in order from the most significant bit. In a case where the modulation mode is the 16 QAM, 4 bits of the code bits of the LDPC code are formed as a symbol (symbol value) of 4 bits $y_0$ to $y_3$ (symbolized).

B of FIG. 14 illustrates bit boundaries of 4 bits (hereinafter, also referred to as symbol bits) $y_0$ to $y_3$ represented by symbols of the 16 QAM.

Here, the bit boundary of a symbol bit $y_i$ (in FIG. 14, i=0, 1, 2, or 3) represents a boundary between a symbol of which the symbol bit $y_i$ is 0 and a symbol of which the symbol bit $y_i$ is 1.

As illustrated in B of FIG. 14, for the most significant symbol bit $y_0$ out of four symbol bits $y_0$ to $y_3$ represented by a symbol of the 16 QAM, only one position on the Q axis of the IQ plane forms a bit boundary, and, for the second (second from the most significant bit) symbol bit $y_1$, only one position on the I axis of the IQ plane forms a bit boundary.

In addition, for the third symbol bit $y_2$, in the 4×4 symbols, two positions including a position between the first and second columns from the left and a position between the third and fourth columns form bit boundaries.

Furthermore, for the fourth symbol bit $y_3$, in the 4×4 symbols, two positions including a position between the first and second rows from the top and a position between the third and fourth rows form bit boundaries.

It is difficult for a symbol bit $y_i$ represented by a symbol to have an error as the number of symbols located far from the bit boundary increases (the error probability is low), and it is easy for the symbol bit $y_i$ to have an error as the number of symbols located close to the bit boundary increases (the error probability is high).

When a bit in which an error is difficult to occur (strong for error) is referred to as a "strong bit", and a bit in which an error is easy to occur (weak for error) is referred to as a "weak bit", out of four symbol bits $y_0$ to $y_3$ of a symbol of the 16 QAM, the most significant symbol bit $y_0$ and the second symbol bit $y_1$ are strong bits, and the third symbol bit $y_2$ and the fourth symbol bit $y_3$ are weak bits.

Figure 15:
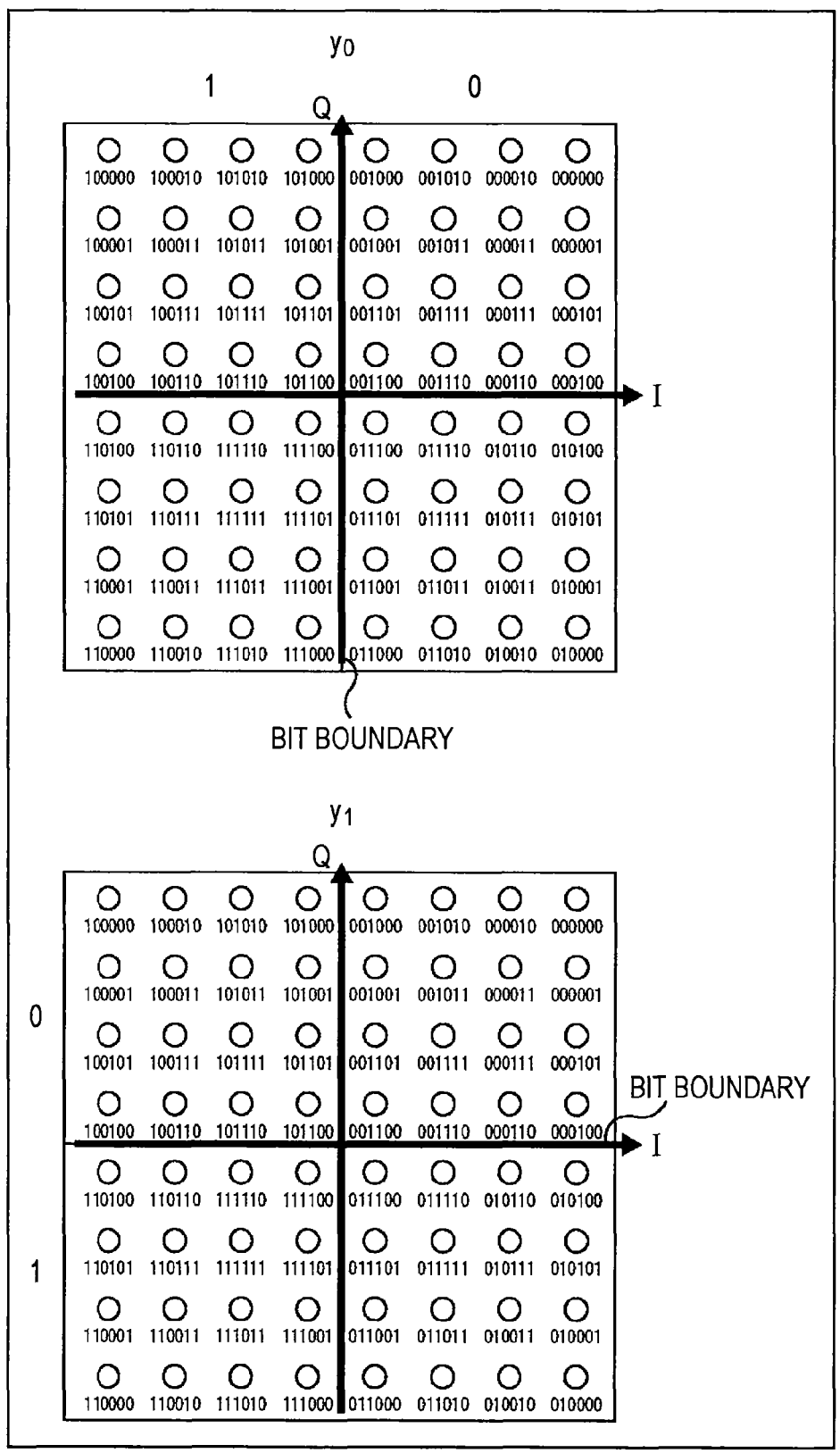
FIG. 15 is a diagram that illustrates the arrangement of signal points of 64 QAM.
Figure 16:
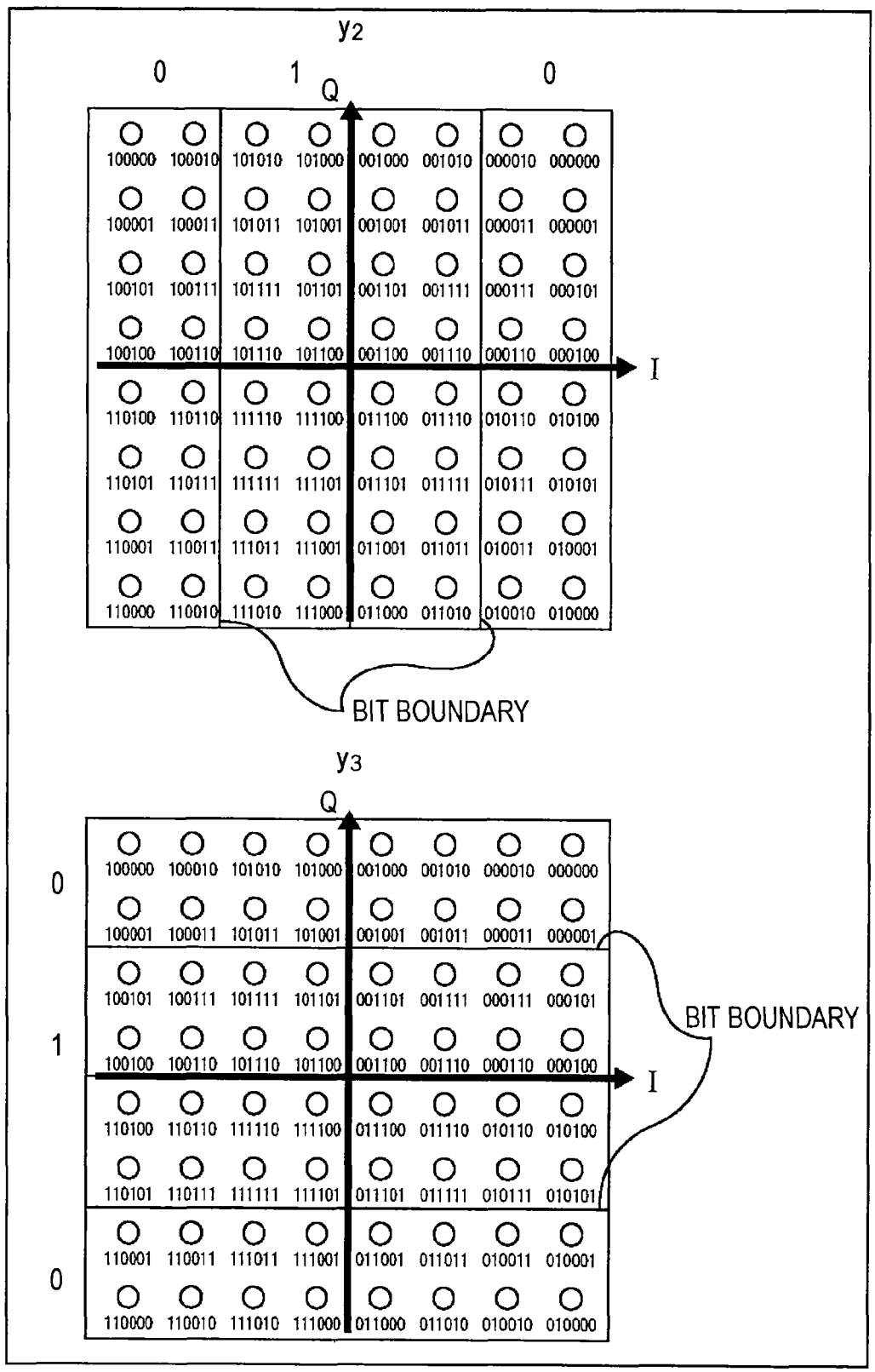
FIG. 16 is a diagram that illustrates the arrangement of signal points of 64 QAM.
Figure 17:
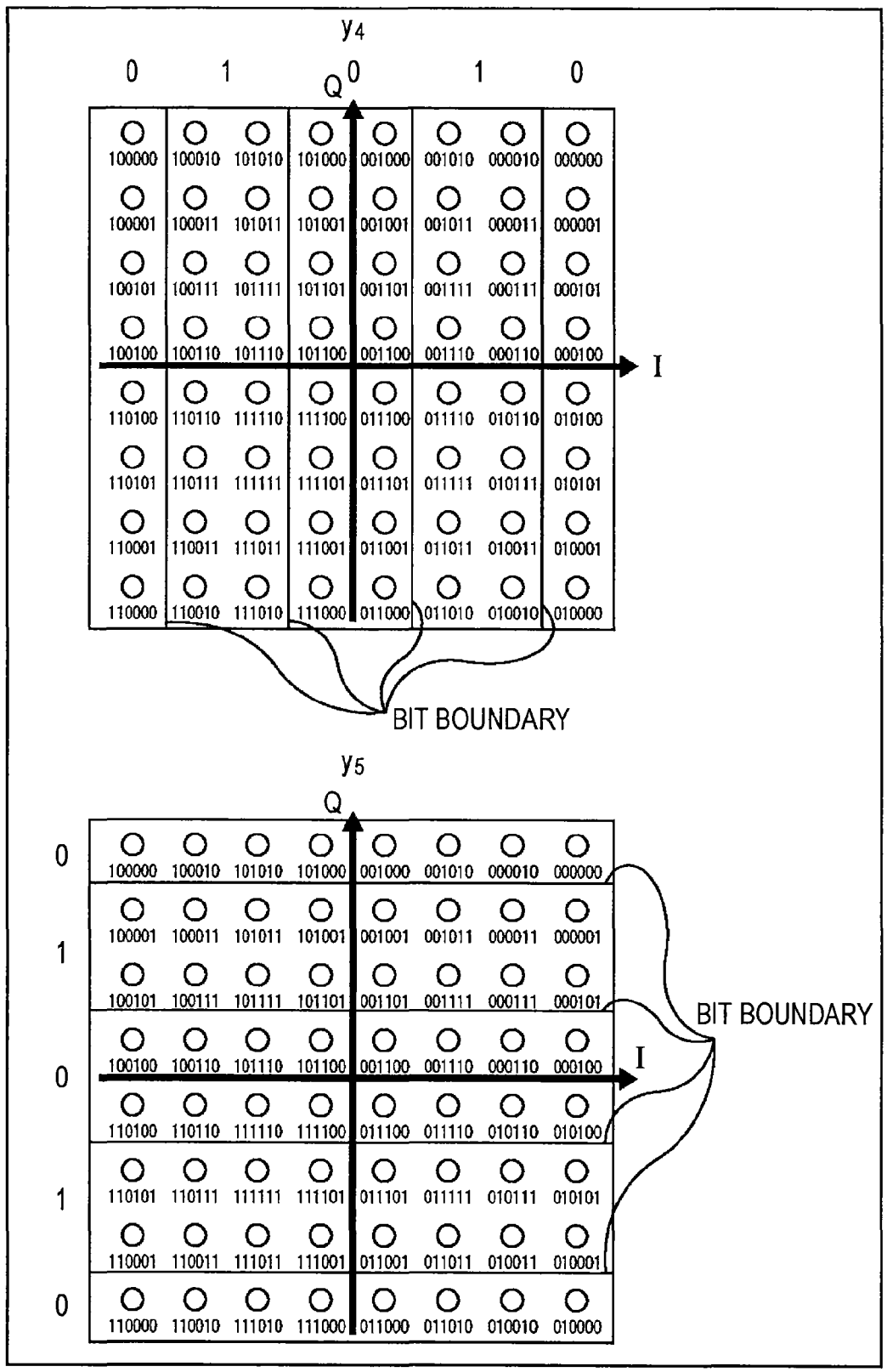
FIG. 17 is a diagram that illustrates the arrangement of signal points of 64 QAM.

FIGS. 15 to 17 illustrate the arrangements of 64 symbols (signal points corresponding thereto) on an IQ plane in a case where 64 QAM is performed by the QAM encoder 117 illustrated in FIG. 8, in other words, symbols of 16 QAM of DVB-T.2.

In the 64 QAM, one symbol is represented using six bits, and $64=(2^6)$ symbols are present. The 64 symbols are arranged with the origin point of the IQ plane set as the center thereof such that the I direction×the Q direction has a form of 8×8 squares.

Symbol bits of one symbol of the 64 QAM can be represented as bits $y_0$, $y_1$, $y_2$, $y_3$, $y_4$, and $y_5$ in order from the most significant bit. In a case where the modulation mode is the 64 QAM, 6 bits of the code bits of the LDPC code are formed as a symbol of 6 bits $y_0$ to $y_5$.

Here, FIG. 15 illustrates bit boundaries of the most significant symbol bit $y_0$ and the second symbol bit $y_1$ out of the symbol bits $y_0$ to $y_5$ of symbols of the 64 QAM, respectively, FIG. 16 illustrates bit boundaries of the third symbol bit $y_2$ and the fourth symbol bit $y_3$, respectively, and FIG. 17 illustrates bit boundaries of the fifth symbol bit $y_4$ and the sixth symbol bit $y_5$, respectively.

As illustrated in FIG. 15, for each one of the most significant symbol bit $y_0$ and the second symbol bit $y_1$, only one position forms a bit boundary, as illustrated in FIG. 16, for each one of the third symbol bit $y_2$ and the fourth symbol bit $y_3$, two positions form bit boundaries, and, as illustrated in FIG. 17, for each one of the fifth symbol bit $y_4$ and the sixth symbol bit $y_5$, four positions form bit boundaries.

Thus, out of symbol bits $y_0$ to $y_5$ of symbols of the 64 QAM, the most significant symbol bit $y_0$ and the second symbol bit $y_1$ are strong bits, and the third symbol bit $y_2$ and the fourth symbol bit $y_3$ are strong bits next thereto. In addition, the fifth symbol bit $y_4$ and the sixth symbol bit $y_5$ are weak bits.

Based on FIGS. 14 and 15 to 17, it can be understood that, out of symbol bits of symbols of orthogonal modulation, high-order bits tend to be strong bits, and low-order bits tend to be weak bits.

Here, as described with reference to FIGS. 12 and 13, out of LDPC codes output by the LDPC encoder 115 (FIG. 8), there are code bits that are strong for error and code bits that are weak for error.

In addition, as described with reference to FIGS. 14 to 17, out of symbol bits of symbols of the orthogonal modulation performed by the QAM encoder 117, there are strong bits and weak bits.

Thus, when the code bits of the LDPC code that are weak for error are allocated to weak symbol bits of symbols of the orthogonal modulation, the resistance to error decreases as a whole.

Thus, in a trend for allocating code bits of the LDPC code that are weak for error to strong bits (symbol bits) of symbols of the orthogonal modulation, an interleaver that interleaves code bits of the LDPC code is proposed.

The demultiplexer 25 illustrated in FIG. 9 can perform the process of the interleaver.

Figure 18:
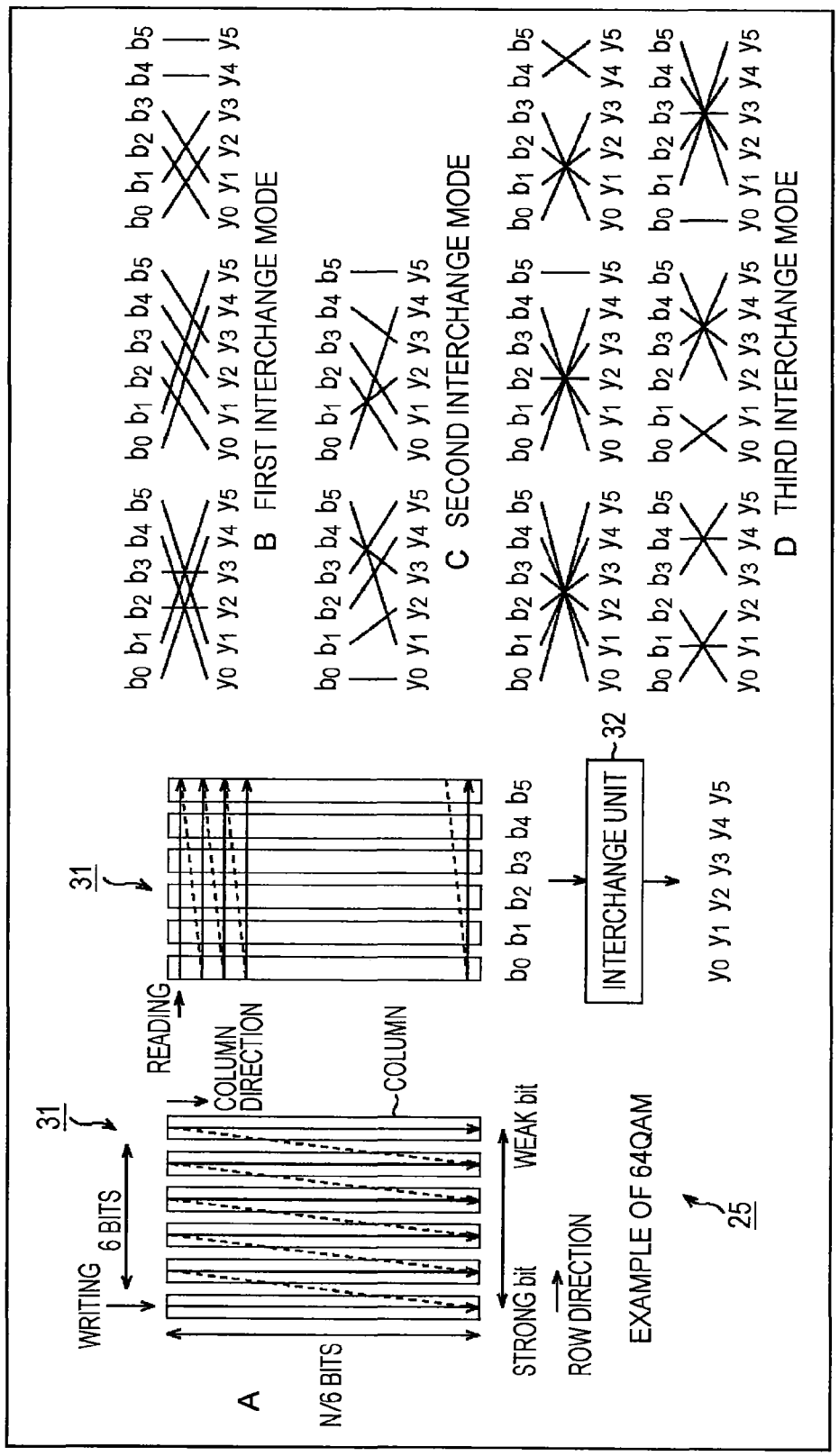
FIG. 18 is a diagram that illustrates the process of a demultiplexer 25.

FIG. 18 is a diagram that illustrates the process of the demultiplexer 25 illustrated in FIG. 9.

In other words, A of FIG. 18 illustrates a functional configuration example of the demultiplexer 25.

The demultiplexer 25 is configured by a memory 31 and an interchange unit 32.

An LDPC code is supplied to the memory 31 from the LDPC encoder 115.

The memory 31 has a memory capacity of mb bits in the row (horizontal) direction and N/(mb) bits in the column (vertical) direction, writes code bits of the LDPC code supplied thereto in the column direction, reads the code bits in the row direction, and supplies the code bits to the interchange unit 32.

Here, N (=information length K+parity length M), as described above, represents the code length of the LDPC code.

In addition, m represents the number of bits of code bits of the LDPC code that forms one symbol, and b is a predetermined positive integer and is a multiple used for integral multiplication of m. The demultiplexer 25, as described above, forms the code bits of the LDPC code as a symbol (symbolizes), and the multiple b represents the number of symbols acquired by one symbolization process of the demultiplexer 25 in a sense.

A of FIG. 18 represents a configuration example of the demultiplexer 25 in a case where the modulation mode is 64 QAM, and, accordingly, the number m of bits of the code bits of the LDPC code that forms one symbol is six bits.

In A of FIG. 18, the multiple b is one, and, accordingly, the memory 31 has a memory capacity of N/(6×1)×(6×1) bits in the column direction×the row direction.

Hereinafter, a memory area of the memory 31 that has one bit in the row direction and extends in the column direction will be referred to as a column as is appropriate. In A of FIG. 18, the memory 31 is configured by 6 (=6×1) columns.

In the demultiplexer 25, writing of the code bits of the LDPC code from the upper side of the columns configuring the memory 31 to the lower side (column direction) is performed from the left side toward the column located on the right side.

Then, when the writing of the code bits up to the bottommost part of the rightmost column is completed, code bits are read in units of six bits (mb bits) in the row direction from the first row of all the columns configuring the memory 31, and the code bits are supplied to the interchange unit 32.

The interchange unit 32 performs an interchange process in which the positions of 6-bit code bits supplied from the memory 31 are interchanged and outputs 6 bits acquired as a result thereof as 6 symbol bits $y_0$, $y_1$, $y_2$, $y_3$, $y_4$, and $y_5$ representing one symbol of the 64 QAM.

In other words, code bits of mb bits (here, 6 bits) are read from the memory 31 in the row direction, and, when an i-th bit (i=0, 1, ..., mb−1) from the most significant bit of the code bits of mb bits read from the memory 31 is represented as a bit $b_i$, the 6-bit code bits read from the memory 31 in the row direction can be represented as bits $b_0, b_1, b_2, b_3, b_4$, and $b_5$ in order from the most significant bit.

Based on the column weight described with reference to FIGS. 12 and 13, code bits located on the side of the bit $b_0$ are code bits that are strong for error, and code bits located on the side of the bit $b_5$ are code bits that are weak for error.

The interchange unit 32 can perform an interchange process in which the positions of the 6-bit code bits $b_0$ to $b_5$ supplied from the memory 31 are interchanged such that code bits that are weak for error out of the 6-bit code bits $b_0$ to $b_5$ supplied from the memory 31 are allocated to strong bits out of symbol bits $y_0$ to $y_5$ of one symbol of the 64 QAM.

Here, as interchange modes for interchanging the 6-bit code bits $b_0$ to $b_5$ supplied from the memory 31 and allocating the code bits to 6 symbol bits $y_0$ to $y_5$ representing one symbol of the 64 QAM, various modes are proposed by companies.

B of FIG. 18 illustrates a first interchange mode, C of FIG. 18 illustrates a second interchange mode, and D of FIG. 18 illustrates a third interchange mode.

In B to D of FIG. 18 (similar also in the case of FIG. 19 to be described later), a segment joining bits $b_i$ and $y_j$ represents the allocation of the code bit $b_i$ to the symbol bit $y_j$ of a symbol (interchange of the position of the code bit with the position of the symbol bit $y_j$).

As the first interchange mode illustrated in B of FIG. 18, a mode is proposed in which any one out of three types of interchange methods is employed, and, as the second interchange mode illustrated in C of FIG. 18, a mode is proposed in which any one out of two types of interchange methods is employed.

As the third interchange mode illustrated in D of FIG. 18, a mode is proposed in which six types of interchange methods are sequentially selected and used.

Figure 19:
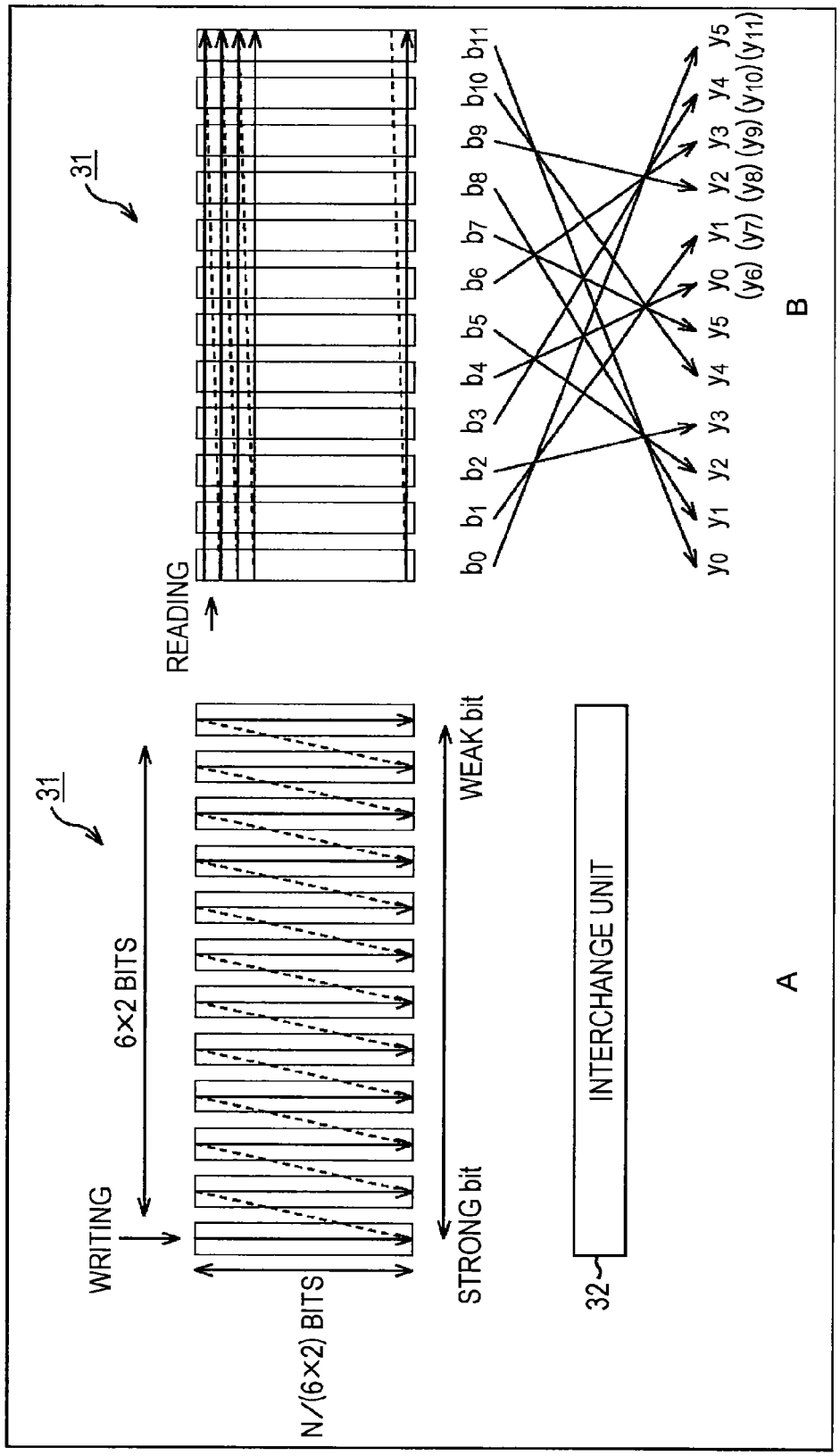
FIG. 19 is a diagram that illustrates the process of the demultiplexer 25.

FIG. 19 illustrates a configuration example of the demultiplexer 25 and a fourth interchange mode in a case where the modulation mode is the 64 QAM (accordingly, the number m of bits of the code bits of an LDPC code that are mapped into one symbol is, similarly to the case illustrated in FIG. 18, 6 bits) and the multiple b is 2.

In a case where the multiple b is 2, the memory 31 has a memory capacity of N/(6×2)×(6×2) bits in the column direction×the row direction and is configured by 12 (=6×2) columns.

A of FIG. 19 illustrates the sequence of writing an LDPC code into the memory 31.

In the demultiplexer 25, as described with reference to FIG. 18, writing of the code bits of the LDPC code from the upper side of the columns configuring the memory 31 to the lower side (column direction) is performed from the left side toward the column located on the right side.

Then, when the writing of the code bits up to the bottommost part of the rightmost column is completed, code bits are read in units of 12 bits (mb bits) in the row direction from the first row of all the columns configuring the memory 31, and the code bits are supplied to the interchange unit 32.

The interchange unit 32 performs an interchange process in which the positions of 12-bit code bits supplied from the memory 31 are interchanged in accordance with the fourth interchange mode and outputs 12 bits acquired as a result thereof as 12 bits representing two symbols (b symbols) of 64 QAM, in other words, 6 symbol bits $y_0, y_1, y_2, y_3, y_4$, and $y_5$ representing one symbol of the 64 QAM, and 6 symbol bits $y_0, y_1, y_2, y_3, y_4$, and $y_5$ representing the next one symbol.

Here, B of FIG. 19 illustrates the fourth interchange mode of the interchange process performed by the interchange unit 32 illustrated in A of FIG. 19.

In a case where the multiple b is 2 (similar even in a case where the multiple is three or more), in the interchange process, code bits of mb bits are allocated to mb-bit symbol bits of consecutive b symbols. Hereinafter, including a case illustrated in FIG. 19, for the convenience of description, an (i+1)-th bit of the mb-bit symbol bits of consecutive b symbols from the most significant bit will be represented as a bit (symbol bit) $y_i$.

In addition, an appropriate interchange method, in other words, whether or not an error rate in the AWGN communication channel is further improved is differently determined based on the coded rate and the code length of the LDPC code, the modulation mode, and the like.

[Parity Interleaving]

Next, parity interleaving performed by the parity interleaver 23 illustrated in FIG. 9 will be described with reference to FIGS. 20 to 22.

Figure 20:
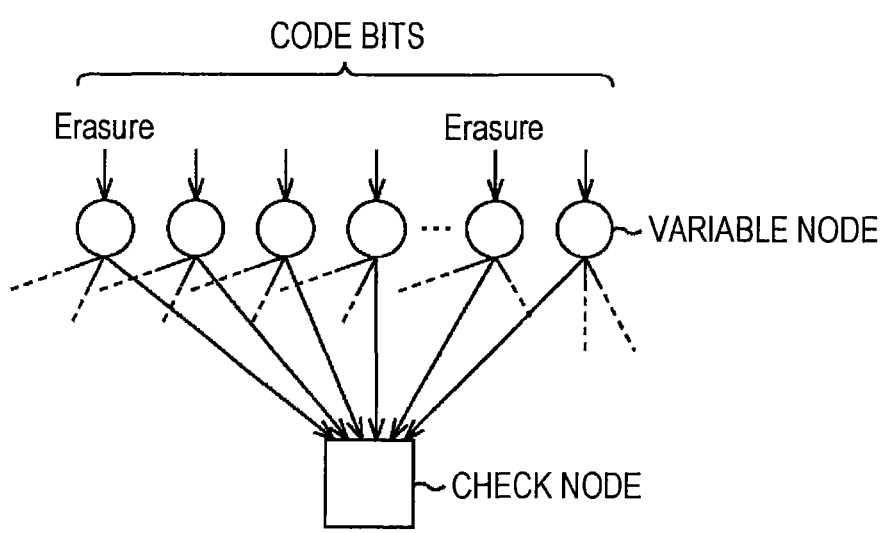
FIG. 20 is a diagram that illustrates a Tanner graph for decoding of an LDPC code.

FIG. 20 illustrates a Tanner graph (a part thereof) of a parity check matrix of an LDPC code.

As illustrated in FIG. 20, when a plurality of, for example, two variable nodes (code bits corresponding thereto) connected to a check node have errors such as being erased at the same time, the check node returns a message of an equal probability for a probability of a value of zero and a probability of a value of one to all the variable nodes connected to the check node. Accordingly, when a plurality of variable nodes connected to the same check node become erasures at the same time or the like, the decoding capability is degraded.

An LDPC code defined in the standard of DVB-T.2, which is output by the LDPC encoder 115 illustrated in FIG. 8, is an IRA code, and the parity matrix $H_T$ of the parity check matrix H, as illustrated in FIG. 11, has a staircase structure.

Figure 21:
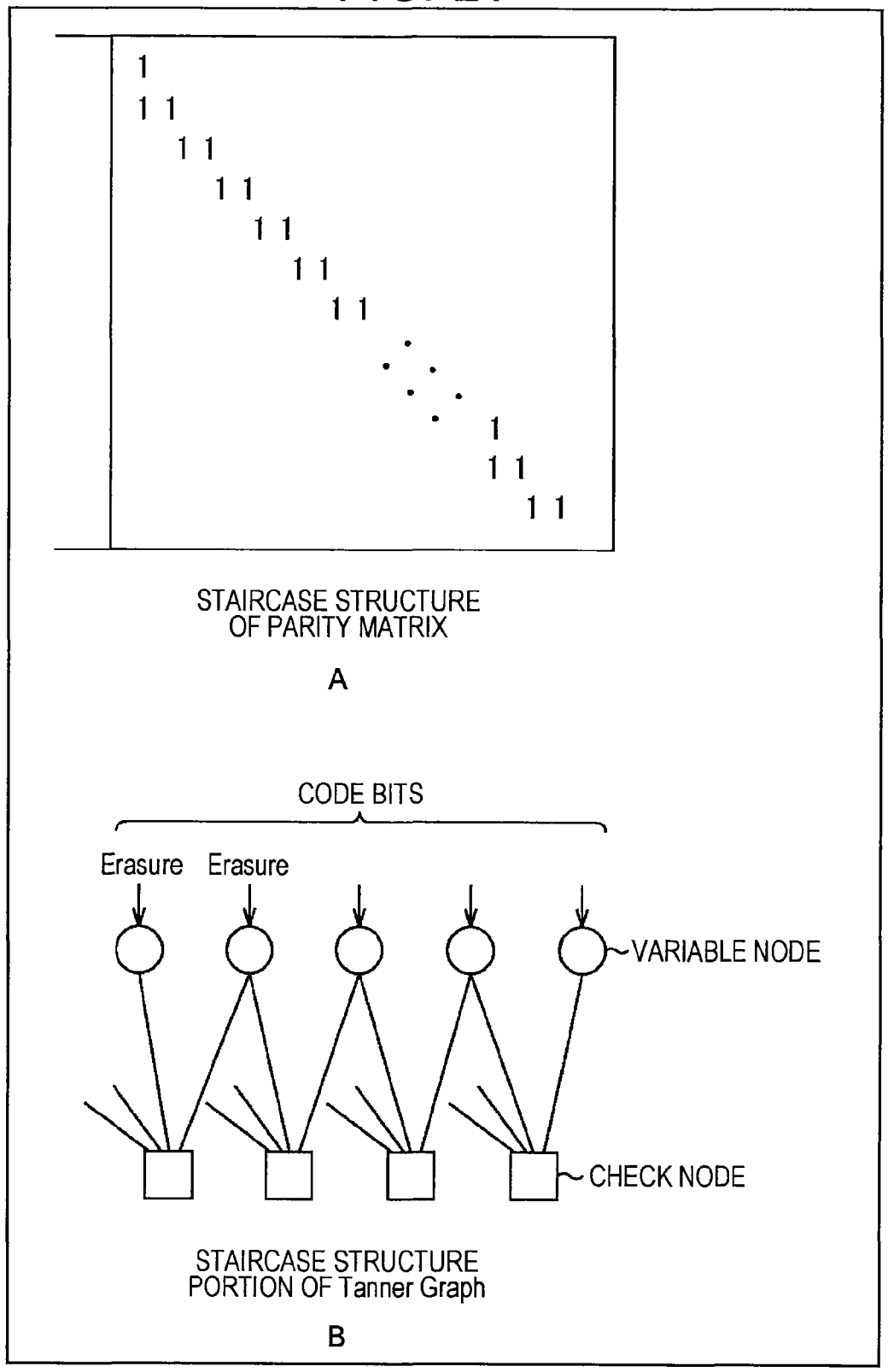
FIG. 21 represents diagrams that illustrate a parity matrix $H_T$ having a staircase structure and a Tanner graph corresponding to the parity matrix $H_T$.

FIG. 21 illustrates a parity matrix $H_T$ having a staircase structure and a Tanner graph corresponding to the parity matrix $H_T$.

In other words, A of FIG. 21 illustrates a parity matrix $H_T$ having a staircase structure, and B of FIG. 21 illustrates a Tanner graph corresponding to the parity matrix $H_T$ illustrated in A of FIG. 21.

In the parity matrix $H_T$ having the staircase structure, in each row, elements of 1's are adjacent to each other (except for the first row). Accordingly, in the Tanner graph of the parity matrix $H_T$, two variable nodes adjacent to each other that correspond to rows of two elements adjacent to each other of which the values of the parity matrix $H_T$ are 1's are connected to the same check node.

Thus, when parity bits corresponding to two variable nodes adjacent to each other described above have errors at the same time due to a burst error, erasure, and the like, the check node connected to two variable nodes (variable nodes acquiring messages using parity bits) corresponding to the two parity bits having errors returns a message of an equal probability for a probability of a value of 0 and a probability of a value of 1 to the variable nodes connected to the check node, and accordingly, the decoding capability is degraded. Then, when a burst length (the number of bits of the parity bits having consecutive errors) is large, the number of check nodes returning the messages of an equal probability increases, and the decoding capability is further degraded.

Thus, in order to prevent the degradation of the decoding capability described above, the parity interleaver 23 (FIG. 9) performs parity interleaving in which the parity bit of the LDPC code supplied from the LDPC encoder 115 is interleaved at the position of another parity bit.

Figure 22:
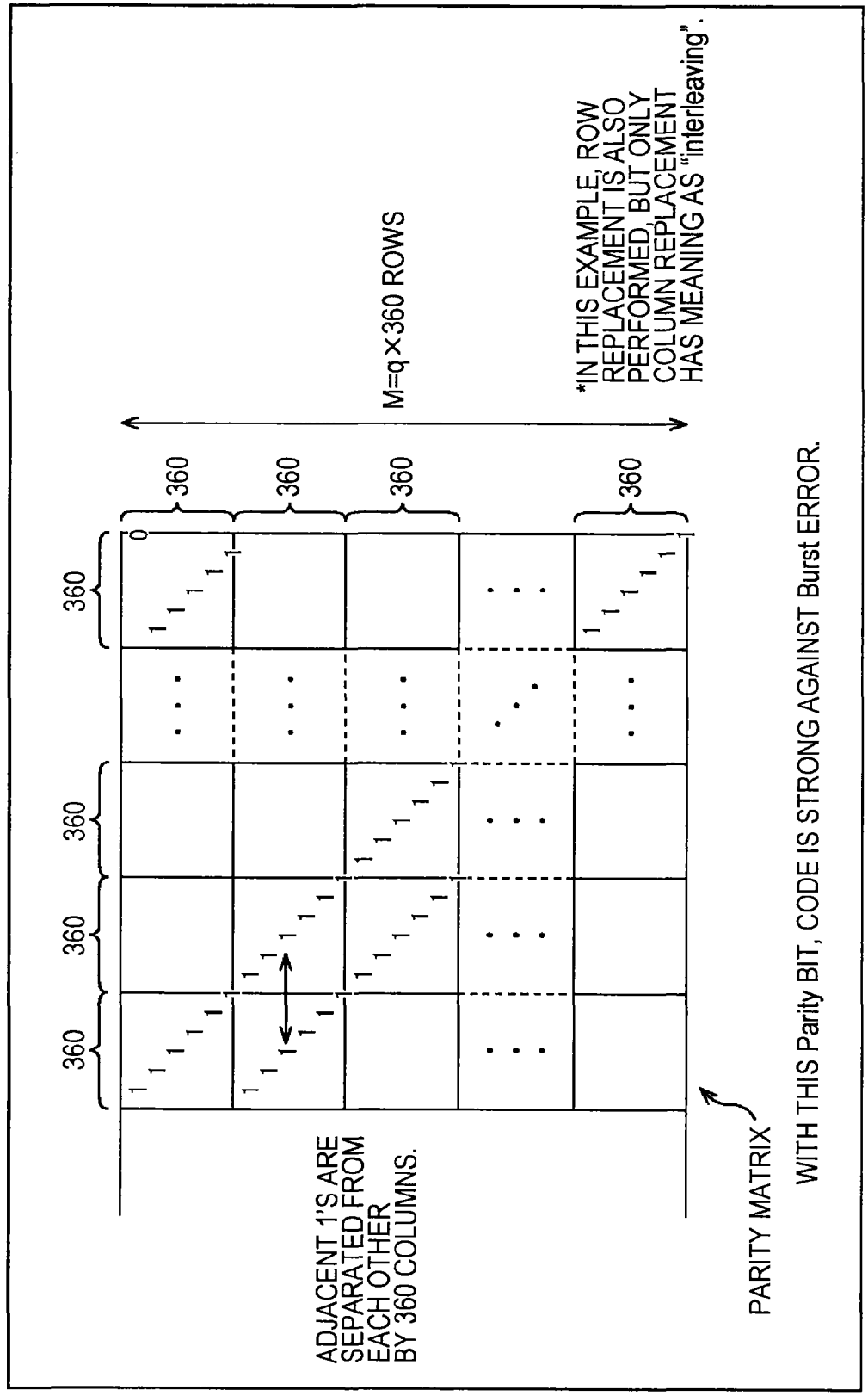
FIG. 22 is a diagram that illustrates the parity matrix $H_T$ of the parity check matrix H that corresponds to the LDPC code after parity interleaving.

FIG. 22 illustrates the parity matrix $H_T$ of the parity check matrix H that corresponds to the LDPC code after parity interleaving performed by the parity interleaver 23 illustrated in FIG. 9.

Here, the information matrix $H_A$ of the parity check matrix H that corresponds to the LDPC code defined in the standard of DVB-T.2, which is output by the LDPC encoder 115, has a cyclic structure.

The cyclic structure represents a structure in which a column coincides with another column when it is cyclic shifted, and, for example, also includes a structure in which, for every P columns, the position of "1" of each row of the P columns is a position acquired by cyclically shifting the first column of the P columns in the column direction by a value that is in proportion to a value q acquired by dividing the parity length M. Hereinafter, as is appropriate, the P columns in the cyclic structure are referred to as the number of unit columns of the cyclic structure.

As LDPC codes defined in the standard of DVB-T.2, as described with reference to FIGS. 12 and 13, there are two types of LDPC codes having code lengths N of 64800 bits and 16200 bits, and, for any one of the two types of the LDPC codes, the number P of unit columns of the cyclic structure is defined as 360 that is one of divisors except for "1" and M out of the divisors of the parity length M.

In addition, the parity length M is a value other than a prime number that is represented by Equation $M=q\times P=q\times 360$ using a value q that is different in accordance with the coded rate. Accordingly, the value q, similarly to the number P of unit columns of the cyclic structure, is one of divisors except for "1" and M out of the divisors of the parity length M and can be acquired by dividing the parity length M by the number P of unit columns of the cyclic structure (the product of P and q that are divisors of the parity length M becomes the parity length M).

As described above, when the information length is K, an integer that is equal to or more than zero and less than P is x, and an integer that is equal to or greater than zero and less than q is y, the parity interleaver 23 interleaves a (K+qx+y+1)-th code bit out of the code bits of an N-bit LDPC code at the position of a (K+Py+x+1)-th code bit as parity interleaving.

Since the (K+qx+y+1)-th code bit and the (K+Py+x+1)-th code bit are code bits after the (K+1)-th code bit, the code bits are parity bits, and accordingly, the positions of the parity bits of the LDPC code are moved according to the parity interleaving.

According to such parity interleaving, the number of variable nodes (parity bits corresponding thereto) connected to a same check node decreases by the number P of unit columns of the cyclic structure, that is, here, 360 bits, and accordingly, in a case where the burst length is less than 360 bits, a situation can be avoided in which a plurality of variable nodes connected to the same check node have errors at the same time, whereby the resistance to a burst error can be improved.

In addition, the LDPC code after parity interleaving in which the (K+qx+y+1)-th code bit is interleaved at the position of the (K+Py+x+1)-th code bit coincides with an LDPC code of a parity check matrix (hereinafter, also referred to as a transformed parity check matrix) acquired by column replacement in which the (K+qx+y+1)-th column of the original parity check matrix H is replaced with the (K+Py+x+1)-th column.

In the parity matrix of the transformed parity check matrix, as illustrated in FIG. 22, a pseudo cyclic structure in units of P columns (in FIG. 22, 360 columns) appears.

Here, the pseudo cyclic structure represents a structure in which a cyclic structure is formed except for a part thereof.

In the transformed parity check matrix acquired by performing column replacement corresponding to parity interleaving for the parity check matrix of an LDPC code defined in the standard of DVB-T.2, the number of elements of 1's is less than one (an element of 0 is present) in a portion (a shift matrix to be described later) of the 360-th row×360-th column of the right corner portion, and, in that point, not a (complete) cyclic structure but a pseudo cyclic structure in a sense is formed.

In addition, the transformed parity check matrix illustrated in FIG. 22 is a matrix acquired by performing for the original parity check matrix H not only column replacement corresponding to parity interleaving but also row replacement (row replacement) such that the transformed check parity matrix is configured as a constitutive matrix to be described later.

[Column Twist Interleaving]

Next, column twist interleaving as the sorting process performed by the column twist interleaver 24 illustrated in FIG. 9 will be described with reference to FIGS. 23 to 26.

The transmission device 11 illustrated in FIG. 8 transmits one or more bits of the code bits of the LDPC code as one symbol. In other words, for example, in a case where two bits of the code bits are configured as one symbol, for example, QPSK is used as the modulation mode, and, in a case where four bits of the code bits are configured as one symbol, for example, 16 QAM is used as the modulation mode.

In a case where two or more bits of the code bits are transmitted as one symbol, when an erasure or the like occurs in a symbol, all the code bits of the symbol have errors (erasures).

Accordingly, for improving the decoding capability, in order to decrease a probability of the occurrence of erasures at the same time in a plurality of variable nodes (code bits corresponding thereto) connected to the same check node, it is necessary to avoid a connection of variable nodes corresponding to code bits of one symbol to the same check node.

Meanwhile, as descried above, in the parity check matrix H of an LDPC code defined in the standard of DVB-T.2, which is output by the LDPC encoder 115, the information matrix $H_A$ has a cyclic structure, and the parity matrix $H_T$ has a staircase structure. As described with reference to FIG. 22, in the transformed parity check matrix that is a parity check matrix of an LDPC code after parity interleaving, a cyclic structure (more precisely, the pseudo cyclic structure as described above) appears also in the parity matrix.

Figure 23:
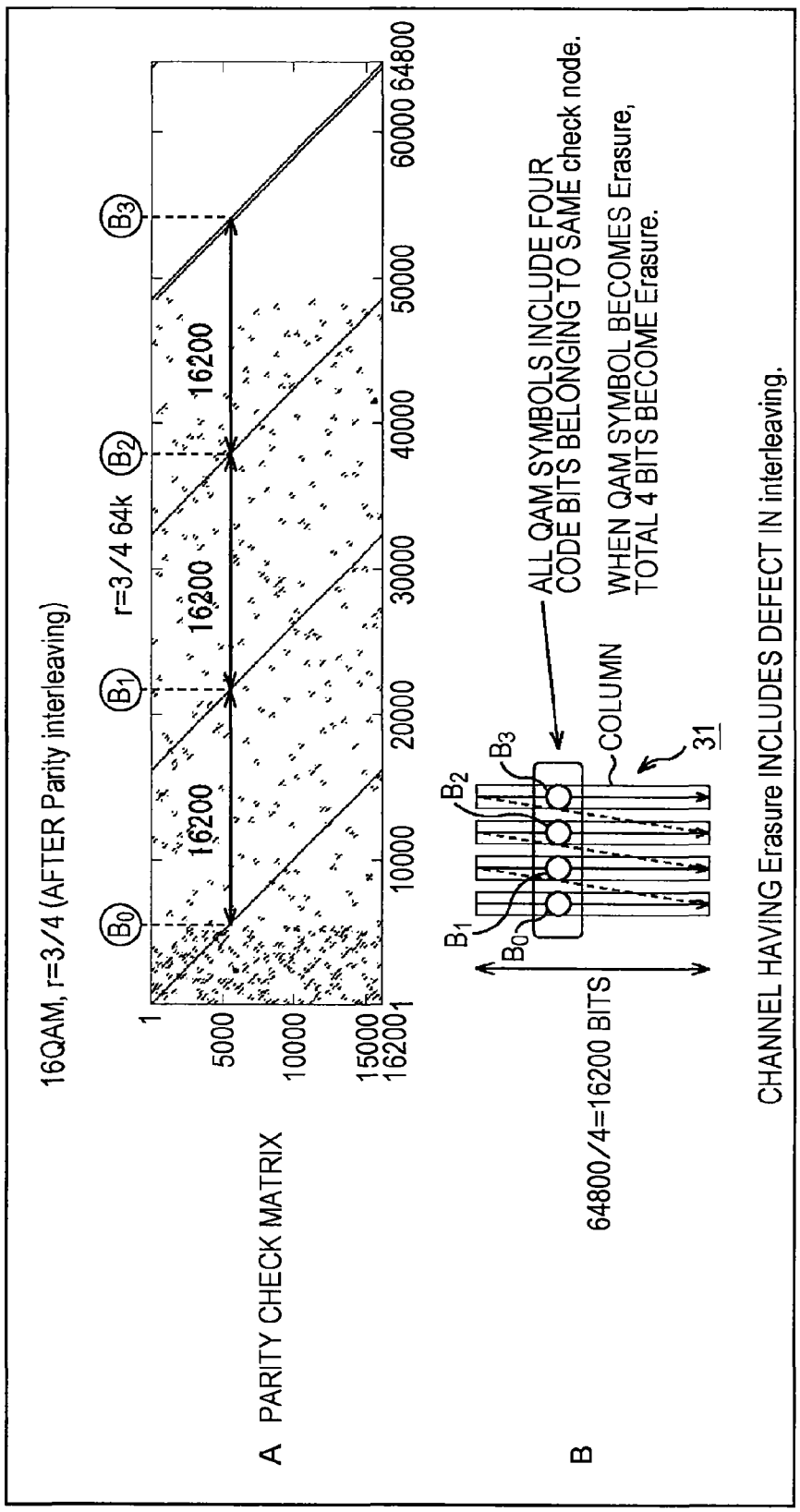
FIG. 23 is a diagram that illustrates a transformed parity check matrix.

FIG. 23 illustrates a transformed parity check matrix.

In other words, A of FIG. 23 illustrates a transformed parity check matrix of a parity check matrix H of an LDPC code having a code length N of 64800 bits and a coded rate (r) of ¾.

In A of FIG. 23, in the transformed parity check matrix, the position of an element having a value of 1 is represented as a point (•).

B of FIG. 23 illustrates a process performed by the demultiplexer 25 (FIG. 9) for an LDPC code of the transformed parity check matrix illustrated in A of FIG. 23, that is, an LDPC code after parity interleaving as a target.

In B of FIG. 23, code bits of the LDPC code after parity interleaving are written into four columns configuring the memory 31 of the demultiplexer 25 in the column direction by using the modulation mode as 16 QAM.

The code bits written into the four columns configuring the memory 31 in the column direction are read in units of four bits in the row direction so as to form one symbol.

In this case, the code bits $B_0$, $B_1$, $B_2$, and $B_3$ of four bits forming one symbol may be code bits corresponding to 1's present in an arbitrary one row of the transformed parity check matrix of A illustrated in FIG. 23, and, in such a case, variable nodes corresponding to the code bits $B_0$, $B_1$, $B_2$, and $B_3$ are connected to a same check node.

Accordingly, in a case where the code bits $B_0$, $B_1$, $B_2$, and $B_3$ of four bits forming one symbol are code bits corresponding to 1's present in an arbitrary one row of the transformed parity check matrix, when an erasure occurs in the symbol, an appropriate message cannot be acquired in the same check node to which the variable nodes corresponding to the code bits $B_0$, $B_1$, $B_2$, and $B_3$ are connected, whereby the decoding capability is degraded.

Also for a coded rate other than the coded rate of ¾, similarly, a plurality of code bits corresponding to a plurality of variable nodes connected to a same check node may be formed as one symbol of the 16 QAM.

Thus, the column twist interleaver 24 performs column twist interleaving in which code bits of the LDPC code after parity interleaving, which are supplied from the parity interleaver 23, are interleaved such that a plurality of code bits corresponding to 1's present in an arbitrary one row of the transformed parity check matrix are not included in one symbol.

Figure 24:
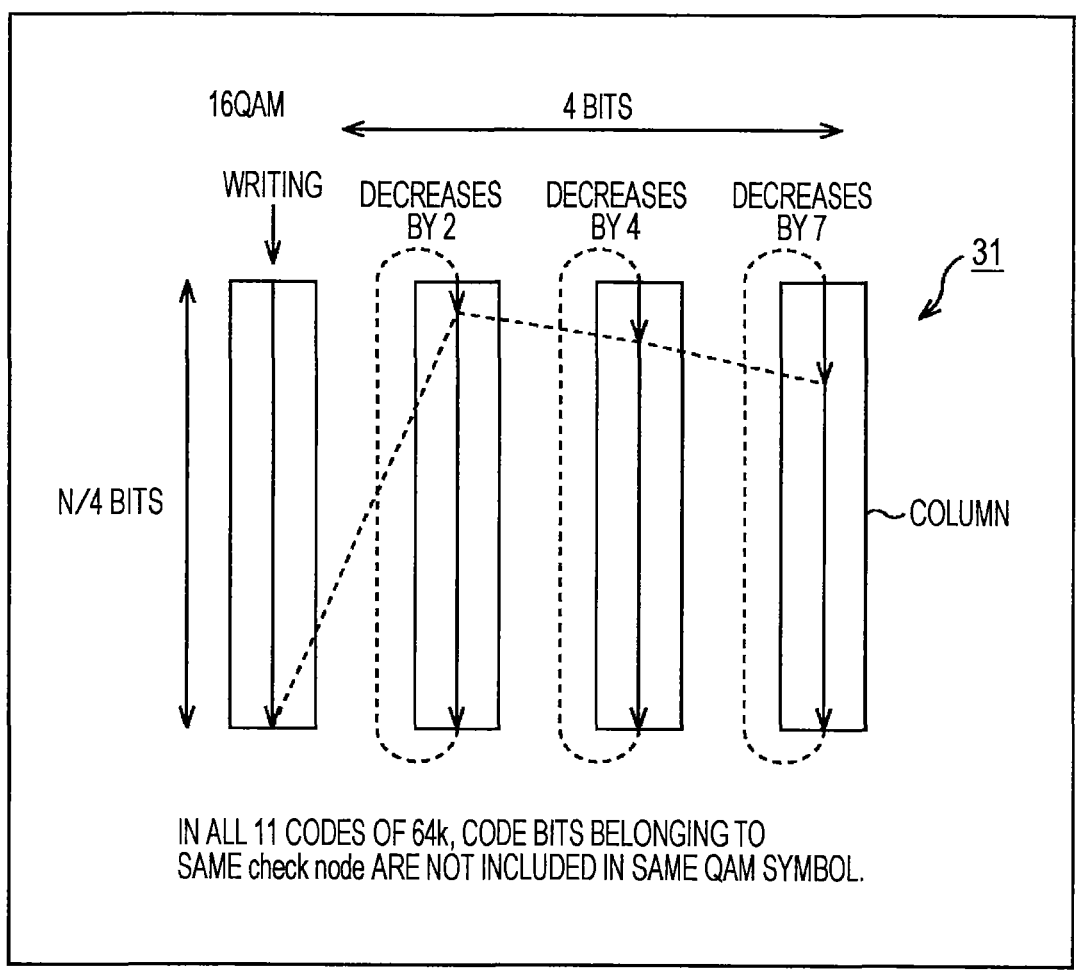
FIG. 24 is a diagram that illustrates the process of a column twist interleaver 24.

FIG. 24 is a diagram that illustrates the column twist interleaving.

In other words, FIG. 24 illustrates the memory 31 (FIGS. 18 and 19) of the demultiplexer 25.

The memory 31, as illustrated in FIG. 18, has a memory capacity of storing mb bits in the column (vertical) direction and N/(mb) bits in the row (horizontal) direction and is configured by mb columns. Then, the column twist interleaver 24 writes code bits of the LDPC code into the memory 31 in the column direction and controls the write starting position at the time of reading in the row direction, whereby performing the column twist interleaving.

In other words, the column twist interleaver 24 appropriately changes the write starting position from which writing of a code bit is started for each one of a plurality of columns, thereby configuring a plurality of code bits forming one symbol, which are read in the row direction, not to be code bits corresponding to 1's present in an arbitrary one row of the transformed parity check matrix (the code bits of the LDPC code are sorted such that a plurality of code bits corresponding to 1's present in an arbitrary one row of the parity check matrix are not included in the same symbol).

Here, FIG. 24 illustrates a configuration example of the memory 31 in a case where the modulation mode is 16 QAM, and the multiple b described with reference to FIG. 18 is 1. Accordingly, the number m of bits of the code bits of an LDPC code that form one symbol is four bits, and the memory 31 is configured by four (=mb) columns.

The column twist interleaver 24 (instead of the demultiplexer 25 illustrated in FIG. 18) performs writing of the code bits of the LDPC code from the upper side of the four columns configuring the memory 31 to the lower side (column direction) from the left side toward the column located on the right side.

Then, when the writing of the code bits up to the rightmost column is completed, the column twist interleaver 24 reads code bits in units of four bits (mb bits) in the row direction from the first row of all the columns configuring the memory 31 and outputs the code bits as an LDPC code after the column twist interleaving to the interchange unit 32 (FIGS. 18 and 19) of the demultiplexer 25.

However, when the address of the position of the lead (uppermost) of each column is 0, and the address of each position in the column direction is represented as an integer in the ascending order, in the column twist interleaver 24, the write starting position is set to a position of address 0 for the leftmost column, the write starting position is set to a position of address 2 for the second column (from the left side), the write starting position is set to a position of address 4 for the third column, and the write starting position is set to a position of address 7 for the fourth column.

For each column having the write starting position other than the position of address 0, after the code bit is written up to the lowermost position, the writing position is returned to the lead (the position of address 0), and writing is performed up to a position immediately prior to the write starting position. Thereafter, writing for the next column (the right side) is performed.

By performing the column twist interleaving as above, for an LDPC code defined in the standard of DVB-T.2, it can be avoided that a plurality of code bits corresponding to a plurality of variable nodes connected to the same check node form one symbol (are included in the same symbol) of 16 QAM, whereby the decoding capability in a communication channel having an erasure can be improved.

FIG. 25 illustrates the number of columns of the memory 31 necessary for column twist interleaving and the addresses of the write starting positions thereof for each modulation mode for LDPC codes, which are defined in the standard of DVB-T.2, having a code length N of 64800 and 11 coded rates.

By employing a multiple b of 1 and employing, for example, QPSK as the modulation mode, in a case where the number m of bits of one symbol is two bits, as illustrated in FIG. 25, the memory 31 has two columns storing 2×1 (=mb) bits in the row direction and stores 64800/(2×1) bits in the column direction.

Out of the two columns of the memory 31, the write starting position of a first column is the position of address 0, and the write starting position of a second column is the position of address 2.

For example, in a case where one of the first to third interchange modes illustrated in FIG. 18 is employed as the interchange mode of the interchange process performed by the demultiplexer 25 (FIG. 9) or the like, the multiple b is 1.

By employing a multiple b of 2 and employing, for example, QPSK as the modulation mode, in a case where the number m of bits of one symbol is two bits, as illustrated in FIG. 25, the memory 31 has four columns storing 2×2 bits in the row direction and stores 64800/(2×2) bits in the column direction.

Out of the four columns of the memory 31, the write starting position of a first column is the position of address 0, the write starting position of a second column is the position of address 2, the write starting position of a third column is the position of address 4, and the write starting position of a fourth column is the position of address 7.

For example, in a case where the fourth interchange mode illustrated in FIG. 19 is employed as the interchange mode of the interchange process performed by the demultiplexer 25 (FIG. 9) or the like, the multiple b is 2.

By employing a multiple b of 1 and employing, for example, 16 QAM as the modulation mode, in a case where the number m of bits of one symbol is four bits, as illustrated in FIG. 25, the memory 31 has four columns storing 4×1 bits in the row direction and stores 64800/(4×1) bits in the column direction.

Out of the four columns of the memory 31, the write starting position of a first column is the position of address 0, the write starting position of a second column is the position of address 2, the write starting position of a third column is the position of address 4, and the write starting position of a fourth column is the position of address 7.

By employing a multiple b of 2 and employing, for example, 16 QAM as the modulation mode, in a case where the number m of bits of one symbol is four bits, as illustrated in FIG. 25, the memory 31 has eight columns storing 4×2 bits in the row direction and stores 64800/(4×2) bits in the column direction.

Out of the eight columns of the memory 31, the write starting position of a first column is the position of address 0, the write starting position of a second column is the position of address 0, the write starting position of a third column is the position of address 2, the write starting position of a fourth column is the position of address 4, the write starting position of a fifth column is the position of address 4, the write starting position of a sixth column is the position of address 5, the write starting position of a seventh column is the position of address 7, and the write starting position of an eighth column is the position of address 7.

By employing a multiple b of 1 and employing, for example, 64 QAM as the modulation mode, in a case where the number m of bits of one symbol is six bits, as illustrated in FIG. 25, the memory 31 has six columns storing 6×1 bits in the row direction and stores 64800/(6×1) bits in the column direction.

Out of the six columns of the memory 31, the write starting position of a first column is the position of address 0, the write starting position of a second column is the position of address 2, the write starting position of a third column is the position of address 5, the write starting position of a fourth column is the position of address 9, the write starting position of a fifth column is the position of address 10, and the write starting position of a sixth column is the position of address 13.

By employing a multiple b of 2 and employing, for example, 64 QAM as the modulation mode, in a case where the number m of bits of one symbol is six bits, as illustrated in FIG. 25, the memory 31 has 12 columns storing 6×2 bits in the row direction and stores 64800/(6×2) bits in the column direction.

Out of the twelve columns of the memory 31, the write starting position of a first column is the position of address 0, the write starting position of a second column is the position of address 0, the write starting position of a third column is the position of address 2, the write starting position of a fourth column is the position of address 2, the write starting position of a fifth column is the position of address 3, the write starting position of a sixth column is the position of address 4, the write starting position of a seventh column is the position of address 4, the write starting position of an eighth column is the position of address 5, the write starting position of a ninth column is the position of address 5, the write starting position of a tenth column is the position of address 7, the write starting position of an eleventh column is the position of address 8, and the write starting position of a twelfth column is the position of address 9.

By employing a multiple b of 1 and employing, for example, 256 QAM as the modulation mode, in a case where the number m of bits of one symbol is eight bits, as illustrated in FIG. 25, the memory 31 has 8 columns storing 8×1 bits in the row direction and stores 64800/(8×1) bits in the column direction.

Out of the eight columns of the memory 31, the write starting position of a first column is the position of address 0, the write starting position of a second column is the position of address 0, the write starting position of a third column is the position of address 2, the write starting position of a fourth column is the position of address 4, the write starting position of a fifth column is the position of address 4, the write starting position of a sixth column is the position of address 5, the write starting position of a seventh column is the position of address 7, and the write starting position of an eighth column is the position of address 7.

By employing a multiple b of 2 and employing, for example, 256 QAM as the modulation mode, in a case where the number m of bits of one symbol is eight bits, as illustrated in FIG. 25, the memory 31 has 16 columns storing 8×2 bits in the row direction and stores 64800/(8×2) bits in the column direction.

Out of the sixteen columns of the memory 31, the write starting position of a first column is the position of address 0, the write starting position of a second column is the position of address 2, the write starting position of a third column is the position of address 2, the write starting position of a fourth column is the position of address 2, the write starting position of a fifth column is the position of address 2, the write starting position of a sixth column is the position of address 3, the write starting position of a seventh column is the position of address 7, the write starting position of an eighth column is the position of address 15, the write starting position of a ninth column is the position of address 16, the write starting position of a tenth column is the position of address 20, the write starting position of an eleventh column is the position of address 22, the write starting position of a twelfth column is the position of address 22, the write starting position of a thirteenth column is the position of address 27, the write starting position of a fourteenth column is the position of address 27, the write starting position of a fifteenth column is the position of address 28, and the write starting position of a sixteenth column is the position of address 32.

By employing a multiple b of 1 and employing, for example, 1024 QAM as the modulation mode, in a case where the number m of bits of one symbol is ten bits, as illustrated in FIG. 25, the memory 31 has ten columns storing 10×1 bits in the row direction and stores 64800/(10×1) bits in the column direction.

Out of the ten columns of the memory 31, the write starting position of a first column is the position of address 0, the write starting position of a second column is the position of address 3, the write starting position of a third column is the position of address 6, the write starting position of a fourth column is the position of address 8, the write starting position of a fifth column is the position of address 11, the write starting position of a sixth column is the position of address 13, the write starting position of a seventh column is the position of address 15, the write starting position of an eighth column is the position of address 17, the write starting position of a ninth column is the position of address 18, and the write starting position of a tenth column is the position of address 20.

By employing a multiple b of 2 and employing, for example, 1024 QAM as the modulation mode, in a case where the number m of bits of one symbol is ten bits, as illustrated in FIG. 25, the memory 31 has 20 columns storing 10×2 bits in the row direction and stores 64800/(10×2) bits in the column direction.

Out of the 20 columns of the memory 31, the write starting position of a first column is the position of address 0, the write starting position of a second column is the position of address 1, the write starting position of a third column is the position of address 3, the write starting position of a fourth column is the position of address 4, the write starting position of a fifth column is the position of address 5, the write starting position of a sixth column is the position of address 6, the write starting position of a seventh column is the position of address 6, the write starting position of an eighth column is the position of address 9, the write starting position of a ninth column is the position of address 13, the write starting position of a tenth column is the position of address 14, the write starting position of an eleventh column is the position of address 14, the write starting position of a twelfth column is the position of address 16, the write starting position of a thirteenth column is the position of address 21, the write starting position of a fourteenth column is the position of address 21, the write starting position of a fifteenth column is the position of address 23, the write starting position of a sixteenth column is the position of address 25, the write starting position of a seventeenth column is the position of address 25, the write starting position of an eighteenth column is the position of address 26, the write starting position of a nineteenth column is the position of address 28, and the write starting position of a twentieth column is the position of address 30.

By employing a multiple b of 1 and employing, for example, 4096 QAM as the modulation mode, in a case where the number m of bits of one symbol is 12 bits, as illustrated in FIG. 25, the memory 31 has 12 columns storing 12×1 bits in the row direction and stores 64800/(12×1) bits in the column direction.

Out of the 12 columns of the memory 31, the write starting position of a first column is the position of address 0, the write starting position of a second column is the position of address 0, the write starting position of a third column is the position of address 2, the write starting position of a fourth column is the position of address 2, the write starting position of a fifth column is the position of address 3, the write starting position of a sixth column is the position of address 4, the write starting position of a seventh column is the position of address 4, the write starting position of an eighth column is the position of address 5, the write starting position of a ninth column is the position of address 5, the write starting position of a tenth column is the position of address 7, the write starting position of an eleventh column is the position of address 8, and the write starting position of a twelfth column is the position of address 9.

By employing a multiple b of 2 and employing, for example, 4096 QAM as the modulation mode, in a case where the number m of bits of one symbol is 12 bits, as illustrated in FIG. 25, the memory 31 has 24 columns storing 12×2 bits in the row direction and stores 64800/(12×2) bits in the column direction.

Out of the 24 columns of the memory 31, the write starting position of a first column is the position of address 0, the write starting position of a second column is the position of address 5, the write starting position of a third column is the position of address 8, the write starting position of a fourth column is the position of address 8, the write starting position of a fifth column is the position of address 8, the write starting position of a sixth column is the position of address 8, the write starting position of a seventh column is the position of address 10, the write starting position of an eighth column is the position of address 10, the write starting position of a ninth column is the position of address 10, the write starting position of a tenth column is the position of address 12, the write starting position of an eleventh column is the position of address 13, the write starting position of a twelfth column is the position of address 16, the write starting position of a thirteenth column is the position of address 17, the write starting position of a fourteenth column is the position of address 19, the write starting position of a fifteenth column is the position of address 21, the write starting position of a sixteenth column is the position of address 22, the write starting position of a seventeenth column is the position of address 23, the write starting position of an eighteenth column is the position of address 26, the write starting position of a nineteenth column is the position of address 37, the write starting position of a twentieth column is the position of address 39, the write starting position of a 21st column is the position of address 40, the write starting position of a 22nd column is the position of address 41, the write starting position of a 23rd column is the position of address 41, and the write starting position of a 24th column is the position of address 41.

FIG. 26 illustrates the number of columns of the memory 31 necessary for column twist interleaving and the addresses of the write starting positions thereof for each modulation mode for LDPC codes, which are defined in the standard of DVB-T.2, having a code length N of 16200 and 10 coded rates.

By employing a multiple b of 1 and employing, for example, QPSK as the modulation mode, in a case where the number m of bits of one symbol is two bits, as illustrated in FIG. 26, the memory 31 has two columns storing 2×1 bits in the row direction and stores 16200/(2×1) bits in the column direction.

Out of the two columns of the memory 31, the write starting position of a first column is the position of address 0, and the write starting position of a second column is the position of address 0.

By employing a multiple b of 2 and employing, for example, QPSK as the modulation mode, in a case where the number m of bits of one symbol is two bits, as illustrated in FIG. 26, the memory 31 has four columns storing 2×2 bits in the row direction and stores 16200/(2×2) bits in the column direction.

Out of the four columns of the memory 31, the write starting position of a first column is the position of address 0, the write starting position of a second column is the position of address 2, the write starting position of a third column is the position of address 3, and the write starting position of a fourth column is the position of address 3.

By employing a multiple b of 1 and employing, for example, 16 QAM as the modulation mode, in a case where the number m of bits of one symbol is four bits, as illustrated in FIG. 26, the memory 31 has four columns storing 4×1 bits in the row direction and stores 16200/(4×1) bits in the column direction.

Out of the four columns of the memory 31, the write starting position of a first column is the position of address 0, the write starting position of a second column is the position of address 2, the write starting position of a third column is the position of address 3, and the write starting position of a fourth column is the position of address 3.

By employing a multiple b of 2 and employing, for example, 16 QAM as the modulation mode, in a case where the number m of bits of one symbol is four bits, as illustrated in FIG. 26, the memory 31 has eight columns storing 4×2 bits in the row direction and stores 16200/(4×2) bits in the column direction.

Out of the eight columns of the memory 31, the write starting position of a first column is the position of address 0, the write starting position of a second column is the position of address 0, the write starting position of a third column is the position of address 0, the write starting position of a fourth column is the position of address 1, the write starting position of a fifth column is the position of address 7, the write starting position of a sixth column is the position of address 20, the write starting position of a seventh column is the position of address 20, and the write starting position of an eighth column is the position of address 21.

By employing a multiple b of 1 and employing, for example, 64 QAM as the modulation mode, in a case where the number m of bits of one symbol is six bits, as illustrated in FIG. 26, the memory 31 has six columns storing 6×1 bits in the row direction and stores 16200/(6×1) bits in the column direction.

Out of the six columns of the memory 31, the write starting position of a first column is the position of address 0, the write starting position of a second column is the position of address 0, the write starting position of a third column is the position of address 2, the write starting position of a fourth column is the position of address 3, the write starting position of a fifth column is the position of address 7, and the write starting position of a sixth column is the position of address 7.

By employing a multiple b of 2 and employing, for example, 64 QAM as the modulation mode, in a case where the number m of bits of one symbol is six bits, as illustrated in FIG. 26, the memory 31 has 12 columns storing 6×2 bits in the row direction and stores 16200/(6×2) bits in the column direction.

Out of the twelve columns of the memory 31, the write starting position of a first column is the position of address 0, the write starting position of a second column is the position of address 0, the write starting position of a third column is the position of address 0, the write starting position of a fourth column is the position of address 2, the write starting position of a fifth column is the position of address 2, the write starting position of a sixth column is the position of address 2, the write starting position of a seventh column is the position of address 3, the write starting position of an eighth column is the position of address 3, the write starting position of a ninth column is the position of address 3, the write starting position of a tenth column is the position of address 6, the write starting position of an eleventh column is the position of address 7, and the write starting position of a twelfth column is the position of address 7.

By employing a multiple b of 1 and employing, for example, 256 QAM as the modulation mode, in a case where the number m of bits of one symbol is eight bits, as illustrated in FIG. 26, the memory 31 has 8 columns storing 8×1 bits in the row direction and stores 16200/(8×1) bits in the column direction.

Out of the eight columns of the memory 31, the write starting position of a first column is the position of address 0, the write starting position of a second column is the position of address 0, the write starting position of a third column is the position of address 0, the write starting position of a fourth column is the position of address 1, the write starting position of a fifth column is the position of address 7, the write starting position of a sixth column is the position of address 20, the write starting position of a seventh column is the position of address 20 and the write starting position of an eighth column is the position of address 21.

By employing a multiple b of 1 and employing, for example, 1024 QAM as the modulation mode, in a case where the number m of bits of one symbol is ten bits, as illustrated in FIG. 26, the memory 31 has ten columns storing 10×1 bits in the row direction and stores 16200/(10×1) bits in the column direction.

Out of the ten columns of the memory 31, the write starting position of a first column is the position of address 0, the write starting position of a second column is the position of address 1, the write starting position of a third column is the position of address 2, the write starting position of a fourth column is the position of address 2, the write starting position of a fifth column is the position of address 3, the write starting position of a sixth column is the position of address 3, the write starting position of a seventh column is the position of address 4, the write starting position of an eighth column is the position of address 4, the write starting position of a ninth column is the position of address 5, and the write starting position of a tenth column is the position of address 7.

By employing a multiple b of 2 and employing, for example, 1024 QAM as the modulation mode, in a case where the number m of bits of one symbol is ten bits, as illustrated in FIG. 26, the memory 31 has 20 columns storing 10×2 bits in the row direction and stores 16200/(10×2) bits in the column direction.

Out of the 20 columns of the memory 31, the write starting position of a first column is the position of address 0, the write starting position of a second column is the position of address 0, the write starting position of a third column is the position of address 0, the write starting position of a fourth column is the position of address 2, the write starting position of a fifth column is the position of address 2, the write starting position of a sixth column is the position of address 2, the write starting position of a seventh column is the position of address 2, the write starting position of an eighth column is the position of address 2, the write starting position of a ninth column is the position of address 5, the write starting position of a tenth column is the position of address 5, the write starting position of an eleventh column is the position of address 5, the write starting position of a twelfth column is the position of address 5, the write starting position of a thirteenth column is the position of address 5, the write starting position of a fourteenth column is the position of address 7, the write starting position of a fifteenth column is the position of address 7, the write starting position of a sixteenth column is the position of address 7, the write starting position of a seventeenth column is the position of address 7, the write starting position of an eighteenth column is the position of address 8, the write starting position of a nineteenth column is the position of address 8, and the write starting position of a twentieth column is the position of address 10.

By employing a multiple b of 1 and employing, for example, 4096 QAM as the modulation mode, in a case where the number m of bits of one symbol is 12 bits, as illustrated in FIG. 26, the memory 31 has 12 columns storing 12×1 bits in the row direction and stores 16200/(12×1) bits in the column direction.

Out of the 12 columns of the memory 31, the write starting position of a first column is the position of address 0, the write starting position of a second column is the position of address 0, the write starting position of a third column is the position of address 0, the write starting position of a fourth column is the position of address 0, the write starting position of a fifth column is the position of address 2, the write starting position of a sixth column is the position of address 2, the write starting position of a seventh column is the position of address 3, the write starting position of an eighth column is the position of address 3, the write starting position of a ninth column is the position of address 3, the write starting position of a tenth column is the position of address 6, the write starting position of an eleventh column is the position of address 7, and the write starting position of a twelfth column is the position of address 7.

By employing a multiple b of 2 and employing, for example, 4096 QAM as the modulation mode, in a case where the number m of bits of one symbol is 12 bits, as illustrated in FIG. 26, the memory 31 has 24 columns storing 12×2 bits in the row direction and stores 16200/(12×2) bits in the column direction.

Out of the 24 columns of the memory 31, the write starting position of a first column is the position of address 0, the write starting position of a second column is the position of address 0, the write starting position of a third column is the position of address 0, the write starting position of a fourth column is the position of address 0, the write starting position of a fifth column is the position of address 0, the write starting position of a sixth column is the position of address 0, the write starting position of a seventh column is the position of address 0, the write starting position of an eighth column is the position of address 1, the write starting position of a ninth column is the position of address 1, the write starting position of a tenth column is the position of address 1, the write starting position of an eleventh column is the position of address 2, the write starting position of a twelfth column is the position of address 2, the write starting position of a thirteenth column is the position of address 2, the write starting position of a fourteenth column is the position of address 3, the write starting position of a fifteenth column is the position of address 7, the write starting position of a sixteenth column is the position of address 9, the write starting position of a seventeenth column is the position of address 9, the write starting position of an eighteenth column is the position of address 9, the write starting position of a nineteenth column is the position of address 10, the write starting position of a twentieth column is the position of address 10, the write starting position of a 21st column is the position of address 10, the write starting position of a 22nd column is the position of address 10, the write starting position of a 23rd column is the position of address 10, and the write starting position of a 24th column is the position of address 11.

Figure 27:
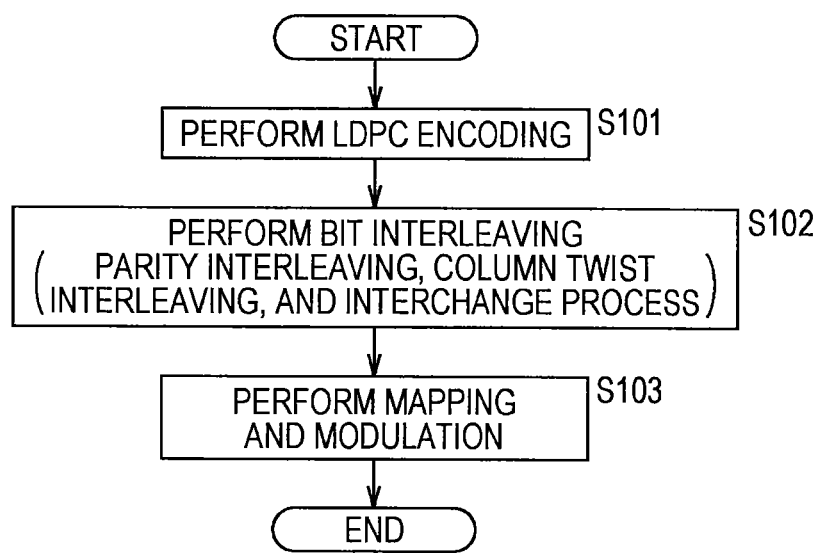
FIG. 27 is a flowchart that illustrates the process performed by the bit interleaver 116 and a QAM encoder 117.

FIG. 27 is a flowchart that illustrates the process performed by the LDPC encoder 115, the bit interleaver 116, and the QAM encoder 117 illustrated in FIG. 8.

The LDPC encoder 115 waits for the supply of an LDPC target data from the BCH encoder 114, in Step S101, encodes the LDPC target data in an LDPC code, supplies the LDPC code to the bit interleaver 116, and the process proceeds to Step S102.

The bit interleaver 116, in Step S102, performs bit interleaving for the LDPC code supplied from the LDPC encoder 115 as a target, supplies a symbol acquired by symbolizing the LDPC code after the bit interleaving to the QAM encoder 117, and the process proceeds to Step S103.

In other words, in Step S102, in the bit interleaver 116 (FIG. 9), the parity interleaver 23 performs parity interleaving for the LDPC code supplied from the LDPC encoder 115 as a target and supplies the LDPC code after the parity interleaving to the column twist interleaver 24.

The column twist interleaver 24 performs column twist interleaving for the LDPC code supplied from the parity interleaver 23 as a target and supplies the interleaved LDPC code to the demultiplexer 25.

The demultiplexer 25 interchanges the code bits of the LDPC code after the column twist interleaving performed by the column twist interleaver 24 and performs an interchange process in which the code bits after the interchange are set as symbol bits (bits representing a symbol) of a symbol.

Here, the interchange process performed by the demultiplexer 25 can be performed in accordance with not only the first to fourth interchange modes illustrated in FIGS. 18 and 19 but also an allocation rule. The allocation rule is a rule used for allocating the code bits of an LDPC code to symbol bits representing a symbol and will be described later in detail.

The symbol acquired by the interchange process performed by the demultiplexer 25 is supplied from the demultiplexer 25 to the QAM encoder 117.

The QAM encoder 117, in Step S103, maps the symbol supplied from the demultiplexer 25 into a signal point determined in the modulation mode of orthogonal modulation performed by the QAM encoder 117 so as to be orthogonally modulated and supplies data acquired as a result thereof to the time interleaver 118.

By performing the parity interleaving and column twist interleaving as above, the resistance to an erasure or a burst error in a case where a plurality of code bits of an LDPC code is transmitted as one symbol can be improved.

Here, in FIG. 9, for the convenience of description, although the parity interleaver 23 that is a block performing the parity interleaving and the column twist interleaver 24 that is a block performing the column twist interleaving are separately configured, the parity interleaver 23 and the column twist interleaver 24 may be integrally configured.

In other words, both the parity interleaving and the column twist interleaving can be performed by writing and reading a code bits into/from a memory and can be represented by a matrix transforming an address (write address) for writing a code bit into an address (read address) for reading a code bit.

Accordingly, when a matrix acquired by multiplying a matrix representing the parity interleaving and a matrix representing the column twist interleaving is acquired, by transforming a code bit using the matrix, the parity interleaving is performed, and a result of the column twist interleaving of an LDPC code after the parity interleaving can be acquired.

Furthermore, in addition to the parity interleaver 23 and the column twist interleaver 24, the demultiplexer 25 may be integrally configured.

In other words, the interchange process performed by the demultiplexer 25 also can be represented by a matrix transforming a write address of the memory 31 storing an LDPC code into a read address.

Accordingly, a matrix that is acquired by multiplying a matrix representing the parity interleaving, a matrix representing the column twist interleaving, and a matrix representing the interchange process together is acquired, the parity interleaving, the column twist interleaving, and the interchange process can be performed together using the matrix.

In addition, any one of the parity interleaving and the column twist interleaving may be performed or both thereof may not be performed.

Next, a simulation for measuring an error rate (bit error rate) performed for the transmission device 11 illustrated in FIG. 8 will be described with reference to FIGS. 28 to 30.

The simulation is performed by employing a communication channel that has a flutter having a D/U of 0 dB.

FIG. 28 illustrates a model of a communication channel employed in the simulation.

In other words, A of FIG. 28 illustrates a model of a flutter employed in the simulation.

In addition, B of FIG. 28 illustrates a model of a communication channel having a flutter represented by the model illustrated in A of FIG. 28.

In B of FIG. 28, H illustrates a model of the flutter illustrated in A of FIG. 28. In B of FIG. 28, N represents ICI (Inter Carrier Interference), and an expected value $E[N^2]$ of the power is approximated in the AWGN by simulation.

Figure 29:
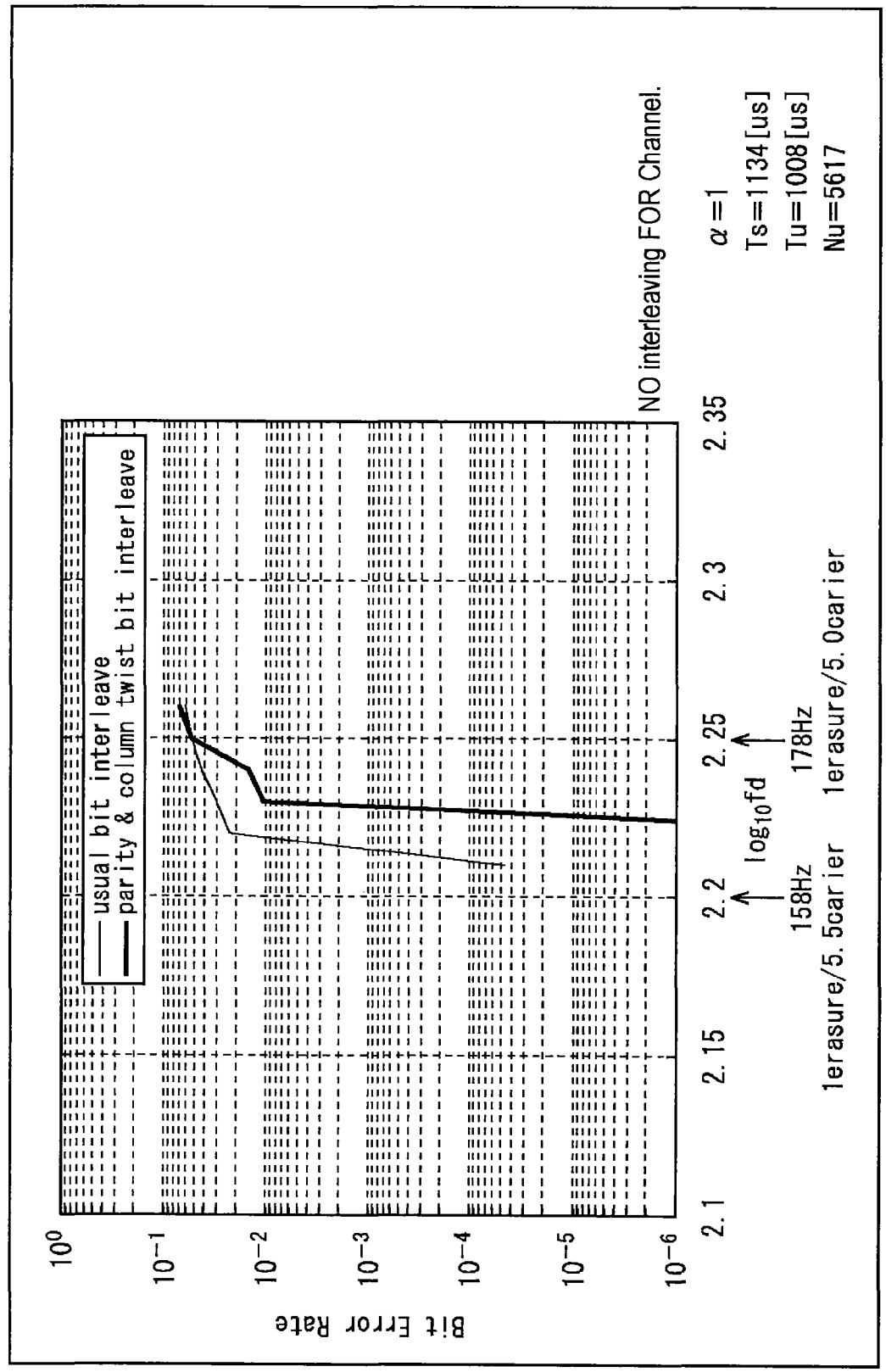
FIG. 29 is a diagram that illustrates the relation between an error rate and a Doppler frequency $f_d$ of a flutter that is acquired through a simulation.
Figure 30:
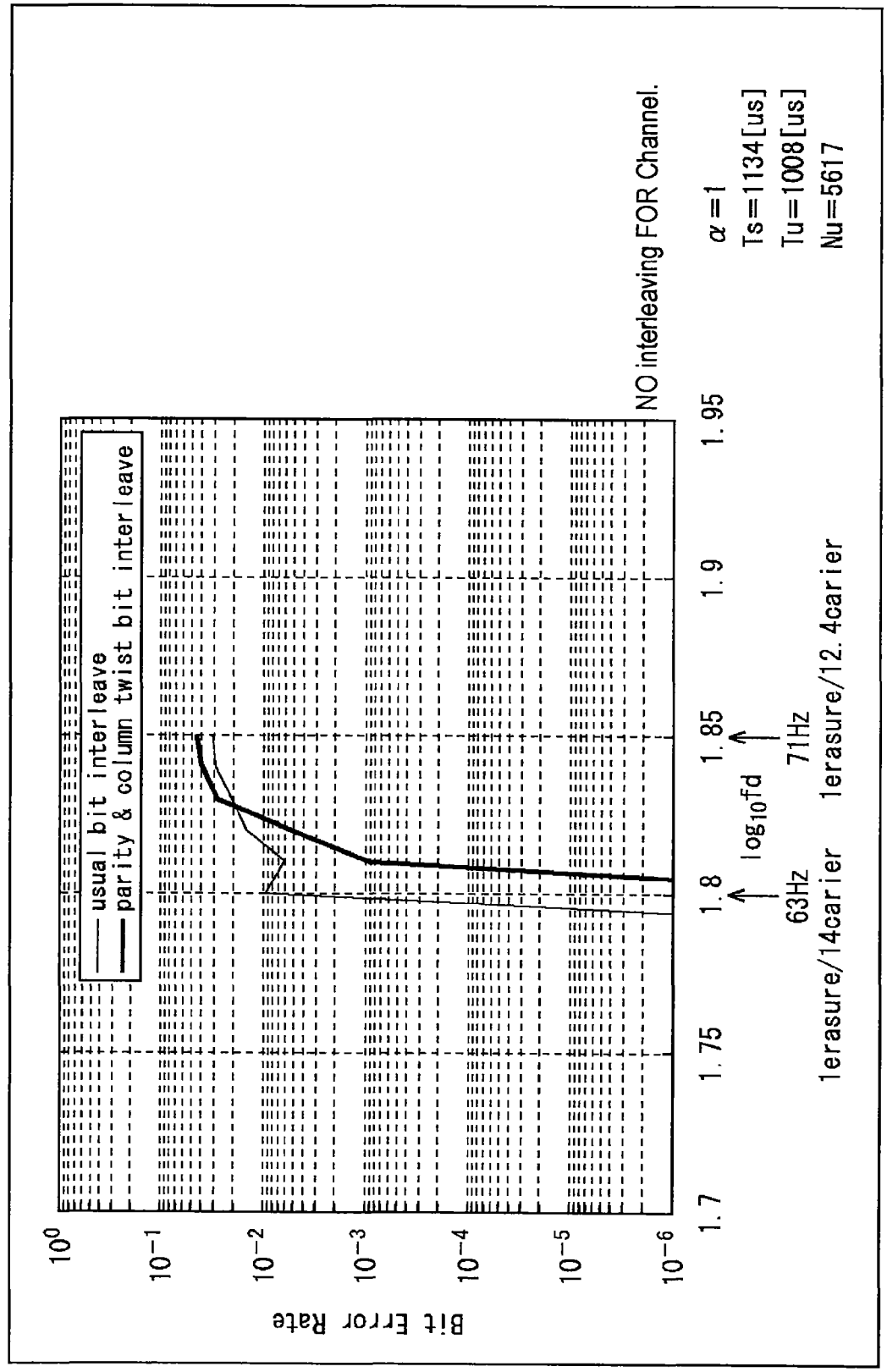
FIG. 30 is a diagram that illustrates the relation between an error rate and a Doppler frequency $f_d$ of a flutter that is acquired through a simulation.

FIGS. 29 and 30 illustrate the relation between an error rate and a Doppler frequency $f_d$ of a flutter that is acquired through a simulation.

FIG. 29 illustrates the relation between an error rate and a Doppler frequency $f_d$ in a case where the modulation mode is 16 QAM, the coded rate (r) is (¾), and the interchange mode is the first interchange mode. FIG. 30 illustrates the relation between an error rate and a Doppler frequency $f_d$ in a case where the modulation mode is 64 QAM, the coded rate (r) is (⅚), and the interchange mode is the first interchange mode.

In addition, in FIGS. 29 and 30, a thick line represents the relation between an error rate and a Doppler frequency $f_d$ in a case where all the parity interleaving, the column twist interleaving, and the interchange process are performed, and a thin line represents the relation between an error rate and a Doppler frequency $f_d$ in a case where only the interchange process out of the parity interleaving, the column twist interleaving, and the interchange process is performed.

In any one of FIGS. 29 and 30, it can be understood that the error rate is improved (decreases) in the case where all the parity interleaving, the column twist interleaving, and the interchange process are performed than in the case where only the interchange process is performed.

Configuration Example of LDPC Encoder 115

Figure 31:
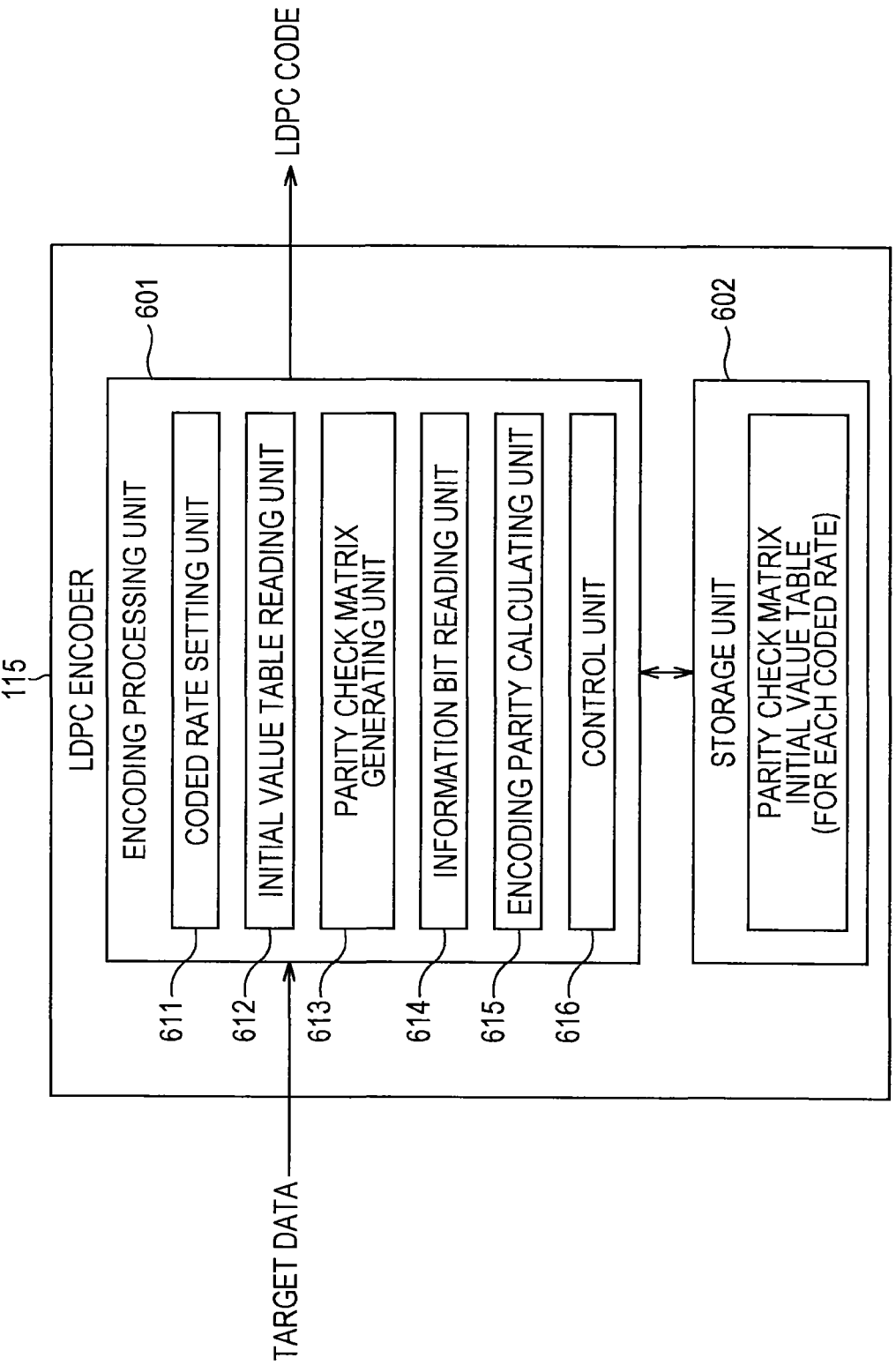
FIG. 31 is a block diagram that illustrates a configuration example of an LDPC encoder 115.

FIG. 31 is a block diagram that illustrates a configuration example of the LDPC encoder 115 illustrated in FIG. 8.

In addition, the LDPC encoder 122 illustrated in FIG. 8 is similarly configured.

As illustrated with reference to FIGS. 12 and 13, in the standard of DVB-T.2, LDPC codes having two kinds of code lengths N including 64800 bits and 16200 bits are defined.

For the LDPC code having a code length N of 64800 bits, 11 coded rates of 1/4, 1/3, 2/5, 1/2, 3/5, 2/3, 3/4, 4/5, 5/6, 8/9, and 9/10 are defined, and, for the LDPC code having a code length N of 16200 bits, 10 coded rates of 1/4, 1/3, 2/5, 1/2, 3/5, 2/3, 3/4, 4/5, 5/6, and 8/9 are defined (FIGS. 12 and 13).

The LDPC encoder 115, for example, can perform encoding (error correction coding) according to the LDPC codes, which have the code lengths N of 64800 bits and 16200 bits, of each coded rate in accordance with a parity check matrix H prepared for each code length N and each coded rate.

The LDPC encoder 115 is configured by an encoding processing unit 601 and a storage unit 602.

The encoding processing unit 601 is configured by an coded rate setting unit 611, an initial value table reading unit 612, a parity check matrix generating unit 613, an information bit reading unit 614, an encoding parity calculating unit 615, and a control unit 616, performs LDPC encoding of LDPC target data supplied to the LDPC encoder 115, and supplies an LDPC code acquired as a result thereof to the bit interleaver 116 (FIG. 8).

In other words, the coded rate setting unit 611, for example, sets a code length N and a coded rate of the LDPC code in accordance with an operator's operation or the like.

The initial value table reading unit 612 reads a parity check matrix initial value table, which will be described later, corresponding to the code length N and the coded rate set by the coded rate setting unit 611 from the storage unit 602.

The parity check matrix generating unit 613 generates a parity check matrix H by arranging elements of 1's of the information matrix $H_A$ corresponding to the information length K (=code length N−parity length M) according to the code length N and the coded rate set by the coded rate setting unit 611 in the column direction at the period of 360 columns (the number P of unit columns of the cyclic stricture) based on the parity check matrix initial value table read by the initial value table reading unit 612 and stores the generated parity check matrix in the storage unit 602.

The information bit reading unit 614 reads (extracts) information bits corresponding to the information length K from the LDPC target data supplied from the LDPC encoder 115.

The encoding parity calculating unit 615 reads the parity check matrix H generated by the parity check matrix generating unit 613 from the storage unit 602 and calculates a parity bit for the information bits read by the information bit reading unit 614 based on a predetermined equation using the parity check matrix H, thereby generating a code word (LDPC codes).

The control unit 616 controls each block that configures the encoding processing unit 601.

In the storage unit 602, a plurality of parity check matrix initial value tables corresponding to a plurality of coded rates illustrated in FIGS. 12 and 13 and the like, for example, for code lengths N of 64800 bits and 16200 bits are stored. In addition, the storage unit 602 temporarily stores data necessary for the process of the encoding processing unit 601.

Figures 32, 33:
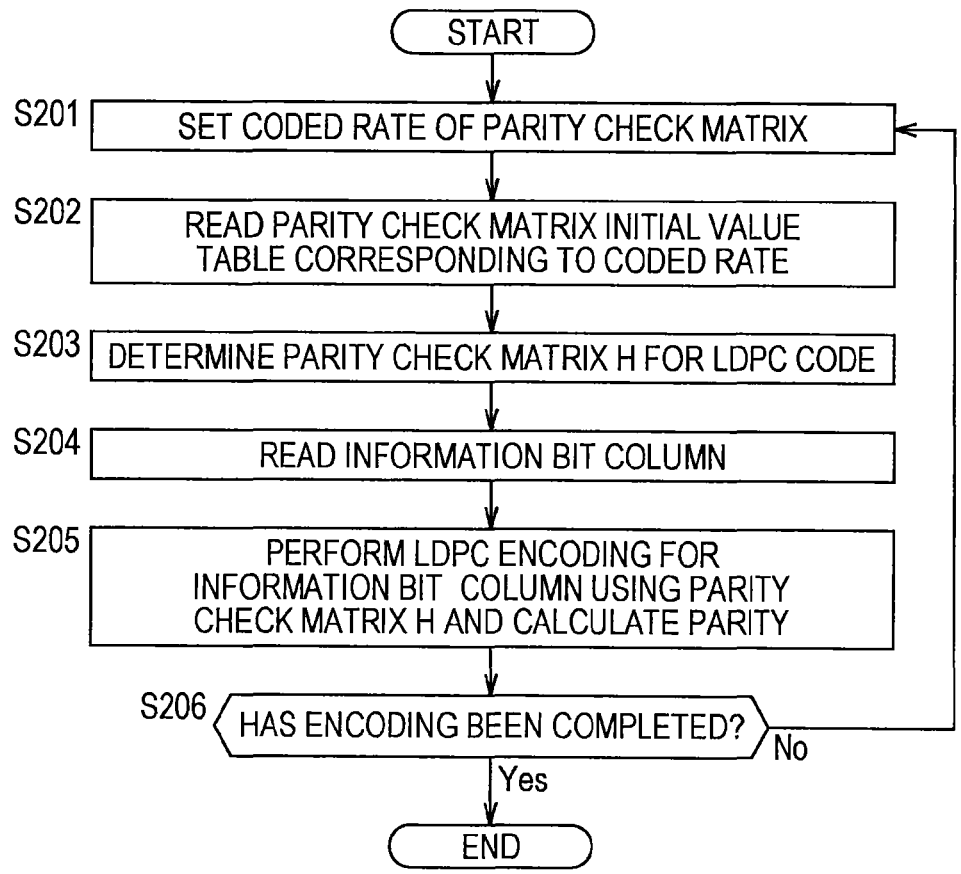
FIG. 32 is a flowchart that illustrates the process of the LDPC encoder 115.
FIG. 33 is a diagram that illustrates an example of an initial value table of a parity check matrix having a coded rate of ¼ and a code length of 16200.

FIG. 32 is a flowchart that illustrates the process of the LDPC encoder 115 illustrated in FIG. 31.

In Step S201, the coded rate setting unit 611 determines (sets) a code length N and a coded rate r for performing LDPC encoding.

In Step S202, the initial value table reading unit 612 reads a parity check matrix initial value table, which is set in advance, corresponding to the code length N and the coded rate r determined by the coded rate setting unit 611 from the storage unit 602.

In Step S203, the parity check matrix generating unit 613 acquires (generates) a parity check matrix H of an LDPC code having the code length N and the coded rate r determined by the coded rate setting unit 611 by using the parity check matrix initial value table read from the storage unit 602 by the initial value table reading unit 612 and stores the parity check matrix in the storage unit 602 by supplying the parity check matrix thereto.

In Step S204, the information bit reading unit 614 reads information bits of an information length K (=N×r) corresponding to the code length N and the coded rate r determined by the coded rate setting unit 611 from the LDPC target data supplied from the LDPC encoder 115 and reads the parity check matrix H acquired by the parity check matrix generating unit 613 from the storage unit 602 and supplies the information bits and the parity check matrix to the encoding parity calculating unit 615.

In Step S205, the encoding parity calculating unit 615 sequentially calculates parity bits of the code word c satisfying Equation (8).

$$Hc^T = 0 \qquad \text{Equation (8)}$$

In Equation (8), c represents a row vector as a code word (LDPC code), and $c^T$ represents the transposition of the row vector c.

Here, as described above, in a case where, in the row vector c as the LDPC code (one code word), the part of information bits is represented by a row vector A, and the part of parity bits is represented by a row vector T, the row vector c can be represented by Equation c=[A|T] using the row vector A as the information bits and the row vector T as the parity bits.

The parity check matrix H and the row vector c=[A|T] as an LDPC code need to satisfy Equation $Hc^T=0$, and the row vector T as parity bits configuring the row vector c=[A|T] satisfying Equation $Hc^T=0$ can be sequentially acquired by setting the elements of each row to zero in order from the elements of the first row of the column vector $Hc^T$ included in Equation $Hc^T=0$ in a case where the parity matrix $H_T$ of the parity check matrix $H=[H_A|H_T]$ has the staircase structure illustrated in FIG. 11.

When the parity bits T for the information bits A are acquired, the encoding parity calculating unit 615 outputs a code word c=[A|T] represented by using the information bits A and the parity bits T as a result of the LDPC encoding of the information bits A.

Thereafter, in Step S206, the control unit 616 determines whether or not the LDPC encoding ends. In a case where the LDPC encoding is determined not to end in Step S206, in other words, for example, in a case where there is still LDPC target data for which the LDPC encoding is to be performed, the process is returned to Step S201 (or Step S204), and then, the process of Step S201 (or Step S204) to Step S206 is repeated.

On the other hand, in a case where the LDPC encoding is determined to end in Step S206, in other words, for example, in a case where there is no LDPC target data for which the LDPC encoding is to be performed, the LDPC encoder 115 ends the process.

As above, the parity check matrix initial value table corresponding to each code length N and each coded rate r is prepared, and the LDPC encoder 115 performs LDPC encoding for a predetermined code length N and a predetermined coded rate r using the parity check matrix H generated from the parity check matrix initial value table corresponding to the predetermined code length N and the predetermined coded rate r.

Example of Parity Check Matrix Initial Value Table

The parity check matrix initial value table is a table representing the positions of elements of 1's of the information matrix $H_A$ (FIG. 10) of the parity check matrix H corresponding to the information length K according to the code length N and the coded rate r of the LDPC code (the LDPC code defined by the parity check matrix H) for each 360 columns (the number P of unit columns of the cyclic structure) and is prepared in advance for each parity check matrix H of each code length N and each coded rate r.

FIG. 33 is a diagram that illustrates an example of the parity check matrix initial value table.

In other words, FIG. 33 illustrates a parity check matrix initial value table for a parity check matrix H having a code length N of 16200 bits and a coded rate r of ¼ defined in the standard of DVB-T.2.

The parity check matrix generating unit 613 (FIG. 31) acquires a parity check matrix H as below by using the parity check matrix initial value table.

Figure 34:
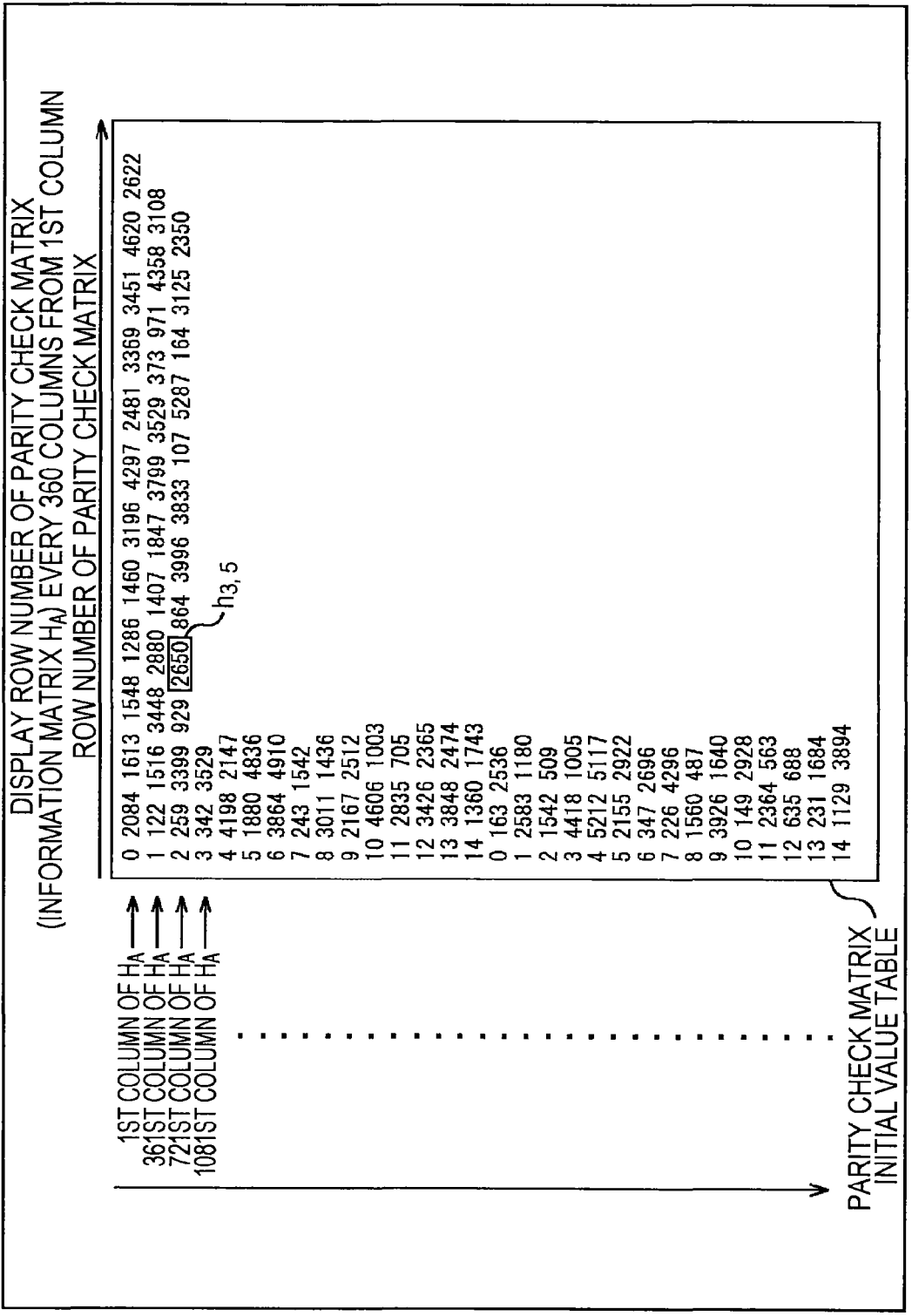
FIG. 34 is a diagram that illustrates a method of acquiring a parity check matrix H from a parity check matrix initial value table.

FIG. 34 illustrates a method of acquiring the parity check matrix H from the parity check matrix initial value table.

The parity check matrix initial value table illustrated in FIG. 34 represents a parity check matrix initial value table for a parity check matrix H having a code length N of 16200 bits and a coded rate r of ⅔ defined in the standard of DVB-T.2.

The parity check matrix initial value table, as described above, is a table representing the positions of elements of 1's of the information matrix $H_A$ (FIG. 10) corresponding to the information length K according to the code length N and the coded rate r of the LDPC code for each 360 columns (the number P of unit columns of the cyclic structure) and, in the i-th row, a row number (a row number when the row number of the first row of the parity check matrix H is 0) of the $(1+360\times(i-1))$-th element of "1" of the parity check matrix H corresponding to the number of the column weights included in the $(1+360\times(i-1))$-th column is aligned.

Here, since the parity matrix $H_T$ (FIG. 10) of the parity check matrix H corresponding to the parity length M is determined as illustrated in FIG. 21, according to the parity check matrix initial value table, the information matrix $H_A$ (FIG. 10) of the parity check matrix H corresponding to the information length K is acquired.

The row number k+1 of the parity check matrix initial value table differs in accordance with the information length K.

Between the information length K and the row number k+1 of the parity check matrix initial value table, the relation of Equation (9) is satisfied.

$$K=(k+1)\times 360 \quad \text{Equation (9)}$$

Here, 360 represented in Equation (9) is the number P of unit columns of the cyclic structure described with reference to FIG. 22.

In the parity check matrix initial value table illustrated in FIG. 34, 13 numerical values are aligned from the first row to the third row, and three numerical values are aligned from the fourth row to the (k+1)-th row (the 30th row in FIG. 34).

Accordingly, the column weight of the parity check matrix H acquired from the parity check matrix initial value table illustrated in FIG. 34 is 13 from the first column to the $((1+360)\times(3-1)-1)$-th column and is 3 from the $((1+360)\times(3-1))$-th column to the K-th column.

In the first row of the parity check matrix initial value table illustrated in FIG. 34, 0, 2084, 1613, 1548, 1286, 1460, 3196, 4297, 2481, 3369, 3451, 4620, and 2622 are arranged, and this represents that, in the first column of the parity check matrix H, the elements of rows having row numbers of 0, 2084, 1613, 1548, 1286, 1460, 3196, 4297, 2481, 3369, 3451, 4620, and 2622 are 1's (in addition, the other elements are 0's).

In addition, in the second row of the parity check matrix initial value table illustrated in FIG. 34, 1, 122, 1516, 3448, 2880, 1407, 1847, 3799, 3529, 373, 971, 4358, and 3108 are arranged, and this represents that, in the 361st ($=1+360\times(2-1)$) column of the parity check matrix H, the elements of rows having row numbers of 1, 122, 1516, 3448, 2880, 1407, 1847, 3799, 3529, 373, 971, 4358, and 3108 are 1's.

As above, the parity check matrix initial value table represents the positions of elements of 1's of the information matrix $H_A$ of the parity check matrix H for each 360 columns.

In each column other than the $(1+360\times(i-1))$-th column of the parity check matrix. H, in other words, each one of the $(2+360\times(i-1))$-th column to the $(360\times i)$-th column, the $(1+360\times(i-1))$-th element of "1" determined based on the parity check matrix initial value table is arranged by being cyclically shifted periodically according to the parity length M to the lower side (lower side of the column).

In other words, for example, the $(2+360\times(i-1))$-th column is acquired by cyclically shifting the $(1+360\times(i-1))$-th column by M/360 ($=q$) to the lower side, and the next $(3+360\times(i-1))$-th column is acquired by cyclically shifting the $(1+360\times(i-1))$-th column by $2\times M/360(=2\times q)$ to the lower side (cyclically shifting the $(2+360\times(i-1))$-th column by M/360 ($=q$) to the lower side).

When the j-th column (j-th from the left side) numerical value of the i-th row (the i-th from the upper side) of the parity check matrix initial value table is represented as $h_{i,j}$, and the row number of the j-th element of "1" of the w-th column of the parity check matrix H is represented as $H_{w-j}$, the row number $H_{w-j}$ of the element of "1" of the w-th column of the parity check matrix H other than the $(1+360\times(i-1))$-th column can be acquired from Equation (10).

$$H_{w-j}=\text{mod }\{h_{i,j}+\text{mod}((w-1),P)\times q,M\} \quad \text{Equation (10)}$$

Here, mod(x, y) represents a remainder acquired by dividing x by y.

In addition, P is the number of unit columns of the cyclic structure described above, and, for example, is 360 as described above in the standard of DVB-T.2. Furthermore, q is a value M/360 acquired by dividing the parity length M by the number P ($=360$) of unit columns of the cyclic structure.

The parity check matrix generating unit 613 (FIG. 31) specifies a row number of the (1+360×(i−1))-th element of "1" of the parity check matrix H based on the parity check matrix initial value table.

In addition, the parity check matrix generating unit 613 (FIG. 31) acquires the row number $H_{w-j}$ of the element of "1" of the w-th column of the parity check matrix H other than the (1+360×(i−1))-th column based on Equation (10) and generates a parity check matrix H in which the elements of the row numbers acquired as above are 1's.

LDPC Code Having Code Length N of 4320 Bits

In a case where digital broadcasting dedicatedly used for mobile terminals can be performed while the specifications of a transmission device and a reception device compliant with DVB-T.2, which is a standard of digital broadcasting dedicatedly used for fixed terminals, are not changed as possibly as can, it is advantageous in terms of cost.

However, according to DVB-T.2, while LDPC codes having code lengths N of 64k bits and 16k bits are defined, an LDPC code having a shorter code length is not defined.

Meanwhile, the amount of memory and a delay required for decoding an LDPC code or the like are smaller for an LDPC code of a short code length than those for an LDPC code of a long code length, and accordingly, the LDPC code of a short code length may be useful for digital broadcasting dedicatedly used for mobile terminals.

Thus, the transmission device 11 (FIG. 7) can perform digital broadcasting dedicatedly used for mobile terminals by using an LDPC code of a code length shorter than the code length of the LDPC code (LDPC codes having code lengths N of 64k bits and 16k bits) defined in DVB-T.2 as an LDPC code (hereinafter, also referred to as a mobile LDPC code) for the digital broadcasting dedicatedly used for mobile terminals.

In addition, in the mobile LDPC code, from the viewpoint of maintaining the compatibility with DVB-T.2 as possibly as can, similarly to the LDPC code defined in the DVB-T.2, the parity matrix $H_T$ of the parity check matrix H has a staircase structure (FIG. 11).

Furthermore, in the mobile LDPC code, similarly to the LDPC code defined in the DVB-T.2, the information matrix $H_A$ of the parity check matrix H has a cyclic structure, and the number P of unit columns of the cyclic structure is 360.

In addition, the code length N of the mobile LDPC code that is shorter than that of the LDPC code defined in DVB-T.2 and (similarly to the LDPC code defined in DVB-T.2) is a multiple of the number P of unit columns of the cyclic structure, for example, 4320 bits (hereinafter, also referred to as 4k bits) is employed.

FIGS. 35 to 43 are diagrams illustrating examples of the parity check matrix initial value table of an LDPC code having a code length N of 4k bits (for mobile) as described above.

In other words, FIG. 35 illustrates a parity check matrix initial value table for a parity check matrix H having a code length N of 4k bits and a coded rate r of ¼.

FIG. 36 illustrates a parity check matrix initial value table for a parity check matrix H having a code length N of 4k bits and a coded rate r of ⅓.

FIG. 37 illustrates a parity check matrix initial value table for a parity check matrix H having a code length N of 4k bits and a coded rate r of 5/12.

FIG. 38 illustrates a parity check matrix initial value table for a parity check matrix H having a code length N of 4k bits and a coded rate r of ½.

FIG. 39 illustrates a parity check matrix initial value table for a parity check matrix H having a code length N of 4k bits and a coded rate r of 7/12.

FIG. 40 illustrates a parity check matrix initial value table for a parity check matrix H having a code length N of 4k bits and a coded rate r of ⅔.

FIG. 41 illustrates a parity check matrix initial value table for a parity check matrix H having a code length N of 4k bits and a coded rate r of ¾.

Figures 42, 43:
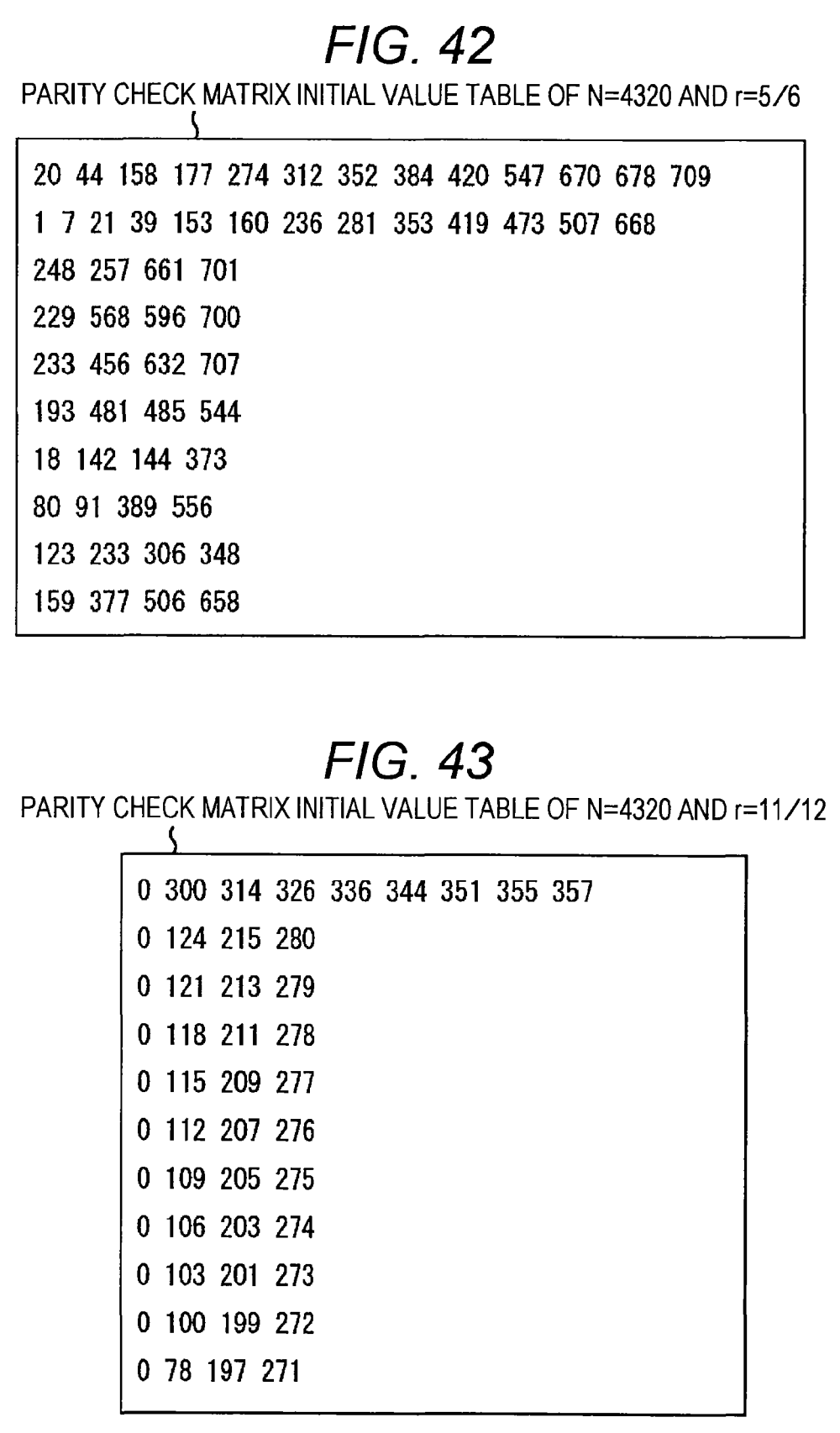

FIG. 42 illustrates a parity check matrix initial value table for a parity check matrix H having a code length N of 4k bits and a coded rate r of ⅚.

FIG. 43 illustrates a parity check matrix initial value table for a parity check matrix H having a code length N of 4k bits and a coded rate r of 11/12.

For the digital broadcasting dedicatedly used for mobile terminals, the LDPC encoder 115 (FIGS. 8 and 31) performs encoding into a LDPC code having a code length N of 4k bits and a coded rate r of one of nine kinds of ¼, ⅓, 5/12, ½, 7/12, ⅔, ¾, ⅚, and, 11/12 by using the parity check matrix H acquired from the parity check matrix initial value table illustrated in FIGS. 35 to 43.

LDPC codes acquired by using the parity check matrix H acquired from the parity check matrix initial value table illustrated in FIGS. 35 to 43 are LDPC codes having high capability.

Here, an LDPC code having high capability is an LDPC code that is acquired from an appropriate parity check matrix H.

In addition, when an LDPC code acquired from the parity check matrix H is transmitted at a low $E_s/N_0$ (a signal power-to-noise power ratio per symbol) or a low $E_b/N_o$ (a signal power-to-noise power ratio per bit), an appropriate parity check matrix H is a parity check matrix satisfying a predetermined condition in which the BER (Bit Error Rate) is small.

The appropriate parity check matrix H can be acquired, for example, by performing a simulation of measuring the BER when LDPC codes acquired from various parity check matrixes satisfying a predetermined condition are transmitted at a low $E_s/N_o$.

As the predetermined condition to be satisfied by an appropriate parity check matrix H, for example, there is a condition that an analysis result acquired by using a method of analyzing the capability of a code called density evolution is good, a condition in which a loop of elements of 1's called cycle-4 does not exist, or the like.

Here, when elements of 1's are densely present in the information matrix $H_A$, like cycle-4, it is known that the decoding capability of the LDPC code is degraded, and accordingly, as a predetermined condition to be satisfied by an appropriate parity check matrix H, it is required that cycle-4 does not exist.

The predetermined condition to be satisfied by an appropriate parity check matrix H can be appropriately determined from a viewpoint of the improvement of the decoding capability of the LDPC code, easiness (simplification) of the decoding process of the LDPC code, and the like.

Figure 44:
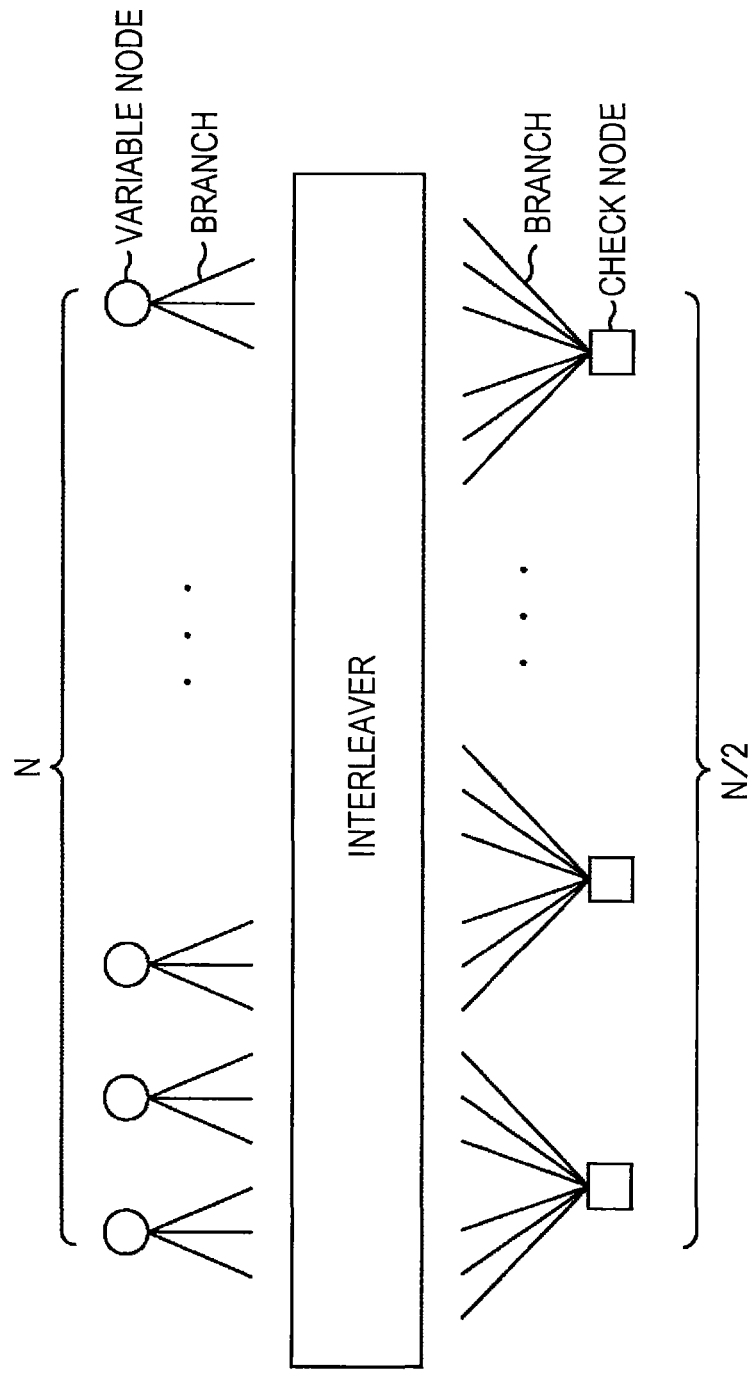
FIG. 44 is a diagram that illustrates an example of a Tanner graph of an ensemble of a degree sequence having a column weight of 3 and a row weight of 6.
Figure 45:
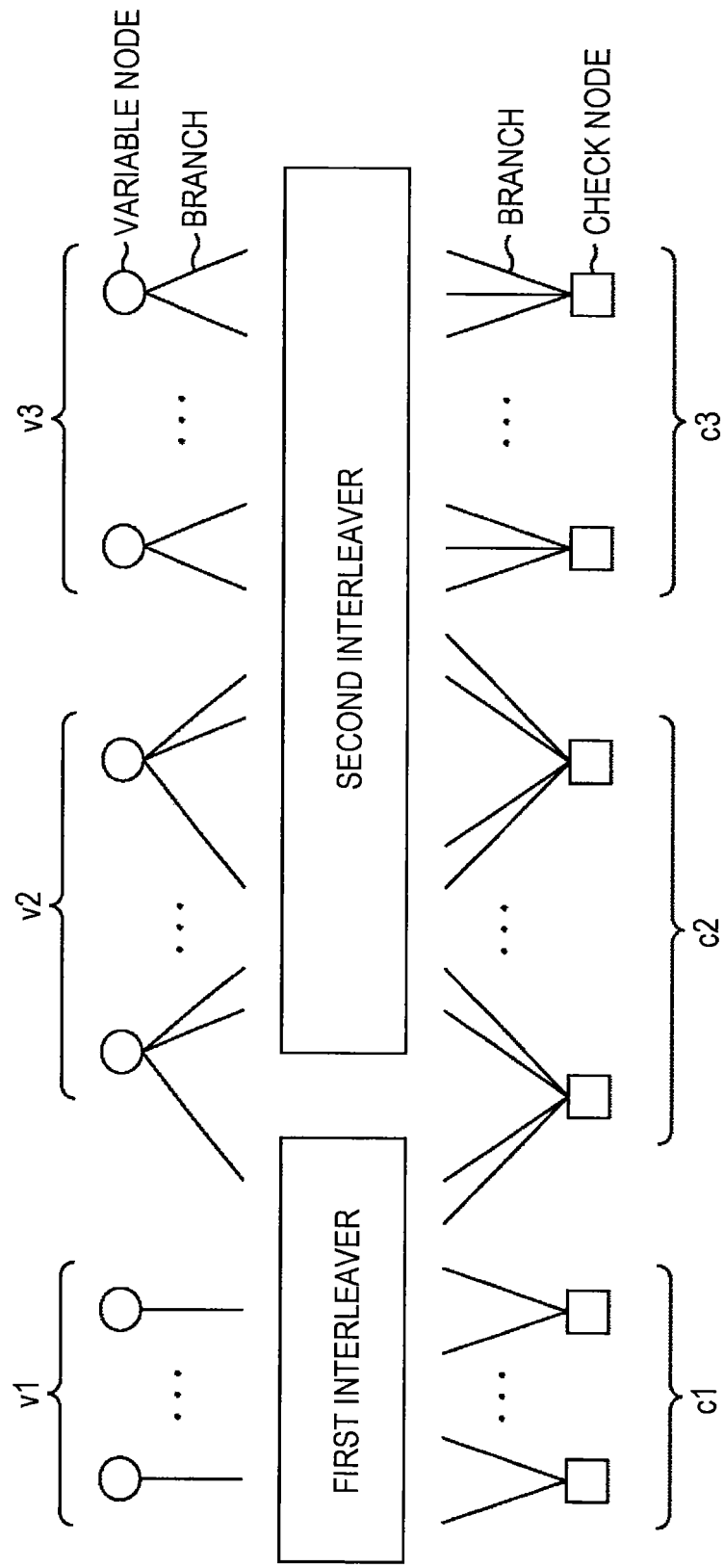
FIG. 45 is a diagram that illustrates an example of a Tanner Graph of an ensemble of a multi-edge type.

FIGS. 44 and 45 are diagrams illustrating a density evolution acquired as an analysis result as the predetermined condition to be satisfied by an appropriate parity check matrix H.

The density evolution is a code analysis method for calculating an expected value of an error probability for all LDPC codes (ensemble) having a code length N of infinity that is specified by a degree sequence to be described later.

For example, as the variance value of noise further increases from zero on an AWGN channel, first, the expected value of the error probability of an ensemble is zero, and, when the variance value of noise is equal to or more than a threshold, the expected value is not zero.

According to the density evolution, by comparing the thresholds (hereinafter, also referred to as capability thresholds) of the variance value of noise for which the expected value of the error probability is not zero, the capability (the degree of appropriateness of a parity check matrix) of an ensemble can be determined.

In addition, for a specific LDPC code, by determining an ensemble to which the LDPC code belongs and performing density evolution for the ensemble, a rough capability of the LDPC code can be estimated.

Thus, when an ensemble having a high capability is found, an LDPC code having a high capability can be found from among LDPC codes belonging to the ensemble.

Here, the degree sequence described above represents, for a code length N of an LDPC code, a ratio of variable nodes or check nodes having weight of each value.

For example, a regular (3,6) LDPC code having a coded rate of ½ belongs to an ensemble that is specified by a degree sequence in which the weight (column weight) of all the variable nodes is 3, and the weight (row weight) of all the check nodes is 6.

FIG. 44 illustrates a Tanner graph of such an ensemble.

In the Tanner graph illustrated in FIG. 44, the number of variable nodes each represented by a white circle (○ mark) in the figure which are present is N that is the same as the code length N, and the number of check nodes each represented by a square (□ mark) in the figure which are present is N/2 that is the same as a value acquired by multiplying the code length N by the coded rate of ½.

Three branches (edges), the number of which is the same as the column weight, are connected to each variable node, and thus a total of 3N branches connected to N variable nodes are present.

In addition, six branches, the number of which is the same as the row weight, are connected to each check node, and thus a total of 3N branches connected to N/2 check nodes are present.

Furthermore, in the Tanner graph illustrated in FIG. 44, one interleaver is present.

The interleaver randomly rearranges the 3N branches connected to the N variable nodes and connects each branch after the rearrangement to one of the 3N branches connected to the N/2 check nodes.

In the interleaver, there are only $(3N)!$ $(=(3N)\times(3N-1)\times\ldots\times1)$ kinds of rearrangement patterns for rearranging 3N branches connected to the N variable nodes. Accordingly, an ensemble specified by a degree sequence in which the weight of all the variable nodes is 3, and the weight of all the check nodes is 6 is a set of $(3N)!$ LDPC codes.

In a simulation for acquiring an LDPC code having a high capability (appropriate parity check matrix), a multi-edge type ensemble is used in the density evolution.

In the multi-edge type, the interleaver through which the branches connected to the variable nodes and the branches connected to the check node pass is divided into a plurality of parts (multi edges), and accordingly, the specifying of the ensemble is performed more accurately.

FIG. 45 is a diagram that illustrates an example of a Tanner Graph of an ensemble of a multi-edge type.

In the Tanner graph illustrated in FIG. 45, two interleavers including a first interleaver and a second interleaver are present.

In addition, in the Tanner graph illustrated in FIG. 45, only v1 variable nodes each having one branch connected to the first interleaver and zero branch connected to the second interleaver are present, only v2 variable nodes each having one branch connected to the first interleaver and two branches connected to the second interleaver are present, and only v3 variable nodes each having zero branch connected to the first interleaver and two branches connected to the second interleaver are present.

Furthermore, in the Tanner graph illustrated in FIG. 45, only c1 check nodes each having two branches connected to the first interleaver and zero branch connected to the second interleaver are present, only c2 check nodes each having two branches connected to the first interleaver and two branches connected to the second interleaver are present, and only c3 check nodes each having zero branch connected to the first interleaver and three branches connected to the second interleaver are present.

Here, the density evolution and the implementation thereof, for example, are written in "On the Design of Low-Density Parity-Check Codes within 0.0045 dB of the Shannon Limit", S. Y. Chung, G. D. Formey, T. J. Richardson, R. Urbanke, IEEE Communications Leggers, VOL. 5, NO. 2, February 2001.

In a simulation for acquiring a mobile LDPC code (the parity check matrix initial value table thereof) illustrated in FIGS. 35 to 43, an ensemble of which the capability threshold, which is $E_b/N_0$, at which the BER starts to fall (decrease) in accordance with the density evolution of the multi-edge type is a predetermined value or less is searched for, and, among the LDPC codes belonging to the ensemble, an LDPC code decreasing the BER in a plurality of modulation modes used for digital broadcasting dedicatedly used for mobile terminals such as 16 QAM or 64 QAM is selected as an LDPC code having a high capability.

Here, as described above, in the digital broadcasting dedicatedly used for mobile terminals, an LDPC code of 4k bits of which the code length N is shorter than that of LDPC codes (LDPC codes having code lengths N of 16k and 64k bits) defined in DVB-T.2 has resistance to error in the communication channel 13 (FIG. 7) that is lower than an LDPC code having a long code length N defined in DVB-T.2.

Accordingly, in the digital broadcasting dedicatedly used for mobile terminals, in order to improve the resistance to error, a modulation mode in which the number of signal points is relatively small such as QPSK, 16 QAM or 64 QAM is employed.

The parity check matrix initial value tables illustrated in FIGS. 35 to 43 described above are the parity check matrix initial value tables of an LDPC code having a code length N of 4k bits that are acquired through the simulation as described above.

Figures 46, 47:
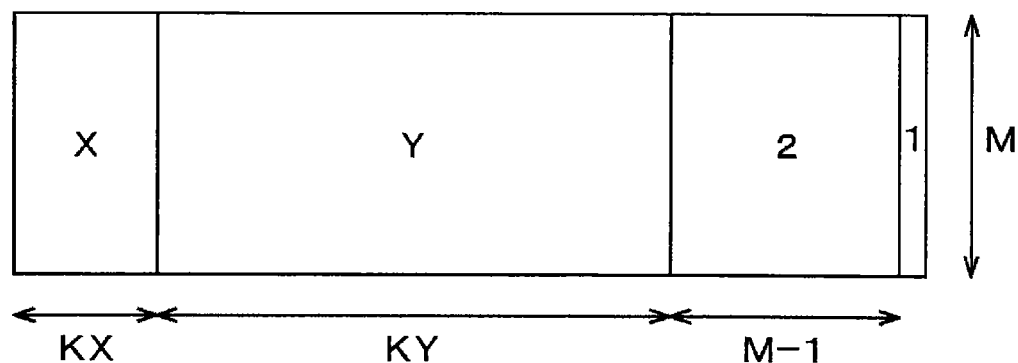
FIG. 46 is a diagram that illustrates a minimal cycle length and a performance threshold of a parity check matrix of an LDPC code having a code length of 4320.
FIG. 47 is a diagram that illustrates a parity check matrix of an LDPC code having a code length of 4320.

FIG. 46 is a diagram illustrating a minimum cycle length and a capability threshold of the parity check matrix H that is acquired from the parity check matrix initial value tables of nine kinds of LDPC codes having a code length N of 4k bits and coded rates r of ¼, ⅓, 5/12, ½, 7/12, ⅔, ¾, ⅚, and 11/12 illustrated in FIGS. 35 to 43.

In the parity check matrix H acquired from the parity check matrix initial value tables illustrated in FIGS. 35 to 43, the minimum cycle length of the parity check matrixes H having coded rates r of ¼ and ⅓ is 8 cycles, and the minimum cycle length of the parity check matrixes H having coded rates r of 5/12, ½, 7/12, ⅔, ¾, ⅚, and 11/12 is 6 cycles.

Accordingly, in the parity check matrix H acquired from the parity check matrix initial value tables illustrated in FIGS. 35 to 43, the cycle-4 is not present.

In addition, as the coded rate r decreases, the redundancy of the LDPC code increases, and accordingly, the capability threshold is improved (decreases) as the coded rate r decreases.

FIG. 47 is a diagram illustrating the parity check matrix H (hereinafter, also referred to as a parity check matrix H of a mobile LDPC code) of FIGS. 35 to 43 (acquired from the parity check matrix initial value tables).

In the parity check matrix H of the mobile LDPC code, a column weight is set to X for KX columns from the first column, a column weight is set to Y for the subsequent KY columns, a column weight is set to two for the subsequent (M−1) columns, and a column weight is set to one for the last column.

Here, KX+KY+M−1+1 is the same as the code length N=4320 bits.

FIG. 48 is a diagram illustrating the number of columns KX, KY, and M and the column weights X and Y for each coded rate r (=1/4, 1/3, 5/12, 1/2, 7/12, 2/3, 3/4, 5/6, and 11/12) of the mobile LDPC code.

For a parity check matrix H of a mobile LDPC code having a code length N of 4k, similarly to the parity check matrix defined in DVB-T.2 described with reference to FIGS. 12 and 13, as a column is located on the further front side (left side), the column weight tends to be large, and accordingly, a code bit of the mobile LDPC code that is located on the further front side tends to be strong for error (has resistance to error).

Column Twist Interleaving of LDPC Code Having Code Length N of 4320 Bits

In the LDPC encoder 115 (FIGS. 8 and 31), in a case where LDPC encoding into a mobile LDPC code is performed using the parity check matrixes H illustrated in FIGS. 35 to 43 (acquired from the parity check matrix initial value tables), the write starting position of each column (FIG. 24) of the memory 31 in column twist interleaving as a rearrangement process performed by the column twist interleaver 24 (FIG. 9) is different from the write starting position (FIGS. 25 and 26) in the case of an LDPC code defined in DVB-T.2.

FIG. 49 is a diagram that illustrates the number of columns of the memory 31 that are necessary for column twist interleaving and addresses of write starting positions thereof for mobile LDPC codes.

In other words, FIG. 49 illustrates the number of columns of the memory 31 necessary for column twist interleaving and the addresses of the write starting positions thereof for each modulation mode for mobile LDPC codes, which are illustrated in FIGS. 35 to 43, having a code length N of 4k bits and nine kinds (can be acquired from the parity check matrix H acquired from the parity check matrix initial value tables) of coded rates r of 1/4, 1/3, 5/12, 1/2, 7/12, 2/3, 3/4, 5/6, and 11/12.

In addition, for the mobile LDPC codes, as the modulation modes, as described above, QPSK, 16 QAM, and 64 QAM having relatively small numbers of signal points are employed.

By employing a multiple b of 1 and employing the QPSK as the modulation mode, in a case where the number m of bits of one symbol is two bits, the memory 31 has two columns storing 2×1 bits in the row direction and stores N/(mb)=4320/(2×1) bits in the column direction.

Out of the two columns of the memory 31, the write starting position of a first column is the position of address 0, and the write starting position of a second column is the position of address 2.

By employing a multiple b of 2 and employing the QPSK as the modulation mode, in a case where the number m of bits of one symbol is two bits, the memory 31 has four columns storing 2×2 bits in the row direction and stores N/(mb)=4320/(2×2) bits in the column direction.

Out of the four columns of the memory 31, the write starting position of a first column is the position of address 0, the write starting position of a second column is the position of address 0, the write starting position of a third column is the position of address 1, and the write starting position of a fourth column is the position of address 0.

By employing a multiple b of 1 and employing 16 QAM as the modulation mode, in a case where the number m of bits of one symbol is four bits, the memory 31 has four columns storing 4×1 bits in the row direction and stores N/(mb)=4320/(4×1) bits in the column direction.

The write starting positions of four columns of the memory 31 are the same as those of a case where the multiple b is 2, and the QPSK is employed as the modulation mode.

In other words, out of the four columns of the memory 31, the write starting position of a first column is the position of address 0, the write starting position of a second column is the position of address 0, the write starting position of a third column is the position of address 1, and the write starting position of a fourth column is the position of address 0.

By employing a multiple b of 2 and employing 16 QAM as the modulation mode, in a case where the number m of bits of one symbol is four bits, the memory 31 has eight columns storing 4×2 bits in the row direction and stores N/(mb)=4320/(4×2) bits in the column direction.

Out of the eight columns of the memory 31, the write starting position of a first column is the position of address 0, the write starting position of a second column is the position of address 8, the write starting position of a third column is the position of address 10, the write starting position of a fourth column is the position of address 10, the write starting position of a fifth column is the position of address 25, the write starting position of a sixth column is the position of address 54, the write starting position of a seventh column is the position of address 62, and the write starting position of an eighth column is the position of address 69.

By employing a multiple b of 1 and employing the 64 QAM as the modulation mode, in a case where the number m of bits of one symbol is six bits, the memory 31 has six columns storing 6×1 bits in the row direction and stores N/(mb)=4320/(6×1) bits in the column direction.

Out of the six columns of the memory 31, the write starting position of a first column is the position of address 0, the write starting position of a second column is the position of address 0, the write starting position of a third column is the position of address 1, the write starting position of a fourth column is the position of address 1, the write starting position of a fifth column is the position of address 0, and the write starting position of a sixth column is the position of address 0.

By employing a multiple b of 2 and employing, for example, 64 QAM as the modulation mode, in a case where the number m of bits of one symbol is six bits, as illustrated in FIG. 49, the memory 31 has 12 columns storing 6×2 bits in the row direction and stores 4320/(6×2) bits in the column direction.

Out of the twelve columns of the memory 31, the write starting position of a first column is the position of address 0, the write starting position of a second column is the position of address 2, the write starting position of a third column is the position of address 10, the write starting position of a fourth column is the position of address 12, the write starting position of a fifth column is the position of address 15, the write starting position of a sixth column is the position of address 17, the write starting position of a seventh column is the position of address 20, the write starting position of an eighth column is the position of address 21, the write starting position of a ninth column is the position of address 23, the write starting position of a tenth column is the position of address 25, the write starting position of an eleventh column is the position of address 26, and the write starting position of a twelfth column is the position of address 30.

By performing the column twist interleaving as above for the mobile LDPC code having a code length N of 4k bits illustrated in FIGS. 35 to 43, it can be avoided that a plurality of code bits corresponding to a plurality of variable nodes connected to the same check node form one symbol (are included in the same symbol) of the QPSK, the 16 QAM, or the 64 QAM, whereby the decoding capability in a communication channel having an erasure can be improved.

Figure 50:
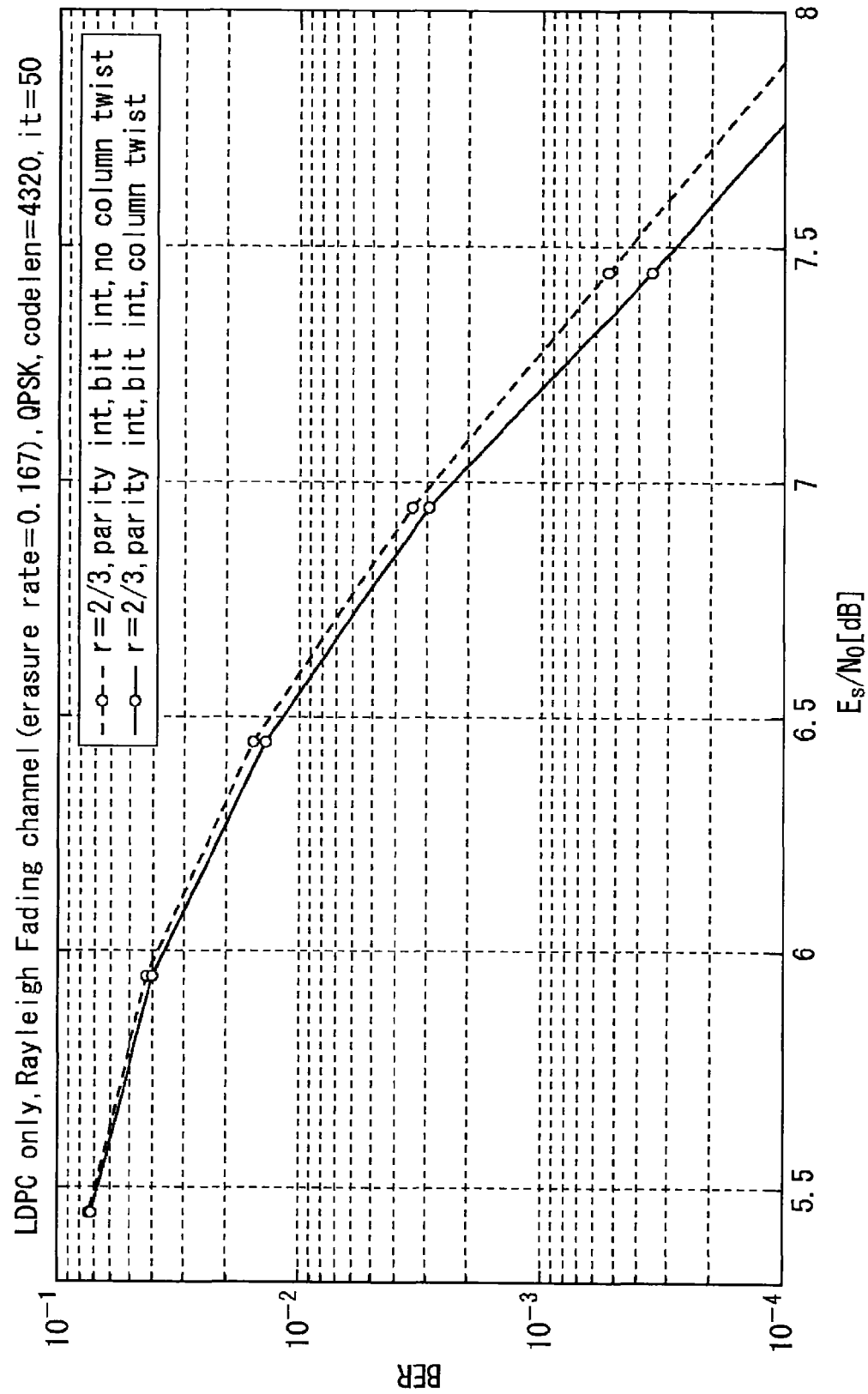
FIG. 50 is a diagram that illustrates a simulation result of a BER in a case where column twist interleaving is performed.

FIG. 50 is a diagram that illustrates a simulation result of a BER in a case where column twist interleaving is performed for a mobile LDPC code.

In the simulation, a communication channel (channel) in which Rayleigh fading having an erasure probability of 0.167, at which a symbol is erased, occurs is considered, an LDPC code (FIG. 40) having a code length N of 4k bits and a coded rate of ⅔ is employed as the mobile LDPC code, and the QPSK is employed as the modulation mode.

In FIG. 50, the horizontal axis represents $E_s/N_0$ (a signal power-to-noise power ratio per symbol), and the vertical axis represents the BER.

In addition, in FIG. 50, a solid line represents a BER in a case where both parity interleaving and column twist interleaving are performed, and a dotted line represents a BER in a case where parity interleaving is performed without performing column twist interleaving.

Based on FIG. 50, in the case where the column twist interleaving is performed, compared to the case where the column twist interleaving is not performed, the BER is improved as a whole, and accordingly, it is understood that the resistance to error is improved.

Interchange Process of LDPC Code Having Code Length N of 4320 Bits

In a case where a mobile LDPC code having a short code length N described above, that is, an LDPC code having a code length N of 4k bits is employed in digital broadcasting dedicatedly used for mobile terminals, the resistance to error in the communication channel 13 (FIG. 7) decreases.

Thus, in the digital broadcasting dedicatedly used for mobile terminals, it is preferable to take a countermeasure for improving the resistance to error.

As a countermeasure for improving the resistance to error, other than a method of employing a modulation mode in which the number of signal points is relatively small such as the 16 QAM or the 64 QAM as described above, for example, there is an interchange process performed by the demultiplexer 25 (FIG. 9).

In the interchange process, while there, for example, are the first to fourth interchange modes described above and interchange modes defined in the standard of DVB-T.2 and the like as interchange modes in which code bits of an LDPC code defined in the standard of DVB-T.2 or the like are interchanged, in a case where the digital broadcasting dedicatedly used for mobile terminals is performed using the above-described LDPC code (mobile LDPC code) having a code length N of 4k bits, it is necessary to employ an interchange process that is appropriate for the LDPC code having a code length N of 4k bits.

In addition, as an interchange process employed for the LDPC code having a code length N of 4k bits, it is preferable that an interchange process of a type for further improving the resistance to error is employed.

Thus, the demultiplexer 25 (FIG. 9), as described with reference to FIG. 27, is configured to perform an interchange process in accordance with an allocation rule.

Hereinafter, an interchange process according to an allocation rule will be described, and, before the description, an interchange process according to an interchange mode (hereinafter, referred to as a current mode) that has been already proposed will be described.

In a case where an interchange process is performed in accordance with the current mode for an LDPC code (hereinafter, referred to as a defined code) defined in DVB-T.2 or the like by the demultiplexer 25, the interchange process will be described with reference to FIGS. 51 and 52.

Figure 51:
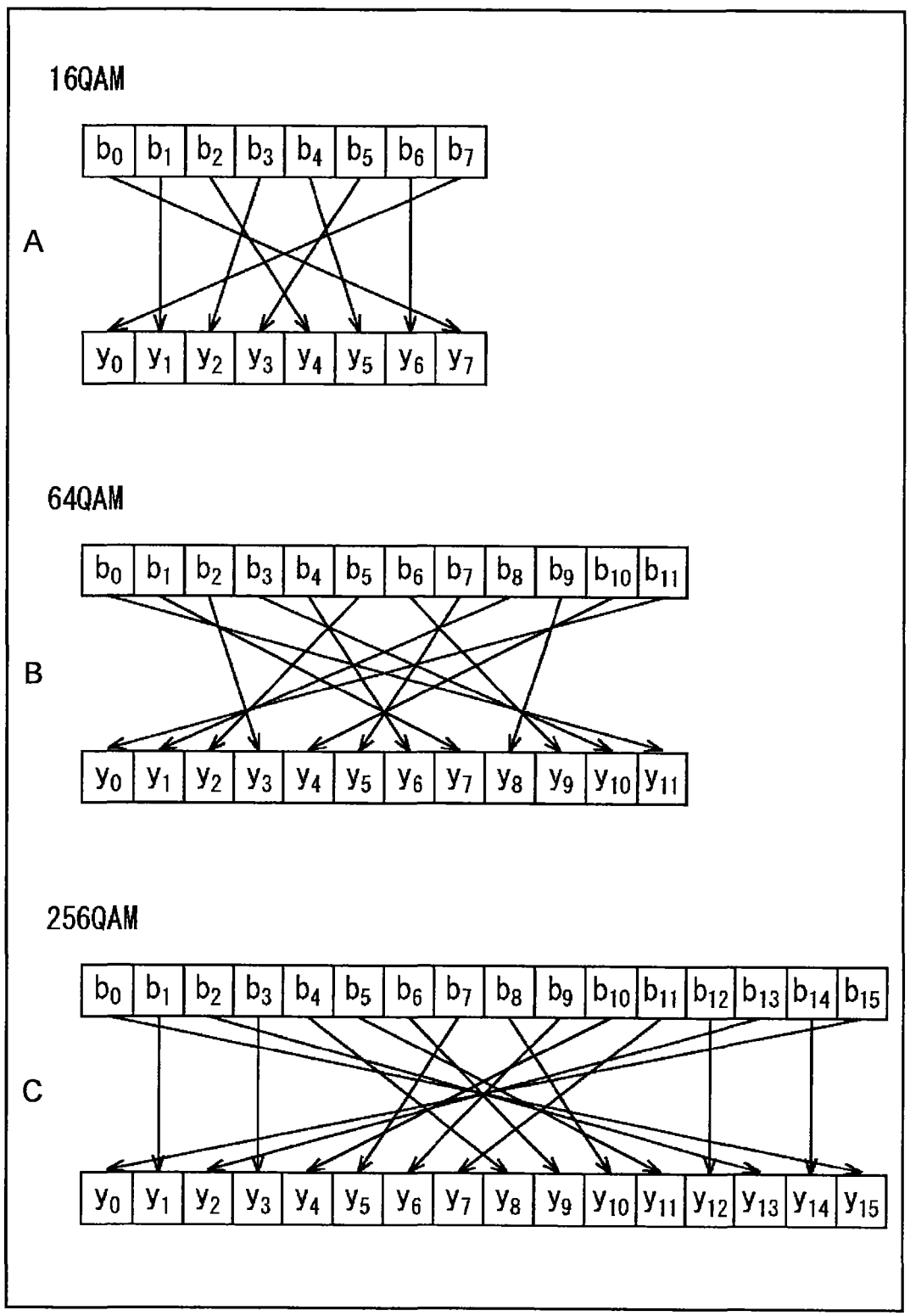
FIG. 51 is a diagram that illustrates an interchange process according to the current mode.

FIG. 51 illustrates an example of an interchange process of the current mode in a case where the LDPC code is an LDPC code having a code length N of 64800 bits and a coded rate of ⅗ defined in DVB-T.2.

In other words, A of FIG. 51 illustrates an example of the interchange process of the current mode in a case where the LDPC code is a defined code having a code length N of 64800 bits and a coded rate of ⅗, the modulation mode is the 16 QAM, and the multiple b is 2.

In a case where the modulation mode is the 16 QAM, 4 (=m) bits of the code bits are mapped into any one of 16 signal points defined in the 16 QAM as one symbol.

In addition, in a case where the code length N is 64800 bits, and the multiple b is 2, the memory 31 (FIGS. 18 and 19) of the demultiplexer 25 has 8 columns storing 4×2 (=mb) bits in the row direction and stores 64800/(4×2) bits in the column direction.

In the demultiplexer 25, when the code bits of an LDPC code are written in the column direction of the memory 31, and writing of code bits (one code word) of 64800 bits is completed, the code bits written into the memory 31 are read in units of 4×2 (=mb) bits in the row direction and are supplied to the interchange unit 32 (FIGS. 18 and 19).

The interchange unit 32 interchanges the code bits $b_0$ to $b_7$ of 4×2 (=mb) bits such that the code bits $b_0$, $b_1$, $b_2$, $b_3$, $b_4$, $b_5$, $b_6$, and $b_7$ of 4×2 (=mb) bits read from the memory 31, for example, as illustrated in A of FIG. 51, are allocated to symbol bits $y_0$, $y_1$, $y_2$, $y_3$, $y_4$, $y_5$, $y_6$, and $y_7$ of 4×2 (=mb) bits of consecutive 2 (=b) symbols.

In other words, the interchange unit 32 performs an interchange process in which:

the code bit $b_0$ is allocated to the symbol bit $y_7$;
the code bit $b_1$ to the symbol bit $y_1$;
the code bit $b_2$ to the symbol bit $y_4$;
the code bit $b_3$ to the symbol bit $y_2$;
the code bit $b_4$ to the symbol bit $y_5$;
the code bit $b_5$ to the symbol bit $y_3$;
the code bit $b_6$ to the symbol bit $y_6$; and
the code bit $b_7$ to the symbol bit $y_0$.

B of FIG. 51 illustrates an example of the interchange process of the current mode in a case where the LDPC code is a defined code having a code length N of 64800 bits and a coded rate of ⅗, the modulation mode is the 64 QAM, and the multiple b is 2.

In a case where the modulation mode is the 64 QAM, 6 (=m) bits of the code bits are mapped into any one of 64 signal points defined in the 64 QAM as one symbol.

In addition, in a case where the code length N is 64800 bits, and the multiple b is 2, the memory 31 (FIGS. 18 and 19) of the demultiplexer 25 has 12 columns storing 6×2 (=mb) bits in the row direction and stores 64800/(6×2) bits in the column direction.

In the demultiplexer 25, when the code bits of an LDPC code are written in the column direction of the memory 31, and writing of code bits (one code word) of 64800 bits is completed, the code bits written into the memory 31 are read in units of 6×2 (=mb) bits in the row direction and are supplied to the interchange unit 32 (FIGS. 18 and 19).

The interchange unit 32 interchanges the code bits $b_0$ to $b_{11}$ of 6×2 (=mb) bits such that the code bits $b_0$, $b_1$, $b_2$, $b_3$, $b_4$, $b_5$, $b_6$, $b_7$, $b_8$, $b_9$, $b_{10}$, and $b_{11}$ of 6×2 (=mb) bits read from the memory 31, for example, as illustrated in B of FIG. 51, are allocated to symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of consecutive 2 (=b) symbols.

In other words, the interchange unit 32 performs an interchange process in which:
the code bit $b_0$ is allocated to the symbol bit $y_{11}$;
the code bit $b_1$ to the symbol bit $y_7$;
the code bit $b_2$ to the symbol bit $y_3$;
the code bit $b_3$ to the symbol bit $y_{10}$;
the code bit $b_4$ to the symbol bit $y_1$;
the code bit $b_5$ to the symbol bit $y_2$;
the code bit $b_6$ to the symbol bit $y_9$;
the code bit $b_7$ to the symbol bit $y_5$;
the code bit $b_8$ to the symbol bit $y_1$;
the code bit $b_9$ to the symbol bit $y_6$;
the code bit $b_{10}$ to the symbol bit $y_4$; and
the code bit $b_{11}$ to the symbol bit $y_0$.

C of FIG. 51 illustrates an example of the interchange process of the current mode in a case where the LDPC code is a defined code having a code length N of 64800 bits and a coded rate of ⅗, the modulation mode is the 256 QAM, and the multiple b is 2.

In a case where the modulation mode is the 256 QAM, 8 (=m) bits of the code bits are mapped into any one of 256 signal points defined in the 256 QAM as one symbol.

In addition, in a case where the code length N is 64800 bits, and the multiple b is 2, the memory 31 (FIGS. 18 and 19) of the demultiplexer 25 has 16 columns storing 8×2 (=mb) bits in the row direction and stores 64800/(8×2) bits in the column direction.

In the demultiplexer 25, when the code bits of an LDPC code are written in the column direction of the memory 31, and writing of code bits (one code word) of 64800 bits is completed, the code bits written into the memory 31 are read in units of 8×2 (=mb) bits in the row direction and are supplied to the interchange unit 32 (FIGS. 18 and 19).

The interchange unit 32 interchanges the code bits $b_0$ to $b_{15}$ of 8×2 (=mb) bits such that the code bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ of 8×2 (=mb) bits read from the memory 31, for example, as illustrated in C of FIG. 51, are allocated to symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$, and $y_{15}$ of 8×2 (=mb) bits of consecutive 2 (=b) symbols.

In other words, the interchange unit 32 performs an interchange process in which:
the code bit $b_0$ is allocated to the symbol bit $y_1$;
the code bit $b_1$ to the symbol bit $y_1$;
the code bit $b_2$ to the symbol bit $y_{13}$;
the code bit $b_3$ to the symbol bit $y_3$;
the code bit $b_4$ to the symbol bit $y_8$;
the code bit $b_5$ to the symbol bit $y_{11}$;
the code bit $b_6$ to the symbol bit $y_9$;
the code bit $b_7$ to the symbol bit $y_5$;
the code bit $b_8$ to the symbol bit $y_{10}$;
the code bit $b_9$ to the symbol bit $y_6$;
the code bit $b_{10}$ to the symbol bit $y_4$;
the code bit $b_{11}$ to the symbol bit $y_7$;
the code bit $b_{12}$ to the symbol bit $y_{12}$;
the code bit $b_{13}$ to the symbol bit $y_2$;
the code bit $b_{14}$ to the symbol bit $y_{14}$; and
the code bit $b_{15}$ to the symbol bit $y_0$.

Figure 52:
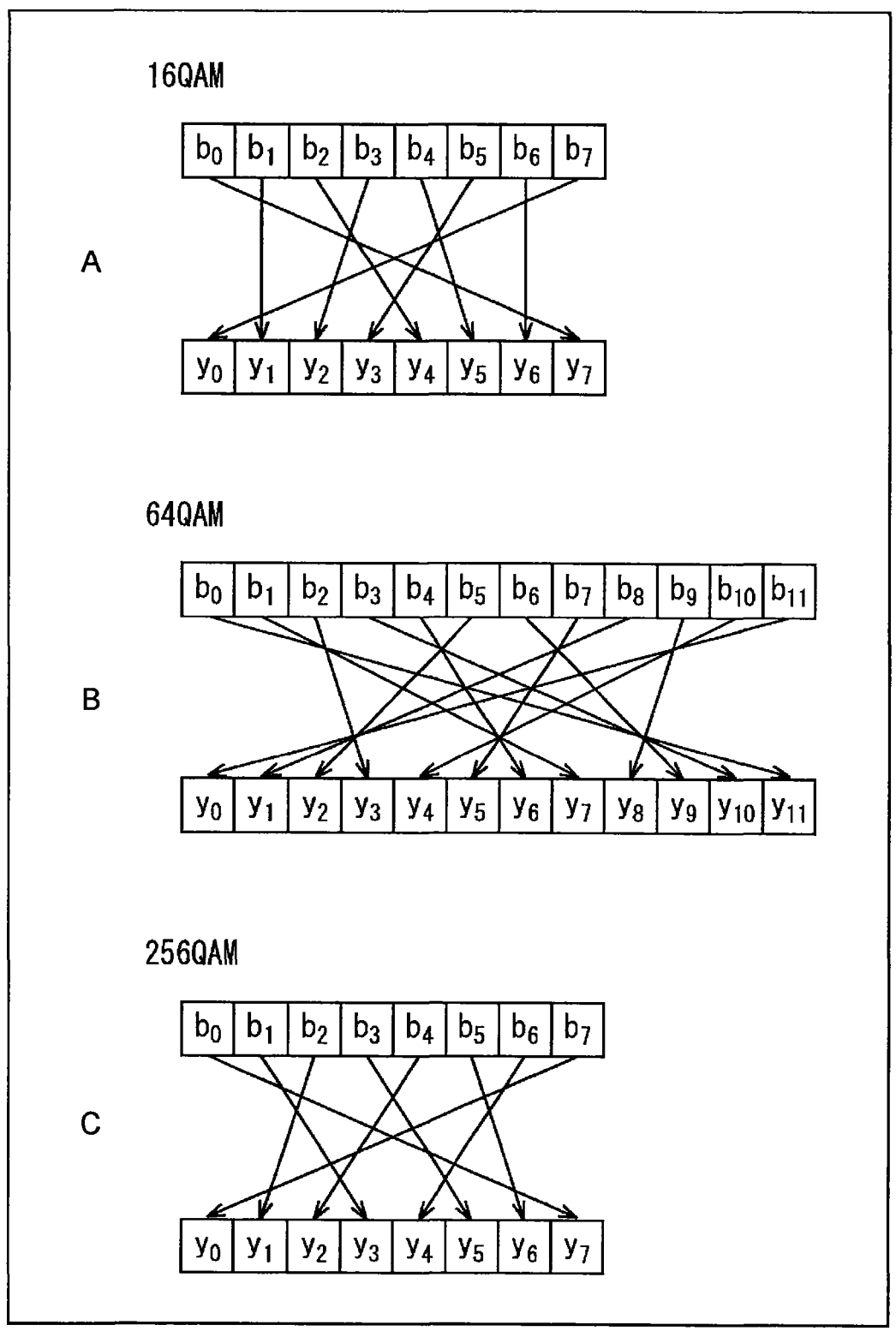
FIG. 52 is a diagram that illustrates an interchange process according to the current mode.

FIG. 52 illustrates an example of the interchange process of the current mode in a case where the LDPC code is a defined code having a code length N of 16200 bits and a coded rate of ⅗.

In other words, A of FIG. 52 illustrates an example of the interchange process of the current mode in a case where the LDPC code is an LDPC code having a code length N of 16200 bits and a coded rate of ⅗, the modulation mode is the 16 QAM, and the multiple b is 2.

In a case where the modulation mode is the 16 QAM, 4 (=m) bits of the code bits are mapped into any one of 16 signal points defined in the 16 QAM as one symbol.

In addition, in a case where the code length N is 16200 bits, and the multiple b is 2, the memory 31 (FIGS. 18 and 19) of the demultiplexer 25 has 8 columns storing 4×2 (=mb) bits in the row direction and stores 16200/(4×2) bits in the column direction.

In the demultiplexer 25, when the code bits of an LDPC code are written in the column direction of the memory 31, and writing of code bits (one code word) of 16200 bits is completed, the code bits written into the memory 31 are read in units of 4×2 (=mb) bits in the row direction and are supplied to the interchange unit 32 (FIGS. 18 and 19).

The interchange unit 32 interchanges the code bits $b_0$ to $b_7$ of 4×2 (=mb) bits such that the code bits $b_0$, $b_1$, $b_2$, $b_3$, $b_4$, $b_5$, $b_6$, and $b_7$ of 4×2 (=mb) bits read from the memory 31, for example, as illustrated in A of FIG. 52, are allocated to symbol bits $y_0$, $y_1$, $y_2$, $y_3$, $y_4$, $y_5$, $y_6$, and $y_7$ of 4×2 (=mb) bits of consecutive 2 (=b) symbols.

In other words, the interchange unit 32, similarly to the case of A of FIG. 51 described above, performs an interchange process in which code bits $b_0$ to $b_7$ are allocated to symbol bits $y_0$ to $y_7$.

B of FIG. 52 illustrates an example of the interchange process of the current mode in a case where the LDPC code is a defined code having a code length N of 16200 bits and a coded rate of ⅗, the modulation mode is the 64 QAM, and the multiple b is 2.

In a case where the modulation mode is the 64 QAM, 6 (=m) bits of the code bits are mapped into any one of 64 signal points defined in the 64 QAM as one symbol.

In addition, in a case where the code length N is 16200 bits, and the multiple b is 2, the memory 31 (FIGS. 18 and 19) of the demultiplexer 25 has 12 columns storing 6×2 (=mb) bits in the row direction and stores 16200/(6×2) bits in the column direction.

In the demultiplexer 25, when the code bits of an LDPC code are written in the column direction of the memory 31, and writing of code bits (one code word) of 16200 bits is completed, the code bits written into the memory 31 are read in units of 6×2 (=mb) bits in the row direction and are supplied to the interchange unit 32 (FIGS. 18 and 19).

The interchange unit 32 interchanges the code bits $b_0$ to $b_{11}$ of 6×2 (=mb) bits such that the code bits $b_0$, $b_1$, $b_2$, $b_3$, $b_4$, $b_5$, $b_6$, $b_7$, $b_8$, $b_9$, $b_{10}$, and $b_{11}$ of 6×2 (=mb) bits read from the memory 31, for example, as illustrated in B of FIG. 52, are allocated to symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of consecutive 2 (=b) symbols.

In other words, the interchange unit 32, similarly to the case of B of FIG. 51 described above, performs an interchange process in which code bits $b_0$ to $b_{11}$ are allocated to symbol bits $y_0$ to $y_{11}$.

C of FIG. 52 illustrates an example of the interchange process of the current mode in a case where the LDPC code is a defined code having a code length N of 16200 bits and a coded rate of ⅗, the modulation mode is the 256 QAM, and the multiple b is 1.

In a case where the modulation mode is the 256 QAM, 8 (=m) bits of the code bits are mapped into any one of 256 signal points defined in the 256 QAM as one symbol.

In addition, in a case where the code length N is 16200 bits, and the multiple b is 1, the memory 31 (FIGS. 18 and 19) of the demultiplexer 25 has 8 columns storing 8×1 (=mb) bits in the row direction and stores 16200/(8×1) bits in the column direction.

In the demultiplexer 25, when the code bits of an LDPC code are written in the column direction of the memory 31, and writing of code bits (one code word) of 16200 bits is completed, the code bits written into the memory 31 are read in units of 8×1 (=mb) bits in the row direction and are supplied to the interchange unit 32 (FIGS. 18 and 19).

The interchange unit 32 interchanges the code bits $b_0$ to $b_7$ of 8×1 (=mb) bits such that the code bits $b_0$, $b_1$, $b_2$, $b_3$, $b_4$, $b_5$, $b_6$, and $b_7$ of 8×1 (=mb) bits read from the memory 31, for example, as illustrated in C of FIG. 52, are allocated to symbol bits $y_0$, $y_1$, $y_2$, $y_3$, $y_4$, $y_5$, $y_6$, and $y_7$ of 8×1 (=mb) bits of 1 (=b) symbol.

In other words, the interchange unit 32 performs an interchange process in which:
the code bit $b_0$ is allocated to the symbol bit $y_7$;
the code bit $b_1$ to the symbol bit $y_3$;
the code bit $b_2$ to the symbol bit $y_1$;
the code bit $b_3$ to the symbol bit $y_5$;
the code bit $b_4$ to the symbol bit $y_2$;
the code bit $b_5$ to the symbol bit $y_6$;
the code bit $b_6$ to the symbol bit $y_4$; and
the code bit $b_7$ to the symbol bit $y_0$;

Next, an interchange process (hereinafter, also referred to as an interchange process according to a new interchange mode) according to an allocation rule will be described.

In addition, in the digital broadcasting dedicatedly used for mobile terminals, a modulation mode in which the number of signal points is small such as QPSK, 16 QAM or 64 QAM is employed, and, here, the new interchange mode will be described for the case of the 16 QAM and the case of the 64 QAM.

In a case where the modulation mode is the QPSK, there is no superiority or inferiority of the strength for error described with reference to FIGS. 14 to 17 between symbol bits $y_0$ and $y_1$ of two bits representing four symbols (signal points) of the QPSK, and accordingly, the interchange process does not need to be performed (even when the interchange process is performed, the resistance to error does not change).

Figure 54:
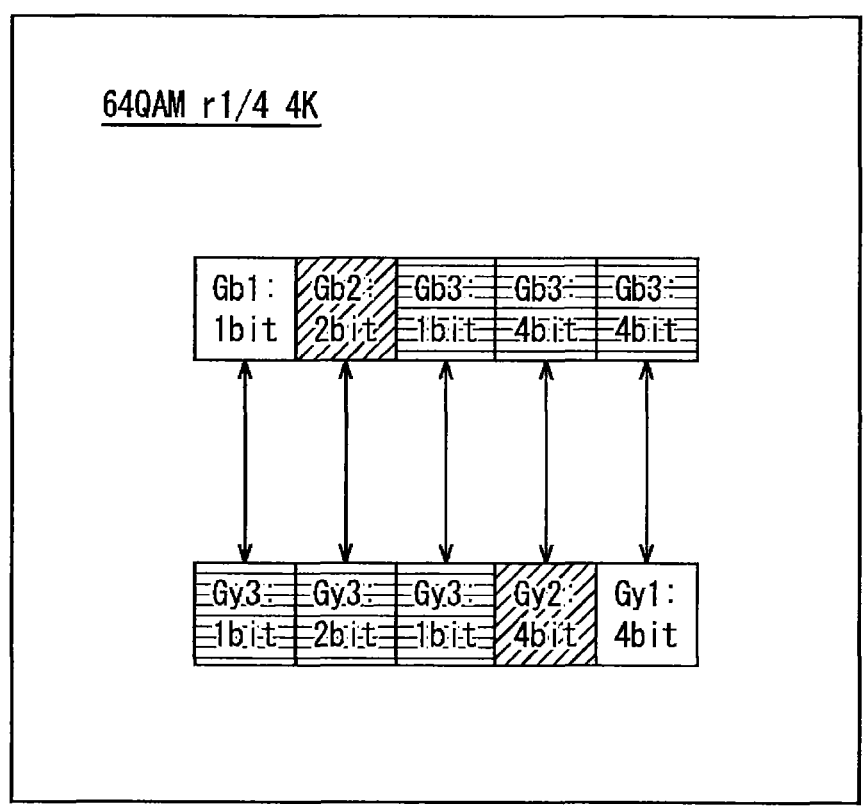
FIG. 54 is a diagram that illustrates an allocation rule in a case where an LDPC code having a code length of 4k and a coded rate of ¼ is modulated in 64 QAM, and the multiple b is two.
Figure 55:
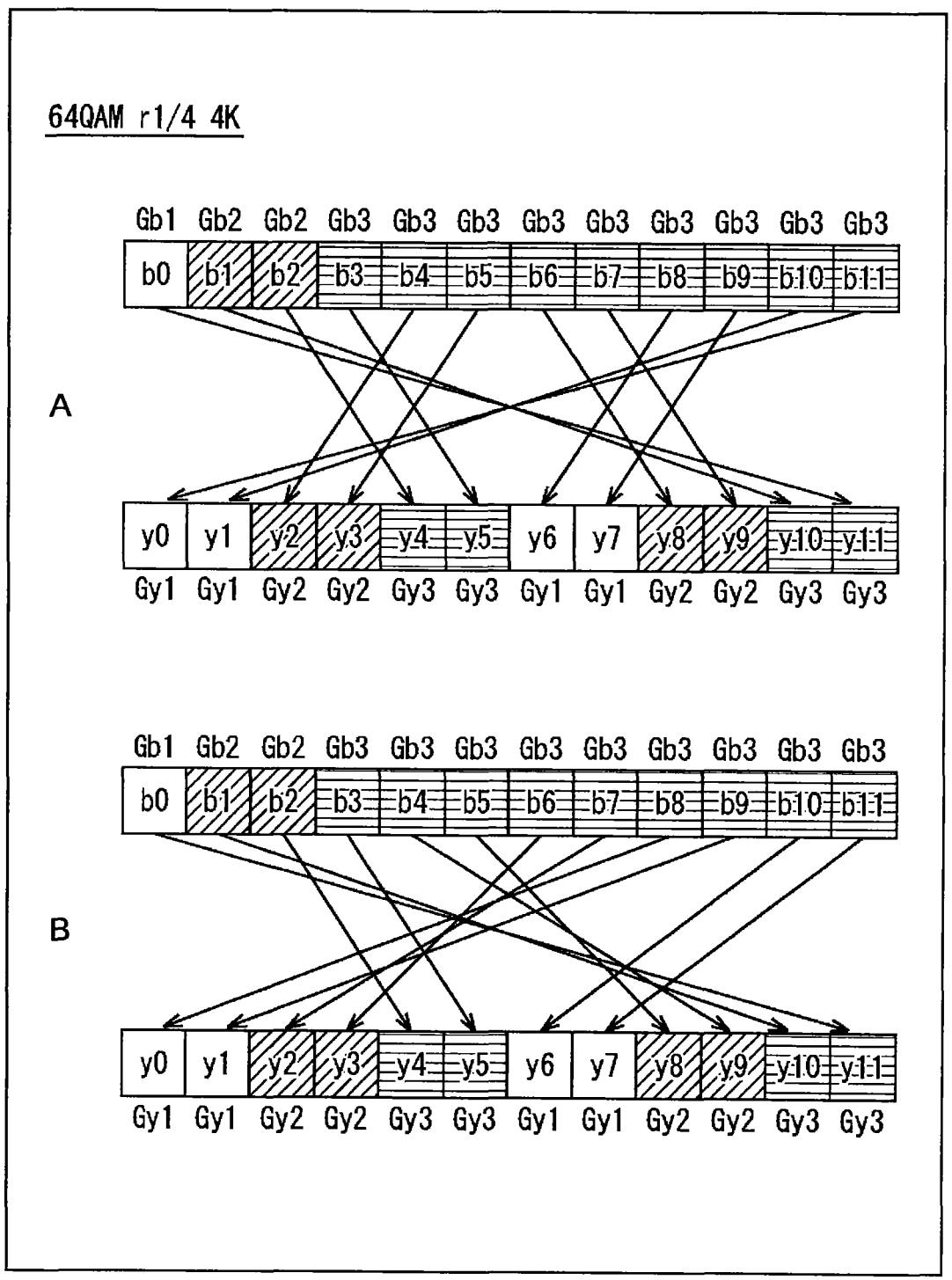
FIG. 55 is a diagram that illustrates the interchange of code bits according to the allocation rule in a case where an LDPC code having a code length of 4k and a coded rate of ¼ is modulated in 64 QAM, and the multiple b is two.

FIGS. 53 to 55 are diagrams illustrating the new interchange mode.

In the new interchange mode, the interchange unit 32 of the demultiplexer 25 performs the interchange of code bits of mb bits in accordance with an allocation rule determined in advance.

The allocation rule is a rule used for allocating code bits of an LDPC code to symbol bits. In the allocation rule, a group set that is a combination of a code bit group of code bits and a symbol bit group of symbol bits that allocates code bits of the code bit group, the code bit group of the group set, code bits of each symbol bit group, and the number of bits (hereinafter, also referred to as a group bit number) of the symbol bits are defined.

Here, between the code bits, as described above, there is a difference in the error probability, and there is a difference in the error probability also between the symbol bits. A code bit group is a group in which code bits are divided based on the error probability, and a symbol bit group is a group in which symbol bits are divided based on the error probability.

FIG. 53 is a diagram that illustrates code bit groups and symbol bit groups in a case where the LDPC code is a mobile LDPC code having a code length N of 4320 bits and a coded rate of ¼, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 53 based on differences in the error probability.

Here, a code bit group Gb#i is a group in which the error probability of code bits belonging to the code bit group Gb#i is good (low) as the suffix #i becomes smaller.

Hereinafter, the (#i+1)-th bit from the most significant bit of the code bits of mb bits read in the row direction from the memory 31 is represented as a bit b#i, and the (#i+1)-th bit from the most significant bit of symbol bits of mb bits of consecutive b symbols is represented as a bit y#i.

In A of FIG. 53, a code bit b0 belongs to the code bit group Gb1, code bits b1 and b2 belong to the code bit group Gb2, and code bits b3, b4, b5, b6, b7, b8, b9, b10, and b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 53, based on differences in the error probability.

Here, a symbol bit group Gy#i, similarly to the code bit groups, is a group in which the error probability of symbol bits belonging to the symbol bit group Gy#i is good as the suffix #i becomes smaller.

In B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

FIG. 54 illustrates an allocation rule in a case where the LDPC code is a mobile LDPC code having a code length N of 4320 bits and a coded rate of ¼, the modulation mode is 64 QAM, and the multiple b is 2.

In the allocation rule illustrated in FIG. 54, a combination of the code bit group Gb1 and the symbol bit group Gy3 is defined as one group set. In addition, the group bit number of the group set is defined as one bit.

Hereinafter, the group set and the group bit number are collectively referred to as group set information. In addition, for example, a group set of the code bit group Gb1 and the symbol bit group Gy3 and one bit that is the group bit number of the group set are written as group set information (Gb1, Gy3, 1).

In the allocation rule illustrated in FIG. 54, in addition to the group set information (Gb1, Gy3, 1), group set information (Gb2, Gy3, 2), (Gb3, Gy3, 1), (Gb3, Gy2, 4), and (Gb3, Gy1, 4) are defined.

For example, the group set information (Gb1, Gy3, 1) represents that one bit of code bits belonging to the code bit group Gb1 is allocated to one bit of symbol bits belonging to the symbol bit group Gy3.

Accordingly, in the allocation rule illustrated in FIG. 54, according to the group set information (Gb1, Gy3, 1), allocation of one bit of the code bits of the code bit group Gb1 of which the error probability is the best to one bit of the symbol bits of the symbol bit group Gy3 of which the error probability is third best is defined, according to the group set information (Gb2, Gy3, 2), allocation of two bits of the code bits of the code bit group Gb2 of which the error probability is second best to two bits of the symbol bits of the symbol bit group Gy3 of which the error probability is third best is defined, according to the group set information (Gb3, Gy3, 1), allocation of one bit of the code bits of the code bit group Gb3 of which the error probability is third best to one bit of the symbol bits of the symbol bit group Gy3 of which the error probability is third best is defined, according to the group set information (Gb3, Gy2, 4), allocation of four bits of the code bits of the code bit group Gb3 of which the error probability is third best to four bits of the symbol bits of the symbol bit group Gy2 of which the error probability is second best is defined, and, according to the group set information (Gb3, Gy1, 4), allocation of four bits of the code bits of the code bit group Gb3 of which the error probability is third best to four bits of the symbol bits of the symbol bit group Gy1 of which the error probability is the best is defined.

As described above, the code bit groups are groups in which code bits are divided based on the error probability, and the symbol bit groups are groups in which symbol bits are divided based on the error probability. Accordingly, the allocation rule can be regarded as defining a combination of an error probability of a code bit and an error probability of a symbol bit to which the code bit is allocated.

In this way, the allocation rule defining a combination of an error probability of a code bit and an error probability of a symbol bit to which the code bit is allocated, for example, is determined through a simulation of measuring the BER or the like such that the resistance to error (resistance to a noise) is improved.

In addition, even when an allocation destination of a code bit of a code bit group is changed within bits belonging to the same symbol bit group, the resistance to error is not (mostly) influenced.

Accordingly, in order to improve the resistance to error, group set information minimizing the BER (Bit Error Rate), in other words, a combination (group set) of a code bit group of code bits and a symbol bit group of symbol bits to which the code bits of the code bit group are allocated, code bit groups of the group set, code bit of each symbol bit group, and the number of bits (group bit numbers) of the symbol bits are defined as an allocation rule, and code bits may be interchanged in accordance with the allocation rule such that the code bits are allocated to the symbol bits.

However, a specific allocation method of allocating a specific code bit to a symbol bit according to the allocation rule needs to be determined in advance between the transmission device 11 and the reception device 12 (FIG. 7).

FIG. 55 illustrates an example of the interchange of code bits according to the allocation rule illustrated in FIG. 54.

In other words, A of FIG. 55 illustrates a first example of the interchange of code bits according to the allocation rule illustrated in FIG. 54 in a case where the LDPC code is a mobile LDPC code having a code length N of 4320 bits and a coded rate of ¼, the modulation mode is 64 QAM, and the multiple b is 2.

In a case where the LDPC code is a mobile LDPC code having a code length N of 4320 bits and a coded rate of ¼, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 54 such that the code bits b0 to b11 of 6×2 (=mb) bits read from the memory 31 are, for example, as illustrated in A of FIG. 55, allocated to symbol bits y0 to y11 of 6×2 (=mb) bits of two (=b) symbols.

In other words, the interchange unit 32 performs an interchange process in which:
the code bit b0 is allocated to the symbol bit y11;
the code bit b1 to the symbol bit y10;
the code bit b2 to the symbol bit y4;
the code bit b3 to the symbol bit y5;
the code bit b4 to the symbol bit y2;
the code bit b5 to the symbol bit y3;
the code bit b6 to the symbol bit y8;
the code bit b7 to the symbol bit y9;
the code bit b8 to the symbol bit y6;
the code bit b9 to the symbol bit y7;
the code bit b10 to the symbol bit y1; and
the code bit b11 to the symbol bit y0.

B of FIG. 55 illustrates a second example of the interchange of code bits according to the allocation rule illustrated in FIG. 54 in a case where the LDPC code is a mobile LDPC code having a code length N of 4320 bits and a coded rate of ¼, the modulation mode is 64 QAM, and the multiple b is 2.

As illustrated in B of FIG. 55, the interchange unit 32 performs an interchange process for code bits b0 to b11 of 6×2 (=mb) bits read from the memory 31, according to the allocation rule illustrated in FIG. 54, in which:
the code bit b0 is allocated to the symbol bit y11;
the code bit b1 to the symbol bit y10;
the code bit b2 to the symbol bit y4;
the code bit b3 to the symbol bit y5;
the code bit b4 to the symbol bit y9;
the code bit b5 to the symbol bit y8;
the code bit b6 to the symbol bit y3;
the code bit b7 to the symbol bit y2;
the code bit b8 to the symbol bit y0;
the code bit b9 to the symbol bit y1;
the code bit b10 to the symbol bit y6; and
the code bit b11 to the symbol bit y7.

Here, all the methods of allocating a code bit b#i to a symbol bit y#i illustrated in A of FIG. 55 and B of FIG. 55 are in accordance with the allocation rule (follow the allocation rule) illustrated in FIG. 54.

FIG. 56 is a diagram that illustrates code bit groups and symbol bit groups in a case where the LDPC code is a mobile LDPC code having a code length N of 4320 bits and a coded rate of ⅓, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 56 based on differences in the error probability.

In A of FIG. 56, a code bit b0 belongs to the code bit group Gb1, code bits b1 to b3 belong to the code bit group Gb2, and code bits b4 to b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 56, based on differences in the error probability.

In B of FIG. 56, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 57:
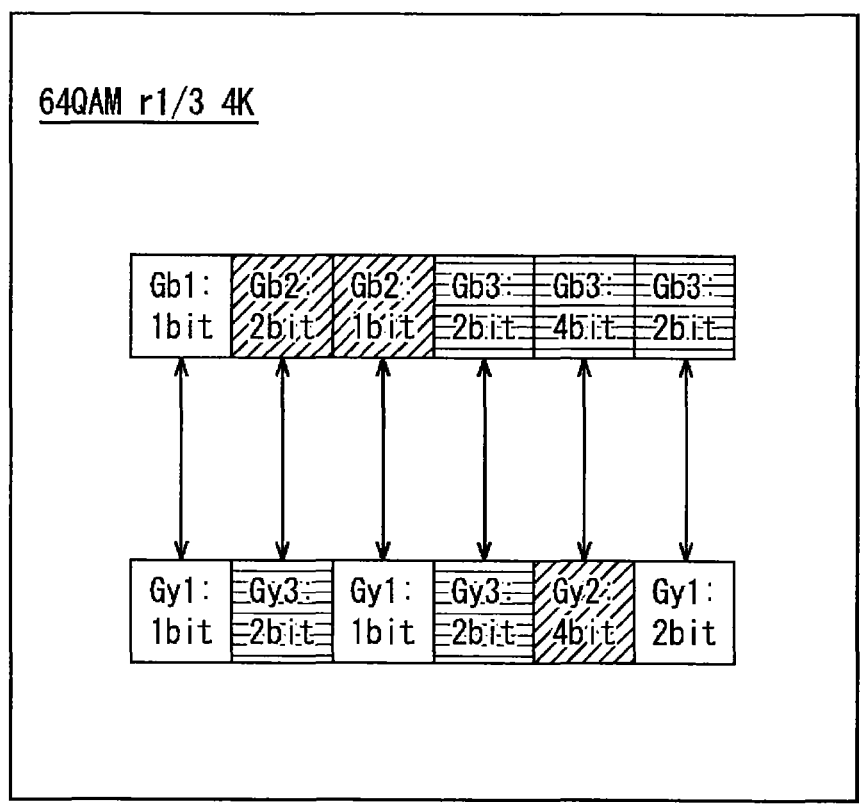
FIG. 57 is a diagram that illustrates an allocation rule in a case where an LDPC code having a code length of 4k and a coded rate of ⅓ is modulated in 64 QAM, and the multiple b is two.

FIG. 57 illustrates an allocation rule in a case where the LDPC code is a mobile LDPC code having a code length N of 4320 bits and a coded rate of ⅓, the modulation mode is 64 QAM, and the multiple b is 2.

In the allocation rule illustrated in FIG. 57, group set information (Gb1, Gy1, 1), (Gb2, Gy3, 2), (Gb2, Gy1, 1), (Gb3, Gy3, 2), (Gb3, Gy2, 4), and (Gb3, Gy1, 2) are defined.

In other words, in the allocation rule illustrated in FIG. 57, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy3, 2), allocation of two bits of the code bits of the code bit group Gb2 of which the error probability is second best to two bits of the symbol bits of the symbol bit group Gy3 of which the error probability is third best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb3, Gy3, 2), allocation of two bits of the code bits of the code bit group Gb3 of which the error probability is third best to two bits of the symbol bits of the symbol bit group Gy3 of which the error probability is third best is defined, according to the group set information (Gb3, Gy2, 4), allocation of four bits of the code bits of the code bit group Gb3 of which the error probability is third best to four bits of the symbol bits of the symbol bit group Gy2 of which the error probability is second best is defined, and, according to the group set information (Gb3, Gy1, 2), allocation of two bits of the code bits of the code bit group Gb3 of which the error probability is third best to two bits of the symbol bits of the symbol bit group Gy1 of which the error probability is the best is defined.

Figure 58:
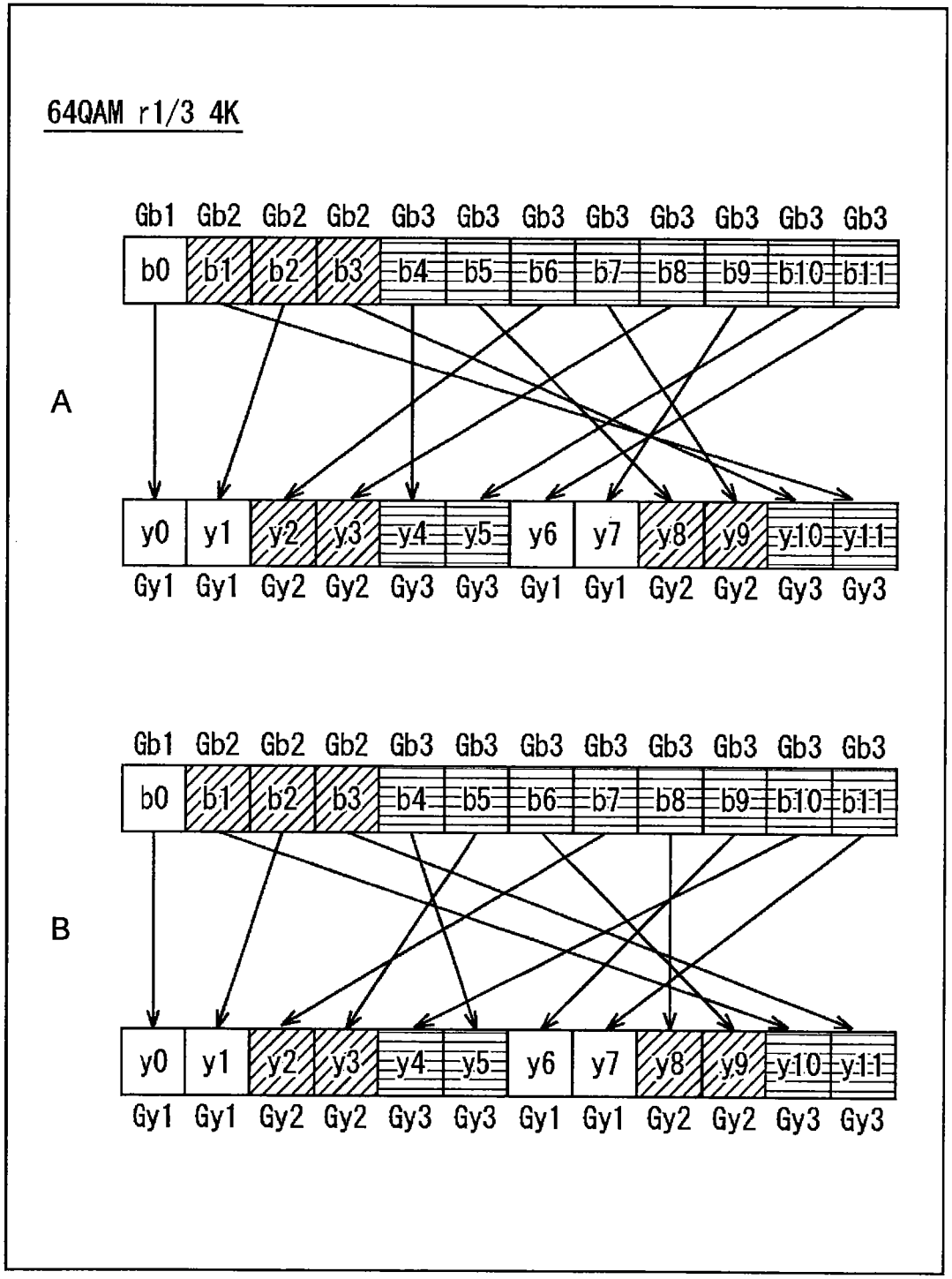
FIG. 58 is a diagram that illustrates the interchange of code bits according to the allocation rule in a case where an LDPC code having a code length of 4k and a coded rate of ⅓ is modulated in 64 QAM, and the multiple b is two.

FIG. 58 illustrates an example of the interchange of code bits according to the allocation rule illustrated in FIG. 57.

In other words, A of FIG. 58 illustrates a first example of the interchange of code bits according to the allocation rule illustrated in FIG. 57 in a case where the LDPC code is a mobile LDPC code having a code length N of 4320 bits and a coded rate of ⅓, the modulation mode is 64 QAM, and the multiple b is 2.

In a case where the LDPC code is a mobile LDPC code having a code length N of 4320 bits and a coded rate of ⅓, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 57 such that the code bits b0 to b11 of 6×2 (=mb) bits read from the memory 31 are, for example, as illustrated in A of FIG. 58, allocated to symbol bits y0 to y11 of 6×2 (=mb) bits of two (=b) symbols.

In other words, the interchange unit 32 performs an interchange process in which:
the code bit b0 is allocated to the symbol bit y0;
the code bit b1 to the symbol bit y11;
the code bit b2 to the symbol bit y1;
the code bit b3 to the symbol bit y10;
the code bit b4 to the symbol bit y4;
the code bit b5 to the symbol bit y8;
the code bit b6 to the symbol bit y2;
the code bit b7 to the symbol bit y9;
the code bit b8 to the symbol bit y3;
the code bit b9 to the symbol bit y7;
the code bit b10 to the symbol bit y5; and
the code bit b11 to the symbol bit y6.

B of FIG. 58 illustrates a second example of the interchange of code bits according to the allocation rule illustrated in FIG. 57 in a case where the LDPC code is a mobile LDPC code having a code length N of 4320 bits and a coded rate of ⅓, the modulation mode is 64 QAM, and the multiple b is 2.

As illustrated in B of FIG. 58, the interchange unit 32 performs an interchange process for code bits b0 to b11 of 6×2 (=mb) bits read from the memory 31, according to the allocation rule illustrated in FIG. 57, in which:
the code bit b0 is allocated to the symbol bit y0;
the code bit b1 to the symbol bit y10;
the code bit b2 to the symbol bit y1;
the code bit b3 to the symbol bit y11;
the code bit b4 to the symbol bit y5;
the code bit b5 to the symbol bit y3;
the code bit b6 to the symbol bit y9;
the code bit b7 to the symbol bit y2;
the code bit b8 to the symbol bit y8;
the code bit b9 to the symbol bit y6;
the code bit b10 to the symbol bit y4; and
the code bit b11 to the symbol bit y7.

Figure 59:
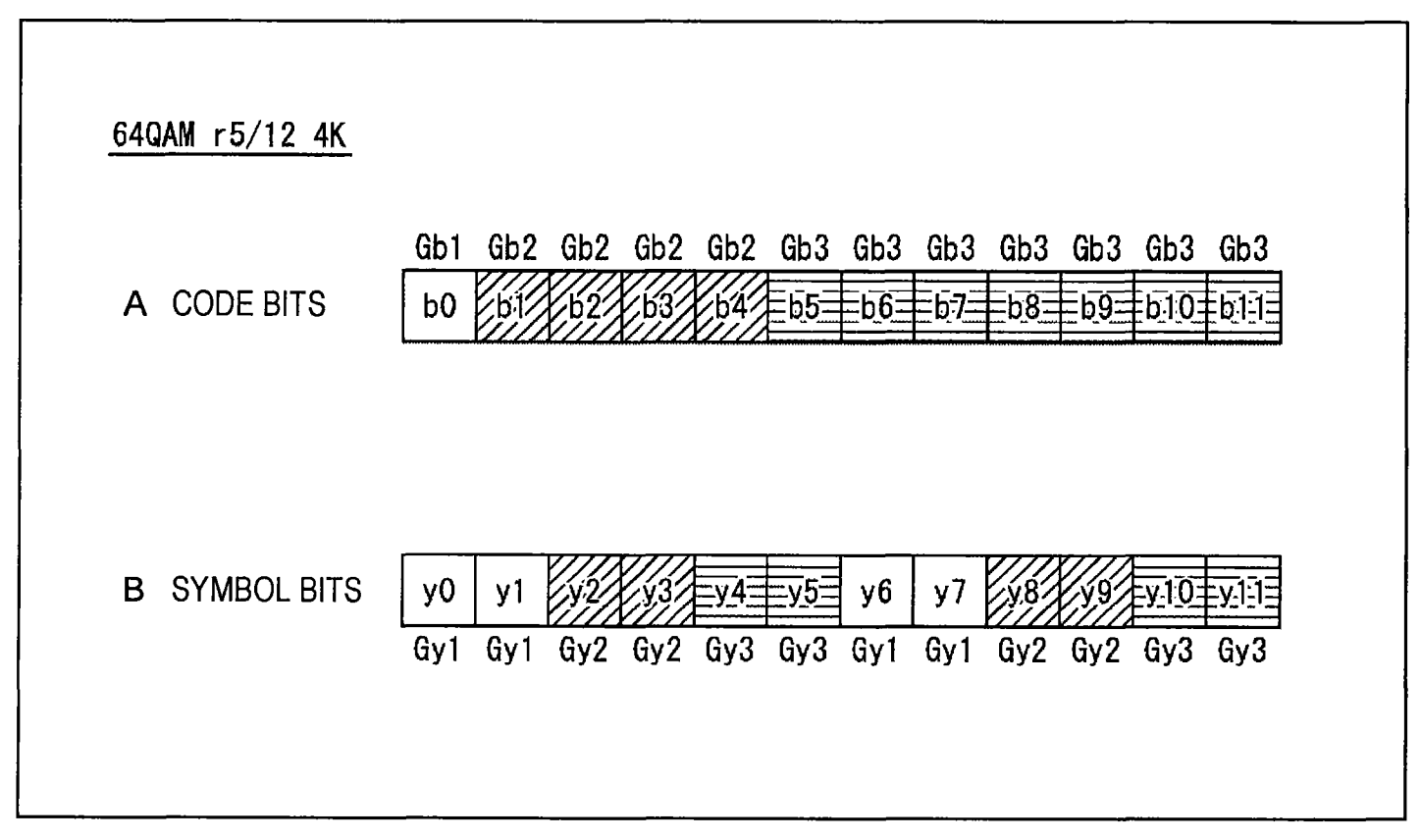

FIG. 59 is a diagram that illustrates code bit groups and symbol bit groups in a case where the LDPC code is a mobile LDPC code having a code length N of 4320 bits and a coded rate of 5/12, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 59 based on differences in the error probability.

In A of FIG. 59, a code bit b0 belongs to the code bit group Gb1, code bits b1 to b4 belong to the code bit group Gb2, and code bits b5 to b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 59, based on differences in the error probability.

In B of FIG. 59, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 60:
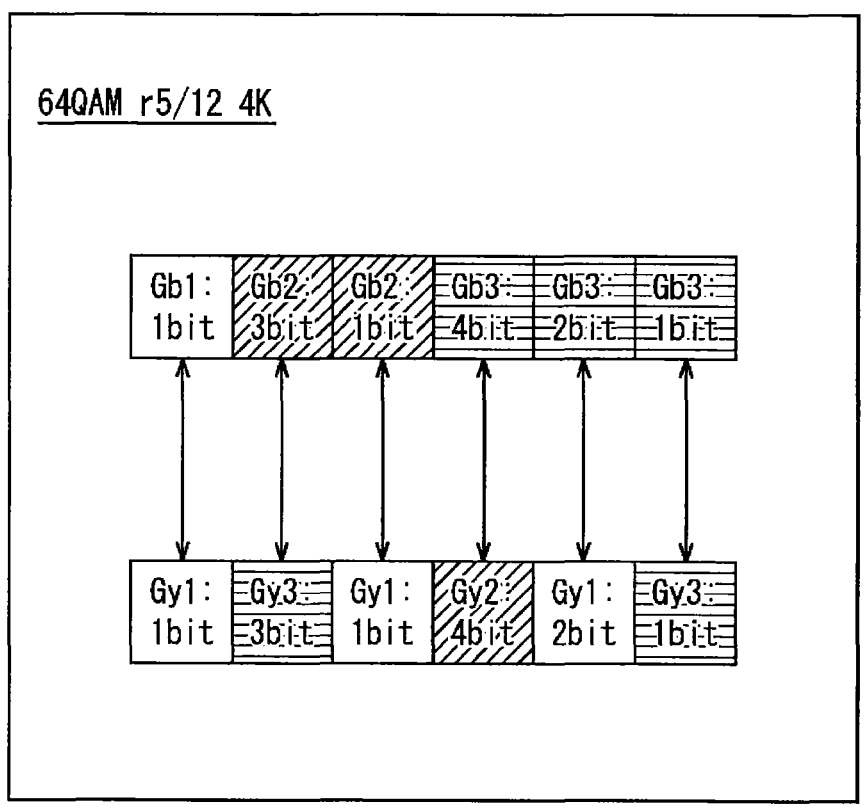
FIG. 60 is a diagram that illustrates an allocation rule in a case where an LDPC code having a code length of 4k and a coded rate of 5/12 is modulated in 64 QAM, and the multiple b is two.

FIG. 60 illustrates an allocation rule in a case where the LDPC code is a mobile LDPC code having a code length N of 4320 bits and a coded rate of 5/12, the modulation mode is 64 QAM, and the multiple b is 2.

In the allocation rule illustrated in FIG. 60, group set information (Gb1, Gy1, 1), (Gb2, Gy3, 3), (Gb2, Gy1, 1), (Gb3, Gy2, 4), (Gb3, Gy1, 2), and (Gb3, Gy3, 1) are defined.

In other words, in the allocation rule illustrated in FIG. 60, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy3, 3), allocation of three bits of the code bits of the code bit group Gb2 of which the error probability is second best to three bits of the symbol bits of the symbol bit group Gy3 of which the error probability is third best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb3, Gy2, 4), allocation of four bits of the code bits of the code bit group Gb3 of which the error probability is third best to four bits of the symbol bits of the symbol bit group Gy2 of which the error probability is second best is defined, according to the group set information (Gb3, Gy1, 2), allocation of two bits of the code bits of the code bit group Gb3 of which the error probability is third best to two bits of the symbol bits of the symbol bit group Gy1 of which the error probability is the best is defined, and, according to the group set information (Gb3, Gy3, 1), allocation of one bit of the code bits of the code bit group Gb3 of which the error probability is third best to one bit of the symbol bits of the symbol bit group Gy3 of which the error probability is third best is defined.

FIG. 61 illustrates an example of the interchange of code bits according to the allocation rule illustrated in FIG. 60.

In other words, A of FIG. 61 illustrates a first example of the interchange of code bits according to the allocation rule illustrated in FIG. 60 in a case where the LDPC code is a mobile LDPC code having a code length N of 4320 bits and a coded rate of 5/12, the modulation mode is 64 QAM, and the multiple b is 2.

In a case where the LDPC code is a mobile LDPC code having a code length N of 4320 bits and a coded rate of 5/12, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 60 such that the code bits b0 to b11 of 6×2 (=mb) bits read from the memory 31 are, for example, as illustrated in A of FIG. 61, allocated to symbol bits y0 to y11 of 6×2 (=mb) bits of two (=b) symbols.

In other words, the interchange unit 32 performs an interchange process in which:
the code bit b0 is allocated to the symbol bit y0;
the code bit b1 to the symbol bit y11;
the code bit b2 to the symbol bit y1;
the code bit b3 to the symbol bit y10;
the code bit b4 to the symbol bit y4;
the code bit b5 to the symbol bit y8;
the code bit b6 to the symbol bit y2;
the code bit b7 to the symbol bit y9;
the code bit b8 to the symbol bit y3;
the code bit b9 to the symbol bit y7;
the code bit b10 to the symbol bit y5; and
the code bit b11 to the symbol bit y6.

B of FIG. 61 illustrates a second example of the interchange of code bits according to the allocation rule illustrated in FIG. 60 in a case where the LDPC code is a mobile LDPC code having a code length N of 4320 bits and a coded rate of 5/12, the modulation mode is 64 QAM, and the multiple b is 2.

As illustrated in B of FIG. 61, the interchange unit 32 performs an interchange process for code bits b0 to b11 of 6×2 (=mb) bits read from the memory 31, according to the allocation rule illustrated in FIG. 60, in which:
the code bit b0 is allocated to the symbol bit y0;
the code bit b1 to the symbol bit y4;
the code bit b2 to the symbol bit y1;
the code bit b3 to the symbol bit y11;
the code bit b4 to the symbol bit y10;
the code bit b5 to the symbol bit y3;
the code bit b6 to the symbol bit y9;
the code bit b7 to the symbol bit y2;
the code bit b8 to the symbol bit y8;
the code bit b9 to the symbol bit y6;
the code bit b10 to the symbol bit y5; and
the code bit b11 to the symbol bit y7.

FIG. 62 is a diagram that illustrates code bit groups and symbol bit groups in a case where the LDPC code is a mobile LDPC code having a code length N of 4320 bits and a coded rate of ½, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 62 based on differences in the error probability.

In A of FIG. 62, a code bit b0 belongs to the code bit group Gb1, code bits b1 to b5 belong to the code bit group Gb2, and code bits b6 to b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 62, based on differences in the error probability.

In B of FIG. 62, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 63:
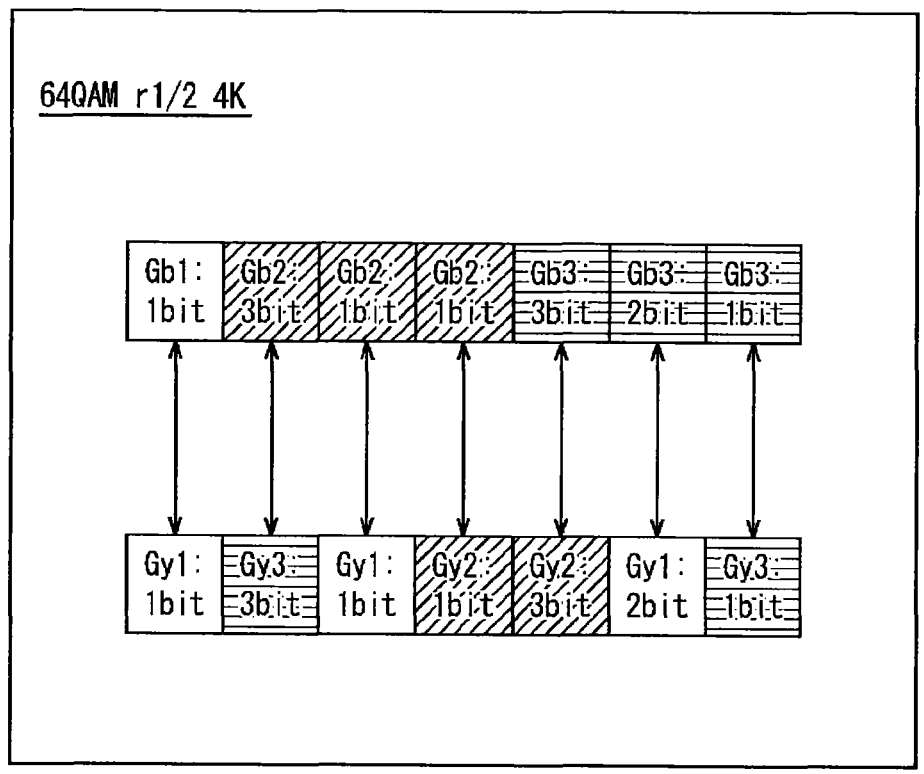
FIG. 63 is a diagram that illustrates an allocation rule in a case where an LDPC code having a code length of 4k and a coded rate of ½ is modulated in 64 QAM, and the multiple b is two.

FIG. 63 illustrates an allocation rule in a case where the LDPC code is a mobile LDPC code having a code length N of 4320 bits and a coded rate of ½, the modulation mode is 64 QAM, and the multiple b is 2.

In the allocation rule illustrated in FIG. 63, group set information (Gb1, Gy1, 1), (Gb2, Gy3, 3), (Gb2, Gy1, 1), (Gb2, Gy2, 1), (Gb3, Gy2, 3), (Gb3, Gy1, 2), and (Gb3, Gy3, 1) are defined.

In other words, in the allocation rule illustrated in FIG. 63, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy3, 3), allocation of three bits of the code bits of the code bit group Gb2 of which the error probability is second best to three bits of the symbol bits of the symbol bit group Gy3 of which the error probability is third best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb3, Gy2, 3), allocation of three bits of the code bits of the code bit group Gb3 of which the error probability is third best to three bits of the symbol bits of the symbol bit group Gy2 of which the error probability is second best is defined, according to the group set information (Gb3, Gy1, 2), allocation of two bits of the code bits of the code bit group Gb3 of which the error probability is third best to two bits of the symbol bits of the symbol bit group Gy1 of which the error probability is the best is defined, and, according to the group set information (Gb3, Gy3, 1), allocation of one bit of the code bits of the code bit group Gb3 of which the error probability is third best to one bit of the symbol bits of the symbol bit group Gy3 of which the error probability is third best is defined.

Figure 64:
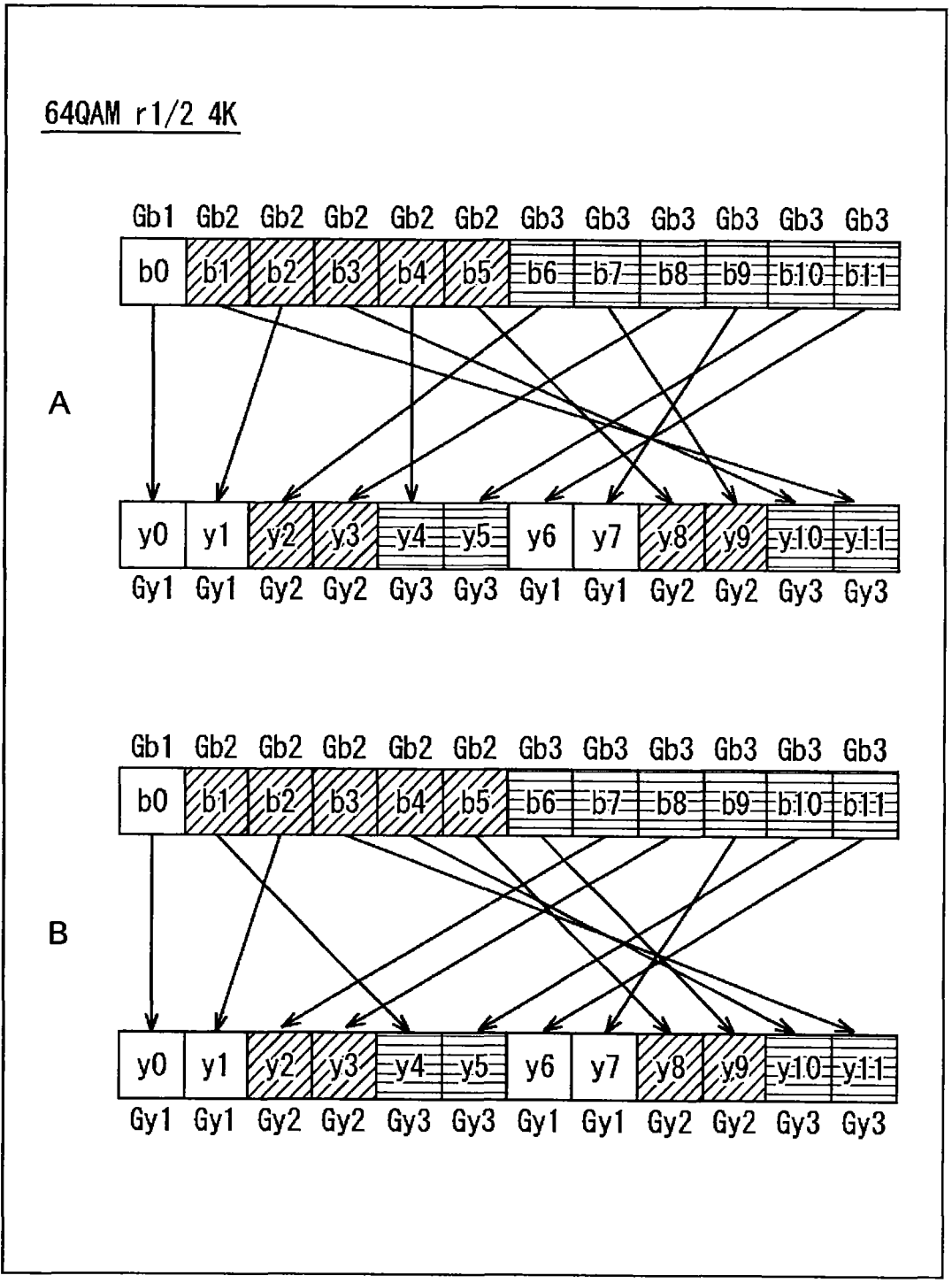
FIG. 64 is a diagram that illustrates the interchange of code bits according to the allocation rule in a case where an LDPC code having a code length of 4k and a coded rate of ½ is modulated in 64 QAM, and the multiple b is two.

FIG. 64 illustrates an example of the interchange of code bits according to the allocation rule illustrated in FIG. 63.

In other words, A of FIG. 64 illustrates a first example of the interchange of code bits according to the allocation rule illustrated in FIG. 63 in a case where the LDPC code is a mobile LDPC code having a code length N of 4320 bits and a coded rate of ½, the modulation mode is 64 QAM, and the multiple b is 2.

In a case where the LDPC code is a mobile LDPC code having a code length N of 4320 bits and a coded rate of ½, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 63 such that the code bits b0 to b11 of 6×2 (=mb) bits read from the memory 31 are, for example, as illustrated in A of FIG. 64, allocated to symbol bits y0 to y11 of 6×2 (=mb) bits of two (=b) symbols.

In other words, the interchange unit 32 performs an interchange process in which:
the code bit b0 is allocated to the symbol bit y0;
the code bit b1 to the symbol bit y11;
the code bit b2 to the symbol bit y1;
the code bit b3 to the symbol bit y10;
the code bit b4 to the symbol bit y4;
the code bit b5 to the symbol bit y8;
the code bit b6 to the symbol bit y2;
the code bit b7 to the symbol bit y9;
the code bit b8 to the symbol bit y3;
the code bit b9 to the symbol bit y7;
the code bit b10 to the symbol bit y5; and
the code bit b11 to the symbol bit y6.

B of FIG. 64 illustrates a second example of the interchange of code bits according to the allocation rule illustrated in FIG. 63 in a case where the LDPC code is a mobile LDPC code having a code length N of 4320 bits and a coded rate of ½, the modulation mode is 64 QAM, and the multiple b is 2.

As illustrated in B of FIG. 64, the interchange unit 32 performs an interchange process for code bits b0 to b11 of 6×2 (=mb) bits read from the memory 31, according to the allocation rule illustrated in FIG. 63, in which:
the code bit b0 is allocated to the symbol bit y0;
the code bit b1 to the symbol bit y4;
the code bit b2 to the symbol bit y1;
the code bit b3 to the symbol bit y11;
the code bit b4 to the symbol bit y10;
the code bit b5 to the symbol bit y8;
the code bit b6 to the symbol bit y9;
the code bit b7 to the symbol bit y2;
the code bit b8 to the symbol bit y3;
the code bit b9 to the symbol bit y7;
the code bit b10 to the symbol bit y5; and
the code bit b11 to the symbol bit y6.

Figure 65:
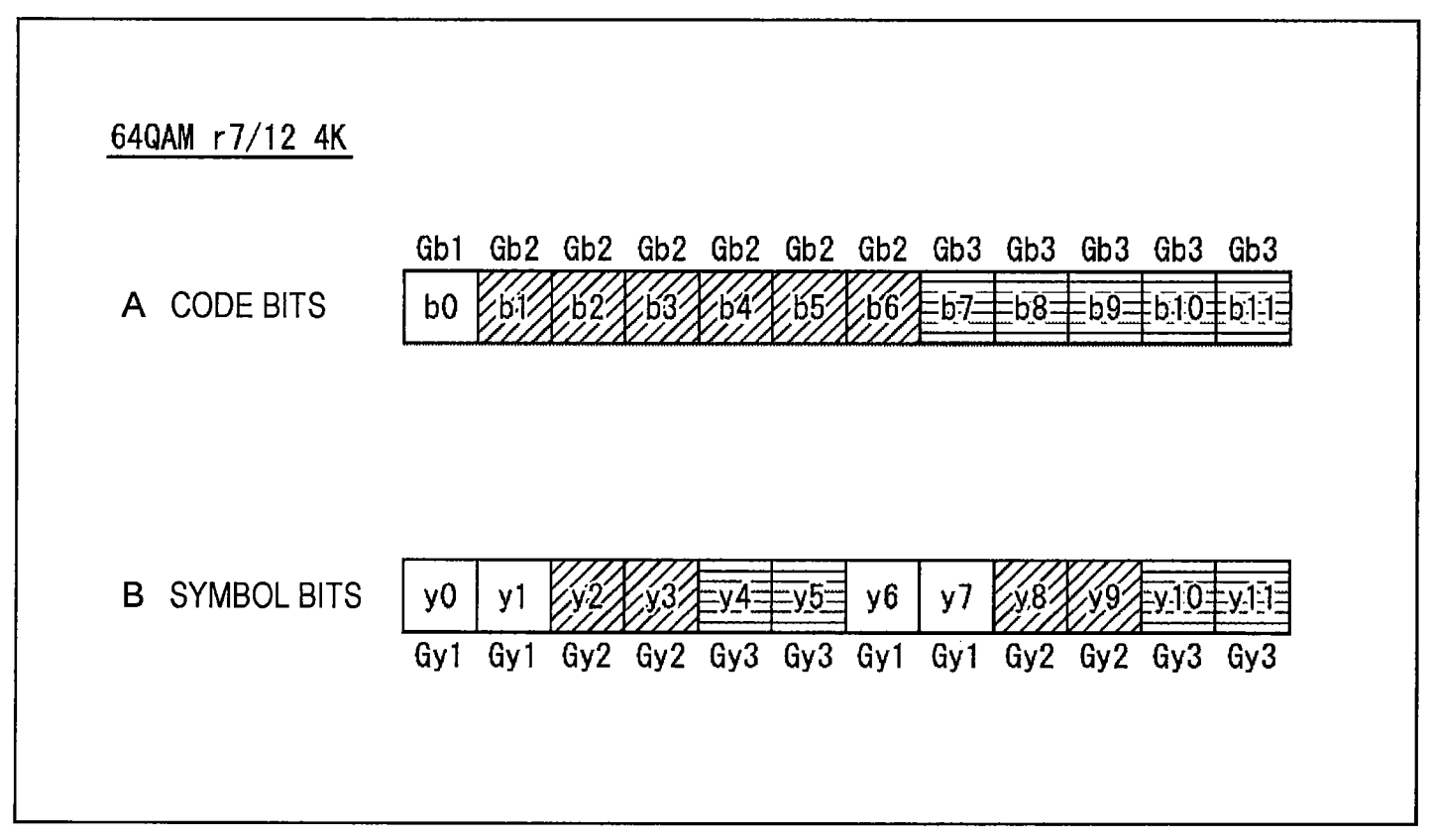

FIG. 65 is a diagram that illustrates code bit groups and symbol bit groups in a case where the LDPC code is a mobile LDPC code having a code length N of 4320 bits and a coded rate of 7/12, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 65 based on differences in the error probability.

In A of FIG. 65, a code bit b0 belongs to the code bit group Gb1, code bits b1 to b6 belong to the code bit group Gb2, and code bits b7 to b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 65, based on differences in the error probability.

In B of FIG. 65, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 66:
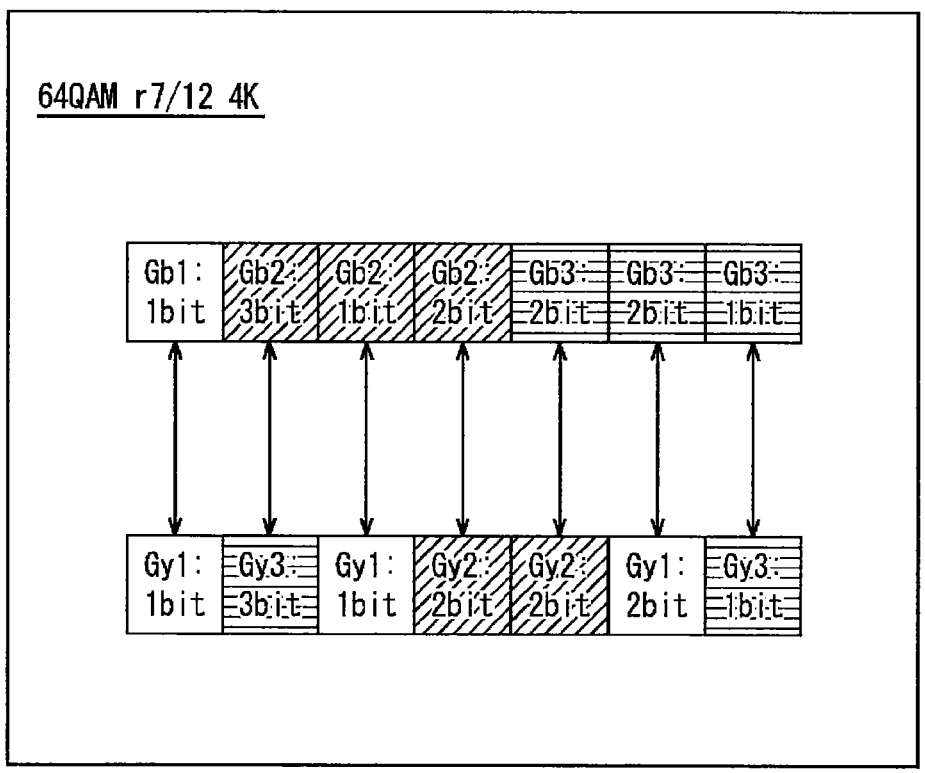
FIG. 66 is a diagram that illustrates an allocation rule in a case where an LDPC code having a code length of 4k and a coded rate of 7/12 is modulated in 64 QAM, and the multiple b is two.

FIG. 66 illustrates an allocation rule in a case where the LDPC code is a mobile LDPC code having a code length N of 4320 bits and a coded rate of 7/12, the modulation mode is 64 QAM, and the multiple b is 2.

In the allocation rule illustrated in FIG. 66, group set information (Gb1, Gy1, 1), (Gb2, Gy3, 3), (Gb2, Gy1, 1), (Gb2, Gy2, 2), (Gb3, Gy2, 2), (Gb3, Gy1, 2), and (Gb3, Gy3, 1) are defined.

In other words, in the allocation rule illustrated in FIG. 66, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy3, 3), allocation of three bits of the code bits of the code bit group Gb2 of which the error probability is second best to three bits of the symbol bits of the symbol bit group Gy3 of which the error probability is third best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb2, Gy2, 2), allocation of two bits of the code bits of the code bit group Gb2 of which the error probability is second best to two bits of the symbol bits of the symbol bit group Gy2 of which the error probability is second best is defined, according to the group set information (Gb3, Gy2, 2), allocation of two bits of the code bits of the code bit group Gb3 of which the error probability is third best to two bits of the symbol bits of the symbol bit group Gy2 of which the error probability is second best is defined, according to the group set information (Gb3, Gy1, 2), allocation of two bits of the code bits of the code bit group Gb3 of which the error probability is third best to two bits of the symbol bits of the symbol bit group Gy1 of which the error probability is the best is defined, and, according to the group set information (Gb3, Gy3, 1), allocation of one bit of the code bits of the code bit group Gb3 of which the error probability is third best to one bit of the symbol bits of the symbol bit group Gy3 of which the error probability is third best is defined.

Figure 67:
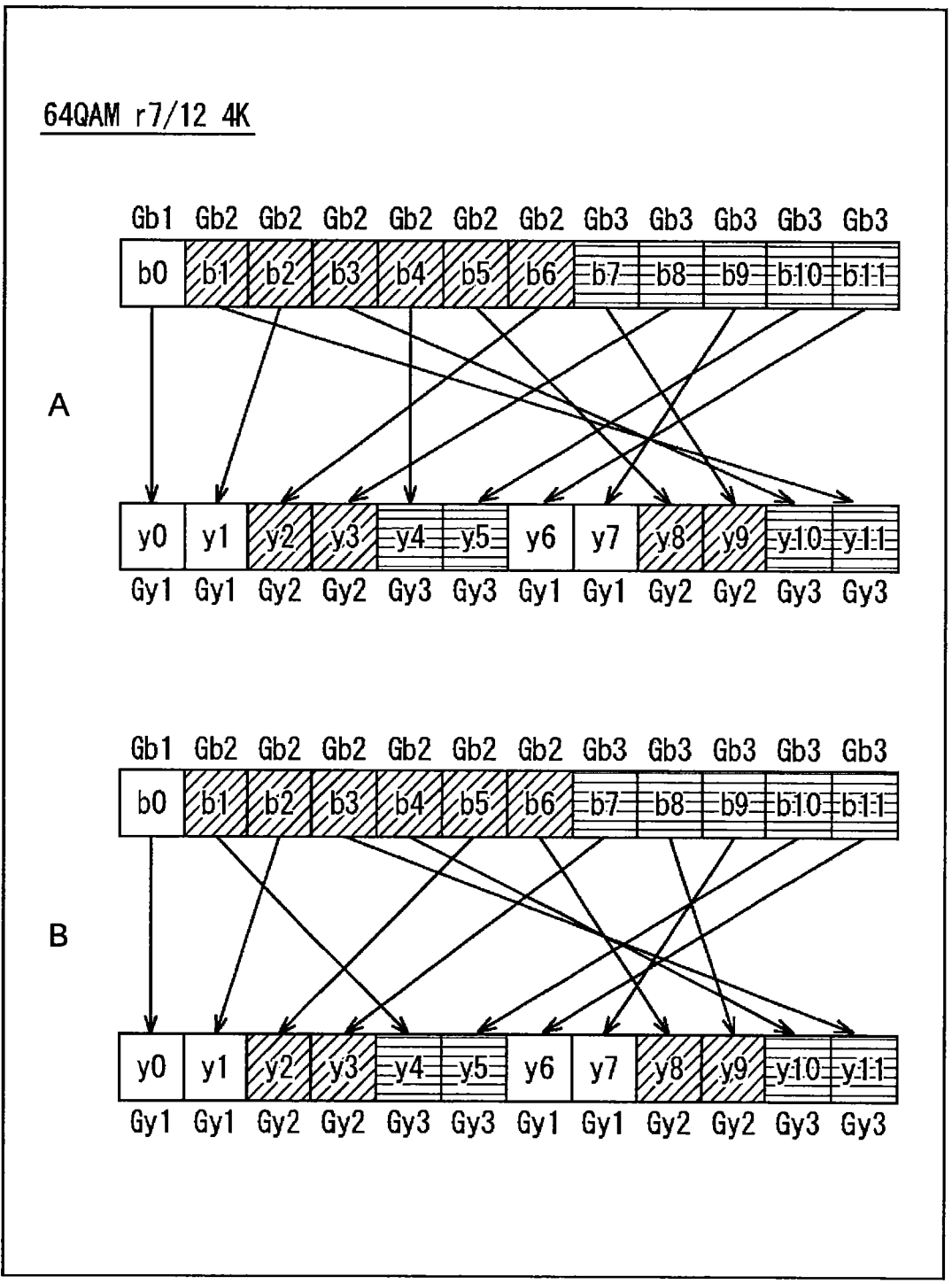
FIG. 67 is a diagram that illustrates the interchange of code bits according to the allocation rule in a case where an LDPC code having a code length of 4k and a coded rate of 7/12 is modulated in 64 QAM, and the multiple b is two.

FIG. 67 illustrates an example of the interchange of code bits according to the allocation rule illustrated in FIG. 66.

In other words, A of FIG. 67 illustrates a first example of the interchange of code bits according to the allocation rule illustrated in FIG. 66 in a case where the LDPC code is a mobile LDPC code having a code length N of 4320 bits and a coded rate of 7/12, the modulation mode is 64 QAM, and the multiple b is 2.

In a case where the LDPC code is a mobile LDPC code having a code length N of 4320 bits and a coded rate of 7/12, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 66 such that the code bits b0 to b11 of 6×2 (=mb) bits read from the memory 31 are, for example, as illustrated in A of FIG. 67, allocated to symbol bits y0 to y11 of 6×2 (=mb) bits of two (=b) symbols.

In other words, the interchange unit 32 performs an interchange process in which:
the code bit b0 is allocated to the symbol bit y0;
the code bit b1 to the symbol bit y11;
the code bit b2 to the symbol bit y1;
the code bit b3 to the symbol bit y10;
the code bit b4 to the symbol bit y4;
the code bit b5 to the symbol bit y8;
the code bit b6 to the symbol bit y2;
the code bit b7 to the symbol bit y9;
the code bit b8 to the symbol bit y3;
the code bit b9 to the symbol bit y7;
the code bit b10 to the symbol bit y5; and
the code bit b11 to the symbol bit y6.

B of FIG. 67 illustrates a second example of the interchange of code bits according to the allocation rule illustrated in FIG. 66 in a case where the LDPC code is a mobile LDPC code having a code length N of 4320 bits and a coded rate of 7/12, the modulation mode is 64 QAM, and the multiple b is 2.

As illustrated in B of FIG. 67, the interchange unit 32 performs an interchange process for code bits b0 to b11 of 6×2 (=mb) bits read from the memory 31, according to the allocation rule illustrated in FIG. 66, in which:
the code bit b0 is allocated to the symbol bit y0;
the code bit b1 to the symbol bit y4;
the code bit b2 to the symbol bit y1;
the code bit b3 to the symbol bit y11;
the code bit b4 to the symbol bit y10;
the code bit b5 to the symbol bit y2;
the code bit b6 to the symbol bit y8;
the code bit b7 to the symbol bit y3;
the code bit b8 to the symbol bit y9;
the code bit b9 to the symbol bit y7;
the code bit b10 to the symbol bit y5; and
the code bit b11 to the symbol bit y6.

Figure 68:
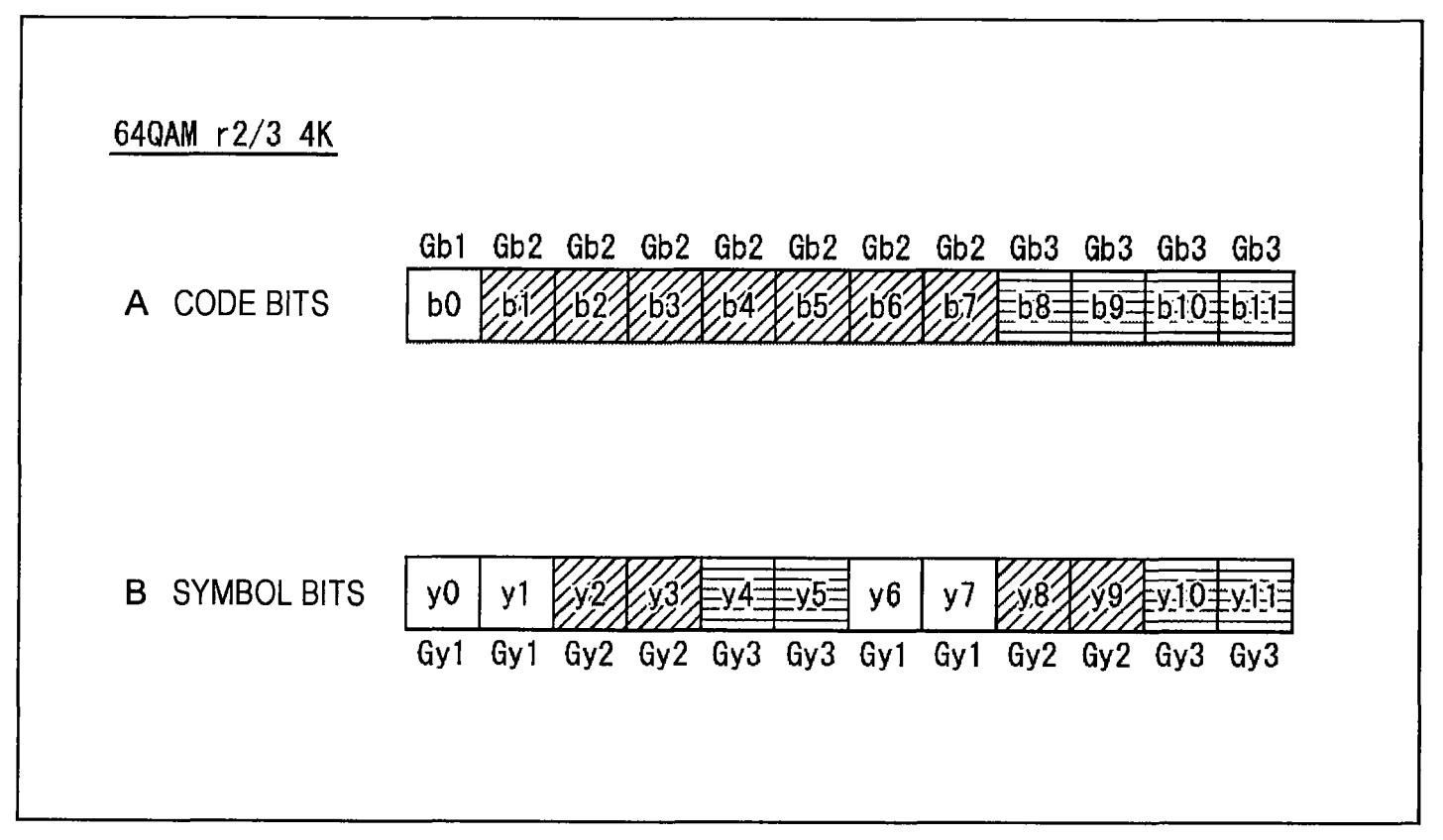

FIG. 68 is a diagram that illustrates code bit groups and symbol bit groups in a case where the LDPC code is a mobile LDPC code having a code length N of 4320 bits and a coded rate of 2/3, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 68 based on differences in the error probability.

In A of FIG. 68, a code bit b0 belongs to the code bit group Gb1, code bits b1 to b7 belong to the code bit group Gb2, and code bits b8 to b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 68, based on differences in the error probability.

In B of FIG. 68, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 69:
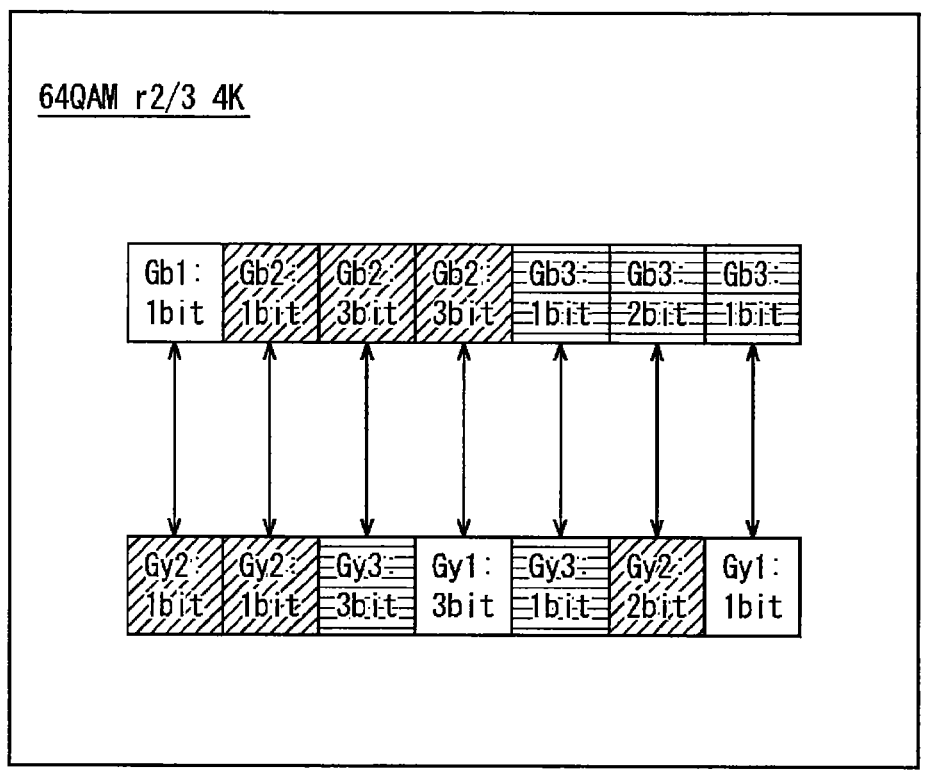
FIG. 69 is a diagram that illustrates an allocation rule in a case where an LDPC code having a code length of 4k and a coded rate of 2/3 is modulated in 64 QAM, and the multiple b is two.

FIG. 69 illustrates an allocation rule in a case where the LDPC code is a mobile LDPC code having a code length N of 4320 bits and a coded rate of 2/3, the modulation mode is 64 QAM, and the multiple b is 2.

In the allocation rule illustrated in FIG. 69, group set information (Gb1, Gy2, 1), (Gb2, Gy2, 1), (Gb2, Gy3, 3), (Gb2, Gy1, 3), (Gb3, Gy3, 1), (Gb3, Gy2, 2), and (Gb3, Gy1, 1) are defined.

In other words, in the allocation rule illustrated in FIG. 69, according to the group set information (Gb1, Gy2, 1), allocation of one bit of the code bits of the code bit group Gb1 of which the error probability is the best to one bit of the symbol bits of the symbol bit group Gy2 of which the error probability is second best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb2, Gy3, 3), allocation of three bits of the code bits of the code bit group Gb2 of which the error probability is second best to three bits of the symbol bits of the symbol bit group Gy3 of which the error probability is third best is defined, according to the group set information (Gb2, Gy1, 3), allocation of three bits of the code bits of the code bit group Gb2 of which the error probability is second best to three bits of the symbol bits of the symbol bit group Gy1 of which the error probability is the best is defined, according to the group set information (Gb3, Gy3, 1), allocation of one bit of the code bits of the code bit group Gb3 of which the error probability is third best to one bit of the symbol bits of the symbol bit group Gy3 of which the error probability is third best is defined, according to the group set information (Gb3, Gy2, 2), allocation of two bits of the code bits of the code bit group Gb3 of which the error probability is third best to two bits of the symbol bits of the symbol bit group Gy2 of which the error probability is second best is defined, and, according to the group set information (Gb3, Gy1, 1), allocation of one bit of the code bits of the code bit group Gb3 of which the error probability is third best to one bit of the symbol bits of the symbol bit group Gy1 of which the error probability is the best is defined.

Figure 70:
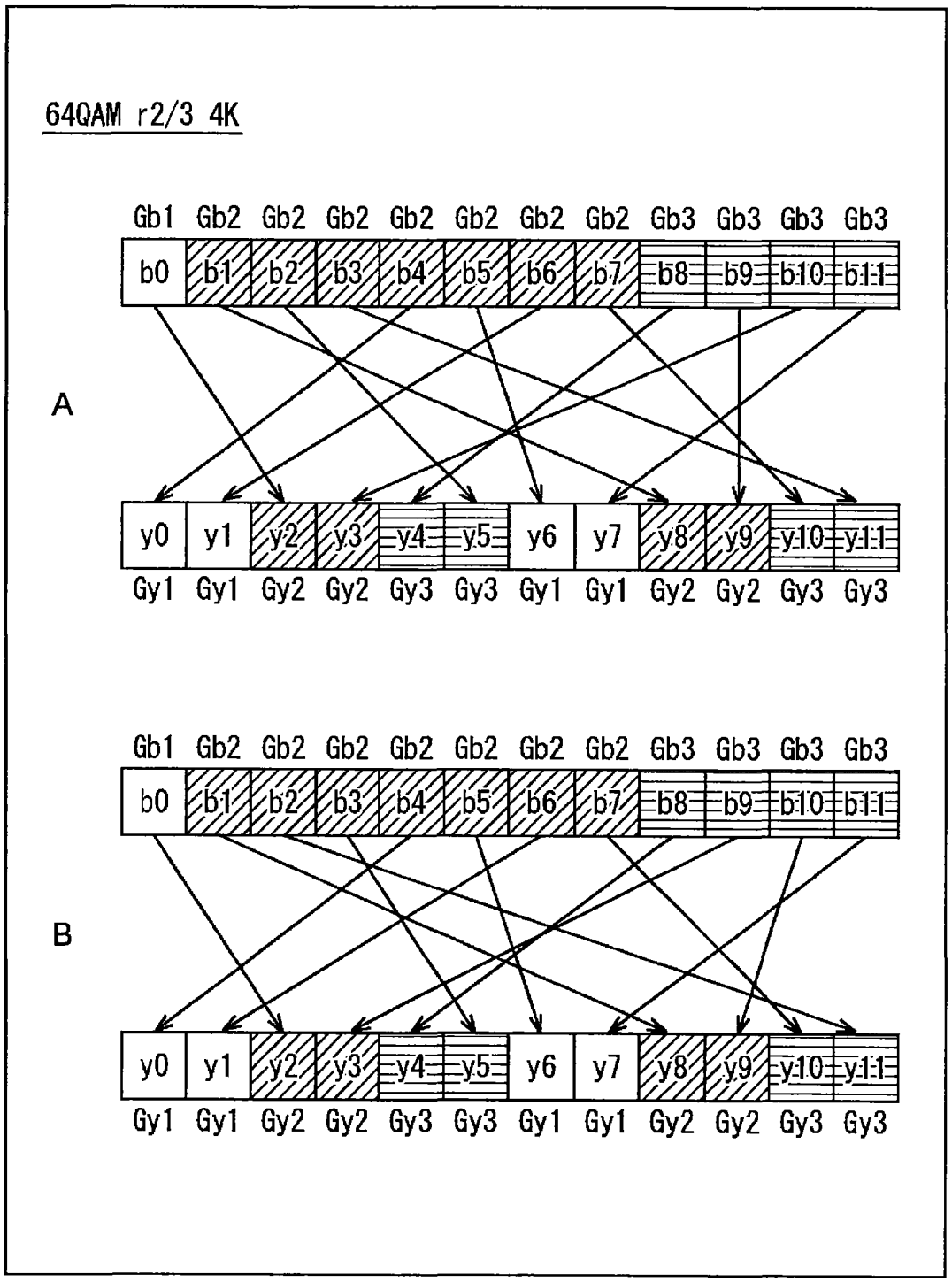
FIG. 70 is a diagram that illustrates the interchange of code bits according to the allocation rule in a case where an LDPC code having a code length of 4k and a coded rate of 2/3 is modulated in 64 QAM, and the multiple b is two.

FIG. 70 illustrates an example of the interchange of code bits according to the allocation rule illustrated in FIG. 69.

In other words, A of FIG. 70 illustrates a first example of the interchange of code bits according to the allocation rule illustrated in FIG. 69 in a case where the LDPC code is a mobile LDPC code having a code length N of 4320 bits and a coded rate of 2/3, the modulation mode is 64 QAM, and the multiple b is 2.

In a case where the LDPC code is a mobile LDPC code having a code length N of 4320 bits and a coded rate of 2/3, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 69 such that the code bits b0 to b11 of 6×2 (=mb) bits read from the memory 31 are, for example, as illustrated in A of FIG. 70, allocated to symbol bits y0 to y11 of 6×2 (=mb) bits of two (=b) symbols.

In other words, the interchange unit 32 performs an interchange process in which:
the code bit b0 is allocated to the symbol bit y2;
the code bit b1 to the symbol bit y8;
the code bit b2 to the symbol bit y5;
the code bit b3 to the symbol bit y11;
the code bit b4 to the symbol bit y0;
the code bit b5 to the symbol bit y6;
the code bit b6 to the symbol bit y1;
the code bit b7 to the symbol bit y10;
the code bit b8 to the symbol bit y4;
the code bit b9 to the symbol bit y9;
the code bit b10 to the symbol bit y3; and
the code bit b11 to the symbol bit y7.

B of FIG. 70 illustrates a second example of the interchange of code bits according to the allocation rule illustrated in FIG. 69 in a case where the LDPC code is a mobile LDPC code having a code length N of 4320 bits and a coded rate of ⅔, the modulation mode is 64 QAM, and the multiple b is 2.

As illustrated in B of FIG. 70, the interchange unit 32 performs an interchange process for code bits b0 to b11 of 6×2 (=mb) bits read from the memory 31, according to the allocation rule illustrated in FIG. 69, in which:
the code bit b0 is allocated to the symbol bit y2;
the code bit b1 to the symbol bit y8;
the code bit b2 to the symbol bit y11;
the code bit b3 to the symbol bit y5;
the code bit b4 to the symbol bit y0;
the code bit b5 to the symbol bit y6;
the code bit b6 to the symbol bit y1;
the code bit b7 to the symbol bit y10;
the code bit b8 to the symbol bit y4;
the code bit b9 to the symbol bit y3;
the code bit b10 to the symbol bit y9; and
the code bit b11 to the symbol bit y7.

Figure 71:
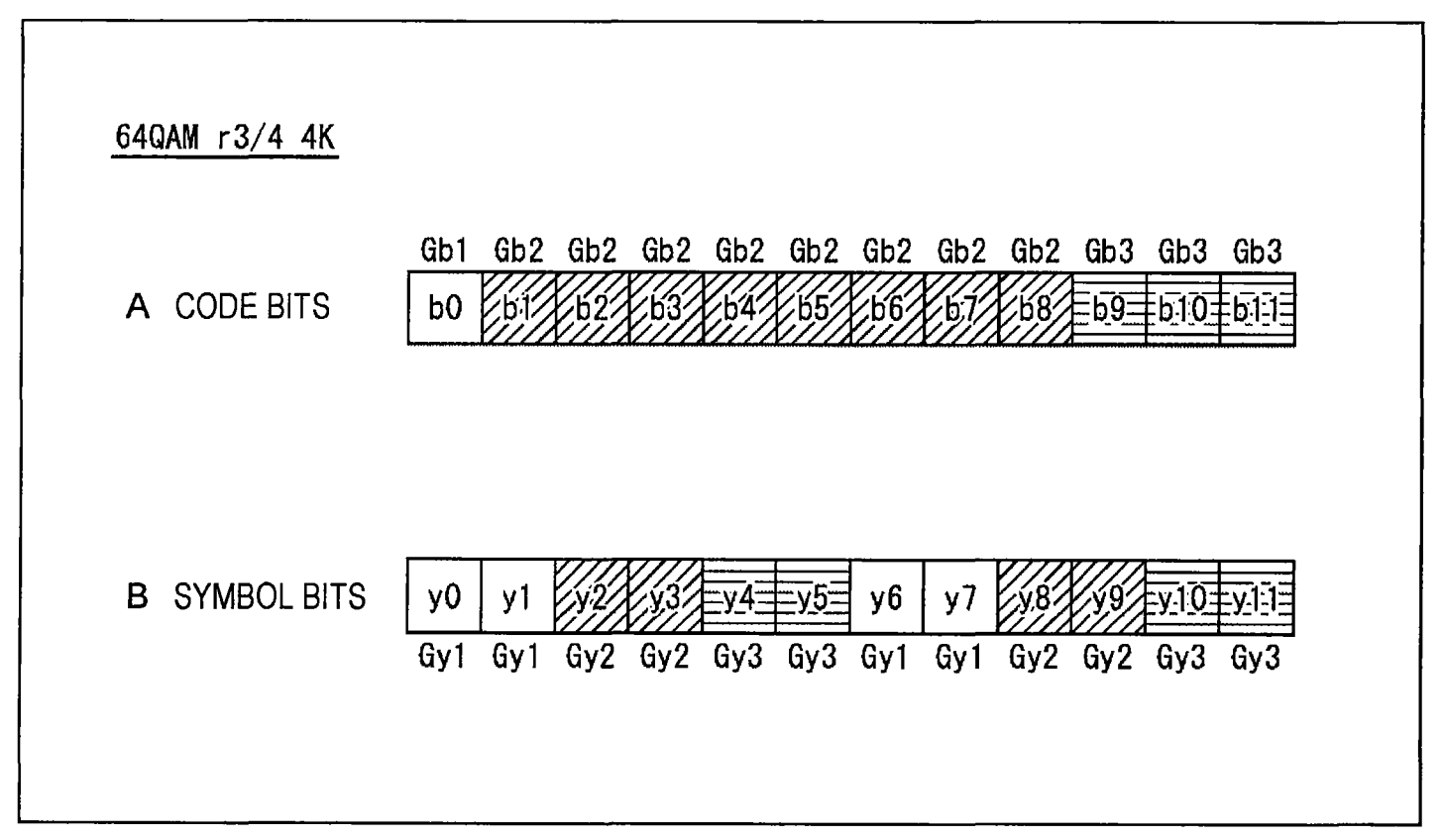

FIG. 71 is a diagram that illustrates code bit groups and symbol bit groups in a case where the LDPC code is a mobile LDPC code having a code length N of 4320 bits and a coded rate of ¾, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 71 based on differences in the error probability.

In A of FIG. 71, a code bit b0 belongs to the code bit group Gb1, code bits b1 to b8 belong to the code bit group Gb2, and code bits b9 to b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 71, based on differences in the error probability.

In B of FIG. 71, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 72:
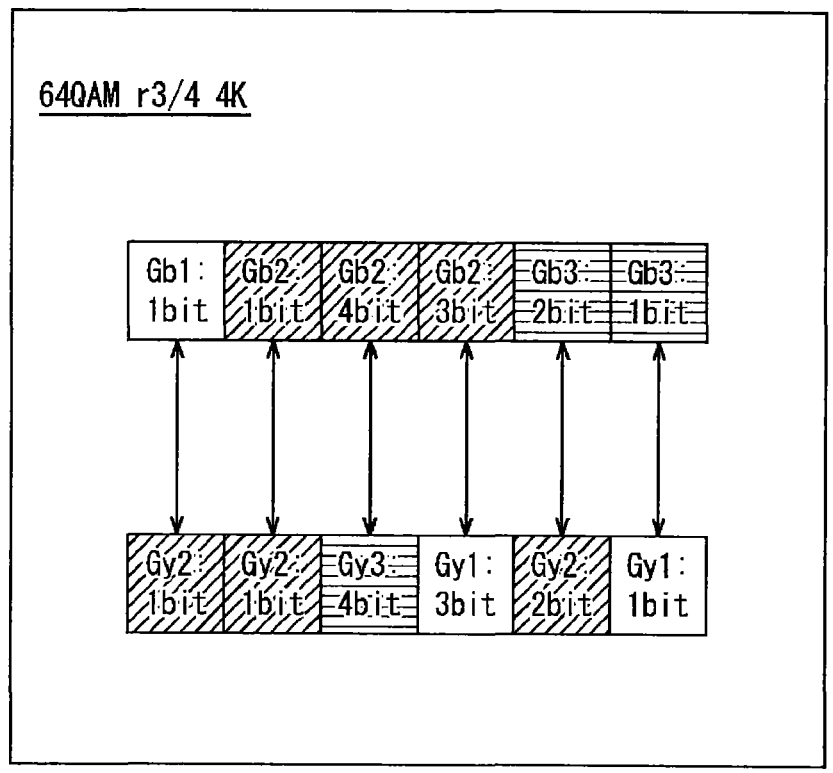
FIG. 72 is a diagram that illustrates an allocation rule in a case where an LDPC code having a code length of 4k and a coded rate of 3/4 is modulated in 64 QAM, and the multiple b is two.

FIG. 72 illustrates an allocation rule in a case where the LDPC code is a mobile LDPC code having a code length N of 4320 bits and a coded rate of ¾, the modulation mode is 64 QAM, and the multiple b is 2.

In the allocation rule illustrated in FIG. 72, group set information (Gb1, Gy2, 1), (Gb2, Gy2, 1), (Gb2, Gy3, 4), (Gb2, Gy1, 3), (Gb3, Gy2, 2), and (Gb3, Gy1, 1) are defined.

In other words, in the allocation rule illustrated in FIG. 72, according to the group set information (Gb1, Gy2, 1), allocation of one bit of the code bits of the code bit group Gb1 of which the error probability is the best to one bit of the symbol bits of the symbol bit group Gy2 of which the error probability is second best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb2, Gy3, 4), allocation of four bits of the code bits of the code bit group Gb2 of which the error probability is second best to four bits of the symbol bits of the symbol bit group Gy3 of which the error probability is third best is defined, according to the group set information (Gb2, Gy1, 3), allocation of three bits of the code bits of the code bit group Gb2 of which the error probability is second best to three bits of the symbol bits of the symbol bit group Gy1 of which the error probability is the best is defined, according to the group set information (Gb3, Gy2, 2), allocation of two bits of the code bits of the code bit group Gb3 of which the error probability is third best to two bits of the symbol bits of the symbol bit group Gy2 of which the error probability is second best is defined, and, according to the group set information (Gb3, Gy1, 1), allocation of one bit of the code bits of the code bit group Gb3 of which the error probability is third best to one bit of the symbol bits of the symbol bit group Gy1 of which the error probability is the best is defined.

Figure 73:
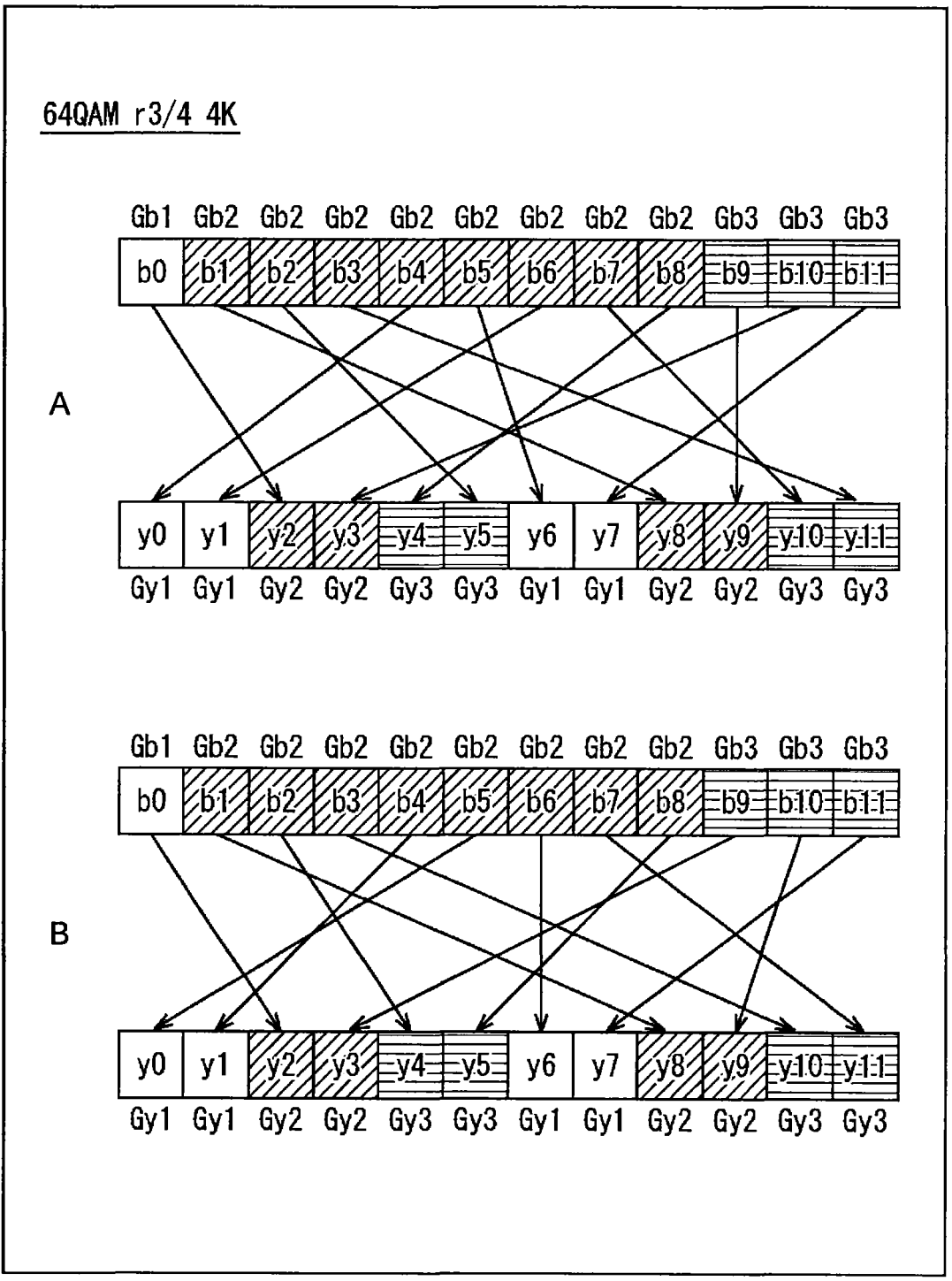
FIG. 73 is a diagram that illustrates the interchange of code bits according to the allocation rule in a case where an LDPC code having a code length of 4k and a coded rate of 3/4 is modulated in 64 QAM, and the multiple b is two.

FIG. 73 illustrates an example of the interchange of code bits according to the allocation rule illustrated in FIG. 72.

In other words, A of FIG. 73 illustrates a first example of the interchange of code bits according to the allocation rule illustrated in FIG. 72 in a case where the LDPC code is a mobile LDPC code having a code length N of 4320 bits and a coded rate of ¾, the modulation mode is 64 QAM, and the multiple b is 2.

In a case where the LDPC code is a mobile LDPC code having a code length N of 4320 bits and a coded rate of ¾, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 72 such that the code bits b0 to b11 of 6×2 (=mb) bits read from the memory 31 are, for example, as illustrated in A of FIG. 73, allocated to symbol bits y0 to y11 of 6×2 (=mb) bits of two (=b) symbols.

In other words, the interchange unit 32 performs an interchange process in which:
the code bit b0 is allocated to the symbol bit y2;
the code bit b1 to the symbol bit y8;
the code bit b2 to the symbol bit y5;
the code bit b3 to the symbol bit y11;
the code bit b4 to the symbol bit y0;
the code bit b5 to the symbol bit y6;
the code bit b6 to the symbol bit y1;
the code bit b7 to the symbol bit y10;
the code bit b8 to the symbol bit y4;
the code bit b9 to the symbol bit y9;
the code bit b10 to the symbol bit y3; and
the code bit b11 to the symbol bit y7.

B of FIG. 73 illustrates a second example of the interchange of code bits according to the allocation rule illustrated in FIG. 72 in a case where the LDPC code is a mobile LDPC code having a code length N of 4320 bits and a coded rate of ¾, the modulation mode is 64 QAM, and the multiple b is 2.

As illustrated in B of FIG. 73, the interchange unit 32 performs an interchange process for code bits b0 to b11 of 6×2 (=mb) bits read from the memory 31, according to the allocation rule illustrated in FIG. 72, in which:

the code bit b0 is allocated to the symbol bit y2;
the code bit b1 to the symbol bit y8;
the code bit b2 to the symbol bit y4;
the code bit b3 to the symbol bit y10;
the code bit b4 to the symbol bit y1;
the code bit b5 to the symbol bit y0;
the code bit b6 to the symbol bit y6;
the code bit b7 to the symbol bit y11;
the code bit b8 to the symbol bit y5;
the code bit b9 to the symbol bit y3;
the code bit b10 to the symbol bit y9; and
the code bit b11 to the symbol bit y7.

Figure 74:
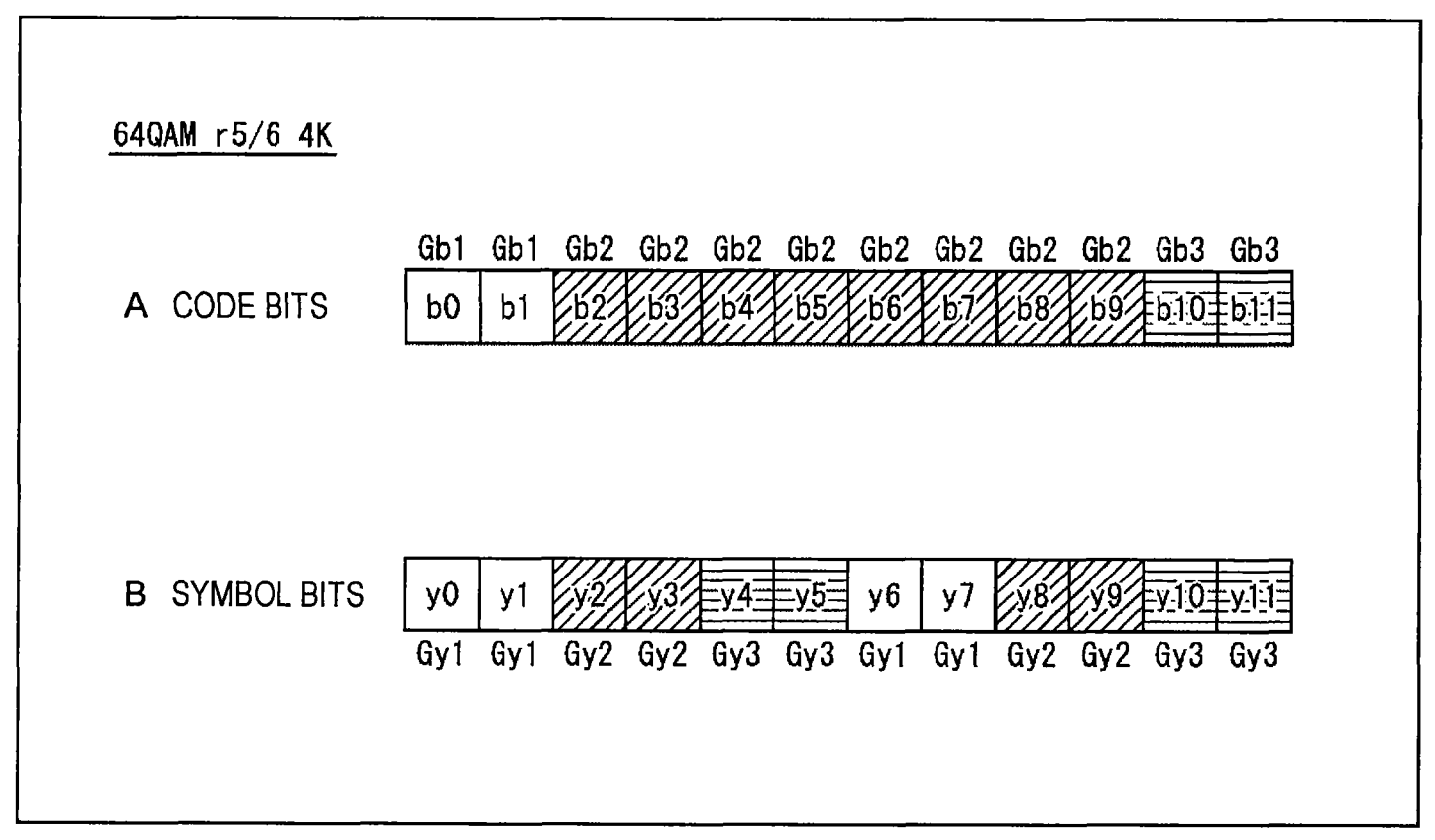

FIG. 74 is a diagram that illustrates code bit groups and symbol bit groups in a case where the LDPC code is a mobile LDPC code having a code length N of 4320 bits and a coded rate of ⅚, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 74 based on differences in the error probability.

In A of FIG. 74, code bits b0 and b1 belong to the code bit group Gb1, code bits b2 to b9 belong to the code bit group Gb2, and code bits b10 and b11 belong to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 74, based on differences in the error probability.

In B of FIG. 74, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 75:
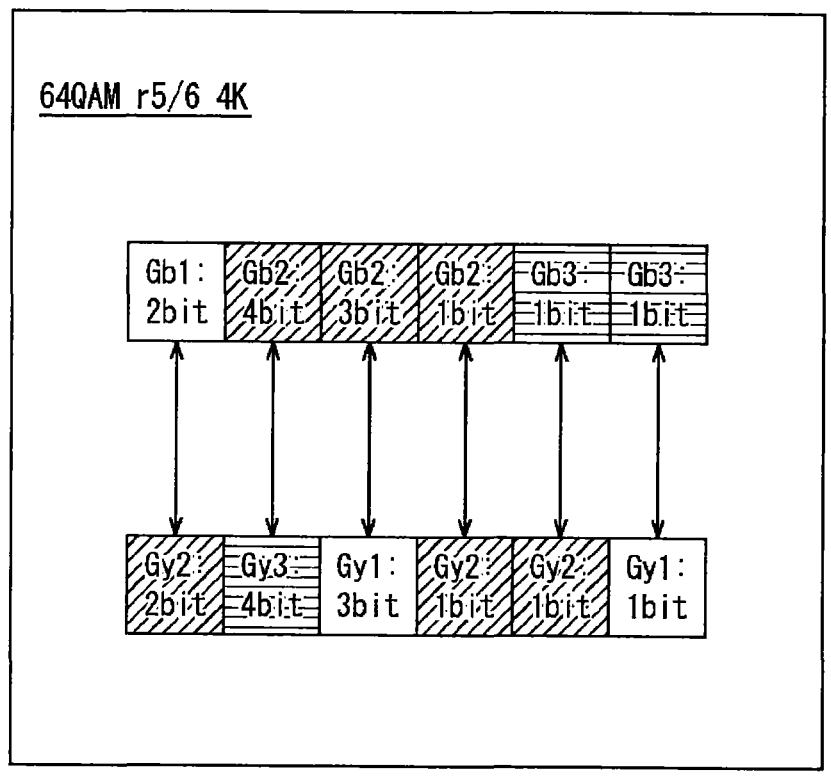
FIG. 75 is a diagram that illustrates an allocation rule in a case where an LDPC code having a code length of 4k and a coded rate of 5/6 is modulated in 64 QAM, and the multiple b is two.

FIG. 75 illustrates an allocation rule in a case where the LDPC code is a mobile LDPC code having a code length N of 4320 bits and a coded rate of ⅚, the modulation mode is 64 QAM, and the multiple b is 2.

In the allocation rule illustrated in FIG. 75, group set information (Gb1, Gy2, 2), (Gb2, Gy3, 4), (Gb2, Gy1, 3), (Gb2, Gy2, 1), (Gb3, Gy2, 1), and (Gb3, Gy1, 1) are defined.

In other words, in the allocation rule illustrated in FIG. 75, according to the group set information (Gb1, Gy2, 2), allocation of two bits of the code bits of the code bit group Gb1 of which the error probability is the best to two bits of the symbol bits of the symbol bit group Gy2 of which the error probability is second best is defined, according to the group set information (Gb2, Gy3, 4), allocation of four bits of the code bits of the code bit group Gb2 of which the error probability is second best to four bits of the symbol bits of the symbol bit group Gy3 of which the error probability is third best is defined, according to the group set information (Gb2, Gy1, 3), allocation of three bits of the code bits of the code bit group Gb2 of which the error probability is second best to three bits of the symbol bits of the symbol bit group Gy1 of which the error probability is the best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb3, Gy2, 1), allocation of one bit of the code bits of the code bit group Gb3 of which the error probability is third best to one bit of the symbol bits of the symbol bit group Gy2 of which the error probability is second best is defined, and, according to the group set information (Gb3, Gy1, 1), allocation of one bit of the code bits of the code bit group Gb3 of which the error probability is third best to one bit of the symbol bits of the symbol bit group Gy1 of which the error probability is the best is defined.

Figure 76:
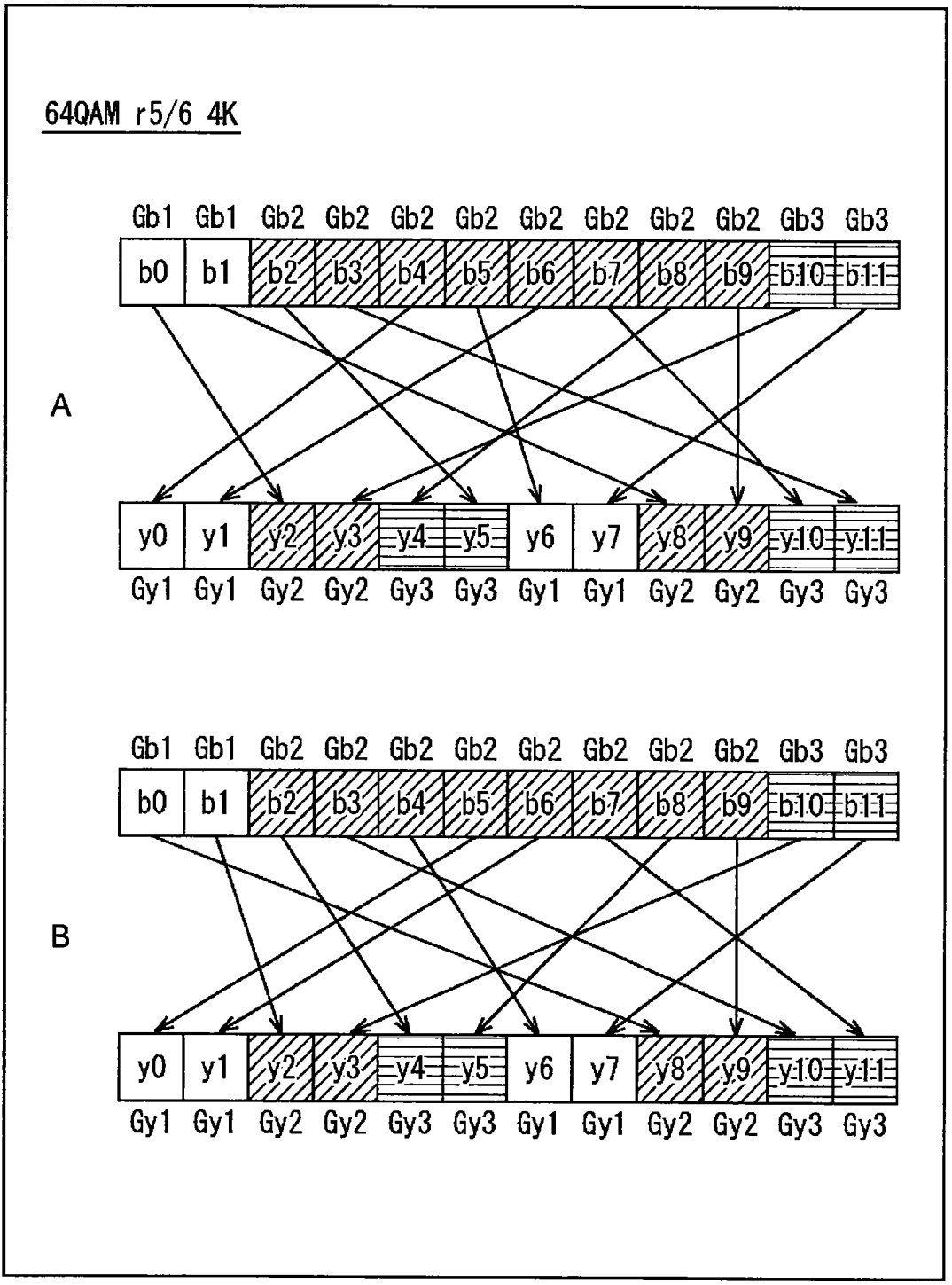
FIG. 76 is a diagram that illustrates the interchange of code bits according to the allocation rule in a case where an LDPC code having a code length of 4k and a coded rate of 5/6 is modulated in 64 QAM, and the multiple b is two.

FIG. 76 illustrates an example of the interchange of code bits according to the allocation rule illustrated in FIG. 75.

In other words, A of FIG. 76 illustrates a first example of the interchange of code bits according to the allocation rule illustrated in FIG. 75 in a case where the LDPC code is a mobile LDPC code having a code length N of 4320 bits and a coded rate of ⅚, the modulation mode is 64 QAM, and the multiple b is 2.

In a case where the LDPC code is a mobile LDPC code having a code length N of 4320 bits and a coded rate of ⅚, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 75 such that the code bits b0 to b11 of 6×2 (=mb) bits read from the memory 31 are, for example, as illustrated in A of FIG. 76, allocated to symbol bits y0 to y11 of 6×2 (=mb) bits of two (=b) symbols.

In other words, the interchange unit 32 performs an interchange process in which:

the code bit b0 is allocated to the symbol bit y2;
the code bit b1 to the symbol bit y8;
the code bit b2 to the symbol bit y5;
the code bit b3 to the symbol bit y11;
the code bit b4 to the symbol bit y0;
the code bit b5 to the symbol bit y6;
the code bit b6 to the symbol bit y1;
the code bit b7 to the symbol bit y10;
the code bit b8 to the symbol bit y4;
the code bit b9 to the symbol bit y9;
the code bit b10 to the symbol bit y3; and
the code bit b11 to the symbol bit y7.

B of FIG. 76 illustrates a second example of the interchange of code bits according to the allocation rule illustrated in FIG. 75 in a case where the LDPC code is a mobile LDPC code having a code length N of 4320 bits and a coded rate of ⅚, the modulation mode is 64 QAM, and the multiple b is 2.

As illustrated in B of FIG. 76, the interchange unit 32 performs an interchange process for code bits b0 to b11 of 6×2 (=mb) bits read from the memory 31, according to the allocation rule illustrated in FIG. 75, in which:

the code bit b0 is allocated to the symbol bit y8;
the code bit b1 to the symbol bit y2;
the code bit b2 to the symbol bit y4;
the code bit b3 to the symbol bit y10;
the code bit b4 to the symbol bit y6;
the code bit b5 to the symbol bit y0;
the code bit b6 to the symbol bit y1;
the code bit b7 to the symbol bit y11;
the code bit b8 to the symbol bit y5;

the code bit b9 to the symbol bit y9;
the code bit b10 to the symbol bit y3; and
the code bit b11 to the symbol bit y7.

FIG. 77 is a diagram that illustrates code bit groups and symbol bit groups in a case where the LDPC code is a mobile LDPC code having a code length N of 4320 bits and a coded rate of 11/12, the modulation mode is 64 QAM, and the multiple b is 2.

In this case, the code bits of 6×2 (=mb) bits read from the memory 31 can be divided into three code bit groups Gb1, Gb2, and Gb3 as illustrated in A of FIG. 77 based on differences in the error probability.

In A of FIG. 77, a code bit b0 belongs to the code bit group Gb1, code bits b1 to b10 belong to the code bit group Gb2, and a code bit b11 belongs to the code bit group Gb3.

In a case where the modulation mode is 64 QAM, and the multiple b is 2, the symbol bits of 6×2 (=mb) bits can be divided into three symbol bit groups Gy1, Gy2, and Gy3, as illustrated in B of FIG. 77, based on differences in the error probability.

In B of FIG. 77, similarly to B of FIG. 53, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 78:
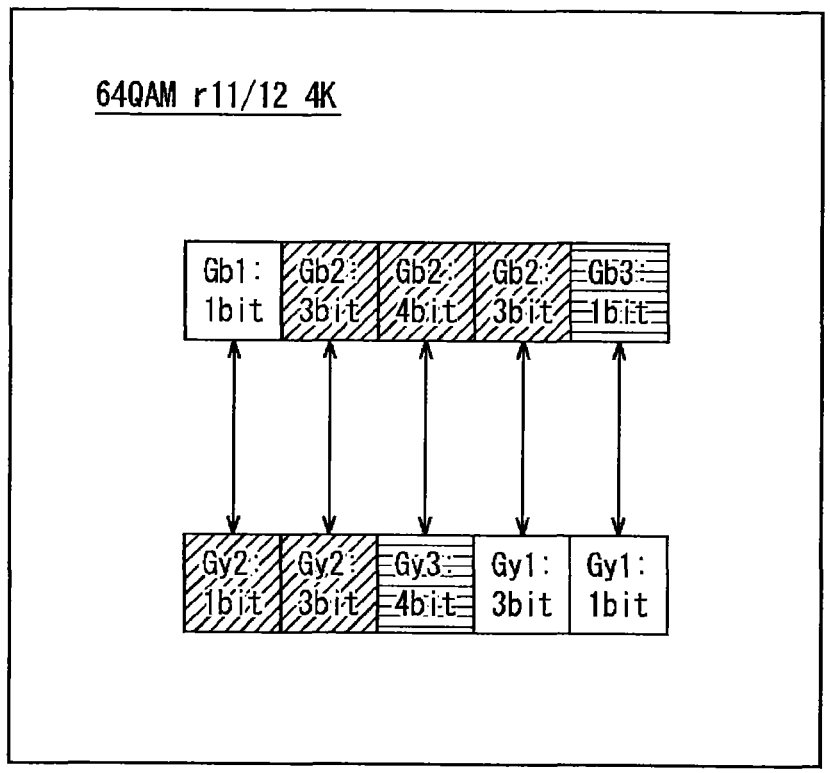
FIG. 78 is a diagram that illustrates an allocation rule in a case where an LDPC code having a code length of 4k and a coded rate of 11/12 is modulated in 64 QAM, and the multiple b is two.

FIG. 78 illustrates an allocation rule in a case where the LDPC code is a mobile LDPC code having a code length N of 4320 bits and a coded rate of 11/12, the modulation mode is 64 QAM, and the multiple b is 2.

In the allocation rule illustrated in FIG. 78, group set information (Gb1, Gy2, 1), (Gb2, Gy2, 3), (Gb2, Gy3, 4)(Gb2, Gy1, 3), (Gb3, Gy1, 1) are defined.

In other words, in the allocation rule illustrated in FIG. 78, according to the group set information (Gb1, Gy2, 1), allocation of one bit of the code bits of the code bit group Gb1 of which the error probability is the best to one bit of the symbol bits of the symbol bit group Gy2 of which the error probability is second best is defined, according to the group set information (Gb2, Gy2, 3), allocation of three bits of the code bits of the code bit group Gb2 of which the error probability is second best to three bits of the symbol bits of the symbol bit group Gy2 of which the error probability is second best is defined, according to the group set information (Gb2, Gy3, 4), allocation of four bits of the code bits of the code bit group Gb2 of which the error probability is second best to four bits of the symbol bits of the symbol bit group Gy3 of which the error probability is third best is defined, according to the group set information (Gb2, Gy1, 3), allocation of three bits of the code bits of the code bit group Gb2 of which the error probability is second best to three bits of the symbol bits of the symbol bit group Gy1 of which the error probability is the best is defined, and, according to the group set information (Gb3, Gy1, 1), allocation of one bit of the code bits of the code bit group Gb3 of which the error probability is third best to one bit of the symbol bits of the symbol bit group Gy1 of which the error probability is the best is defined.

Figure 79:
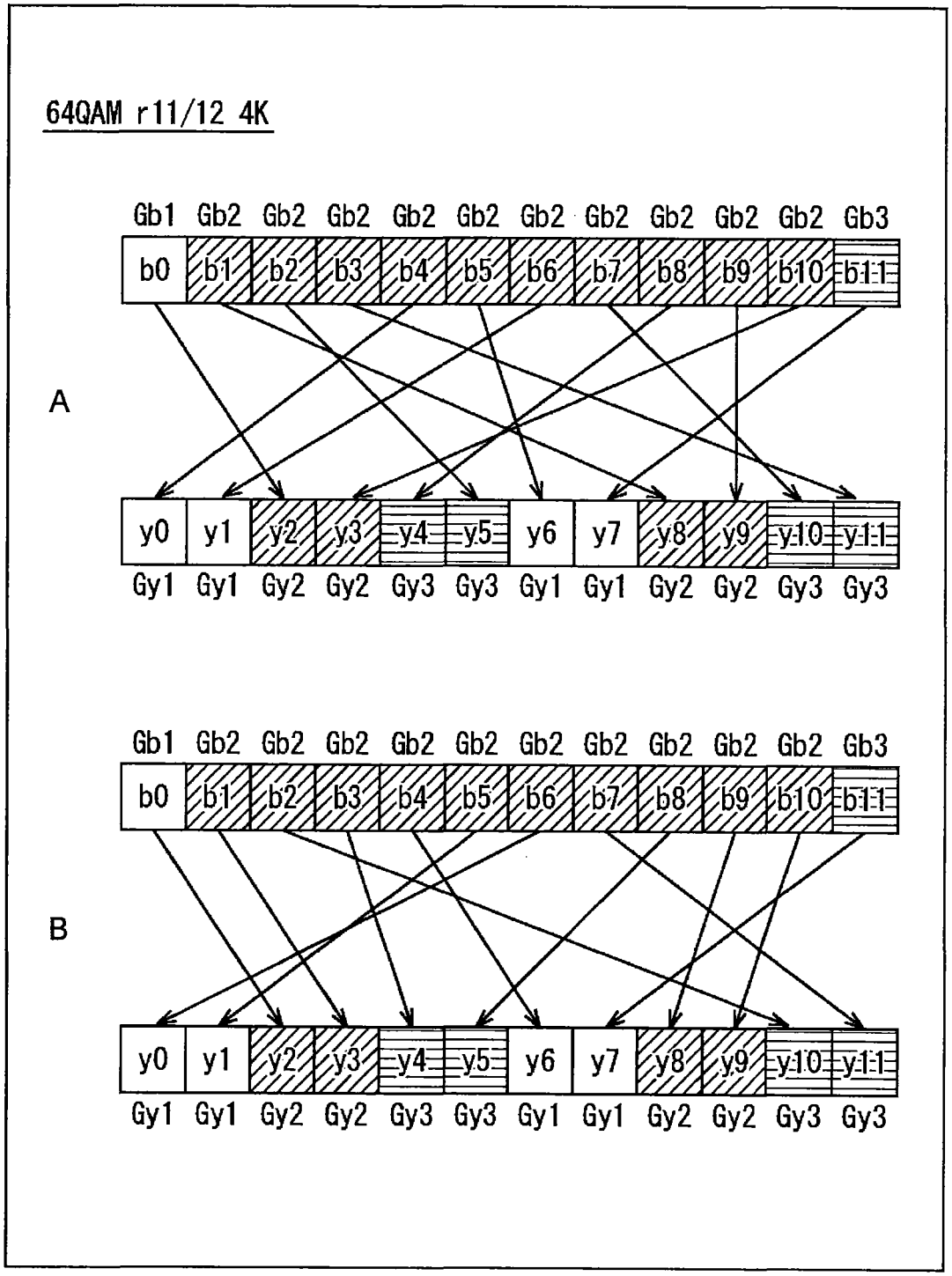
FIG. 79 is a diagram that illustrates the interchange of code bits according to the allocation rule in a case where an LDPC code having a code length of 4k and a coded rate of 11/12 is modulated in 64 QAM, and the multiple b is two.

FIG. 79 illustrates an example of the interchange of code bits according to the allocation rule illustrated in FIG. 78.

In other words, A of FIG. 79 illustrates a first example of the interchange of code bits according to the allocation rule illustrated in FIG. 78 in a case where the LDPC code is a mobile LDPC code having a code length N of 4320 bits and a coded rate of 11/12, the modulation mode is 64 QAM, and the multiple b is 2.

In a case where the LDPC code is a mobile LDPC code having a code length N of 4320 bits and a coded rate of 11/12, the modulation mode is 64 QAM, and the multiple b is 2, in the demultiplexer 25, code bits written into the memory 31 of (4320/(6×2))×(6×2) bits in the column direction×the row direction are read in units of 6×2 (=mb) bits in the row direction and are supplied to the interchange unit 32 (FIGS. 18 and 19).

The interchange unit 32 interchanges code bits b0 to b11 of 6×2 (=mb) bits according to the allocation rule illustrated in FIG. 78 such that the code bits b0 to b11 of 6×2 (=mb) bits read from the memory 31 are, for example, as illustrated in A of FIG. 79, allocated to symbol bits y0 to y11 of 6×2 (=mb) bits of two (=b) symbols.

In other words, the interchange unit 32 performs an interchange process in which:
the code bit b0 is allocated to the symbol bit y2;
the code bit b1 to the symbol bit y8;
the code bit b2 to the symbol bit y5;
the code bit b3 to the symbol bit y11;
the code bit b4 to the symbol bit y0;
the code bit b5 to the symbol bit y6;
the code bit b6 to the symbol bit y1;
the code bit b7 to the symbol bit y10;
the code bit b8 to the symbol bit y4;
the code bit b9 to the symbol bit y9;
the code bit b10 to the symbol bit y3; and
the code bit b11 to the symbol bit y7.

B of FIG. 79 illustrates a second example of the interchange of code bits according to the allocation rule illustrated in FIG. 78 in a case where the LDPC code is a mobile LDPC code having a code length N of 4320 bits and a coded rate of 11/12, the modulation mode is 64 QAM, and the multiple b is 2.

As illustrated in B of FIG. 79, the interchange unit 32 performs an interchange process for code bits b0 to b11 of 6×2 (=mb) bits read from the memory 31, according to the allocation rule illustrated in FIG. 78, in which:
the code bit b0 is allocated to the symbol bit y2;
the code bit b1 to the symbol bit y3;
the code bit b2 to the symbol bit y10;
the code bit b3 to the symbol bit y4;
the code bit b4 to the symbol bit y6;
the code bit b5 to the symbol bit y1;
the code bit b6 to the symbol bit y0;
the code bit b7 to the symbol bit y11;
the code bit b8 to the symbol bit y5;
the code bit b9 to the symbol bit y8;
the code bit b10 to the symbol bit y9; and
the code bit b11 to the symbol bit y7.

FIG. 80 is a diagram that illustrates code bit groups and symbol bit groups in a case where the LDPC code is a mobile LDPC code having a code length N of 4320 bits and a coded rate of 1/4, the modulation mode is 16 QAM, and the multiple b is 2.

In this case, the code bits of 4×2 (=mb) bits read from the memory 31 can be divided into three code bit groups Gb1, Gb2, and Gb3 as illustrated in A of FIG. 80 based on differences in the error probability.

In A of FIG. 80, a code bit b0 belongs to the code bit group Gb1, a code bit b1 belongs to the code bit group Gb2, and code bits b2 to b7 belong to the code bit group Gb3.

In a case where the modulation mode is 16 QAM, and the multiple b is 2, the symbol bits of 4×2 (=mb) bits can be divided into two symbol bit groups Gy1 and Gy2, as illustrated in B of FIG. 80, based on differences in the error probability.

In B of FIG. 80, symbol bits y0, y1, y4, and y5 belong to the symbol bit group Gy1, and symbol bits y2, y3, y6, and y7 belong to the symbol bit group Gy2.

Figure 81:
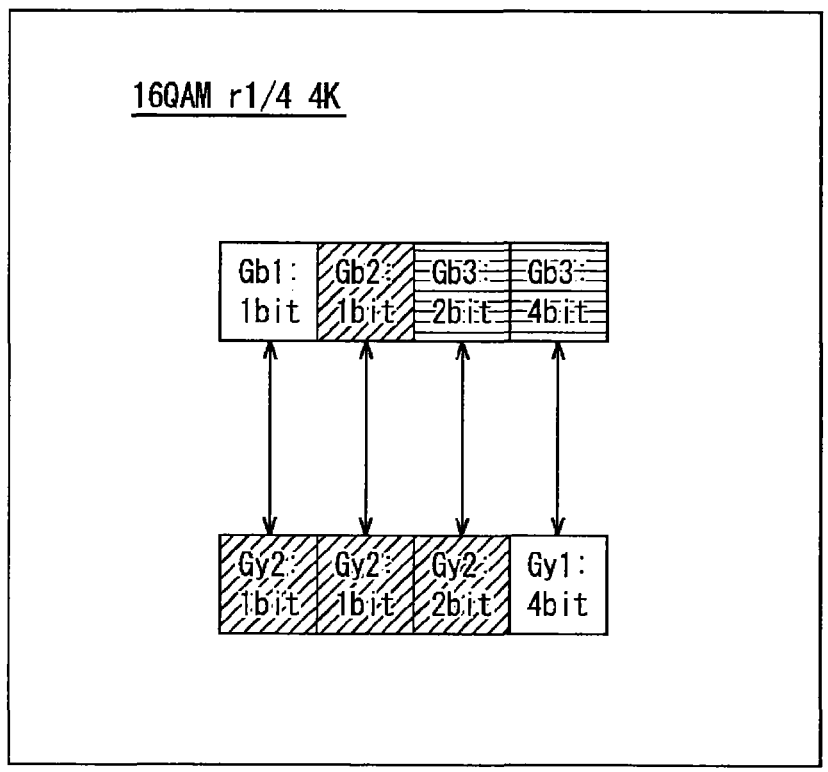
FIG. 81 is a diagram that illustrates an allocation rule in a case where an LDPC code having a code length of 4k and a coded rate of 1/4 is modulated in 16 QAM, and the multiple b is two.

FIG. 81 illustrates an allocation rule in a case where the LDPC code is a mobile LDPC code having a code length N of 4320 bits and a coded rate of ¼, the modulation mode is 16 QAM, and the multiple b is 2.

In the allocation rule illustrated in FIG. 81, group set information (Gb1, Gy2, 1), (Gb2, Gy2, 1), (Gb3, Gy2, 2), and (Gb3, Gy1, 4) are defined.

In other words, in the allocation rule illustrated in FIG. 81, according to the group set information (Gb1, Gy2, 1), allocation of one bit of the code bits of the code bit group Gb1 of which the error probability is the best to one bit of the symbol bits of the symbol bit group Gy2 of which the error probability is second best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb3, Gy2, 2), allocation of two bits of the code bits of the code bit group Gb3 of which the error probability is third best to two bits of the symbol bits of the symbol bit group Gy2 of which the error probability is second best is defined, and, according to the group set information (Gb3, Gy1, 4), allocation of four bits of the code bits of the code bit group Gb3 of which the error probability is third best to four bits of the symbol bits of the symbol bit group Gy1 of which the error probability is the best is defined.

Figure 82:
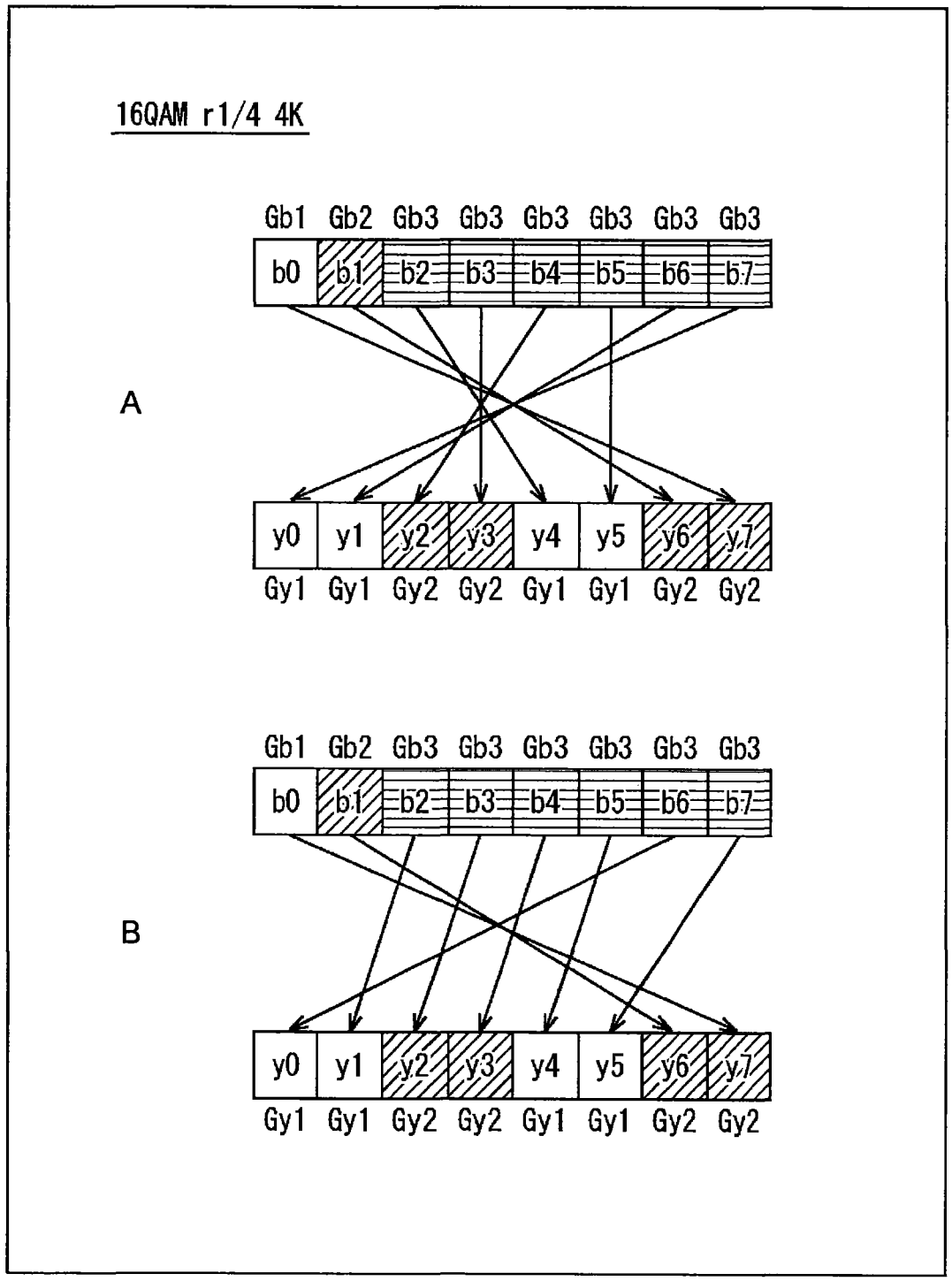
FIG. 82 is a diagram that illustrates the interchange of code bits according to the allocation rule in a case where an LDPC code having a code length of 4k and a coded rate of 1/4 is modulated in 16 QAM, and the multiple b is two.

FIG. 82 illustrates an example of the interchange of code bits according to the allocation rule illustrated in FIG. 81.

In other words, A of FIG. 82 illustrates a first example of the interchange of code bits according to the allocation rule illustrated in FIG. 81 in a case where the LDPC code is a mobile LDPC code having a code length N of 4320 bits and a coded rate of ¼, the modulation mode is 16 QAM, and the multiple b is 2.

In a case where the LDPC code is a mobile LDPC code having a code length N of 4320 bits and a coded rate of ¼, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 81 such that the code bits b0 to b7 of 4×2 (=mb) bits read from the memory 31 are, for example, as illustrated in A of FIG. 82, allocated to symbol bits y0 to y7 of 4×2 (=mb) bits of two (=b) symbols.

In other words, the interchange unit 32 performs an interchange process in which:
the code bit b0 is allocated to the symbol bit y7;
the code bit b1 to the symbol bit y6;
the code bit b2 to the symbol bit y4;
the code bit b3 to the symbol bit y3;
the code bit b4 to the symbol bit y2;
the code bit b5 to the symbol bit y5;
the code bit b6 to the symbol bit y1; and
the code bit b7 to the symbol bit y0.

B of FIG. 82 illustrates a second example of the interchange of code bits according to the allocation rule illustrated in FIG. 81 in a case where the LDPC code is a mobile LDPC code having a code length N of 4320 bits and a coded rate of ¼, the modulation mode is 16 QAM, and the multiple b is 2.

As illustrated in B of FIG. 82, the interchange unit 32 performs an interchange process for code bits b0 to b7 of 4×2 (=mb) bits read from the memory 31, according to the allocation rule illustrated in FIG. 81, in which:
the code bit b0 is allocated to the symbol bit y7;
the code bit b1 to the symbol bit y6;
the code bit b2 to the symbol bit y1;
the code bit b3 to the symbol bit y2;
the code bit b4 to the symbol bit y3;
the code bit b5 to the symbol bit y4;
the code bit b6 to the symbol bit y0; and
the code bit b7 to the symbol bit y5.

Figure 83:
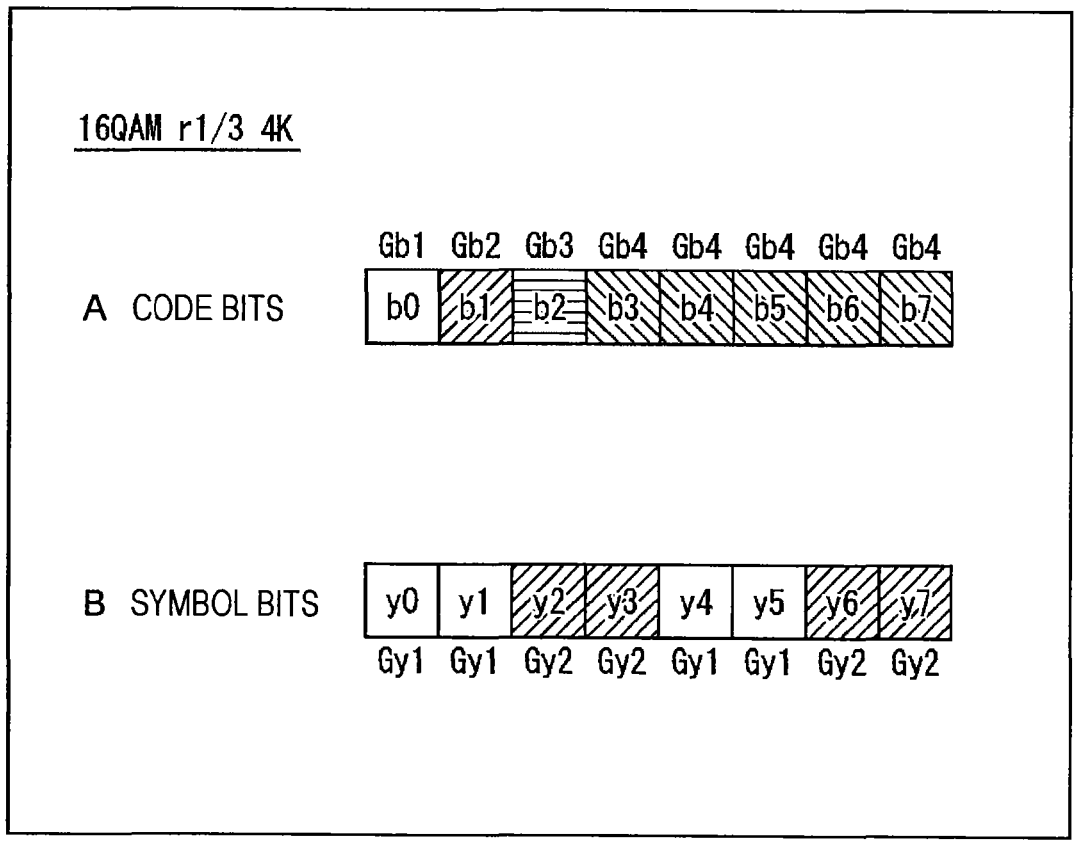
FIG. 83 is a diagram that illustrates a code bit group and a symbol bit group in a case where an LDPC code having a code length of 4k and a coded rate of 1/3 is modulated in 16 QAM, and the multiple b is two.

FIG. 83 is a diagram that illustrates code bit groups and symbol bit groups in a case where the LDPC code is a mobile LDPC code having a code length N of 4320 bits and a coded rate of ⅓, the modulation mode is 16 QAM, and the multiple b is 2.

In this case, the code bits of 4×2 (=mb) bits read from the memory 31 can be divided into four code bit groups Gb1, Gb2, Gb3, and Gb4 as illustrated in A of FIG. 83 based on differences in the error probability.

In A of FIG. 83, a code bit b0 belongs to the code bit group Gb1, a code bit b1 belongs to the code bit group Gb2, a code bit b2 belongs to the code bit group Gb3, and code bits b3 to b7 belong to the code bit group Gb4.

In a case where the modulation mode is 16 QAM, and the multiple b is 2, the symbol bits of 4×2 (=mb) bits can be divided into two symbol bit groups Gy1 and Gy2, as illustrated in B of FIG. 83, based on differences in the error probability.

In B of FIG. 83, similarly to the case of B of FIG. 80, symbol bits y0, y1, y4, and y5 belong to the symbol bit group Gy1, and symbol bits y2, y3, y6, and y7 belong to the symbol bit group Gy2.

Figure 84:
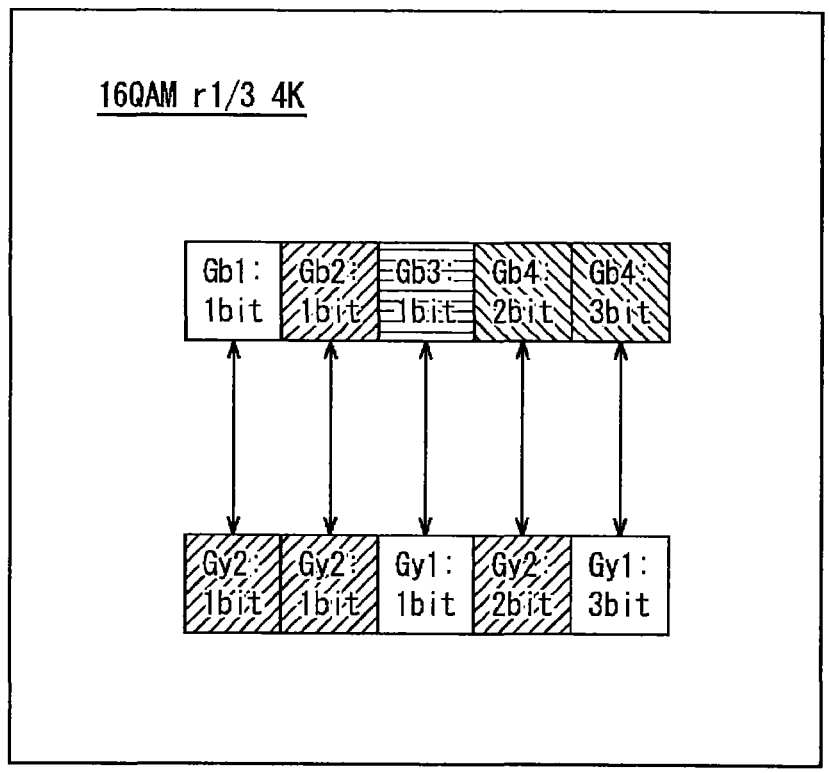
FIG. 84 is a diagram that illustrates an allocation rule in a case where an LDPC code having a code length of 4k and a coded rate of 1/3 is modulated in 16 QAM, and the multiple b is two.

FIG. 84 illustrates an allocation rule in a case where the LDPC code is a mobile LDPC code having a code length N of 4320 bits and a coded rate of ⅓, the modulation mode is 16 QAM, and the multiple b is 2.

In the allocation rule illustrated in FIG. 84, group set information (Gb1, Gy2, 1), (Gb2, Gy2, 1), (Gb3, Gy1, 1), (Gb4, Gy2, 2), and (Gb4, Gy1, 3) are defined.

In other words, in the allocation rule illustrated in FIG. 84, according to the group set information (Gb1, Gy2, 1), allocation of one bit of the code bits of the code bit group Gb1 of which the error probability is the best to one bit of the symbol bits of the symbol bit group Gy2 of which the error probability is second best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb3, Gy1, 1), allocation of one bit of the code bits of the code bit group Gb3 of which the error probability is third best to one bit of the symbol bits of the symbol bit group Gy1 of which the error probability is the best is defined, according to the group set information (Gb4, Gy2, 2), allocation of two bits of the code bits of the code bit group Gb4 of which the error probability is fourth best to two bits of the symbol bits of the symbol bit group Gy2 of which the error probability is second best is defined, and, according to the group set information (Gb4, Gy1, 3), allocation of three bits of the code bits of the code bit group Gb4 of which the error probability is fourth best to three bits of the symbol bits of the symbol bit group Gy1 of which the error probability is the best is defined.

Figure 85:
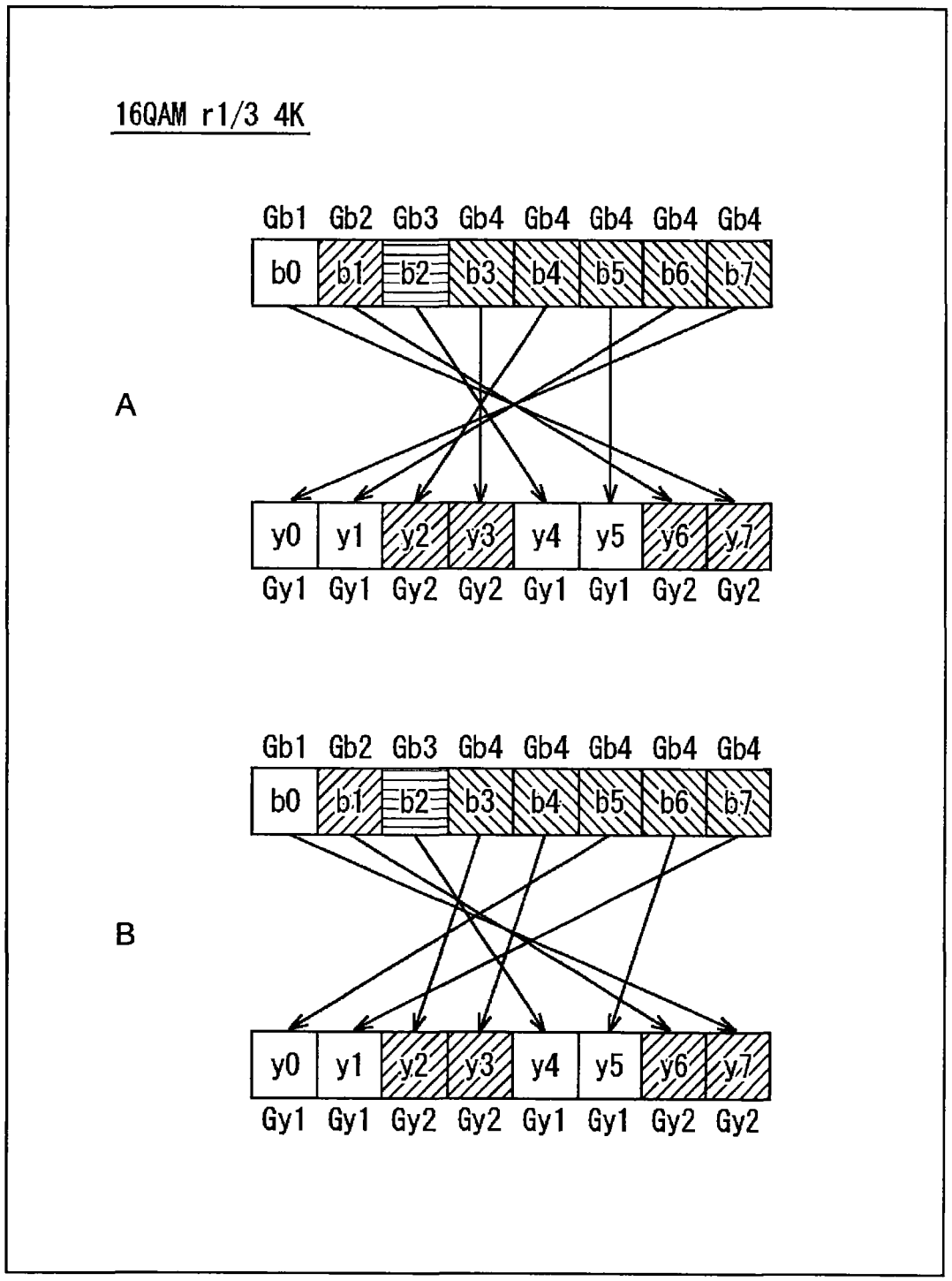
FIG. 85 is a diagram that illustrates the interchange of code bits according to the allocation rule in a case where an LDPC code having a code length of 4k and a coded rate of 1/3 is modulated in 16 QAM, and the multiple b is two.

FIG. 85 illustrates an example of the interchange of code bits according to the allocation rule illustrated in FIG. 84.

In other words, A of FIG. 85 illustrates a first example of the interchange of code bits according to the allocation rule illustrated in FIG. 84 in a case where the LDPC code is a mobile LDPC code having a code length N of 4320 bits and a coded rate of ⅓, the modulation mode is 16 QAM, and the multiple b is 2.

In a case where the LDPC code is a mobile LDPC code having a code length N of 4320 bits and a coded rate of ⅓, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 84 such that the code bits b0 to b7 of 4×2 (=mb) bits read from the memory 31 are, for example, as illustrated in A of FIG. 85, allocated to symbol bits y0 to y7 of 4×2 (=mb) bits of two (=b) symbols.

In other words, the interchange unit 32 performs an interchange process in which:
the code bit b0 is allocated to the symbol bit y7;
the code bit b1 to the symbol bit y6;
the code bit b2 to the symbol bit y4;
the code bit b3 to the symbol bit y3;
the code bit b4 to the symbol bit y2;
the code bit b5 to the symbol bit y5;
the code bit b6 to the symbol bit y1; and
the code bit b7 to the symbol bit y0.

B of FIG. 85 illustrates a second example of the interchange of code bits according to the allocation rule illustrated in FIG. 84 in a case where the LDPC code is a mobile LDPC code having a code length N of 4320 bits and a coded rate of ⅓, the modulation mode is 16 QAM, and the multiple b is 2.

As illustrated in B FIG. 85, the interchange unit 32 performs an interchange process for code bits b0 to b7 of 4×2 (=mb) bits read from the memory 31, according to the allocation rule illustrated in FIG. 84, in which:
the code bit b0 is allocated to the symbol bit y7;
the code bit b1 to the symbol bit y6;
the code bit b2 to the symbol bit y4;
the code bit b3 to the symbol bit y2;
the code bit b4 to the symbol bit y3;
the code bit b5 to the symbol bit y0;
the code bit b6 to the symbol bit y5; and
the code bit b7 to the symbol bit y1.

Figure 86:
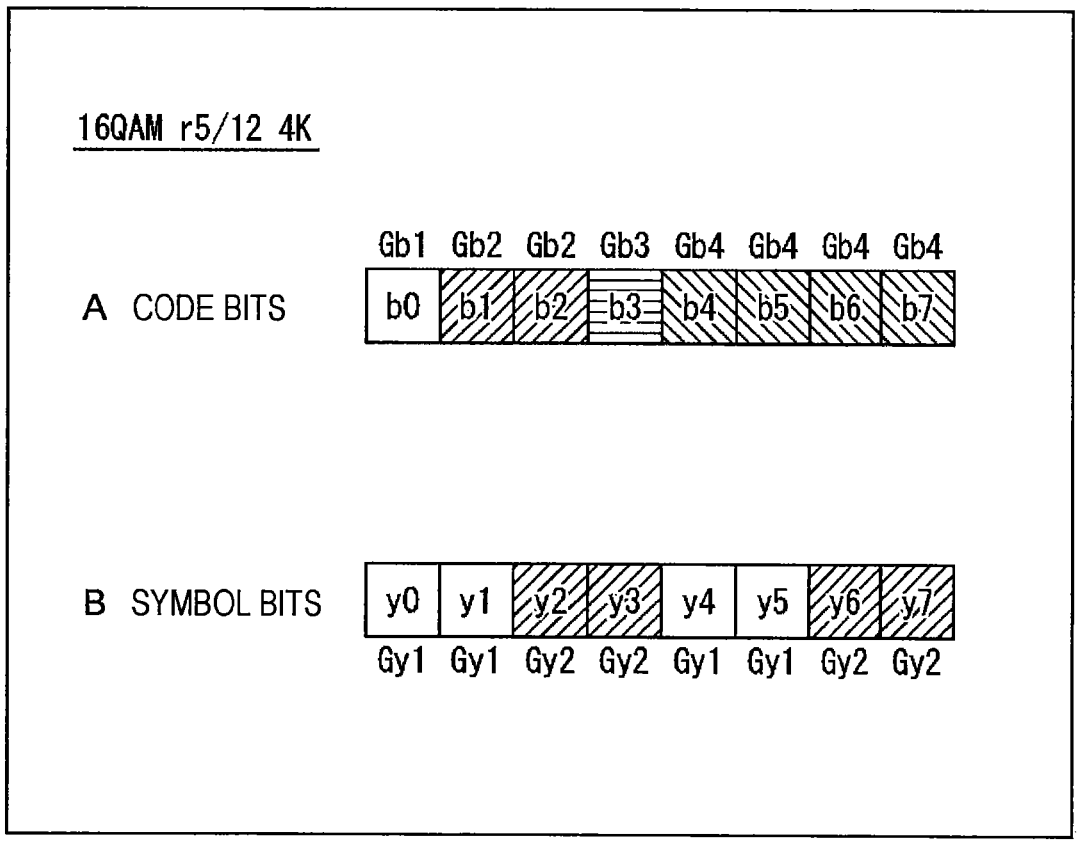
FIG. 86 is a diagram that illustrates a code bit group and a symbol bit group in a case where an LDPC code having a code length of 4k and a coded rate of 5/12 is modulated in 16 QAM, and the multiple b is two.

FIG. 86 is a diagram that illustrates code bit groups and symbol bit groups in a case where the LDPC code is a mobile LDPC code having a code length N of 4320 bits and a coded rate of 5/12, the modulation mode is 16 QAM, and the multiple b is 2.

In this case, the code bits of 4×2 (=mb) bits read from the memory 31 can be divided into four code bit groups Gb1, Gb2, Gb3, and Gb4 as illustrated in A of FIG. 86 based on differences in the error probability.

In A of FIG. 86, a code bit b0 belongs to the code bit group Gb1, code bits b1 and b2 belong to the code bit group Gb2, a code bit b3 belongs to the code bit group Gb3, and code bits b4 to b7 belong to the code bit group Gb4.

In a case where the modulation mode is 16 QAM, and the multiple b is 2, the symbol bits of 4×2 (=mb) bits can be divided into two symbol bit groups Gy1 and Gy2, as illustrated in B of FIG. 86, based on differences in the error probability.

In B of FIG. 86, similarly to the case of B of FIG. 80, symbol bits y0, y1, y4, and y5 belong to the symbol bit group Gy1, and symbol bits y2, y3, y6, and y7 belong to the symbol bit group Gy2.

Figure 87:
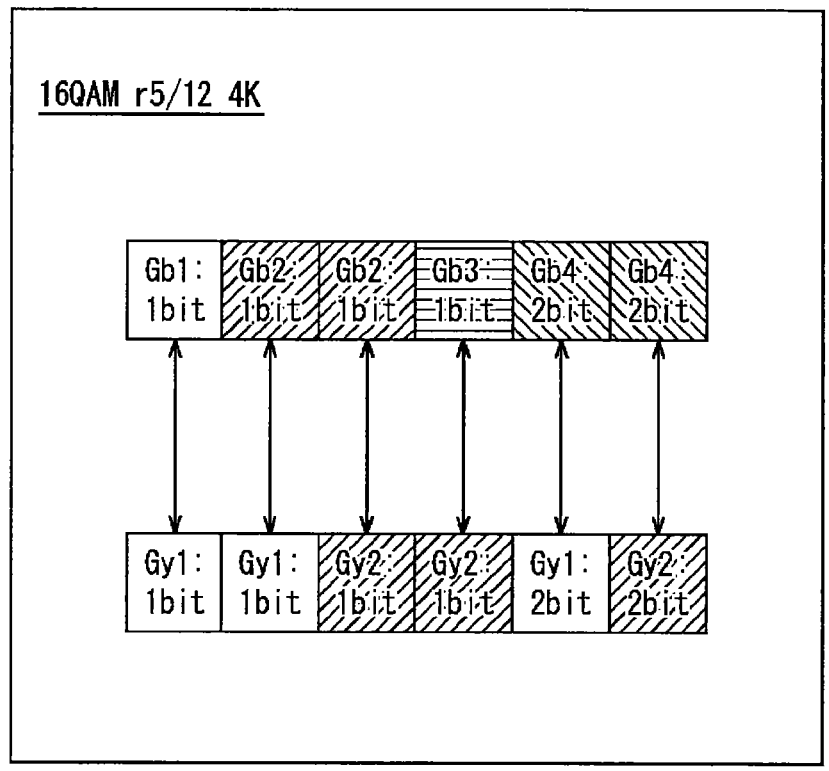
FIG. 87 is a diagram that illustrates an allocation rule in a case where an LDPC code having a code length of 4k and a coded rate of 5/12 is modulated in 16 QAM, and the multiple b is two.

FIG. 87 illustrates an allocation rule in a case where the LDPC code is a mobile LDPC code having a code length N of 4320 bits and a coded rate of 5/12, the modulation mode is 16 QAM, and the multiple b is 2.

In the allocation rule illustrated in FIG. 87, group set information (Gb1, Gy1, 1), (Gb2, Gy1, 1), (Gb2, Gy2, 1), (Gb3, Gy2, 1), (Gb4, Gy1, 2), and (Gb4, Gy2, 2) are defined.

In other words, in the allocation rule illustrated in FIG. 87, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb2, Gy2, 1), allocation of one bit of the code bits of the code bit group Gb2 of which the error probability is second best to one bit of the symbol bits of the symbol bit group Gy2 of which the error probability is second best is defined, according to the group set information (Gb3, Gy2, 1), allocation of one bit of the code bits of the code bit group Gb3 of which the error probability is third best to one bit of the symbol bits of the symbol bit group Gy2 of which the error probability is second best is defined, according to the group set information (Gb4, Gy1, 2), allocation of two bits of the code bits of the code bit group Gb4 of which the error probability is fourth best to two bits of the symbol bits of the symbol bit group Gy1 of which the error probability is the best is defined, and, according to the group set information (Gb4, Gy2, 2), allocation of two bits of the code bits of the code bit group Gb4 of which the error probability is fourth best to two bits of the symbol bits of the symbol bit group Gy2 of which the error probability is second best is defined.

FIG. 88 illustrates an example of the interchange of code bits according to the allocation rule illustrated in FIG. 87.

In other words, A of FIG. 88 illustrates a first example of the interchange of code bits according to the allocation rule illustrated in FIG. 87 in a case where the LDPC code is a mobile LDPC code having a code length N of 4320 bits and a coded rate of 5/12, the modulation mode is 16 QAM, and the multiple b is 2.

In a case where the LDPC code is a mobile LDPC code having a code length N of 4320 bits and a coded rate of 5/12, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 87 such that the code bits b0 to b7 of 4×2 (=mb) bits read from the memory 31 are, for example, as illustrated in A of FIG. 88, allocated to symbol bits y0 to y7 of 4×2 (=mb) bits of two (=b) symbols.

In other words, the interchange unit 32 performs an interchange process in which:
the code bit b0 is allocated to the symbol bit y0;
the code bit b1 to the symbol bit y4;
the code bit b2 to the symbol bit y2;
the code bit b3 to the symbol bit y6;
the code bit b4 to the symbol bit y1;
the code bit b5 to the symbol bit y5;
the code bit b6 to the symbol bit y3; and
the code bit b7 to the symbol bit y7.

B of FIG. 88 illustrates a second example of the interchange of code bits according to the allocation rule illustrated in FIG. 87 in a case where the LDPC code is a mobile LDPC code having a code length N of 4320 bits and a coded rate of $5/12$, the modulation mode is 16 QAM, and the multiple b is 2.

As illustrated in B of FIG. 88, the interchange unit 32 performs an interchange process for code bits b0 to b7 of 4×2 (=mb) bits read from the memory 31, according to the allocation rule illustrated in FIG. 87, in which:

the code bit b0 is allocated to the symbol bit y0;
the code bit b1 to the symbol bit y4;
the code bit b2 to the symbol bit y2;
the code bit b3 to the symbol bit y6;
the code bit b4 to the symbol bit y5;
the code bit b5 to the symbol bit y1;
the code bit b6 to the symbol bit y3; and
the code bit b7 to the symbol bit y7.

Figure 89:
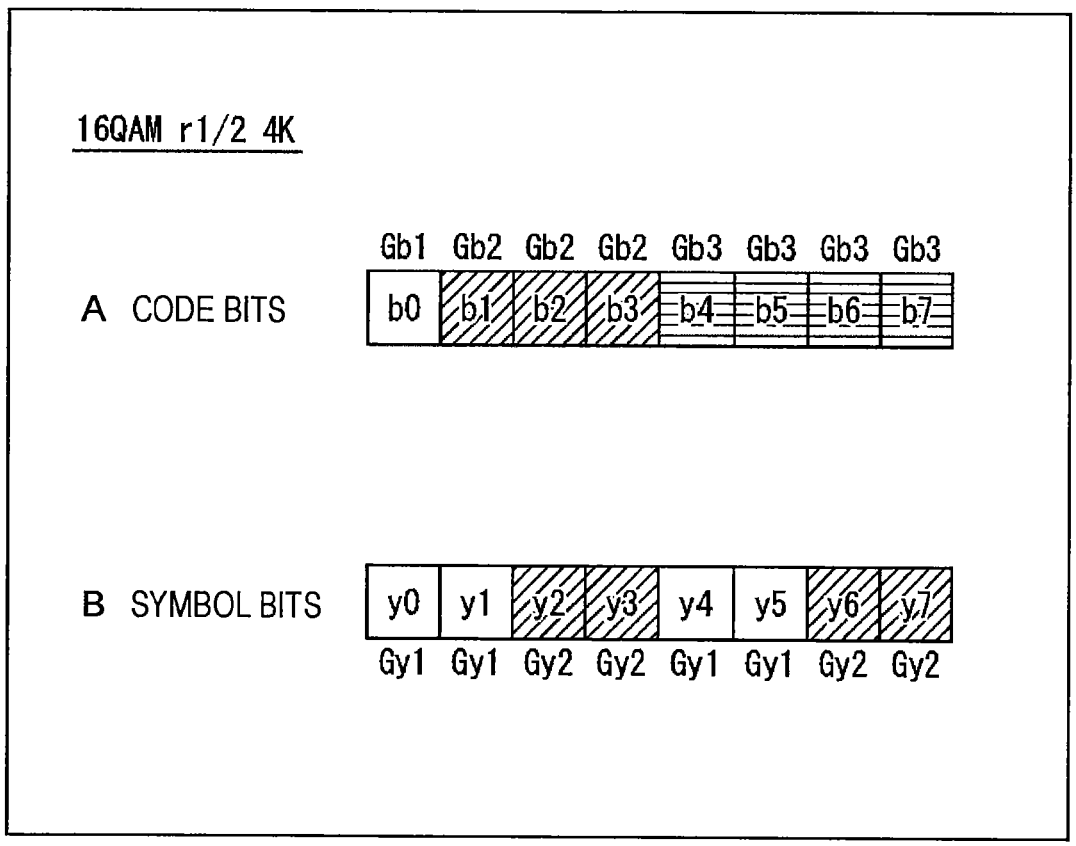
FIG. 89 is a diagram that illustrates a code bit group and a symbol bit group in a case where an LDPC code having a code length of 4k and a coded rate of 1/2 is modulated in 16 QAM, and the multiple b is two.

FIG. 89 is a diagram that illustrates code bit groups and symbol bit groups in a case where the LDPC code is a mobile LDPC code having a code length N of 4320 bits and a coded rate of ½, the modulation mode is 16 QAM, and the multiple b is 2.

In this case, the code bits of 4×2 (=mb) bits read from the memory 31 can be divided into three code bit groups Gb1, Gb2, and Gb3 as illustrated in A of FIG. 89 based on differences in the error probability.

In A of FIG. 89, a code bit b0 belongs to the code bit group Gb1, code bits b1 to b3 belong to the code bit group Gb2, and code bits b4 to b7 belong to the code bit group Gb3.

In a case where the modulation mode is 16 QAM, and the multiple b is 2, the symbol bits of 4×2 (=mb) bits can be divided into two symbol bit groups Gy1 and Gy2, as illustrated in B of FIG. 89, based on differences in the error probability.

In B of FIG. 89, similarly to the case of B of FIG. 80, symbol bits y0, y1, y4, and y5 belong to the symbol bit group Gy1, and symbol bits y2, y3, y6, and y7 belong to the symbol bit group Gy2.

Figure 90:
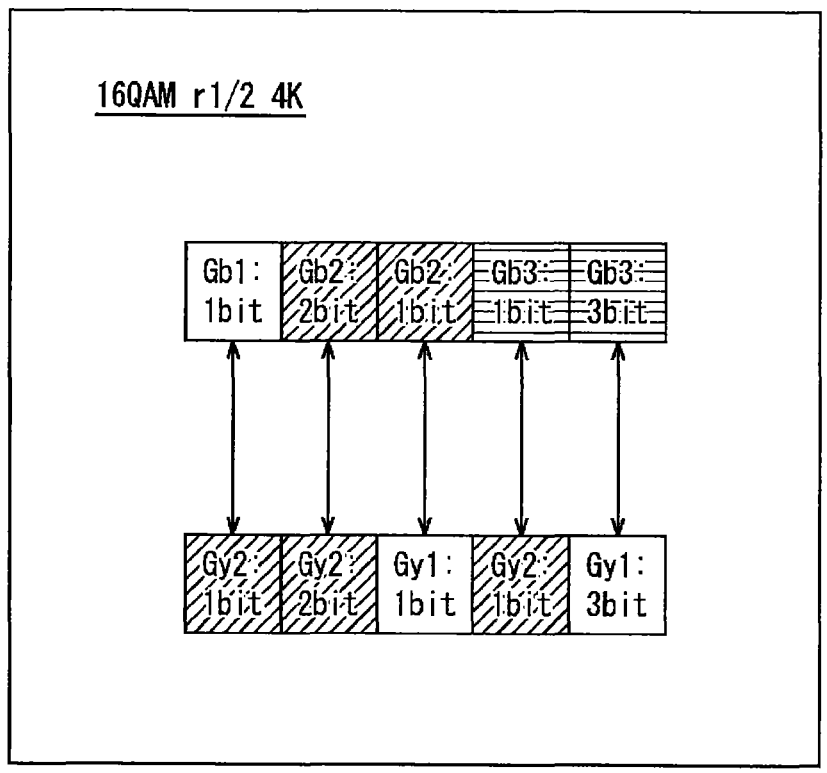
FIG. 90 is a diagram that illustrates an allocation rule in a case where an LDPC code having a code length of 4k and a coded rate of 1/2 is modulated in 16 QAM, and the multiple b is two.

FIG. 90 illustrates an allocation rule in a case where the LDPC code is a mobile LDPC code having a code length N of 4320 bits and a coded rate of ½, the modulation mode is 16 QAM, and the multiple b is 2.

In the allocation rule illustrated in FIG. 90, group set information (Gb1, Gy2, 1), (Gb2, Gy2, 2), (Gb2, Gy1, 1), (Gb3, Gy2, 1), and (Gb3, Gy1, 3) are defined.

In other words, in the allocation rule illustrated in FIG. 90, according to the group set information (Gb1, Gy2, 1), allocation of one bit of the code bits of the code bit group Gb1 of which the error probability is the best to one bit of the symbol bits of the symbol bit group Gy2 of which the error probability is second best is defined, according to the group set information (Gb2, Gy2, 2), allocation of two bits of the code bits of the code bit group Gb2 of which the error probability is second best to two bits of the symbol bits of the symbol bit group Gy2 of which the error probability is second best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb3, Gy2, 1), allocation of one bit of the code bits of the code bit group Gb3 of which the error probability is third best to one bit of the symbol bits of the symbol bit group Gy2 of which the error probability is second best is defined, and, according to the group set information (Gb3, Gy1, 3), allocation of three bits of the code bits of the code bit group Gb3 of which the error probability is third best to three bits of the symbol bits of the symbol bit group Gy1 of which the error probability is the best is defined.

Figure 91:
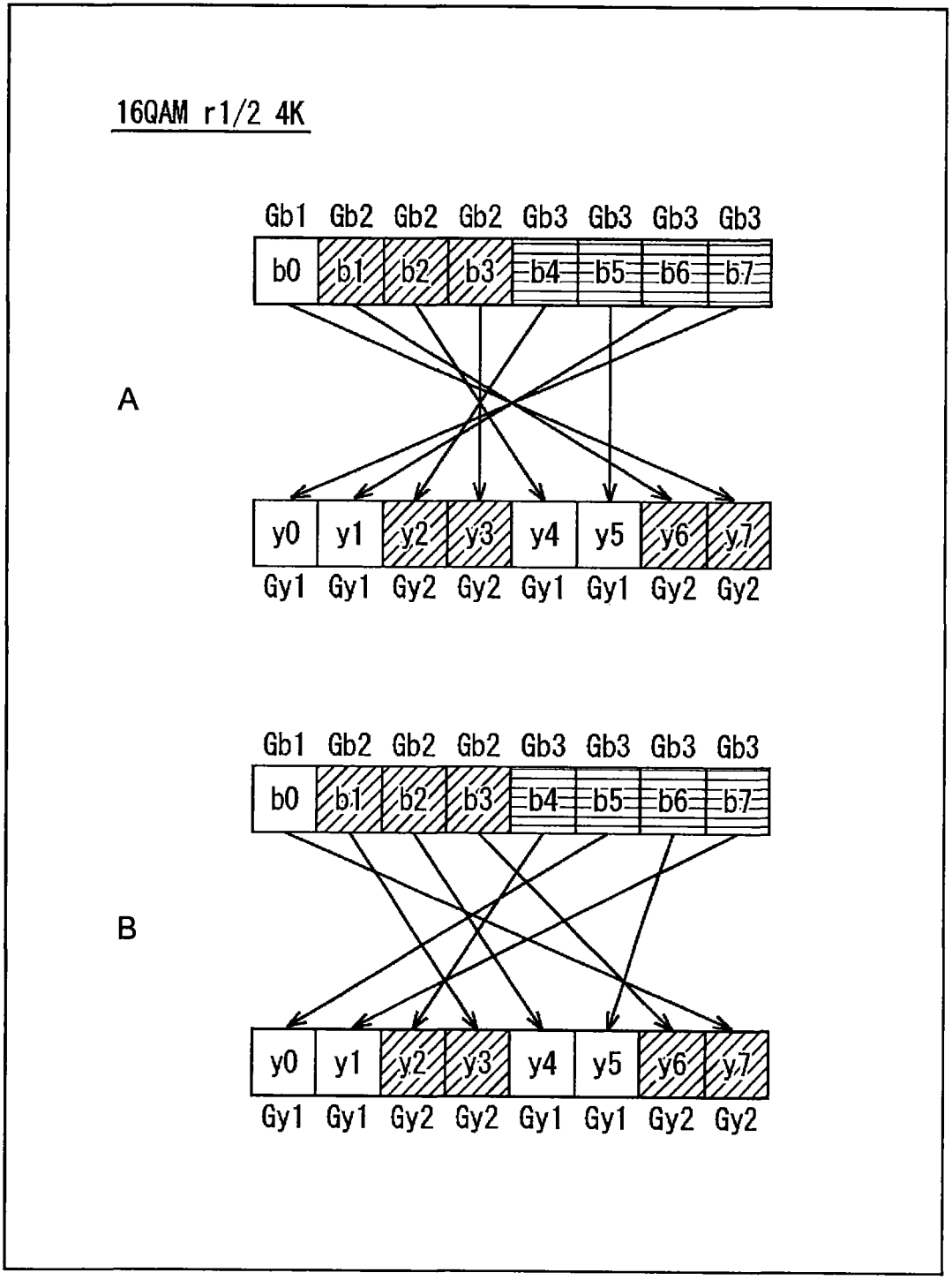
FIG. 91 is a diagram that illustrates the interchange of code bits according to the allocation rule in a case where an LDPC code having a code length of 4k and a coded rate of 1/2 is modulated in 16 QAM, and the multiple b is two.

FIG. 91 illustrates an example of the interchange of code bits according to the allocation rule illustrated in FIG. 90.

In other words, A of FIG. 91 illustrates a first example of the interchange of code bits according to the allocation rule illustrated in FIG. 90 in a case where the LDPC code is a mobile LDPC code having a code length N of 4320 bits and a coded rate of ½, the modulation mode is 16 QAM, and the multiple b is 2.

In a case where the LDPC code is a mobile LDPC code having a code length N of 4320 bits and a coded rate of ½, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 90 such that the code bits b0 to b7 of 4×2 (=mb) bits read from the memory 31 are, for example, as illustrated in A of FIG. 91, allocated to symbol bits y0 to y7 of 4×2 (=mb) bits of two (=b) symbols.

In other words, the interchange unit 32 performs an interchange process in which:

the code bit b0 is allocated to the symbol bit y7;
the code bit b1 to the symbol bit y6;
the code bit b2 to the symbol bit y4;
the code bit b3 to the symbol bit y3;
the code bit b4 to the symbol bit y2;
the code bit b5 to the symbol bit y5;
the code bit b6 to the symbol bit y1; and
the code bit b7 to the symbol bit y0.

B of FIG. 91 illustrates a second example of the interchange of code bits according to the allocation rule illustrated in FIG. 90 in a case where the LDPC code is a mobile LDPC code having a code length N of 4320 bits and a coded rate of ½, the modulation mode is 16 QAM, and the multiple b is 2.

As illustrated B of FIG. 91, the interchange unit 32, according to the allocation rule illustrated in FIG. 90, for code bits b0 to b7 of 4×2 (=mb) bits read from the memory 31, in which:

the code bit b0 is allocated to the symbol bit y7;
the code bit b1 to the symbol bit y3;
the code bit b2 to the symbol bit y4;
the code bit b3 to the symbol bit y6;
the code bit b4 to the symbol bit y2;
the code bit b5 to the symbol bit y0;
the code bit b6 to the symbol bit y5; and
the code bit b7 to the symbol bit y1.

Figure 92:
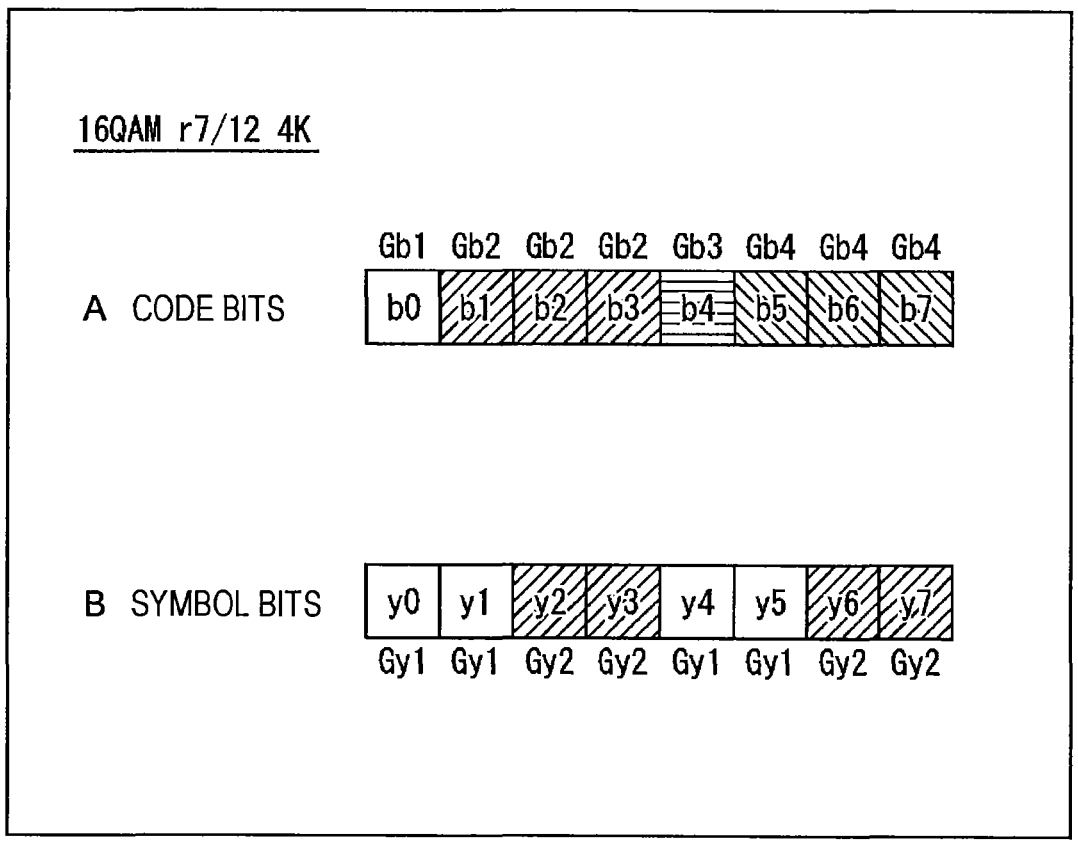
FIG. 92 is a diagram that illustrates a code bit group and a symbol bit group in a case where an LDPC code having a code length of 4k and a coded rate of 7/12 is modulated in 16 QAM, and the multiple b is two.

FIG. 92 is a diagram that illustrates code bit groups and symbol bit groups in a case where the LDPC code is a mobile LDPC code having a code length N of 4320 bits and a coded rate of $7/12$, the modulation mode is 16 QAM, and the multiple b is 2.

In this case, the code bits of 4×2 (=mb) bits read from the memory 31 can be divided into four code bit groups Gb1, Gb2, Gb3, and Gb4 as illustrated in A of FIG. 92 based on differences in the error probability.

In A of FIG. 92, a code bit b0 belongs to the code bit group Gb1, code bits b1 to b3 belong to the code bit group Gb2, a code bit b4 belongs to the code bit group Gb3, and code bits b5 to b7 belong to the code bit group Gb4.

In a case where the modulation mode is 16 QAM, and the multiple b is 2, the symbol bits of 4×2 (=mb) bits can be divided into two symbol bit groups Gy1 and Gy2, as illustrated in B of FIG. 92, based on differences in the error probability.

In B of FIG. 92, similarly to the case of B of FIG. 80, symbol bits y0, y1, y4, and y5 belong to the symbol bit group Gy1, and symbol bits y2, y3, y6, and y7 belong to the symbol bit group Gy2.

Figure 93:
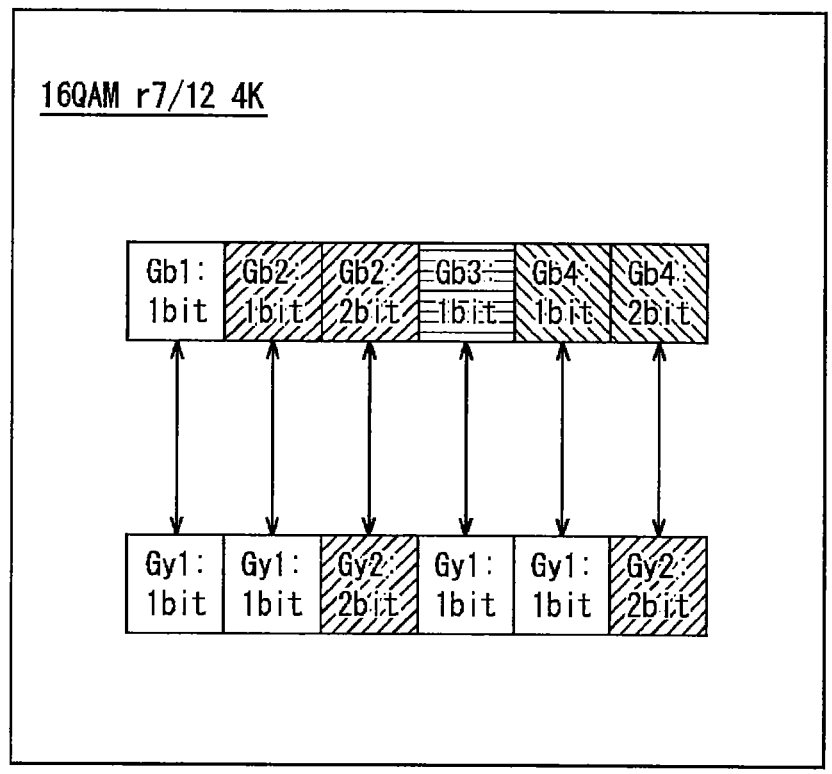
FIG. 93 is a diagram that illustrates an allocation rule in a case where an LDPC code having a code length of 4k and a coded rate of 7/12 is modulated in 16 QAM, and the multiple b is two.

FIG. 93 illustrates an allocation rule in a case where the LDPC code is a mobile LDPC code having a code length N of 4320 bits and a coded rate of 7/12, the modulation mode is 16 QAM, and the multiple b is 2.

In the allocation rule illustrated in FIG. 93, group set information (Gb1, Gy1, 1), (Gb2, Gy1, 1), (Gb2, Gy2, 2), (Gb3, Gy1, 1), (Gb4, Gy1, 1), and (Gb4, Gy2, 2) are defined.

In other words, in the allocation rule illustrated in FIG. 93, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb2, Gy2, 2), allocation of two bits of the code bits of the code bit group Gb2 of which the error probability is second best to two bits of the symbol bits of the symbol bit group Gy2 of which the error probability is second best is defined, according to the group set information (Gb3, Gy1, 1), allocation of one bit of the code bits of the code bit group Gb3 of which the error probability is third best to one bit of the symbol bits of the symbol bit group Gy1 of which the error probability is the best is defined, according to the group set information (Gb4, Gy1, 1), allocation of one bit of the code bits of the code bit group Gb4 of which the error probability is fourth best to one bit of the symbol bits of the symbol bit group Gy1 of which the error probability is the best is defined, and, according to the group set information (Gb4, Gy2, 2), allocation of two bits of the code bits of the code bit group Gb4 of which the error probability is fourth best to two bits of the symbol bits of the symbol bit group Gy2 of which the error probability is second best is defined.

Figure 94:
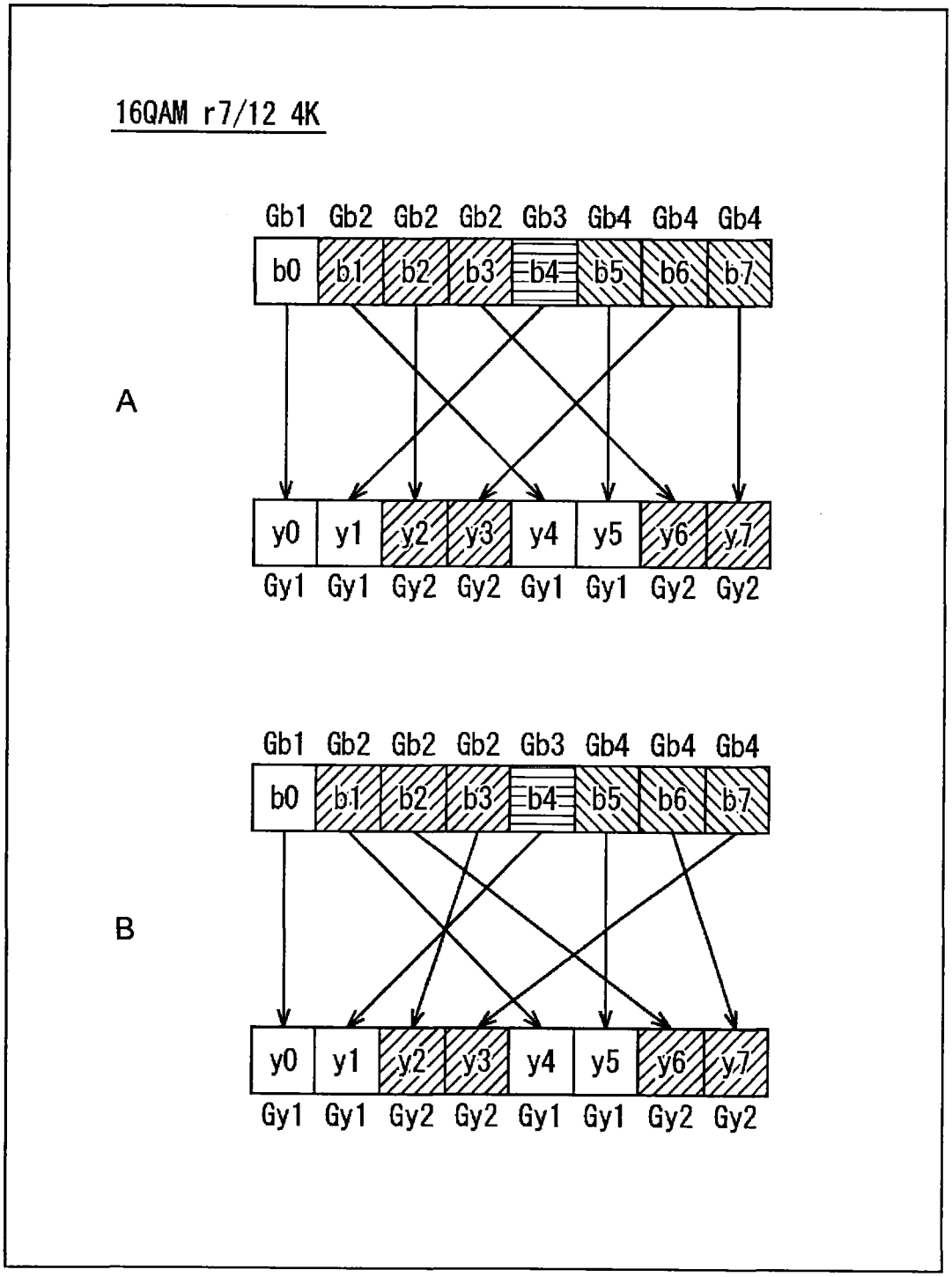
FIG. 94 is a diagram that illustrates the interchange of code bits according to the allocation rule in a case where an LDPC code having a code length of 4k and a coded rate of 7/12 is modulated in 16 QAM, and the multiple b is two.

FIG. 94 illustrates an example of the interchange of code bits according to the allocation rule illustrated in FIG. 93.

In other words, A of FIG. 94 illustrates a first example of the interchange of code bits according to the allocation rule illustrated in FIG. 93 in a case where the LDPC code is a mobile LDPC code having a code length N of 4320 bits and a coded rate of 7/12, the modulation mode is 16 QAM, and the multiple b is 2.

In a case where the LDPC code is a mobile LDPC code having a code length N of 4320 bits and a coded rate of 7/12, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 93 such that the code bits b0 to b7 of 4×2 (=mb) bits read from the memory 31 are, for example, as illustrated in A of FIG. 94, allocated to symbol bits y0 to y7 of 4×2 (=mb) bits of two (=b) symbols.

In other words, the interchange unit 32 performs an interchange process in which:

the code bit b0 is allocated to the symbol bit y0;
the code bit b1 to the symbol bit y4;
the code bit b2 to the symbol bit y2;
the code bit b3 to the symbol bit y6;
the code bit b4 to the symbol bit y1;
the code bit b5 to the symbol bit y5;
the code bit b6 to the symbol bit y3; and
the code bit b7 to the symbol bit y7.

B of FIG. 94 illustrates a second example of the interchange of code bits according to the allocation rule illustrated in FIG. 93 in a case where the LDPC code is a mobile LDPC code having a code length N of 4320 bits and a coded rate of 7/12, the modulation mode is 16 QAM, and the multiple b is 2.

As illustrated in B of FIG. 94, the interchange unit 32 performs an interchange process for code bits b0 to b7 of 4×2 (=mb) bits read from the memory 31, according to the allocation rule illustrated in FIG. 93, in which:

the code bit b0 is allocated to the symbol bit y0;
the code bit b1 to the symbol bit y4;
the code bit b2 to the symbol bit y6;
the code bit b3 to the symbol bit y2;
the code bit b4 to the symbol bit y1;
the code bit b5 to the symbol bit y5;
the code bit b6 to the symbol bit y7; and
the code bit b7 to the symbol bit y3.

Figure 95:
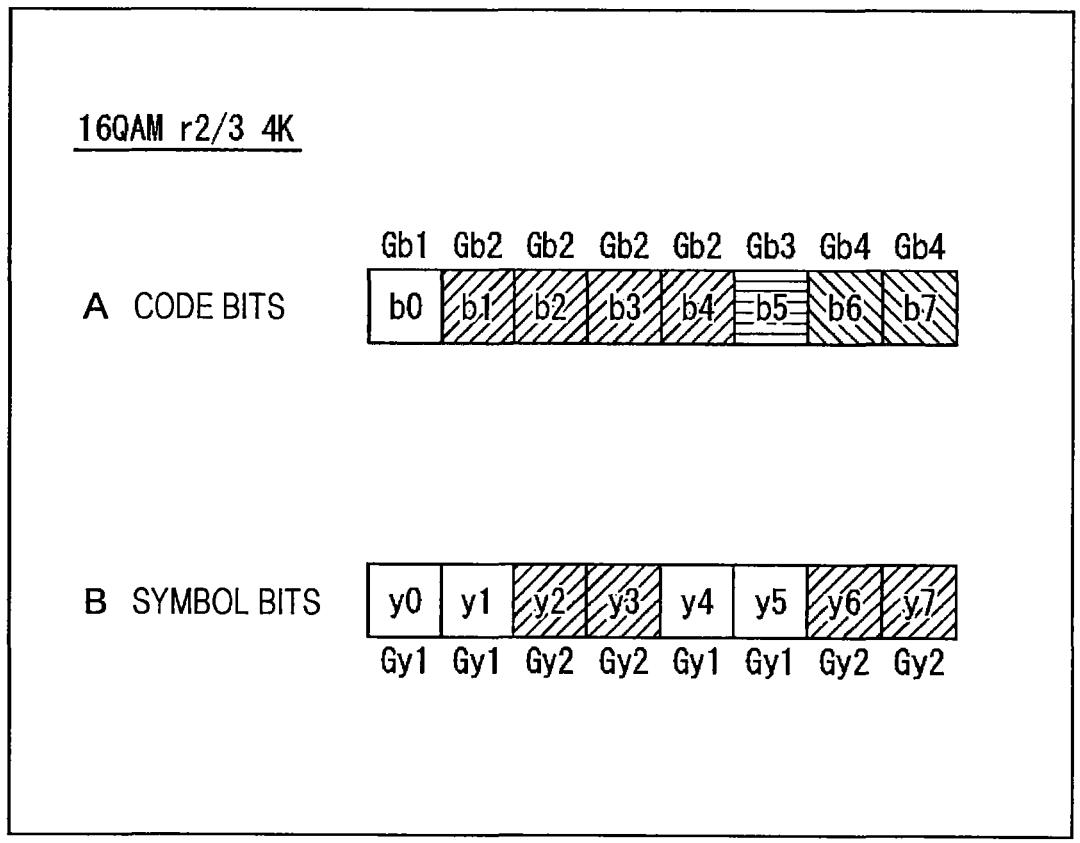
FIG. 95 is a diagram that illustrates a code bit group and a symbol bit group in a case where an LDPC code having a code length of 4k and a coded rate of 2/3 is modulated in 16 QAM, and the multiple b is two.

FIG. 95 is a diagram that illustrates code bit groups and symbol bit groups in a case where the LDPC code is a mobile LDPC code having a code length N of 4320 bits and a coded rate of 2/3, the modulation mode is 16 QAM, and the multiple b is 2.

In this case, the code bits of 4×2 (=mb) bits read from the memory 31 can be divided into four code bit groups Gb1, Gb2, Gb3, and Gb4 as illustrated in A of FIG. 95 based on differences in the error probability.

In A of FIG. 95, a code bit b0 belongs to the code bit group Gb1, code bits b1 to b4 belong to the code bit group Gb2, a code bit b5 belongs to the code bit group Gb3, and code bits b6 and b7 belong to the code bit group Gb4.

In a case where the modulation mode is 16 QAM, and the multiple b is 2, the symbol bits of 4×2 (=mb) bits can be divided into two symbol bit groups Gy1 and Gy2, as illustrated in B of FIG. 95, based on differences in the error probability.

In B of FIG. 95, similarly to the case of B of FIG. 80, symbol bits y0, y1, y4, and y5 belong to the symbol bit group Gy1, and symbol bits y2, y3, y6, and y7 belong to the symbol bit group Gy2.

Figure 96:
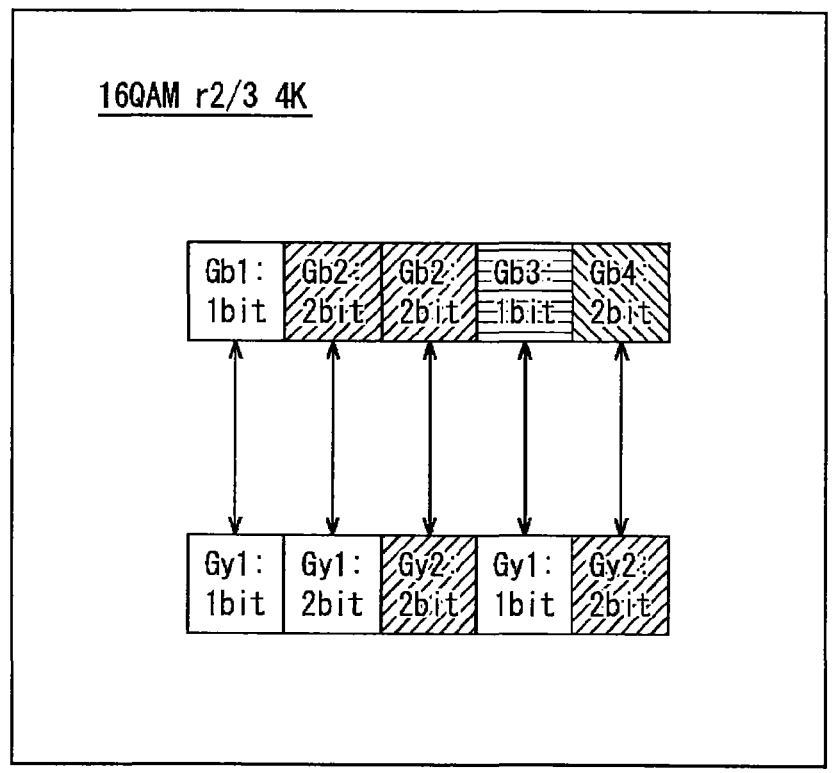
FIG. 96 is a diagram that illustrates an allocation rule in a case where an LDPC code having a code length of 4k and a coded rate of 2/3 is modulated in 16 QAM, and the multiple b is two.

FIG. 96 illustrates an allocation rule in a case where the LDPC code is a mobile LDPC code having a code length N of 4320 bits and a coded rate of 2/3, the modulation mode is 16 QAM, and the multiple b is 2.

In the allocation rule illustrated in FIG. 96, group set information (Gb1, Gy1, 1), (Gb2, Gy1, 2), (Gb2, Gy2, 2), (Gb3, Gy1, 1), and (Gb4, Gy2, 2) are defined.

In other words, in the allocation rule illustrated in FIG. 96, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy1, 2), allocation of two bits of the code bits of the code bit group Gb2 of which the error probability is second best to two bits of the symbol bits of the symbol bit group Gy1 of which the error probability is the best is defined, according to the group set information (Gb2, Gy2, 2), allocation of two bits of the code bits of the code bit group Gb2 of which the error probability is second best to two bits of the symbol bits of the symbol bit group Gy2 of which the error probability is second best is defined, according to the group set information (Gb3, Gy1, 1), allocation of one bit of the code bits of the code bit group Gb3 of which the error probability is third best to one bit of the symbol bits of the symbol bit group Gy1 of which the error probability is the best is defined, and according to the group set information (Gb4, Gy2, 2), allocation of two bits of the code bits of the code bit group Gb4 of which the error probability is fourth best to two bits of the symbol bits of the symbol bit group Gy2 of which the error probability is second best is defined.

FIG. 97 illustrates an example of the interchange of code bits according to the allocation rule illustrated in FIG. 96.

In other words, A of FIG. 97 illustrates a first example of the interchange of code bits according to the allocation rule illustrated in FIG. 96 in a case where the LDPC code is a mobile LDPC code having a code length N of 4320 bits and a coded rate of ⅔, the modulation mode is 16 QAM, and the multiple b is 2.

In a case where the LDPC code is a mobile LDPC code having a code length N of 4320 bits and a coded rate of ⅔, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 96 such that the code bits b0 to b7 of 4×2 (=mb) bits read from the memory 31 are, for example, as illustrated in A of FIG. 97, allocated to symbol bits y0 to y7 of 4×2 (=mb) bits of two (=b) symbols.

In other words, the interchange unit 32 performs an interchange process in which:

the code bit b0 is allocated to the symbol bit y0;
the code bit b1 to the symbol bit y4;
the code bit b2 to the symbol bit y2;
the code bit b3 to the symbol bit y6;
the code bit b4 to the symbol bit y1;
the code bit b5 to the symbol bit y5;
the code bit b6 to the symbol bit y3; and
the code bit b7 to the symbol bit y7.

B of FIG. 97 illustrates a second example of the interchange of code bits according to the allocation rule illustrated in FIG. 96 in a case where the LDPC code is a mobile LDPC code having a code length N of 4320 bits and a coded rate of ⅔, the modulation mode is 16 QAM, and the multiple b is 2.

As illustrated in B FIG. 97, the interchange unit 32 performs an interchange process, according to the allocation rule illustrated in FIG. 96, for code bits b0 to b7 of 4×2 (=mb) bits read from the memory 31, in which:

the code bit b0 is allocated to the symbol bit y0;
the code bit b1 to the symbol bit y1;
the code bit b2 to the symbol bit y6;
the code bit b3 to the symbol bit y2;
the code bit b4 to the symbol bit y4;
the code bit b5 to the symbol bit y5;
the code bit b6 to the symbol bit y7; and
the code bit b7 to the symbol bit y3.

Figure 98:
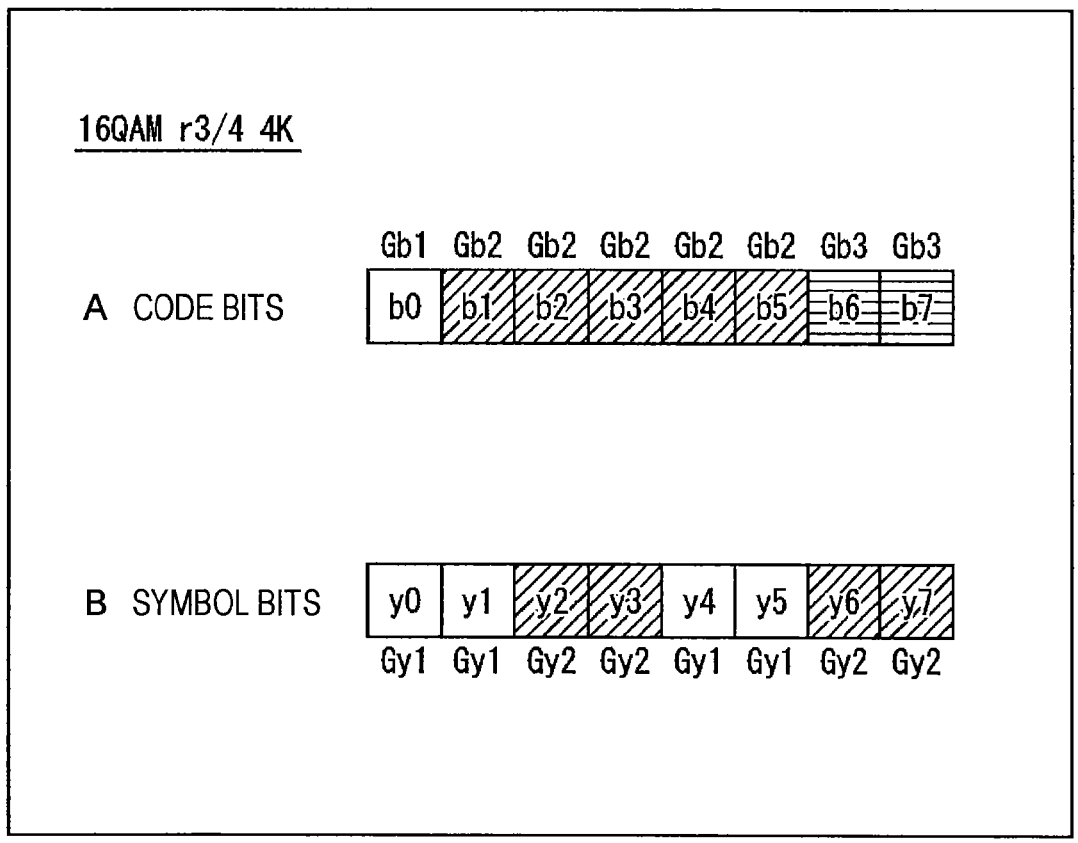
FIG. 98 is a diagram that illustrates a code bit group and a symbol bit group in a case where an LDPC code having a code length of 4k and a coded rate of ¾ is modulated in 16 QAM, and the multiple b is two.

FIG. 98 is a diagram that illustrates code bit groups and symbol bit groups in a case where the LDPC code is a mobile LDPC code having a code length N of 4320 bits and a coded rate of ¾, the modulation mode is 16 QAM, and the multiple b is 2.

In this case, the code bits of 4×2 (=mb) bits read from the memory 31 can be divided into three code bit groups Gb1, Gb2, and Gb3 as illustrated in A of FIG. 98 based on differences in the error probability.

In A of FIG. 98, a code bit b0 belongs to the code bit group Gb1, code bits b1 to b5 belong to the code bit group Gb2, and code bits b6 and b7 belong to the code bit group Gb3.

In a case where the modulation mode is 16 QAM, and the multiple b is 2, the symbol bits of 4×2 (=mb) bits can be divided into two symbol bit groups Gy1 and Gy2, as illustrated in B of FIG. 98, based on differences in the error probability.

In B of FIG. 98, similarly to the case of B of FIG. 80, symbol bits y0, y1, y4, and y5 belong to the symbol bit group Gy1, and symbol bits y2, y3, y6, and y7 belong to the symbol bit group Gy2.

Figure 99:
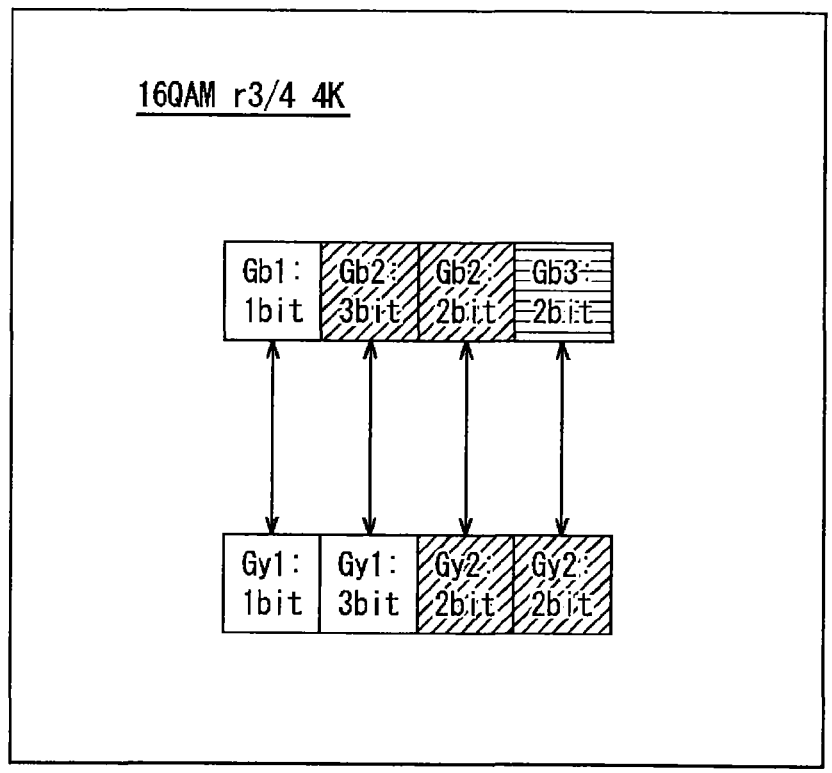
FIG. 99 is a diagram that illustrates an allocation rule in a case where an LDPC code having a code length of 4k and a coded rate of ¾ is modulated in 16 QAM, and the multiple b is two.

FIG. 99 illustrates an allocation rule in a case where the LDPC code is a mobile LDPC code having a code length N of 4320 bits and a coded rate of ¾, the modulation mode is 16 QAM, and the multiple b is 2.

In the allocation rule illustrated in FIG. 99, group set information (Gb1, Gy1, 1), (Gb2, Gy1, 3), (Gb2, Gy2, 2), and (Gb3, Gy2, 2) are defined.

In other words, in the allocation rule illustrated in FIG. 99, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy1, 3), allocation of three bits of the code bits of the code bit group Gb2 of which the error probability is second best to three bits of the symbol bits of the symbol bit group Gy1 of which the error probability is the best is defined, according to the group set information (Gb2, Gy2, 2), allocation of two bits of the code bits of the code bit group Gb2 of which the error probability is second best to two bits of the symbol bits of the symbol bit group Gy2 of which the error probability is second best is defined, and, according to the group set information (Gb3, Gy2, 2), allocation of two bits of the code bits of the code bit group Gb3 of which the error probability is third best to two bits of the symbol bits of the symbol bit group Gy2 of which the error probability is second best is defined.

FIG. 100 illustrates an example of the interchange of code bits according to the allocation rule illustrated in FIG. 99.

In other words, A of FIG. 100 illustrates a first example of the interchange of code bits according to the allocation rule illustrated in FIG. 99 in a case where the LDPC code is a mobile LDPC code having a code length N of 4320 bits and a coded rate of ¾, the modulation mode is 16 QAM, and the multiple b is 2.

In a case where the LDPC code is a mobile LDPC code having a code length N of 4320 bits and a coded rate of ¾, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 99 such that the code bits b0 to b7 of 4×2 (=mb) bits read from the memory 31 are, for example, as illustrated in A of FIG. 100, allocated to symbol bits y0 to y7 of 4×2 (=mb) bits of two (=b) symbols.

In other words, the interchange unit 32 performs an interchange process in which:

the code bit b0 is allocated to the symbol bit y0;
the code bit b1 to the symbol bit y4;
the code bit b2 to the symbol bit y2;
the code bit b3 to the symbol bit y6;

the code bit b4 to the symbol bit y1;
the code bit b5 to the symbol bit y5;
the code bit b6 to the symbol bit y3; and
the code bit b7 to the symbol bit y7.

B of FIG. 100 illustrates a second example of the interchange of code bits according to the allocation rule illustrated in FIG. 99 in a case where the LDPC code is a mobile LDPC code having a code length N of 4320 bits and a coded rate of ¾, the modulation mode is 16 QAM, and the multiple b is 2.

As illustrated in B of FIG. 100, the interchange unit 32 performs an interchange process for code bits b0 to b7 of 4×2 (=mb) bits read from the memory 31, according to the allocation rule illustrated in FIG. 99, in which:
the code bit b0 is allocated to the symbol bit y0;
the code bit b1 to the symbol bit y5;
the code bit b2 to the symbol bit y6;
the code bit b3 to the symbol bit y2;
the code bit b4 to the symbol bit y4;
the code bit b5 to the symbol bit y1;
the code bit b6 to the symbol bit y7; and
the code bit b7 to the symbol bit y3.

Figure 101:
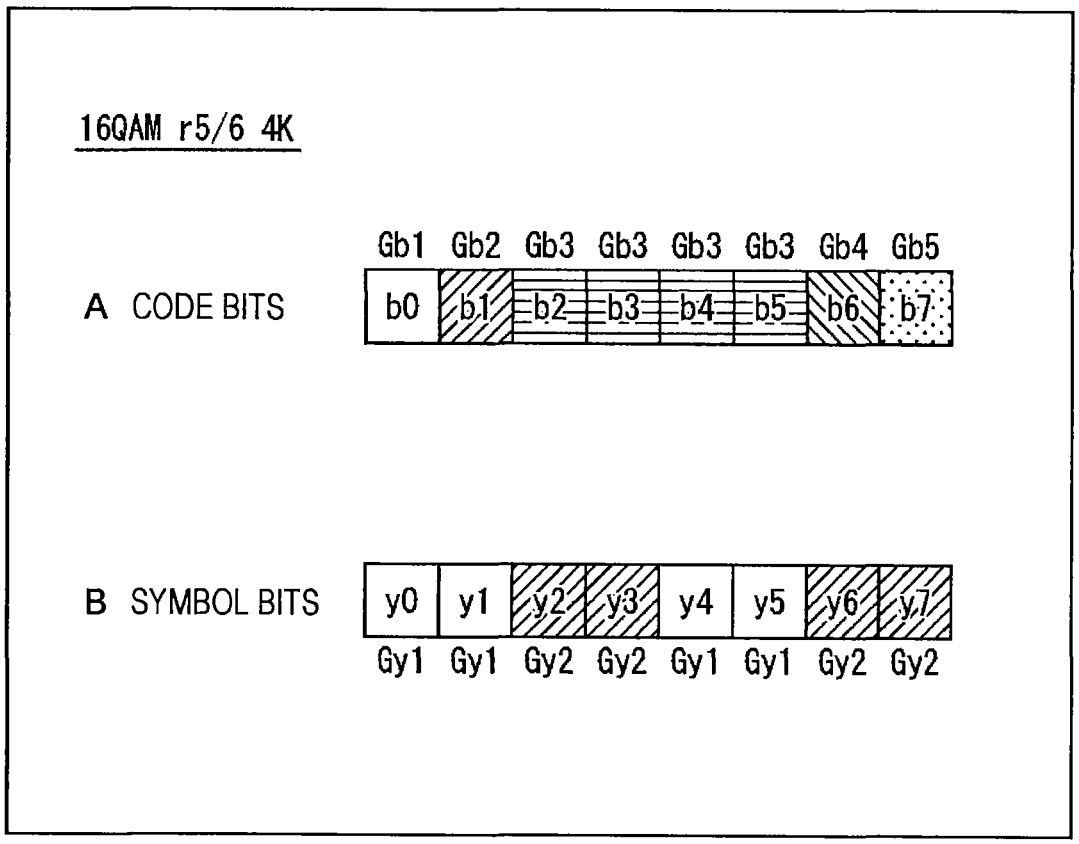
FIG. 101 is a diagram that illustrates a code bit group and a symbol bit group in a case where an LDPC code having a code length of 4k and a coded rate of ⅚ is modulated in 16 QAM, and the multiple b is two.

FIG. 101 is a diagram that illustrates code bit groups and symbol bit groups in a case where the LDPC code is a mobile LDPC code having a code length N of 4320 bits and a coded rate of ⅚, the modulation mode is 16 QAM, and the multiple b is 2.

In this case, the code bits of 4×2 (=mb) bits read from the memory 31 can be divided into five code bit groups Gb1, Gb2, Gb3, Gb4, and Gb5 as illustrated in A of FIG. 101 based on differences in the error probability.

In A of FIG. 101, a code bit b0 belongs to the code bit group Gb1, a code bit b1 belongs to the code bit group Gb2, code bits b2 to b5 belong to the code bit group Gb3, a code bit b6 belongs to the code bit group Gb4, and a code bit b7 belongs to the code bit group Gb5.

In a case where the modulation mode is 16 QAM, and the multiple b is 2, the symbol bits of 4×2 (=mb) bits can be divided into two symbol bit groups Gy1 and Gy2, as illustrated in B of FIG. 101, based on differences in the error probability.

In B of FIG. 101, similarly to the case of B of FIG. 80, symbol bits y0, y1, y4, and y5 belong to the symbol bit group Gy1, and symbol bits y2, y3, y6, and y7 belong to the symbol bit group Gy2.

Figure 102:
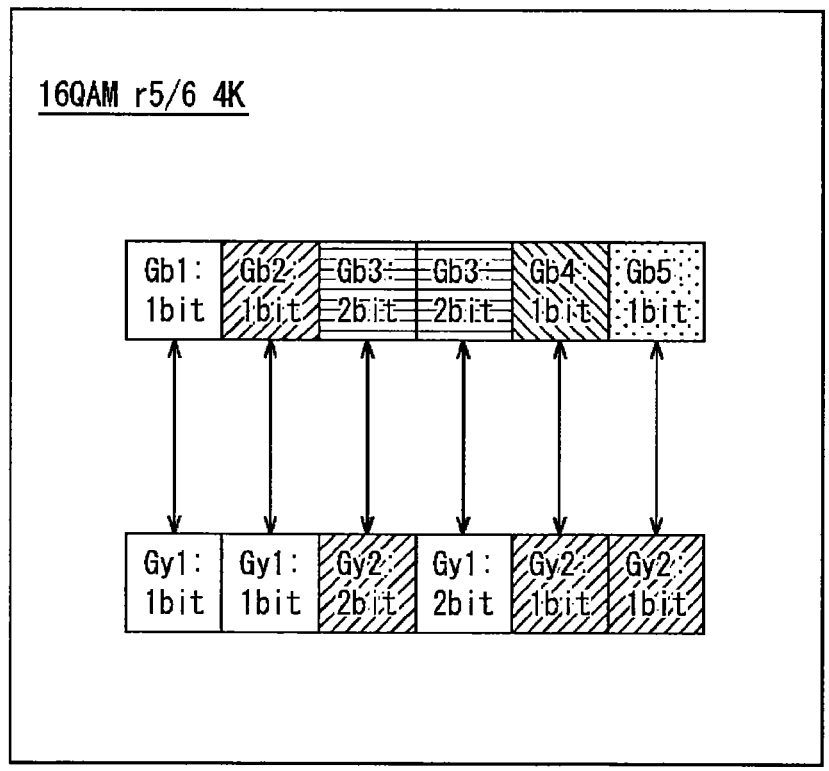
FIG. 102 is a diagram that illustrates an allocation rule in a case where an LDPC code having a code length of 4k and a coded rate of ⅚ is modulated in 16 QAM, and the multiple b is two.

FIG. 102 illustrates an allocation rule in a case where the LDPC code is a mobile LDPC code having a code length N of 4320 bits and a coded rate of ⅚, the modulation mode is 16 QAM, and the multiple b is 2.

In the allocation rule illustrated in FIG. 102, group set information (Gb1, Gy1, 1), (Gb2, Gy1, 1), (Gb3, Gy2, 2), (Gb3, Gy1, 2), (Gb4, Gy2, 1), and (Gb5, Gy2, 1) are defined.

In other words, in the allocation rule illustrated in FIG. 102, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy1, 1), allocation of one bit of the code bits of the code bit group Gb2 of which the error probability is second best to one bit of the symbol bits of the symbol bit group Gy1 of which the error probability is the best is defined, according to the group set information (Gb3, Gy2, 2), allocation of two bits of the code bits of the code bit group Gb3 of which the error probability is third best to two bits of the symbol bits of the symbol bit group Gy2 of which the error probability is second best is defined, according to the group set information (Gb3, Gy1, 2), allocation of two bits of the code bits of the code bit group Gb3 of which the error probability is third best to two bits of the symbol bits of the symbol bit group Gy1 of which the error probability is the best is defined, according to the group set information (Gb4, Gy2, 1), allocation of one bit of the code bits of the code bit group Gb4 of which the error probability is fourth best to one bit of the symbol bits of the symbol bit group Gy2 of which the error probability is second best is defined, and according to the group set information (Gb5, Gy2, 1), allocation of one bit of the code bits of the code bit group Gb5 of which the error probability is fifth best to one bit of the symbol bits of the symbol bit group Gy2 of which the error probability is second best is defined.

Figure 103:
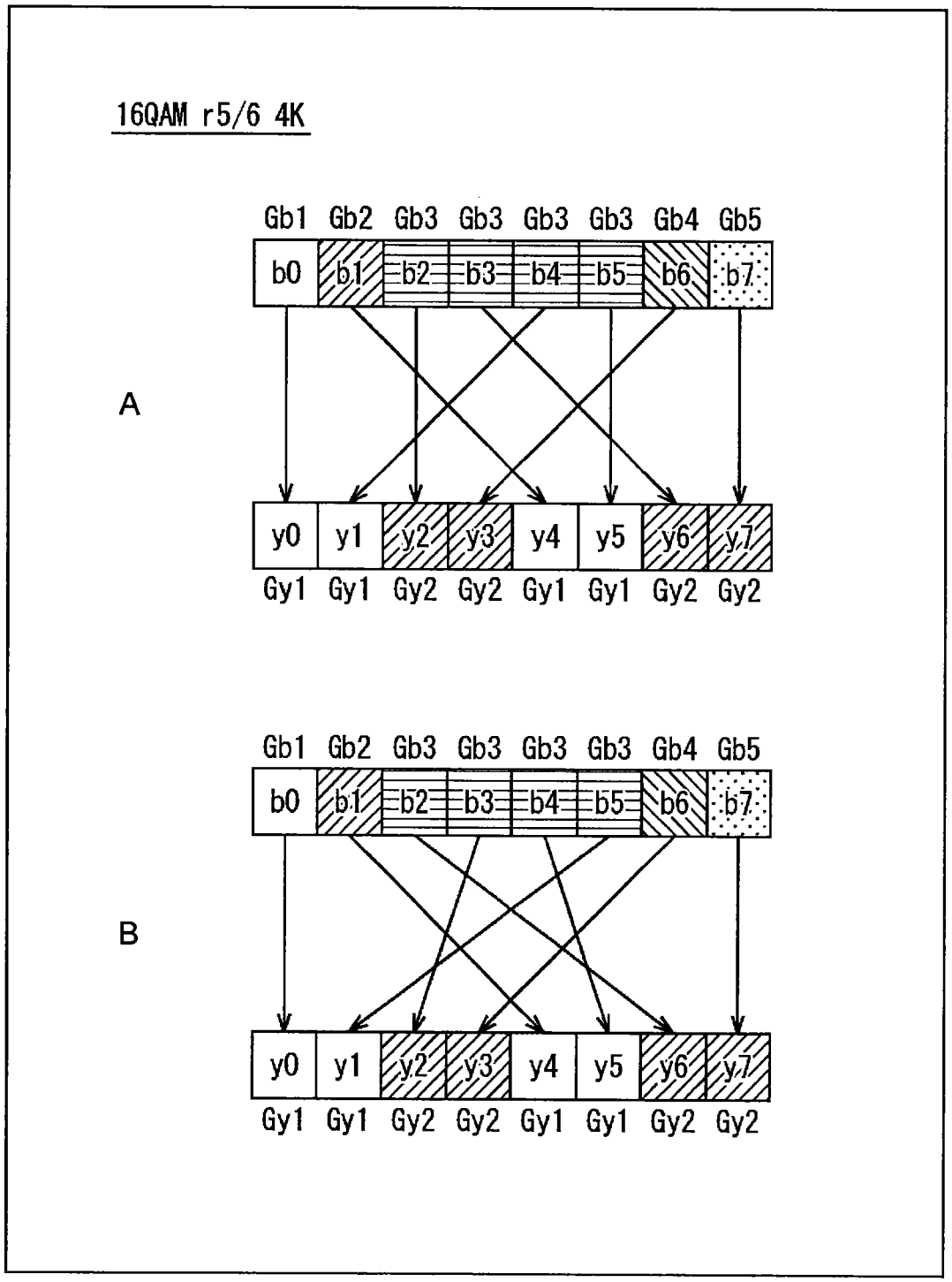
FIG. 103 is a diagram that illustrates the interchange of code bits according to the allocation rule in a case where an LDPC code having a code length of 4k and a coded rate of ⅚ is modulated in 16 QAM, and the multiple b is two.

FIG. 103 illustrates an example of the interchange of code bits according to the allocation rule illustrated in FIG. 102.

In other words, A of FIG. 103 illustrates a first example of the interchange of code bits according to the allocation rule illustrated in FIG. 102 in a case where the LDPC code is a mobile LDPC code having a code length N of 4320 bits and a coded rate of ⅚, the modulation mode is 16 QAM, and the multiple b is 2.

In a case where the LDPC code is a mobile LDPC code having a code length N of 4320 bits and a coded rate of ⅚, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 102 such that the code bits b0 to b7 of 4×2 (=mb) bits read from the memory 31 are, for example, as illustrated in A of FIG. 103, allocated to symbol bits y0 to y7 of 4×2 (=mb) bits of two (=b) symbols.

In other words, the interchange unit 32 performs an interchange process in which:
the code bit b0 is allocated to the symbol bit y0;
the code bit b1 to the symbol bit y4;
the code bit b2 to the symbol bit y2;
the code bit b3 to the symbol bit y6;
the code bit b4 to the symbol bit y1;
the code bit b5 to the symbol bit y5;
the code bit b6 to the symbol bit y3; and
the code bit b7 to the symbol bit y7.

B of FIG. 103 illustrates a second example of the interchange of code bits according to the allocation rule illustrated in FIG. 102 in a case where the LDPC code is a mobile LDPC code having a code length N of 4320 bits and a coded rate of ⅚, the modulation mode is 16 QAM, and the multiple b is 2.

As illustrated in B of FIG. 103, the interchange unit 32 performs an interchange process for code bits b0 to b7 of 4×2 (=mb) bits read from the memory 31, according to the allocation rule illustrated in FIG. 102, in which:
the code bit b0 is allocated to the symbol bit y0;
the code bit b1 to the symbol bit y4;
the code bit b2 to the symbol bit y6;
the code bit b3 to the symbol bit y2;
the code bit b4 to the symbol bit y5;
the code bit b5 to the symbol bit y1;
the code bit b6 to the symbol bit y3; and
the code bit b7 to the symbol bit y7.

Figure 104:
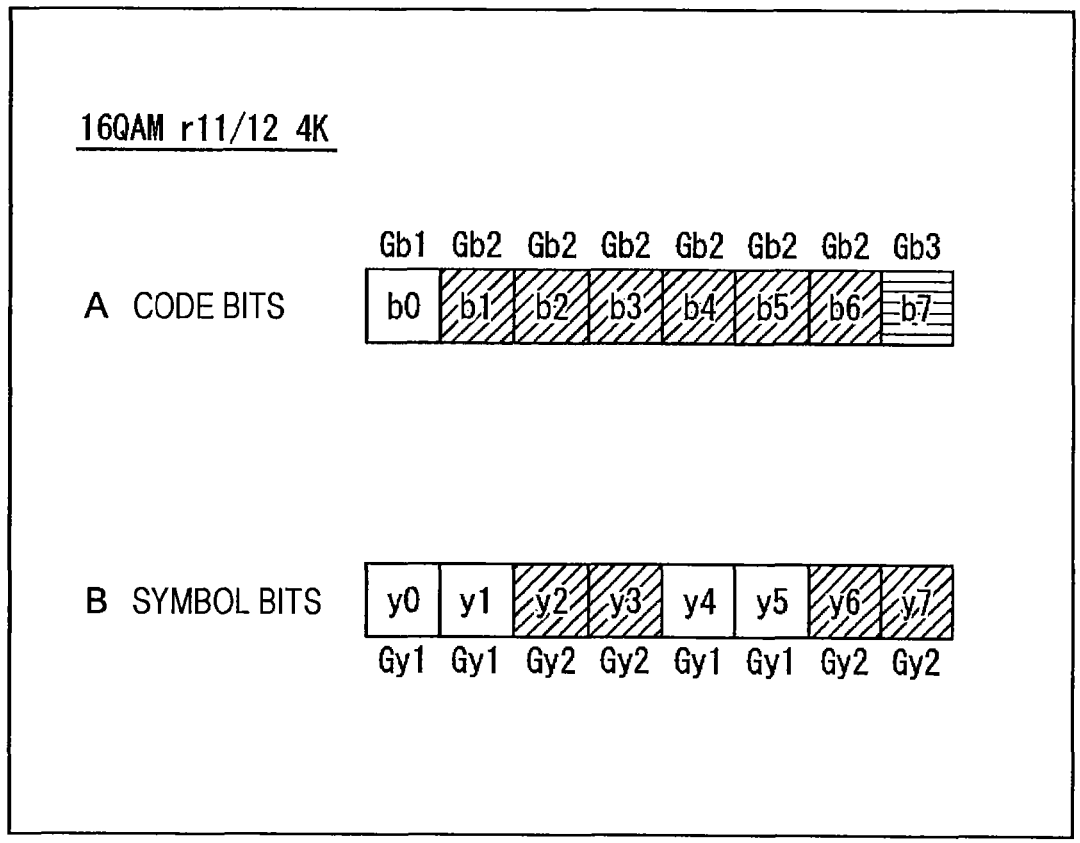
FIG. 104 is a diagram that illustrates a code bit group and a symbol bit group in a case where an LDPC code having a code length of 4k and a coded rate of 11/12 is modulated in 16 QAM, and the multiple b is two.

FIG. 104 is a diagram that illustrates code bit groups and symbol bit groups in a case where the LDPC code is a mobile LDPC code having a code length N of 4320 bits and a coded rate of 11/12, the modulation mode is 16 QAM, and the multiple b is 2.

In this case, the code bits of 4×2 (=mb) bits read from the memory 31 can be divided into three code bit groups Gb1, Gb2, and Gb3 as illustrated in A of FIG. 104 based on differences in the error probability.

In A of FIG. 104, a code bit b0 belongs to the code bit group Gb1, code bits b1 to b6 belong to the code bit group Gb2, and a code bit b7 belongs to the code bit group Gb3.

In a case where the modulation mode is 16 QAM, and the multiple b is 2, the symbol bits of 4×2 (=mb) bits can be divided into two symbol bit groups Gy1 and Gy2, as illustrated in B of FIG. 104, based on differences in the error probability.

In B of FIG. 104, similarly to the case of B of FIG. 80, symbol bits y0, y1, y4, and y5 belong to the symbol bit group Gy1, and symbol bits y2, y3, y6, and y7 belong to the symbol bit group Gy2.

Figure 105:
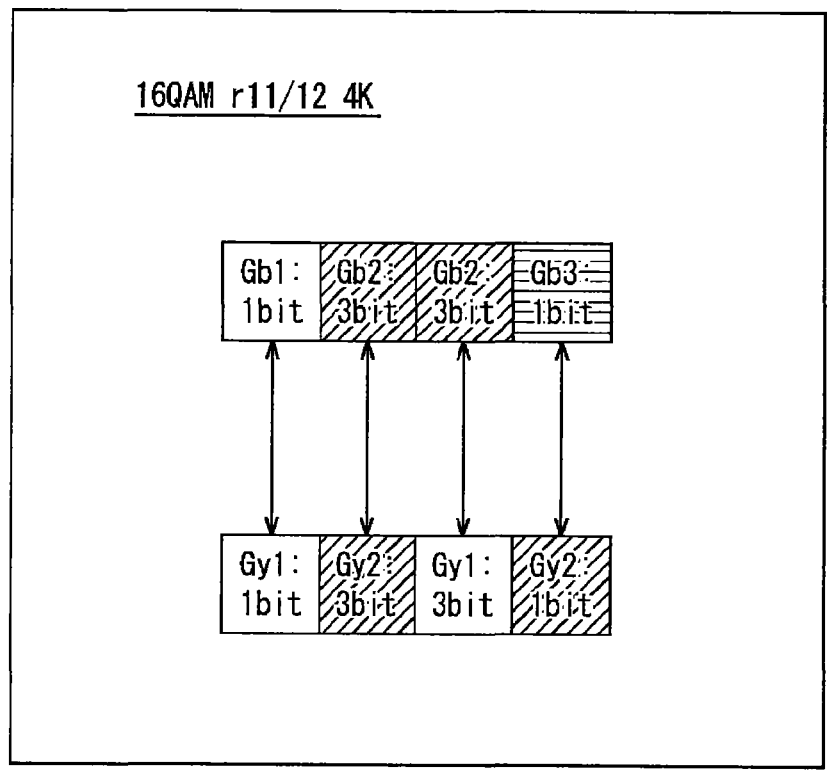
FIG. 105 is a diagram that illustrates an allocation rule in a case where an LDPC code having a code length of 4k and a coded rate of 11/12 is modulated in 16 QAM, and the multiple b is two.

FIG. 105 illustrates an allocation rule in a case where the LDPC code is a mobile LDPC code having a code length N of 4320 bits and a coded rate of $11/12$, the modulation mode is 16 QAM, and the multiple b is 2.

In the allocation rule illustrated in FIG. 105, group set information (Gb1, Gy1, 1), (Gb2, Gy2, 3), (Gb2, Gy1, 3), and (Gb3, Gy2, 1) are defined.

In other words, in the allocation rule illustrated in FIG. 105, according to the group set information (Gb1, Gy1, 1), allocation of one bit of the code bits of the code bit group Gb1 of which the error probability is the best to one bit of the symbol bits of the symbol bit group Gy1 of which the error probability is the best is defined, according to the group set information (Gb2, Gy2, 3), allocation of three bits of the code bits of the code bit group Gb2 of which the error probability is second best to three bits of the symbol bits of the symbol bit group Gy2 of which the error probability is second best is defined, according to the group set information (Gb2, Gy1, 3), allocation of three bits of the code bits of the code bit group Gb2 of which the error probability is second best to three bits of the symbol bits of the symbol bit group Gy1 of which the error probability is the best is defined, and, according to the group set information (Gb3, Gy2, 1), allocation of one bit of the code bits of the code bit group Gb3 of which the error probability is third best to one bit of the symbol bits of the symbol bit group Gy2 of which the error probability is second best is defined.

Figure 106:
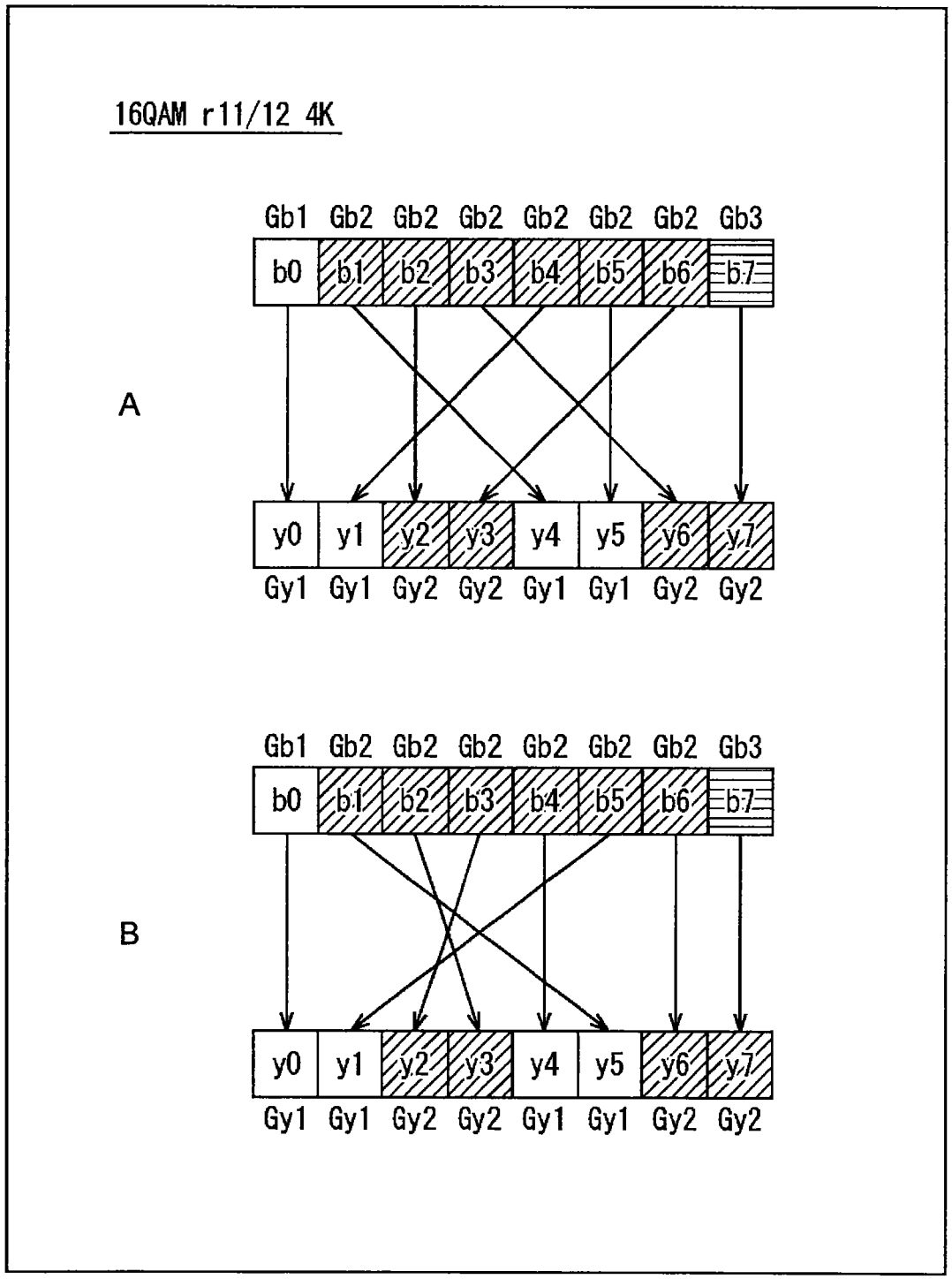
FIG. 106 is a diagram that illustrates the interchange of code bits according to the allocation rule in a case where an LDPC code having a code length of 4k and a coded rate of 11/12 is modulated in 16 QAM, and the multiple b is two.
Figure 107:
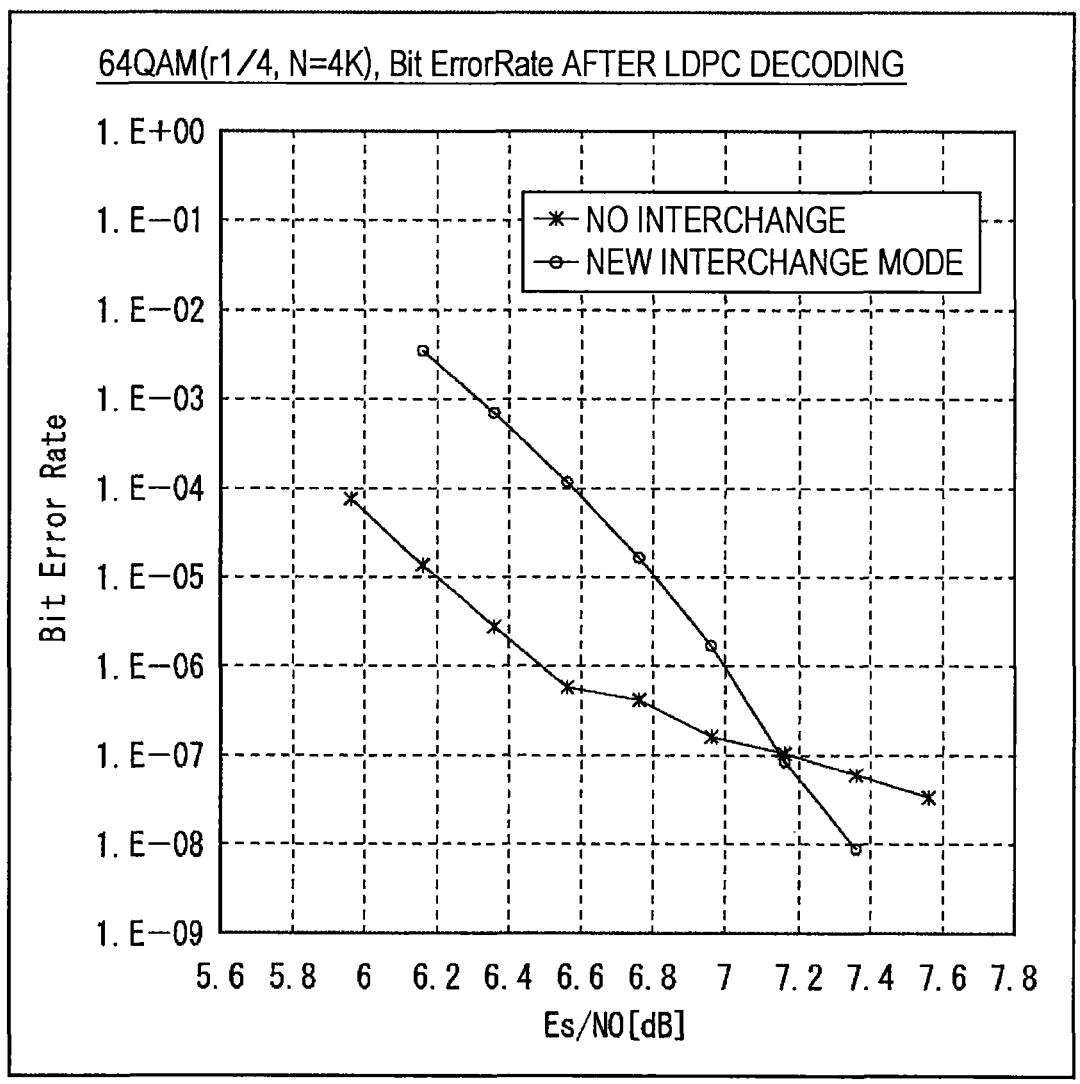
FIG. 107 is a diagram that illustrates a simulation result of a BER in a case where an LDPC code having a code length of 4k and a coded rate of ¼ is modulated in 64 QAM, and the multiple b is two.
Figure 108:
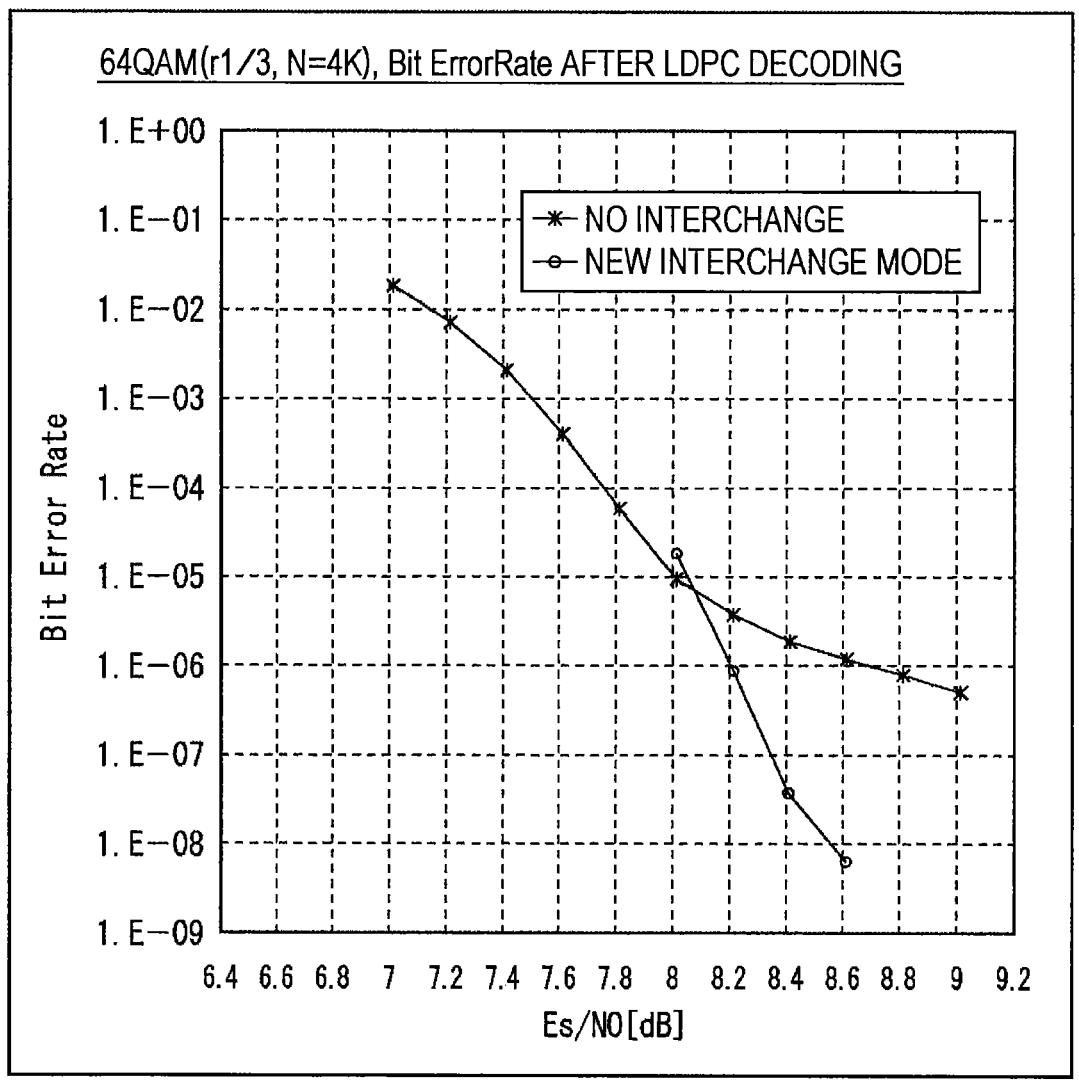
FIG. 108 is a diagram that illustrates a simulation result of a BER in a case where an LDPC code having a code length of 4k and a coded rate of ⅓ is modulated in 64 QAM, and the multiple b is two.
Figure 109:
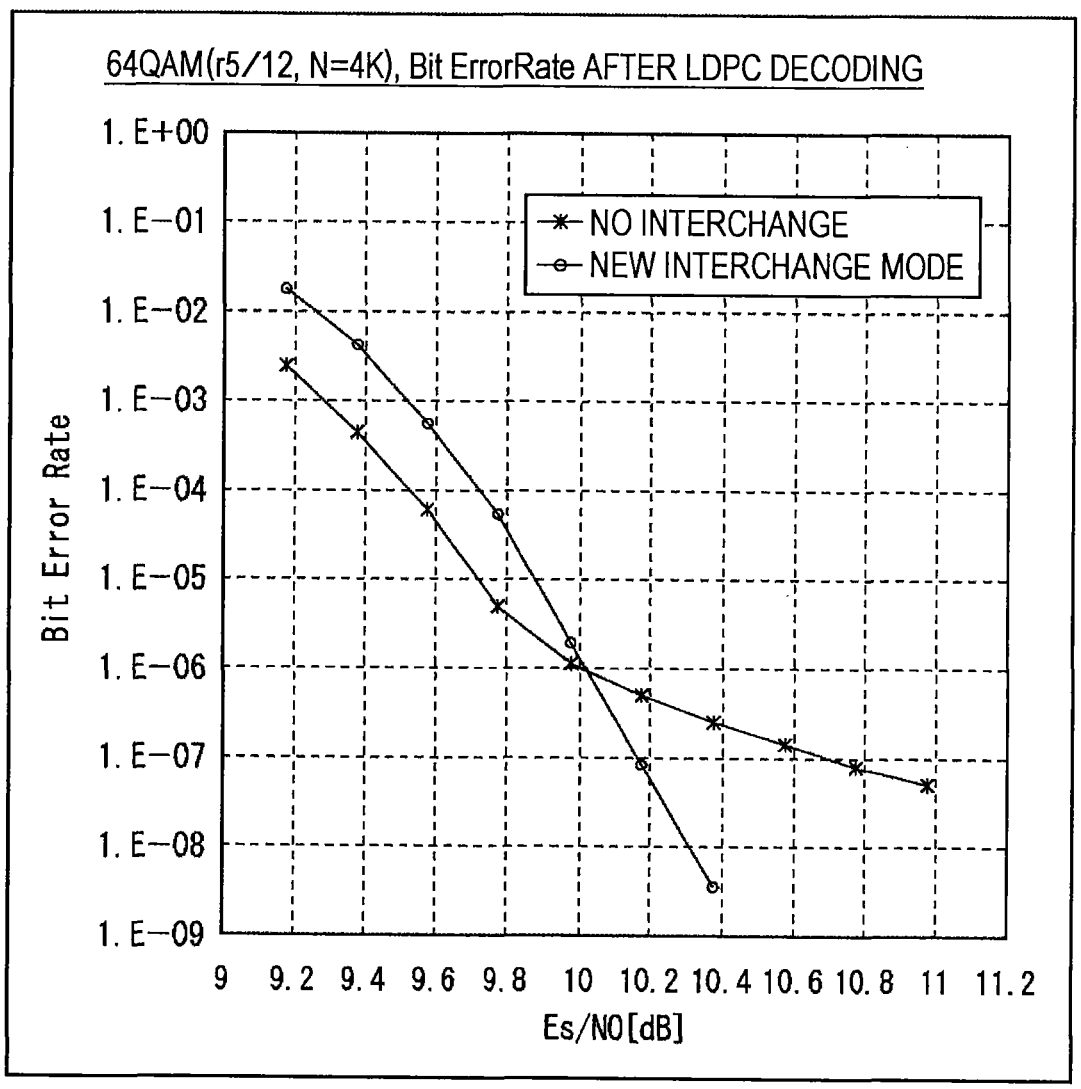
FIG. 109 is a diagram that illustrates a simulation result of a BER in a case where an LDPC code having a code length of 4k and a coded rate of 5/12 is modulated in 64 QAM, and the multiple b is two.
Figure 110:
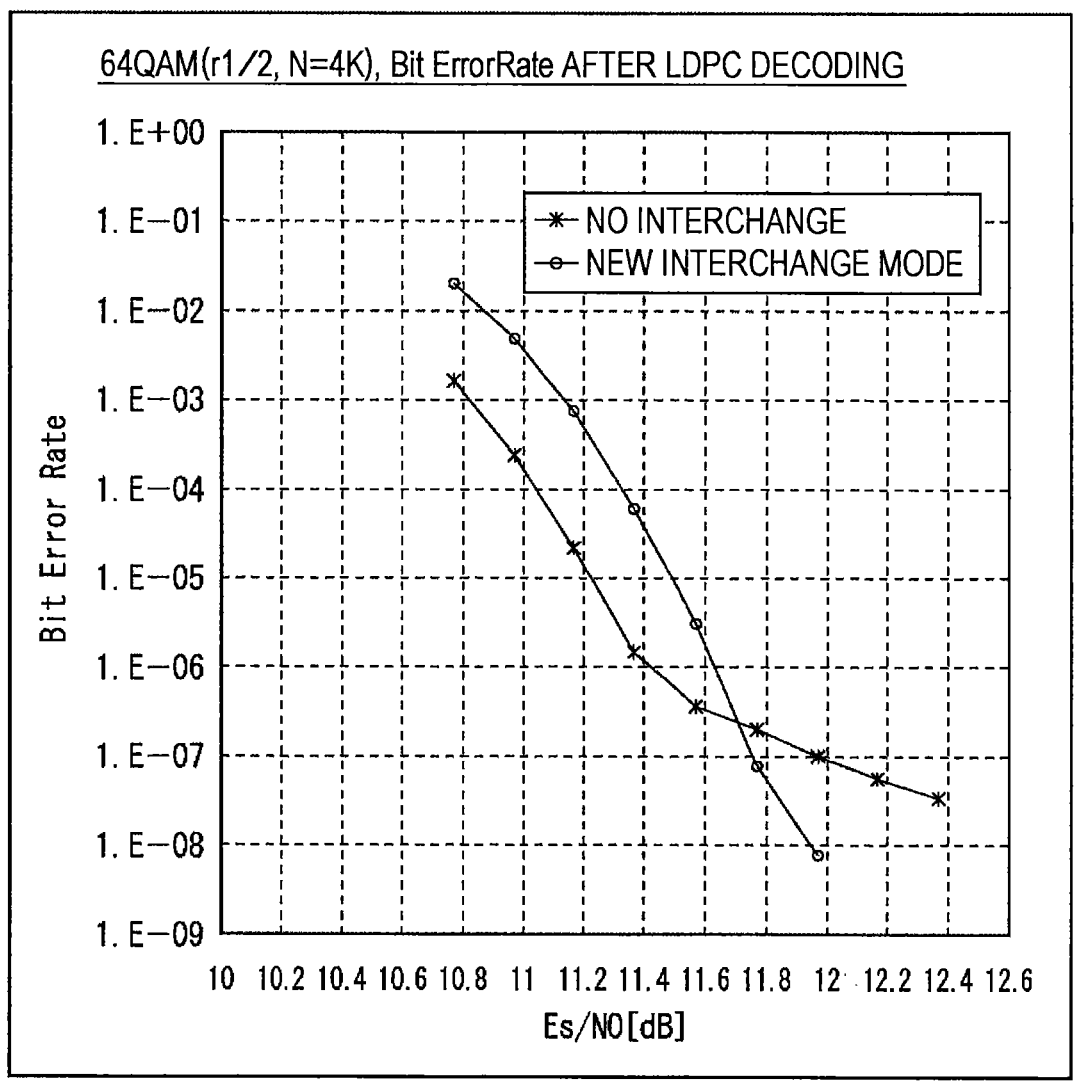
FIG. 110 is a diagram that illustrates a simulation result of a BER in a case where an LDPC code having a code length of 4k and a coded rate of ½ is modulated in 64 QAM, and the multiple b is two.
Figure 111:
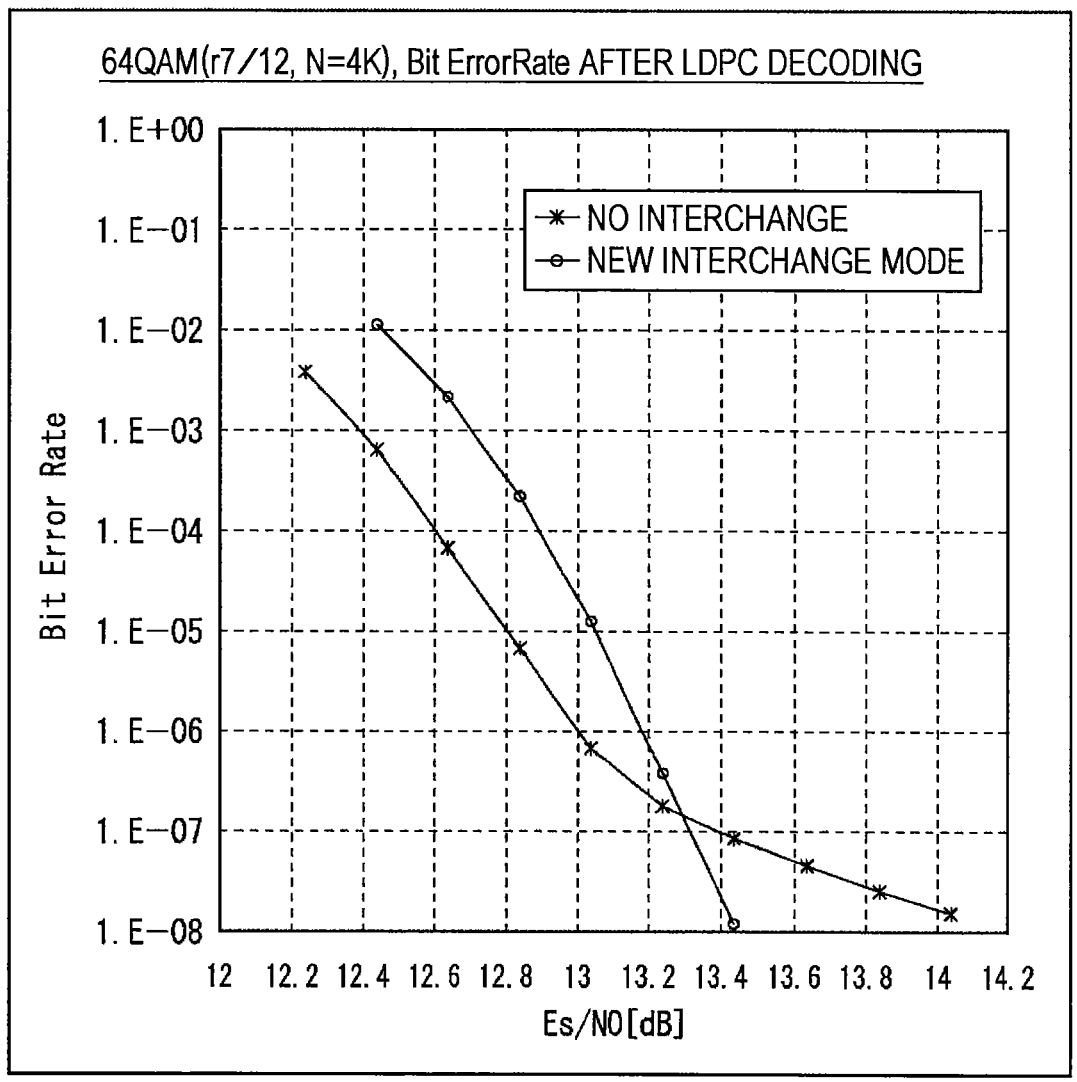
FIG. 111 is a diagram that illustrates a simulation result of a BER in a case where an LDPC code having a code length of 4k and a coded rate of 7/12 is modulated in 64 QAM, and the multiple b is two.
Figure 112:
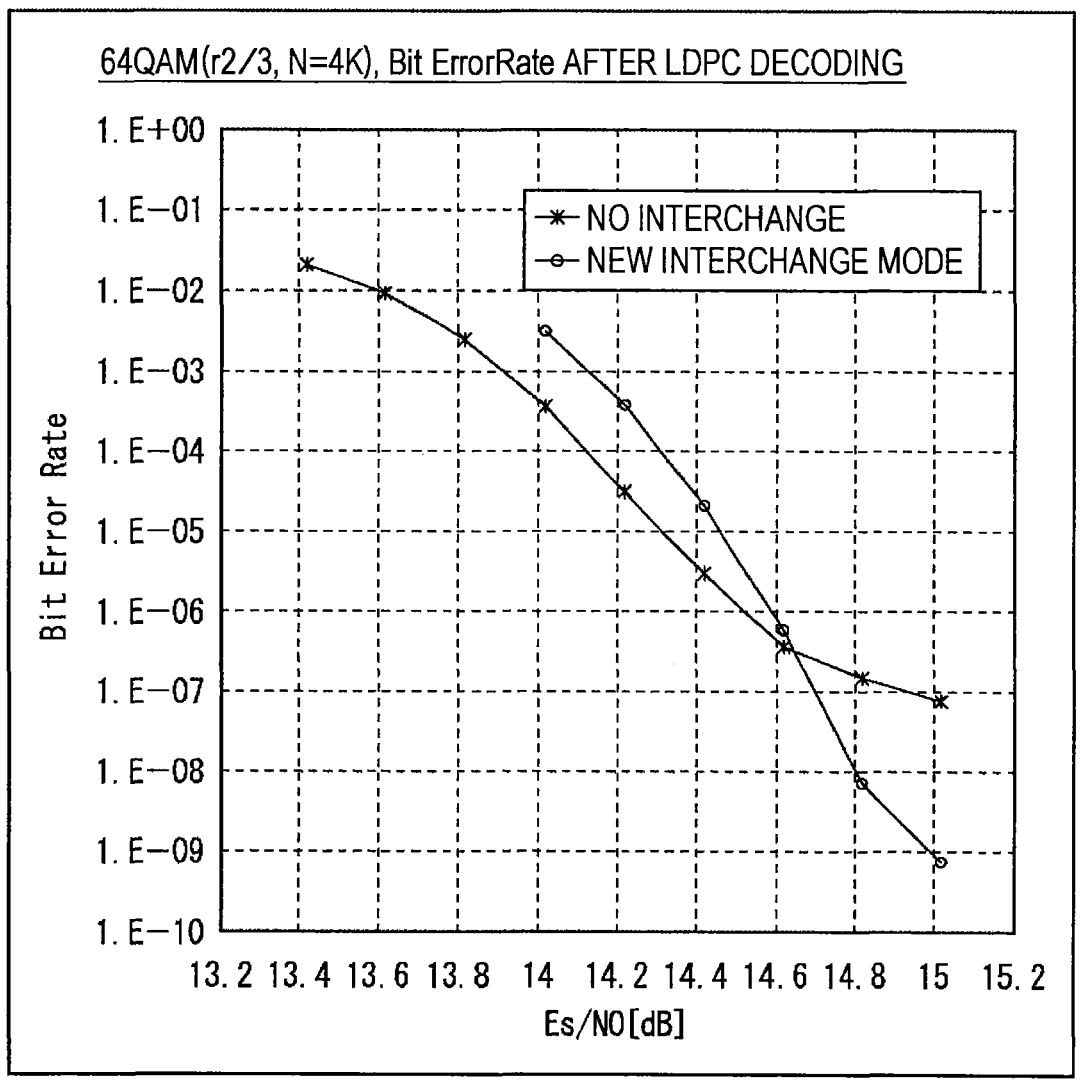
FIG. 112 is a diagram that illustrates a simulation result of a BER in a case where an LDPC code having a code length of 4k and a coded rate of ⅔ is modulated in 64 QAM, and the multiple b is two.
Figure 113:
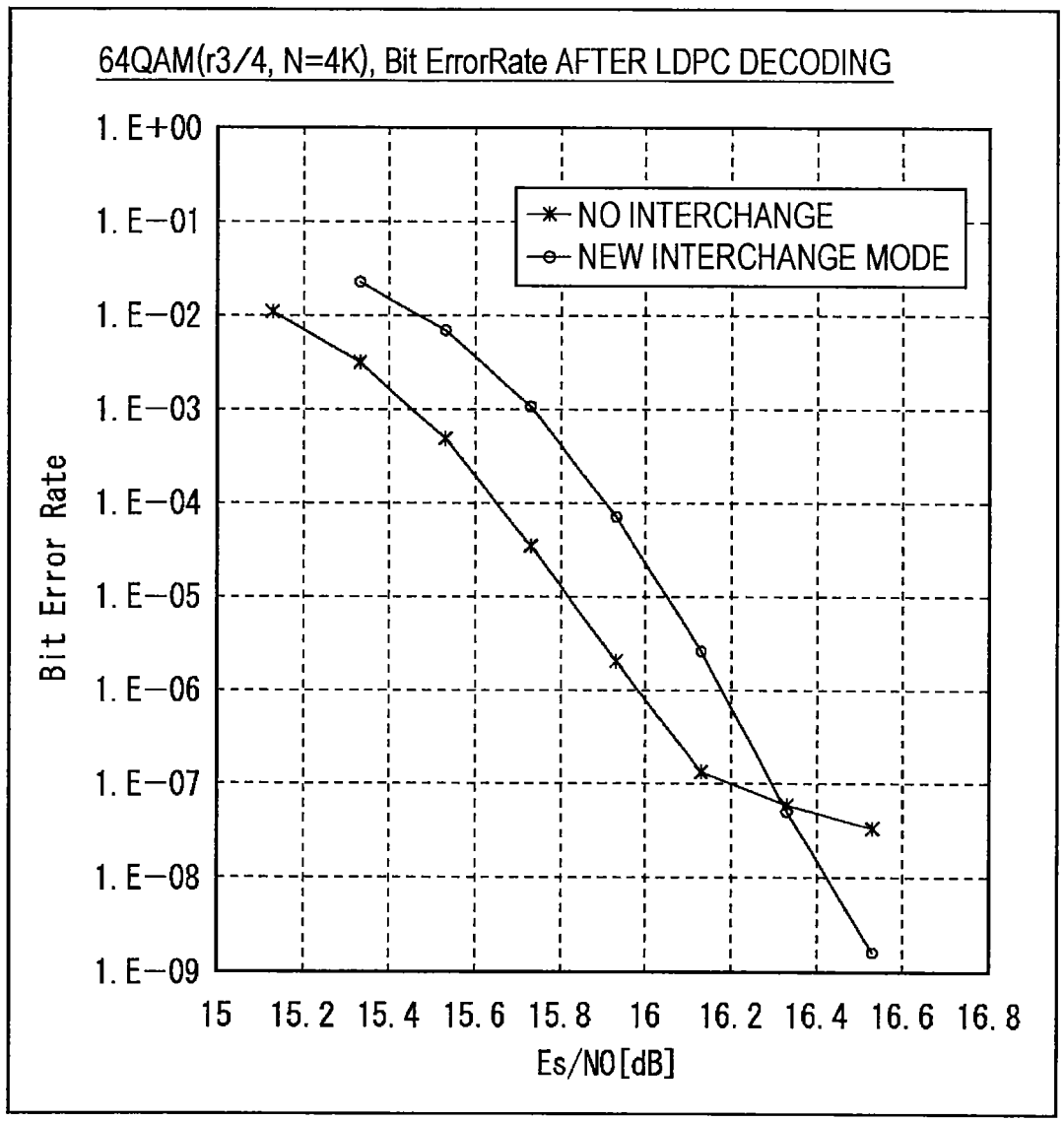
FIG. 113 is a diagram that illustrates a simulation result of a BER in a case where an LDPC code having a code length of 4k and a coded rate of ¾ is modulated in 64 QAM, and the multiple b is two.
Figure 114:
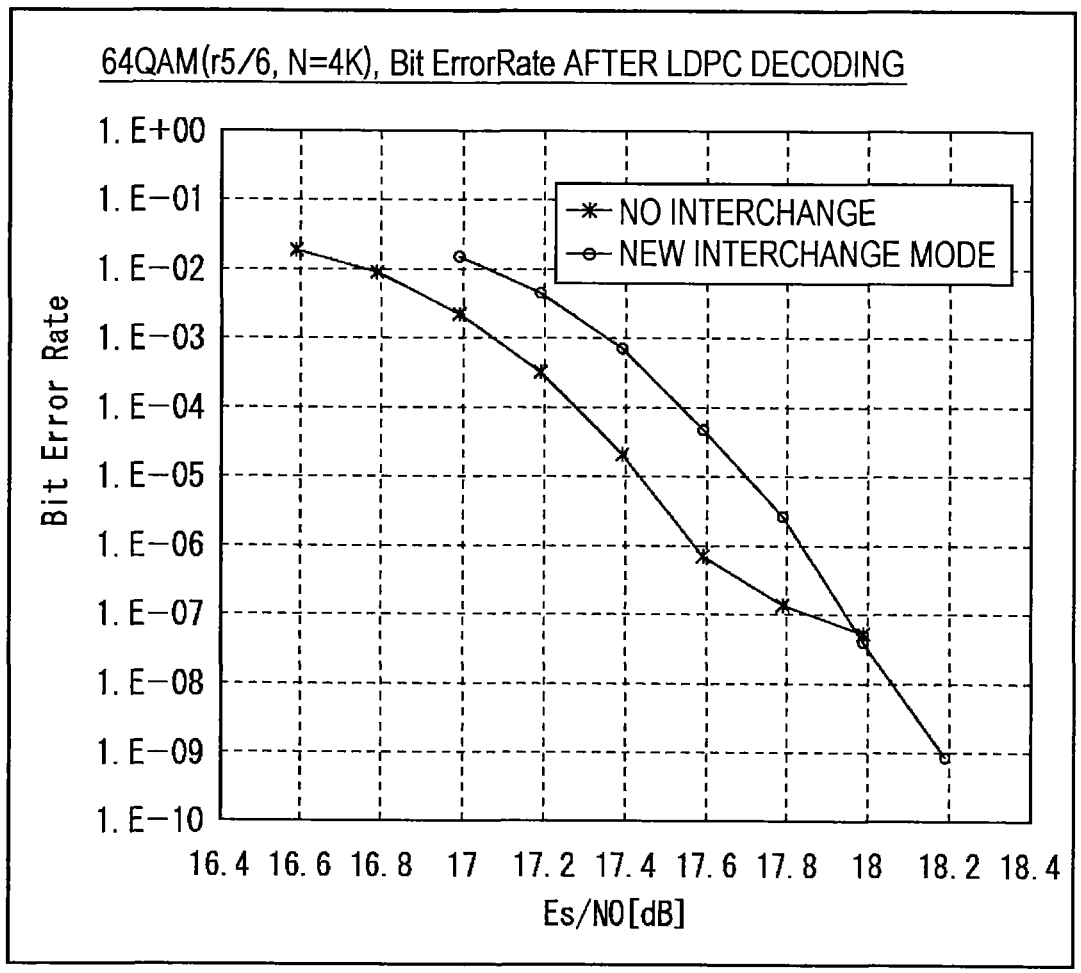
FIG. 114 is a diagram that illustrates a simulation result of a BER in a case where an LDPC code having a code length of 4k and a coded rate of ⅚ is modulated in 64 QAM, and the multiple b is two.
Figure 115:
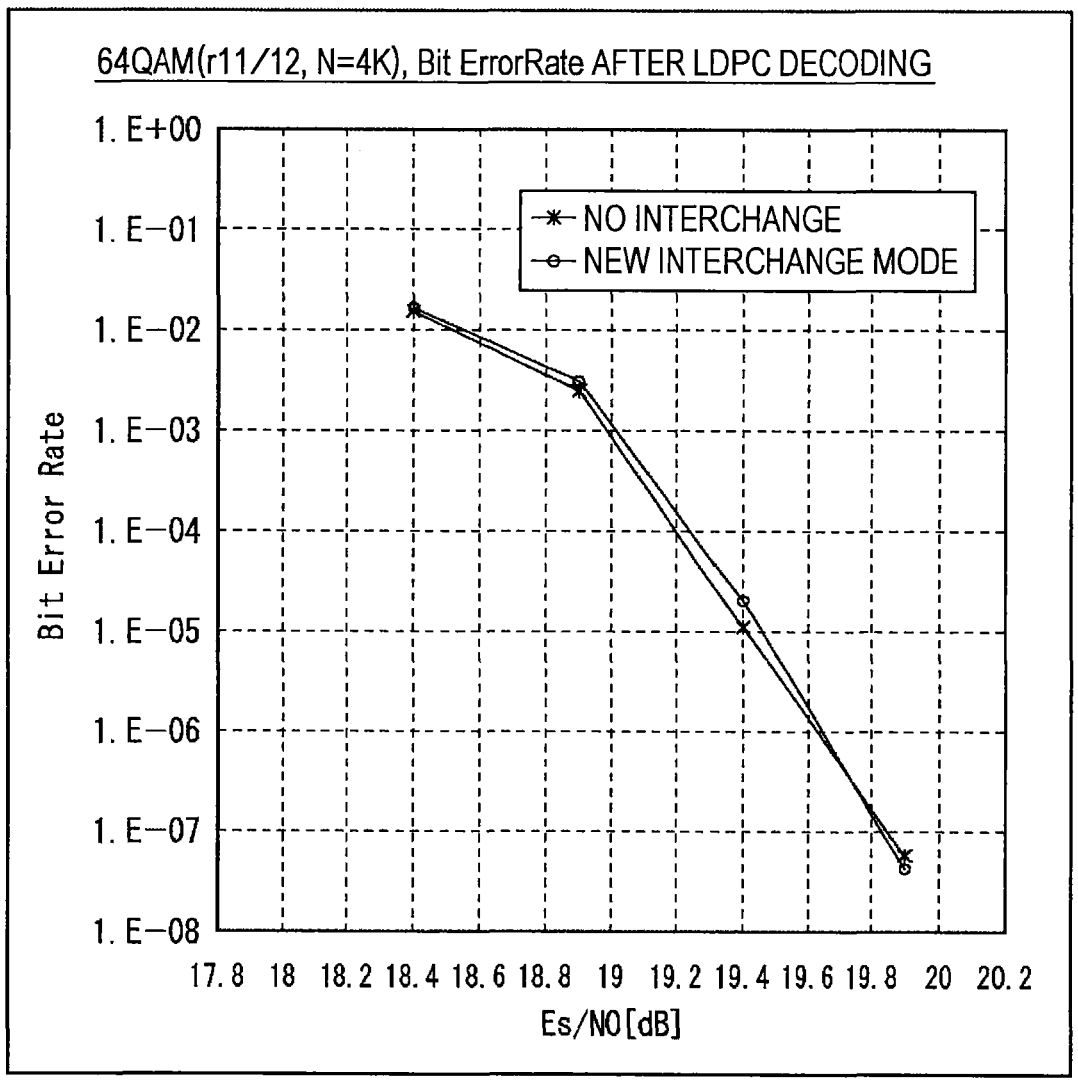
FIG. 115 is a diagram that illustrates a simulation result of a BER in a case where an LDPC code having a code length of 4k and a coded rate of 11/12 is modulated in 64 QAM, and the multiple b is two.
Figure 116:
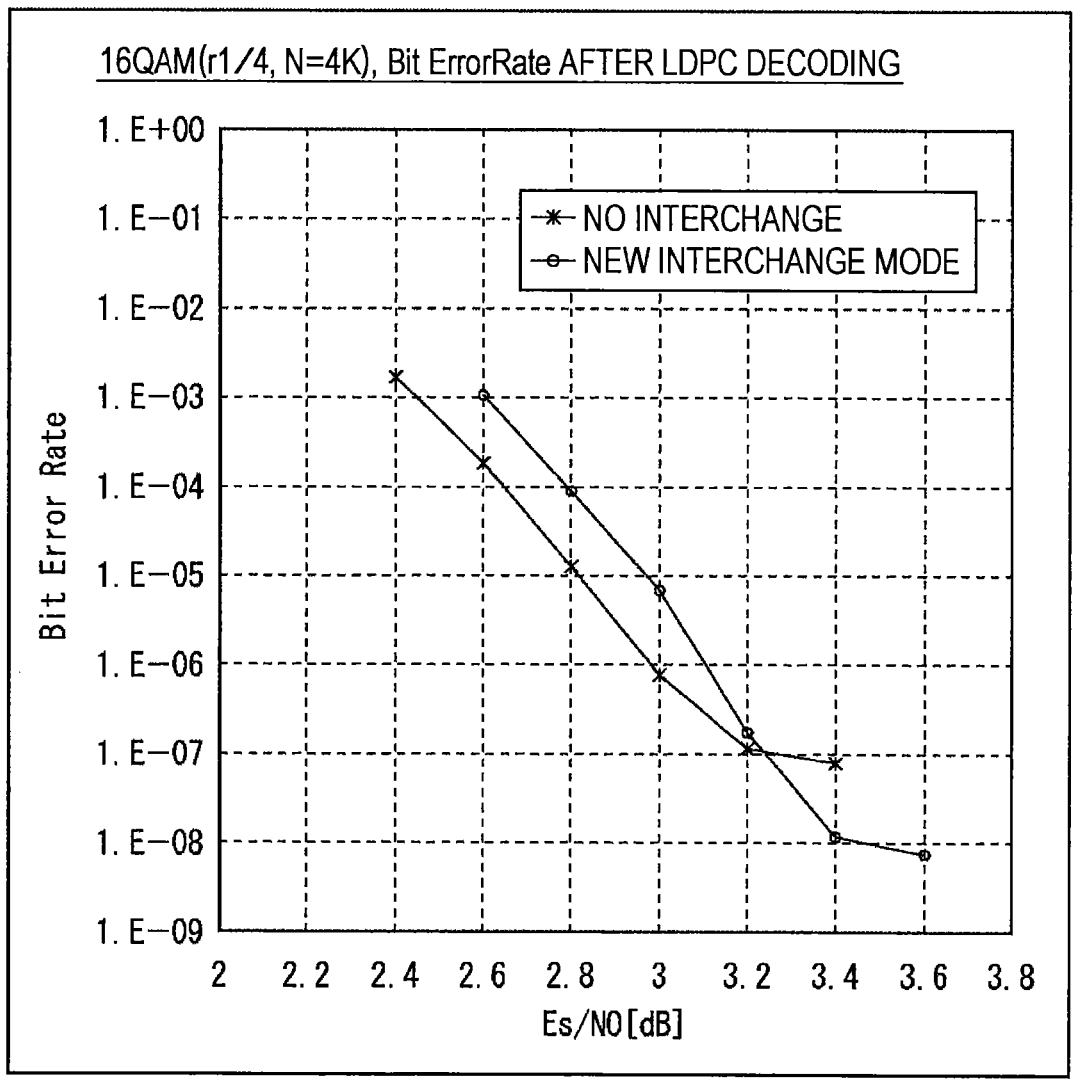
FIG. 116 is a diagram that illustrates a simulation result of a BER in a case where an LDPC code having a code length of 4k and a coded rate of ¼ is modulated in 16 QAM, and the multiple b is two.
Figure 117:
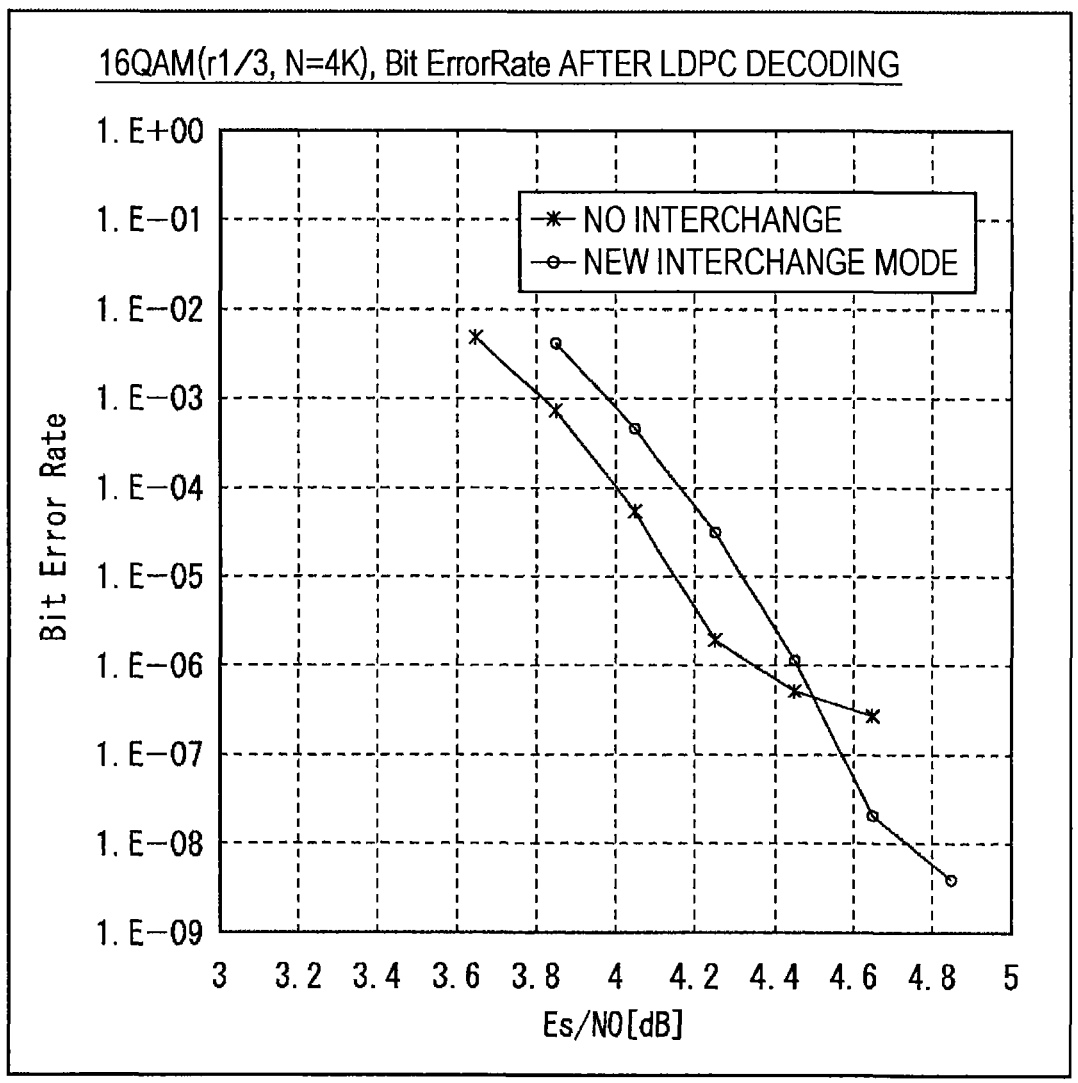
FIG. 117 is a diagram that illustrates a simulation result of a BER in a case where an LDPC code having a code length of 4k and a coded rate of ⅓ is modulated in 16 QAM, and the multiple b is two.
Figure 118:
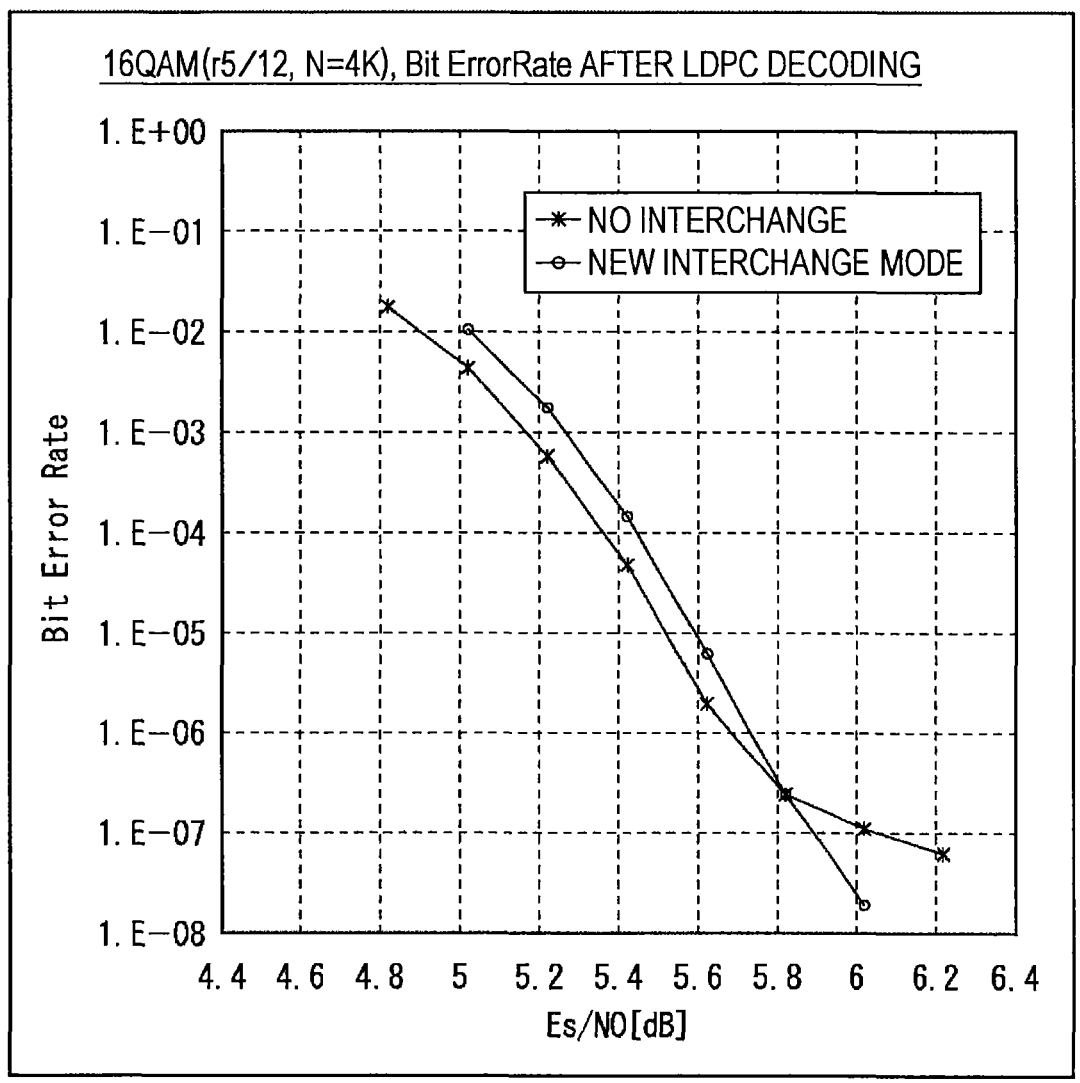
FIG. 118 is a diagram that illustrates a simulation result of a BER in a case where an LDPC code having a code length of 4k and a coded rate of 5/12 is modulated in 16 QAM, and the multiple b is two.
Figure 119:
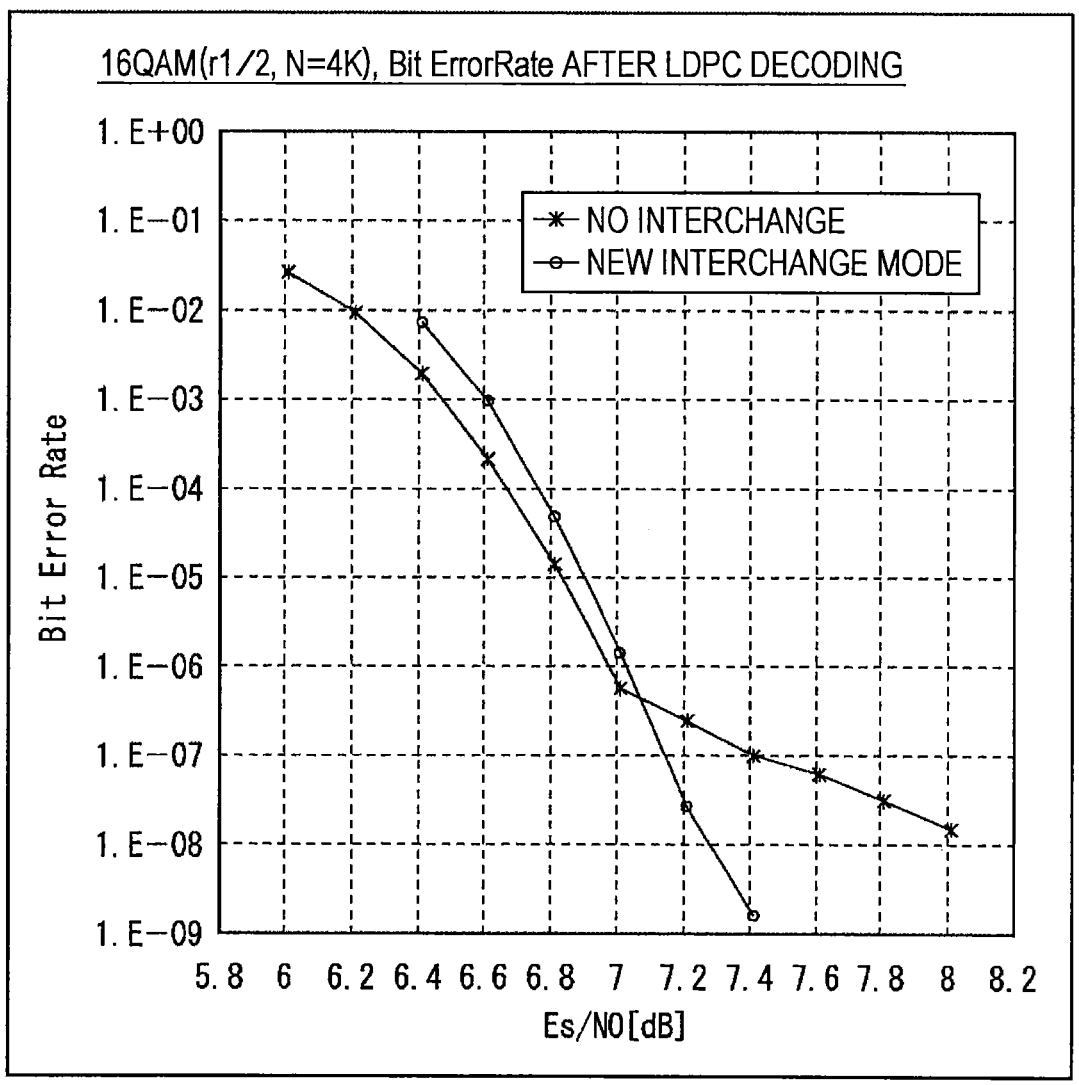
FIG. 119 is a diagram that illustrates a simulation result of a BER in a case where an LDPC code having a code length of 4k and a coded rate of ½ is modulated in 16 QAM, and the multiple b is two.
Figure 120:
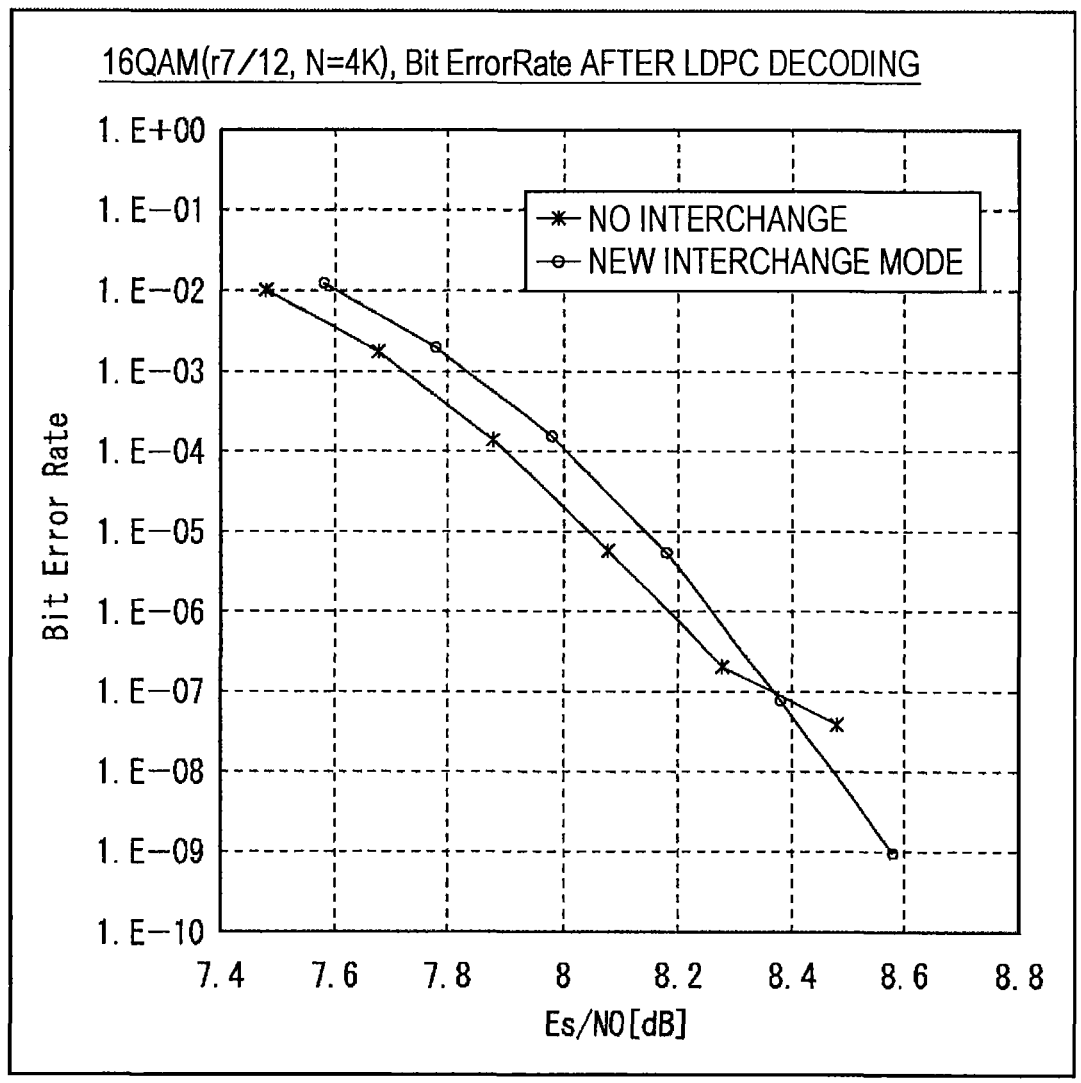
Figure 121:
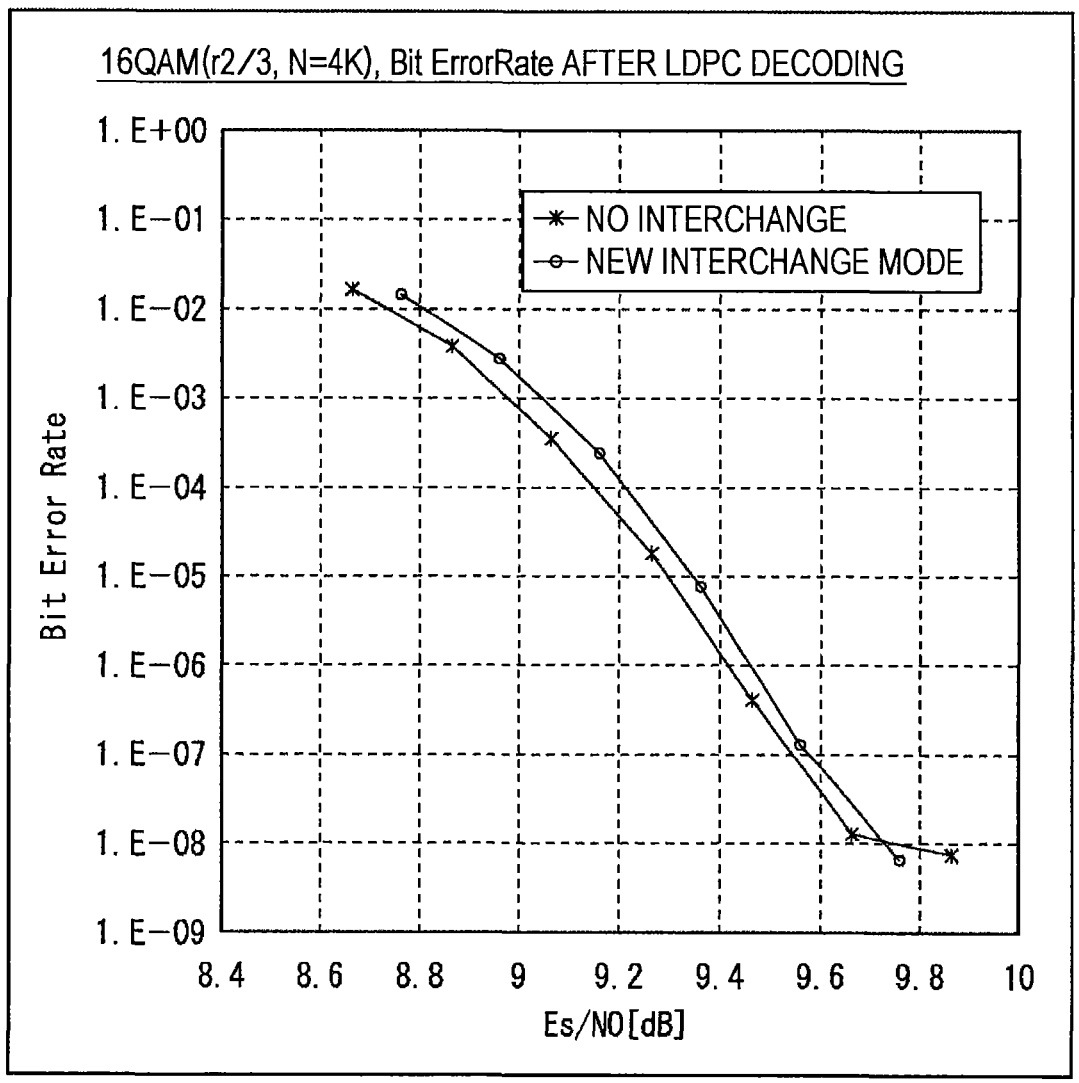
Figure 122:
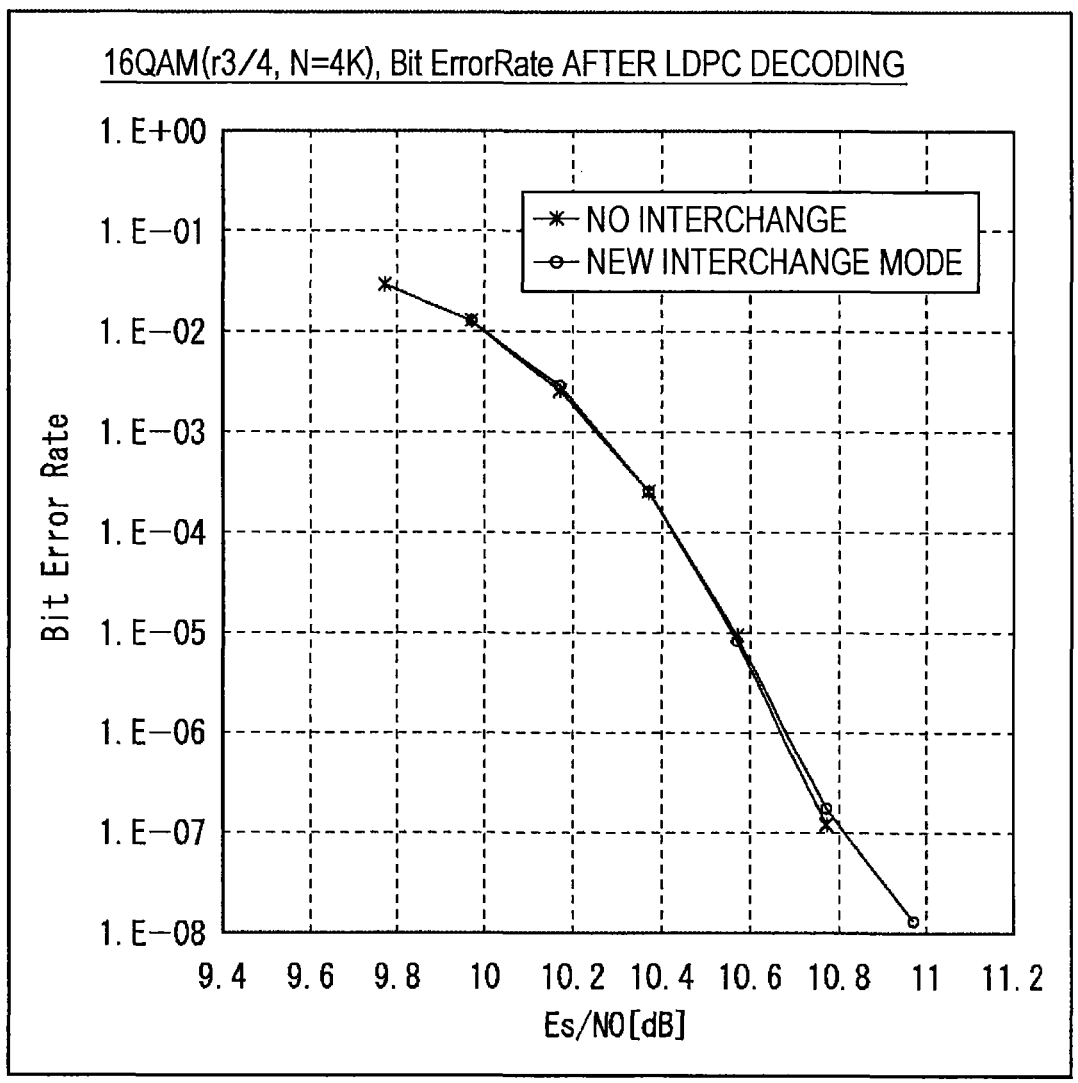
Figure 123:
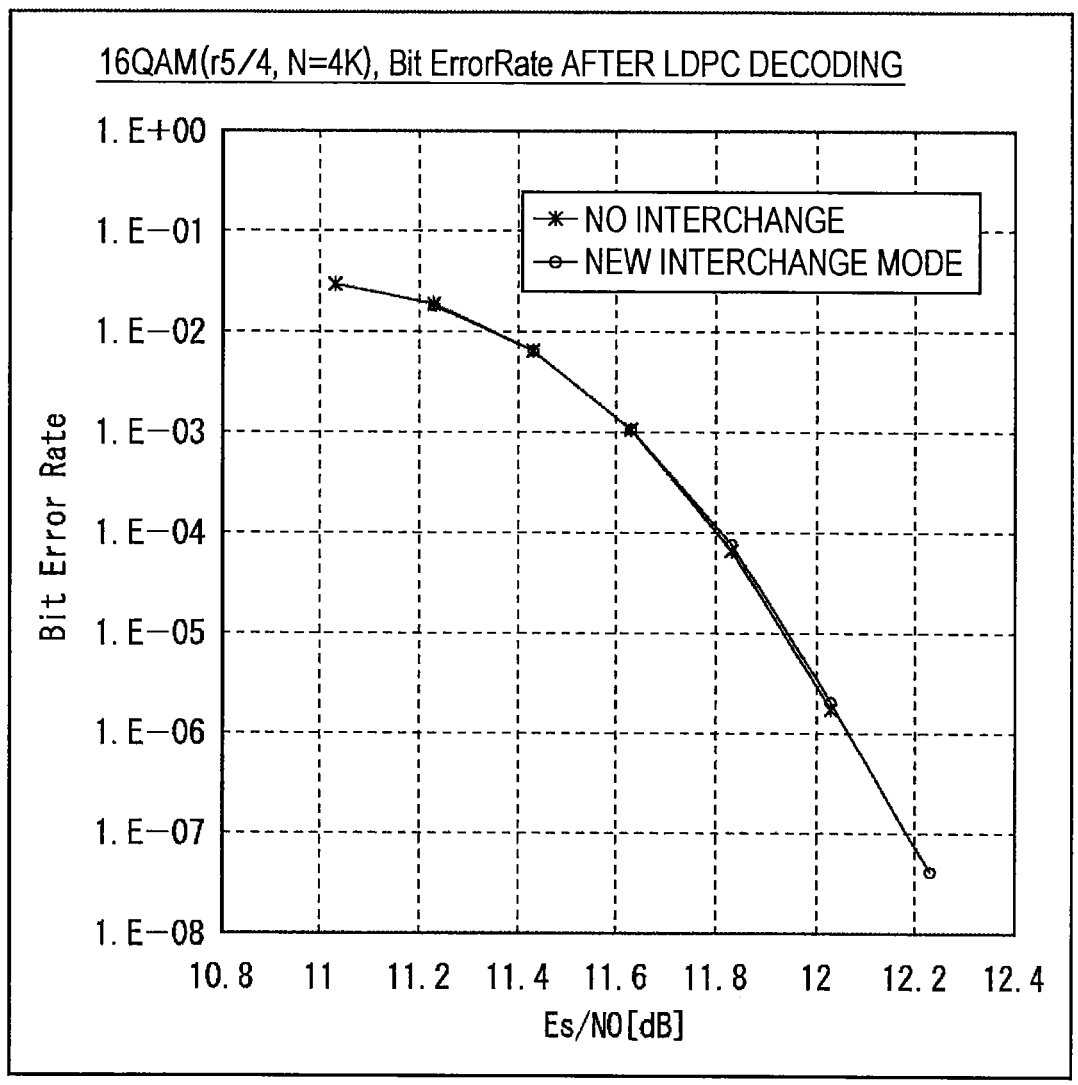
Figure 124:
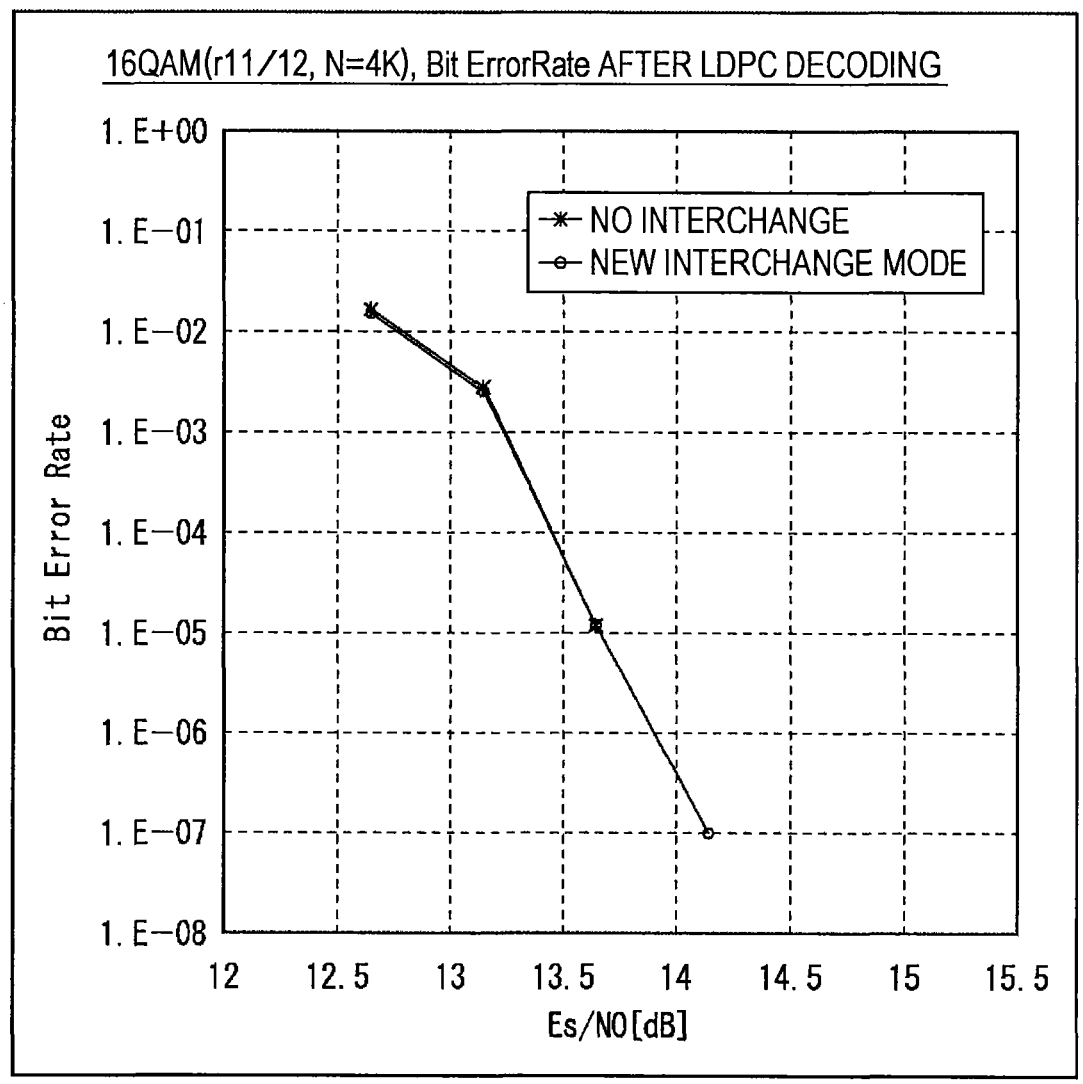

FIG. 106 illustrates an example of the interchange of code bits according to the allocation rule illustrated in FIG. 105.

In other words, A of FIG. 106 illustrates a first example of the interchange of code bits according to the allocation rule illustrated in FIG. 105 in a case where the LDPC code is a mobile LDPC code having a code length N of 4320 bits and a coded rate of $11/12$, the modulation mode is 16 QAM, and the multiple b is 2.

In a case where the LDPC code is a mobile LDPC code having a code length N of 4320 bits and a coded rate of $11/12$, the modulation mode is 16 QAM, and the multiple b is 2, in the demultiplexer 25, code bits written into the memory 31 of (4320/(4×2))×(4×2) bits in the column direction×the row direction are read in units of 4×2 (=mb) bits in the row direction and are supplied to the interchange unit 32 (FIGS. 18 and 19).

The interchange unit 32 interchanges code bits b0 to b7 of 4×2 (=mb) bits according to the allocation rule illustrated in FIG. 105 such that the code bits b0 to b7 of 4×2 (=mb) bits read from the memory 31 are, for example, as illustrated in A of FIG. 106, allocated to symbol bits y0 to y7 of 4×2 (=mb) bits of two (=b) symbols.

In other words, the interchange unit 32 performs an interchange process in which:

the code bit b0 is allocated to the symbol bit y0;
the code bit b1 to the symbol bit y4;
the code bit b2 to the symbol bit y2;
the code bit b3 to the symbol bit y6;
the code bit b4 to the symbol bit y1;
the code bit b5 to the symbol bit y5;
the code bit b6 to the symbol bit y3; and
the code bit b7 to the symbol bit y7.

B of FIG. 106 illustrates a second example of the interchange of code bits according to the allocation rule illustrated in FIG. 105 in a case where the LDPC code is a mobile LDPC code having a code length N of 4320 bits and a coded rate of $11/12$, the modulation mode is 16 QAM, and the multiple b is 2.

As illustrated in B of FIG. 106, the interchange unit 32 performs an interchange process for code bits b0 to b7 of 4×2 (=mb) bits read from the memory 31, according to the allocation rule illustrated in FIG. 105, in which:

the code bit b0 is allocated to the symbol bit y0;
the code bit b1 to the symbol bit y5;
the code bit b2 to the symbol bit y3;
the code bit b3 to the symbol bit y2;
the code bit b4 to the symbol bit y4;
the code bit b5 to the symbol bit y1;
the code bit b6 to the symbol bit y6; and
the code bit b7 to the symbol bit y7.

FIGS. 107, 108, 109, 110, 111, 112, 113, 114, 115, 116, 117, 118, 119, 120, 121, 122, 123 and 124 illustrate simulation results of BERs (Bit Error Rates) in a case where the interchange process of the new interchange mode is performed and a case where the interchange process is not performed.

In other words, FIGS. 107 to 115 illustrate BERs in a case where mobile LDPC codes (FIGS. 35 to 43) having a code length N of 4320 and coded rates of $1/4$, $1/3$, $5/12$, $1/2$, $7/12$, $2/3$, $3/4$, $5/6$, and $11/12$ are set as targets, and 64 QAM is employed as the modulation mode.

FIGS. 116 to 124 illustrate BERs in a case where mobile LDPC codes having a code length N of 4320 and coded rates of $1/4$, $1/3$, $5/12$, $1/2$, $7/12$, $2/3$, $3/4$, $5/6$, and $11/12$ are set as targets, and 16 QAM is employed as the modulation mode.

Here, in FIGS. 107 to 124, the multiple b is 2.

In FIGS. 107 to 123, the horizontal axis represents the $E_s/N_0$ (a signal power-to-noise power ratio per symbol), and the vertical axis represents the BER. In addition, a white circle (○) represents the BER in a case where the interchange process of the new interchange mode is performed, and asterisk represents the BER in a case where the interchange process is not performed.

As illustrated in FIGS. 107 to 124, according to the interchange process of the new interchange mode, compared to a case where the interchange process is not performed, the BER is improved as a whole or at an $E_s/N_0$ of a certain level and above, and accordingly, it can be understood that the resistance to error is improved.

Here, as a method of interchanging code bits of an LDPC code in the interchange process performed by the interchange unit 32, in other words, a pattern (hereinafter, also referred to as a bit allocation pattern) of allocation of code bits of an LDPC code and symbol bits representing a symbol, for LDPC codes having mutually-different coded rates, bit allocation patterns dedicatedly used for the LDPC codes can be employed.

However, when the bit allocation patterns dedicatedly used for LDPC codes are employed for the LDPC codes having mutually-different coded rates, it is necessary to mount a plurality of bit allocation patterns in the transmission device 11, and the bit allocation pattern need to be changed (switched) for LDPC codes having mutually-different coded rates.

Meanwhile, according to the interchange process described with reference to FIGS. 53 to 106, the number of the bit allocation patterns to be mounted in the transmission device 11 can decrease.

In other words, in a case where the code length N is 4320 bits, and the modulation mode is 64 QAM, by employing a bit allocation pattern for allocating code bits b0, b1, b2, b3, b4, b5, b6, b7, b8, b9, b10, and b11 to symbol bits y11, y10, y4, y5, y2, y3, y8, y9, y6, y7, y1, and y0, respectively, which is illustrated in A of FIG. 55, for an LDPC code having a coded rate of ¼, employing a bit allocation pattern for allocating code bits b0 to bib to symbol bits y0, y11, y1, y10, y4, y8, y2, y9, y3, y7, y5, and y6, respectively, which is illustrated in A of FIGS. 58, 61, 64, and 67, for LDPC codes having coded rates of ⅓, 5/12, ½, and, 7/12, and employing a bit allocation pattern for allocating code bits b0 to bib to symbol bits y2, y8, y5, y11, y0, y6, y1, y10, y4, y9, y3, and y7, respectively, which is illustrated in A's of FIGS. 70, 73, 76, and 79, for LDPC codes having coded rates of ⅔, ¾, ⅚, and 11/12, only three patterns of the bit allocation pattern may be mounted in the transmission device 11.

In addition, in a case where the code length N is 4320 bits, and the modulation mode is 16 QAM, by employing a bit allocation pattern for allocating code bits b0 to b7 to symbol bits y7, y6, y4, y3, y2, y5, y1, and y0, respectively, which is illustrated in A's of FIGS. 82, 85, and 91, for LDPC codes having coded rates of ¼, ⅓, and ½ and employing a bit allocation pattern for allocating code bits b0 to b7 to symbol bits y0, y4, y2, y6, y1, y5, y3, and y7, respectively, which is illustrated in A's of FIGS. 88, 94, 97, 100, 103, and 106, for LDPC codes having coded rates of 5/12, 7/12, ⅔, ¾, ⅚, and, 11/12, only two patterns of the bit allocation pattern may be mounted in the transmission device 11.

In this embodiment, for the convenience of description, while the interchange unit 32 of the demultiplexer 25 has been described to perform the interchange process for code bits read from the memory 31 as targets, the interchange process may be performed by controlling writing or reading of code bits into/from the memory 31.

In other words, the interchange process, for example, may be performed by performing control of the address (read-out address) from which a code bit is read such that the reading of code bits from the memory 31 is performed in the order of code bits after the interchange.

LDPC Code (Second 4k Code) Having Code Length N of 4320 Bits

However, for an LDPC code (hereinafter, also referred to as a first 4k code) having a code length of 4k bits acquired using the parity check matrix acquired from the parity check matrix initial value tables illustrated in FIGS. 35 to 43, from the viewpoint of maintaining the compatibility with DVB-T.2 as possibly as can, similarly to the case of an LDPC code defined in DVB-T.2, 360 defined in DVB-T.2 is employed as the number P of column units of the cyclic structure.

However, there are cases where the compatibility with DVB-T.2 is requested to be sacrificed more or less so as to improve the BER.

FIGS. 125 to 128 are diagrams illustrating examples of the parity check matrix initial value table of a second 4k code that is a mobile LDPC code having a code length of 4k bits other than the first 4k code.

In other words, FIG. 125 illustrates a parity check matrix initial value table for a parity check matrix H having a code length N of 4k bits and a coded rate r of ½.

FIG. 126 illustrates a parity check matrix initial value table for a parity check matrix H having a code length N of 4k bits and a coded rate r of 7/12.

FIG. 127 illustrates a parity check matrix initial value table for a parity check matrix H having a code length N of 4k bits and a coded rate r of ⅔.

FIG. 128 illustrates a parity check matrix initial value table for a parity check matrix H having a code length N of 4k bits and a coded rate r of ¾.

In addition, the parity matrix of the parity check matrix acquired from the parity check matrix initial value tables illustrated in FIGS. 125 to 128 has a staircase structure (FIG. 11).

Furthermore, for the second 4k code that is an LDPC code having a code length of 4k bits acquired using the parity check matrix acquired from the parity check matrix initial value tables illustrated in FIGS. 125 to 128, similarly to the LDPC code defined in DVB-T.2, the information matrix of the parity check matrix H has a cyclic structure.

However, for the second 4k code, the number P of unit columns of the cyclic structure is not 360 but 72 that is one divisor of 360.

The LDPC encoder 115 (FIGS. 8 and 31) can perform LDPC encoding into any one of the second 4k codes having a code length N of 4k bits and a coded rate r of any one of four types including ½, 7/12, ⅔, and ¾ by using a parity check matrix acquired from the parity check matrix initial value tables illustrated in FIGS. 125 to 128.

In other words, the LDPC encoder 115 sets the number P of unit columns of the cyclic structure not to 360 but to 72, acquires a parity check matrix from the parity check matrix initial value tables illustrated in FIGS. 125 to 128, similarly to the case described with reference to FIG. 34, and performs LDPC encoding into the second 4k code using the parity check matrix.

The second 4k codes (the parity check matrix initial value tables thereof) illustrated in FIGS. 125 to 128 are acquired by performing the same simulation as the simulation for acquiring the first 4k codes illustrated in FIGS. 35 to 43.

In other words, in a simulation for acquiring the second 4k code, an ensemble of which the capability threshold, which is $E_b/N_0$, at which the BER starts to fall (decrease) in accordance with the density evolution of the multi-edge type is a predetermined value or less is searched for, and, among the LDPC codes belonging to the ensemble, an LDPC code decreasing the BER in a plurality of modulation modes used for digital broadcasting dedicatedly used for mobile terminals such as 16 QAM or 64 QAM is selected as an LDPC code having a high capability.

Accordingly, in the simulation for acquiring the second 4k code, similarly to the simulation for acquiring the first 4k code, in order to improve the resistance to error, a modulation mode in which the number of signal points is relatively small such as QPSK, 16 QAM or 64 QAM is employed.

Figures 129, 130:
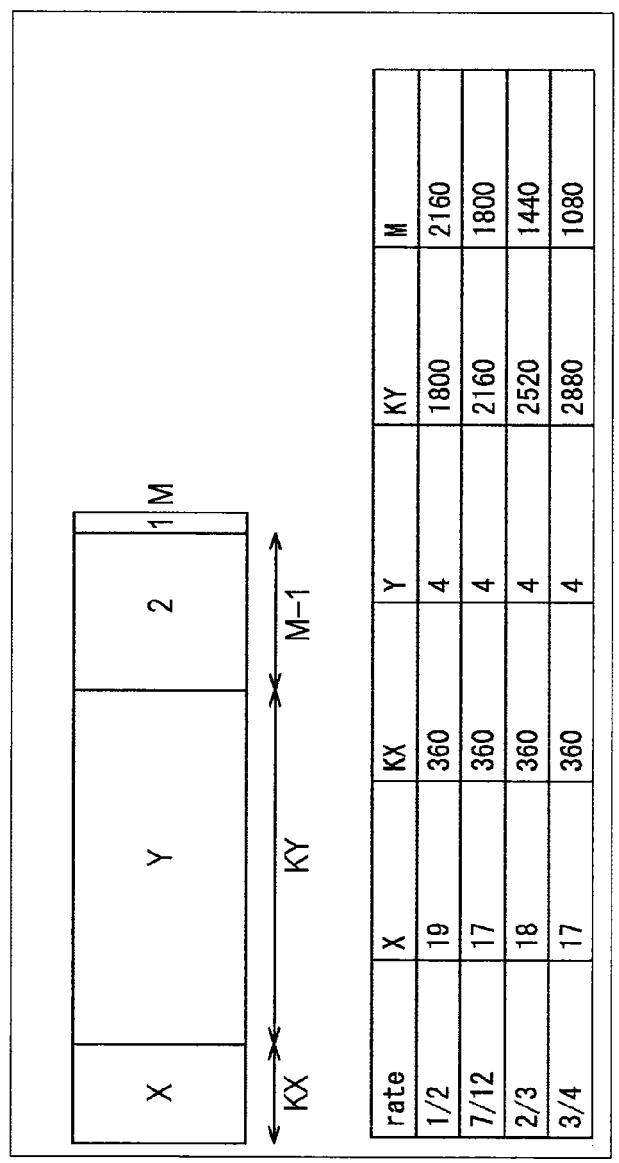

FIG. 129 is a diagram illustrating a minimum cycle length and a capability threshold of the parity check matrix that is acquired from the parity check matrix initial value tables of the second 4k codes having coded rates r of four kinds of ½, 7/12, ⅔, and ¾ illustrated in FIGS. 125 to 128.

All the minimum cycle lengths of the parity check matrix acquired from the parity check matrix initial value tables illustrated in FIGS. 125 to 128 are six cycles, and the cycle-4 is not present.

In addition, as the coded rate r decreases, the redundancy of the LDPC code increases, and accordingly, the capability threshold is improved (decreases) as the coded rate r decreases.

FIG. 130 is a diagram illustrating the parity check matrix (of the second 4k code acquired from the parity check matrix initial value table) of FIGS. 125 to 128.

In the parity check matrix of the second 4k code, similarly to the case of the first 4k code described with reference to FIGS. 47 and 48, a column weight is set to X for KX columns from the first column, a column weight is set to Y for the subsequent KY columns, a column weight is set to two for the subsequent (M−1) columns, and a column weight is set to one for the last column.

Here, KX+KY+M−1+1 is the same as the code length N=4320 bits.

The number of columns KX, KY, and M and the column weights X and Y of the second 4k code for each coded rate r of ½, 7/12, ⅔, and ¾ are as represented in FIG. 130.

For a parity check matrix of the second 4k code, similarly to the parity check matrix defined in DVB-T.2 described with reference to FIGS. 12 and 13 or the parity check matrix of the first 4k code, as a column is located on the further front side (left side), the column weight tends to be large, and accordingly, a code bit of the second 4k code that is located on the further front side tends to be strong for error (has resistance to error).

Figure 131:
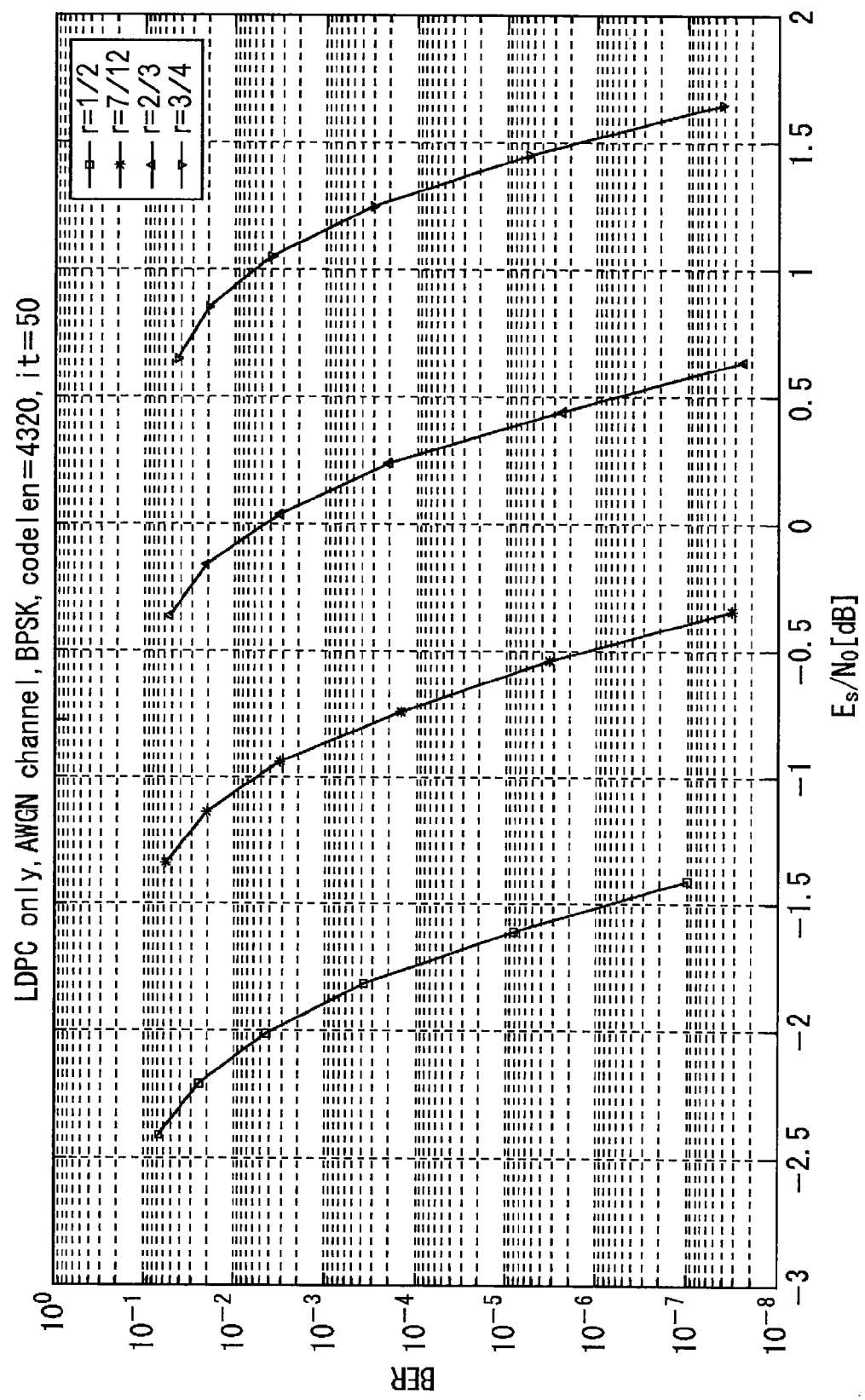

FIG. 131 is a diagram illustrating a simulation result of the BER that is performed for the second 4k code.

In the simulation, an AWGN communication channel (channel) is considered, BPSK is employed as the modulation mode, and, as the number C of repetition of decoding, 50 is employed.

In FIG. 131, the horizontal axis represents $E_s/N_0$ (a signal power-to-noise power ratio per symbol), and the vertical axis represents the BER.

According to the inventors of the present disclosure, it is checked that the BER of the second 4k code is improved more than that of the first 4k code for any one of the coded rates r of ½, 7/12, ⅔, and ¾, and, according to the second 4k code, the resistance to error can be improved.

Configuration Example of Reception Device 12

FIG. 132 is a block diagram illustrating a configuration example of the reception device 12 illustrated in FIG. 7.

An OFDM processing unit (OFDM operation) 151 receives an OFDM signal from the transmission device 11 (FIG. 7) and performs signal processing of the OFDM signal. The data (symbol) acquired by the OFDM processing unit 151 performing the signal processing is supplied to a frame managing unit (Frame Management) 152.

The frame managing unit 152 performs processing (frame analysis) of a frame configured by symbols supplied from the OFDM processing unit 151 and supplies symbols of the target data and symbols of control data acquired as a result thereof to frequency deinterleavers 161 and 153.

The frequency deinterleaver 153 performs frequency deinterleaving for the symbols supplied from the frame managing unit 152 in units of symbols and supplies resultant data to a QAM decoder 154.

The QAM decoder 154 performs orthogonal demodulation for the symbols (symbols arranged at signal points) supplied from the frequency deinterleaver 153 by demapping (signal point arrangement decoding) the symbols and supplies data (LDPC code) acquired as a result thereof to an LDPC decoder 155.

The LDPC decoder 155 performs LDPC decoding of the LDPC code supplied from the QAM decoder 154 and supplies LDPC target data (here, a BCH code) acquired as a result thereof to a BCH decoder 156.

The BCH decoder 156 performs BCH decoding of the LDPC target data supplied from the LDPC decoder 155 and outputs control data (signaling) acquired as a result thereof.

On the other hand, the frequency deinterleaver 161 performs frequency deinterleaving for the symbols supplied from the frame managing unit 152 in units of symbols and supplies resultant data to an MISO/MIMO decoder 162.

The MISO/MIMO decoder 162 performs time and spatial decoding of the data (symbol) supplied from the frequency deinterleaver 161 and supplies resultant data to a time deinterleaver 163.

The time deinterleaver 163 performs time deinterleaving for the data (symbols) supplied from the MISO/MIMO decoder 162 in units of symbols and supplies resultant data to a QAM decoder 164.

The QAM decoder 164 performs orthogonal demodulation for the symbols (symbols arranged at signal points) supplied from the time deinterleaver 163 by demapping (signal point arrangement decoding) the symbols and supplies data (symbols) acquired as a result thereof to a bit deinterleaver 165.

The bit deinterleaver 165 performs bit deinterleaving of the data (symbols) supplied from the QAM decoder 164 and supplies an LDPC code acquired as a result thereof to an LDPC decoder 166.

The LDPC decoder 166 performs LDPC decoding of the LDPC code supplied from the bit deinterleaver 165 and supplies LDPC target data (here, a BCH code) acquired as a result thereof to a BCH decoder 167.

The BCH decoder 167 performs BCH decoding of the LDPC target data supplied from the LDPC decoder 155 and supplies data acquired as a result thereof to a BB descrambler 168.

The BB descrambler 168 performs energy band diffusion process for the data supplied from the BCH decoder 167 and supplies data acquired as a result thereof to a null deletion unit 169.

The null deletion unit 169 deletes null inserted from the padder 112 illustrated in FIG. 8 from the data supplied from the BB descrambler 168 and supplies resultant data to a demultiplexer 170.

The demultiplexer 170 separates one or more streams (target data) that are multiplexed in the data supplied from the null deletion unit 169 and outputs the streams as output streams.

FIG. 133 is a block diagram illustrating a configuration example of the bit deinterleaver 165 illustrated in FIG. 132.

The bit deinterleaver 165 is configured by a multiplexer (MUX) 54 and a column twist deinterleaver 55 and performs deinterleaving of symbol bits (bits) of the symbol supplied from the QAM decoder 164 (FIG. 132).

In other words, the multiplexer 54, for symbol bits of the symbol supplied from the QAM decoder 164, performs a reverse interchange process (a reverse process of the interchange process) corresponding to the interchange process performed by the demultiplexer 25 illustrated in FIG. 9, that is, a reverse interchange process in which the positions of the code bits (symbol bits) of an LDPC code that have been interchanged by the interchange process are returned to the original positions and supplies an LDPC code acquired as a result thereof to the column twist deinterleaver 55.

The column twist deinterleaver 55, for the LDPC code supplied from the multiplexer 54, performs column twist deinterleaving (reverse process of the column twist interleaving) corresponding to the column twist interleaving as a row rearranging process performed by the column twist interleaver 24 illustrated in FIG. 9, that is, for example, column twist deinterleaving as a reverse sorting process in which the code bits of an LDPC code of which rows have been changed by the column twist interleaving as a sorting process are returned to the original arrangement.

More specifically, the column twist deinterleaver 55 writes code bits of an LDPC code into a deinterleaving memory configured similarly to the memory 31 illustrated in FIG. 24 or the like and further reads the code bits, thereby performing column twist deinterleaving.

However, in the column twist deinterleaver 55, the writing of the code bits is performed in the row direction of the deinterleaving memory by using the read address at the time of reading the code bits from the memory 31 as a write address. In addition, the reading of code bits is performed in the column direction of the deinterleaving memory by using a write address at the time of writing the code bits into the memory 31 as a read address.

An LDPC code acquired as a result of the column twist deinterleaving is supplied from the column twist deinterleaver 55 to the LDPC decoder 166.

Here, although the parity interleaving, the column twist interleaving, and the interchange process have been performed in the order for the LDPC code supplied from the QAM decoder 164 to the bit deinterleaver 165, in the bit deinterleaver 165, only the reverse interchange process corresponding to the interchange process and the column twist deinterleaving corresponding to the column twist interleaving are performed, and parity deinterleaving (reverse process of the parity interleaving) corresponding to the parity interleaving, that is, parity deinterleaving in which code bits of an LDPC code of which rows have been changed by the parity interleaving are returned to the original rows is not performed.

Accordingly, from the bit deinterleaver 165 (the column twist deinterleaver 55 thereof) to the LDPC decoder 166, an LDPC code for which the reverse interchange process and the column twist deinterleaving have been performed but the parity deinterleaving has not been performed is supplied.

The LDPC decoder 166 performs LDPC decoding of the LDPC code supplied form the bit deinterleaver 165 using a transformed parity check matrix acquired by at least performing the column replacement corresponding to parity interleaving for the parity check matrix H used by the LDPC encoder 115 illustrated in FIG. 8 in the LDPC encoding process and outputs data acquired as a result thereof as a result of decoding the LDPC target data.

FIG. 134 is a flowchart illustrating the process performed by the QAM decoder, 164, the bit deinterleaver 165, and the LDPC decoder 166 illustrated in FIG. 133.

In Step S111, the QAM decoder 164 performs orthogonal demodulation by demapping the symbol (a symbol mapped into a signal point) supplied from the time deinterleaver 163 and supplies resultant data to the bit deinterleaver 165, and the process proceeds to Step S112.

In Step S112, the bit deinterleaver 165 performs deinterleaving (bit deinterleaving) of symbol bits of a symbol supplied from the QAM decoder 164, and the process proceeds to Step S113.

In other words, in Step S112, in the bit deinterleaver 165, the multiplexer 54 performs a reverse interchange process for the symbol bits of the symbol supplied from the QAM decoder 164 as a target and supplies code bits of the LDPC code acquired as a result thereof to the column twist deinterleaver 55.

The column twist deinterleaver 55 performs column twist deinterleaving for the LDPC code supplied from the multiplexer 54 as a target and supplies an LDPC code acquired as a result thereof to the LDPC decoder 166.

In Step S113, the LDPC decoder 166 performs LDPC decoding of the LDPC code supplied from the column twist deinterleaver 55 using a transformed parity check matrix acquired by at least performing row replacement corresponding to parity interleaving for the parity check matrix H that is used in the LDPC encoding process by the LDPC encoder 115 illustrated in FIG. 8 and outputs data acquired as a result thereof to the BCH decoder 167 as a result of decoding of the LDPC target data.

Also as illustrated in FIG. 133, similarly to the case of FIG. 9, for the convenience of description, although the multiplexer 54 performing the reverse interchange process and the column twist deinterleaver 55 performing the column twist deinterleaving are configured to be separate, the multiplexer 54 and the column twist deinterleaver 55 may be integrally configured.

In addition, in the bit interleaver 116 illustrated in FIG. 9, in a case where column twist interleaving is not performed, in the bit deinterleaver 165 illustrated in FIG. 133, the column twist deinterleaver 55 is not necessary.

Next, the LDPC decoding performed by the LDPC decoder 166 illustrated in FIG. 132 will be described further.

In the LDPC decoder 166 illustrated in FIG. 132, as described above, the reverse interchange process and the column twist deinterleaving are performed by the column twist deinterleaver 55, and LDPC decoding of an LDPC code for which parity deinterleaving is not performed is performed using a transformed parity check matrix acquired by performing at least row replacement corresponding to the parity interleaving for the parity check matrix H used in the LDPC encoding process by the LDPC encoder 115 illustrated in FIG. 8.

Here, LDPC decoding has been proposed which can suppress the circuit scale and suppress the operating frequency to be in a range that can be sufficiently implemented by performing the LDPC decoding using the transformed parity check matrix (for example, see U.S. Pat. No. 4,224,777).

Thus, first, the LDPC decoding using the transformed parity check matrix that has been proposed will be described with reference to FIGS. 135 to 138.

FIG. 135 is a diagram that illustrates an example of the parity check matrix H of an LDPC code having a code length N of 90 and a coded rate of ⅔.

In FIG. 135 (similarly to the case of FIGS. 136 and 137 to be described later), "0" is represented by a period (".").

In the parity check matrix H illustrated in FIG. 135, the parity matrix has a staircase structure.

FIG. 136 illustrates a parity check matrix H' acquired by performing row replacement of Equation (11) and column replacement of Equation (12) for the parity check matrix H illustrated in FIG. 135.

$$\text{Row Replacement: } (6s+t+1)\text{-th} \rightarrow (5t+s+1)\text{-th.} \quad \text{Equation (11)}$$

$$\text{Column Replacement: } (6x+y+61)\text{-th} \rightarrow (5y+x+61)\text{-th.} \quad \text{Equation (12)}$$

Here, in Equations (11) and (12), s, t, x, and y are integers respectively in the range of $0 \leq s < 5$, $0 \leq t < 6$, $0 \leq x < 5$, and $0 \leq t < 6$.

According to the row replacement of Equation (11), replacement is performed to be in a state in which the first, seventh, 13rd, 19th, and 25th rows having a remainder of 1 by being divided by 6 replace the first, second, third, fourth, and fifth rows, respectively, and the second, eighth, 14th, 20th, and 26th having a remainder of 2 when being divided by 6 replace the sixth, seventh, eighth, ninth, and tenth rows, respectively.

In addition, according to the column replacement of Equation (12), replacement is performed to be in a state in which the 61st, 67th, 73rd, 79th, and 85th columns having a remainder of 1 by being divided by 6 replace the 61st, 62nd, 63rd, 64th, and 65th columns, respectively, and the 62nd, 68th, 74th, 80th, and 86th having a remainder of 2 when being divided by 6 replace the 66th, 67th, 68th, 69th, and 70th columns, respectively, for the 61st and subsequent columns (parity matrix).

In this way, the matrix acquired by performing the row replacement and the column replacement for the parity check matrix H illustrated in FIG. 135 is the parity check matrix H' illustrated in FIG. 136.

Here, even in a case where the row replacement of the parity check matrix H is performed, it does not influence the arrangement of the codes bits of an LDPC code.

In addition, the column replacement of Equation (12) corresponds to parity interleaving in which the (K+qx+y+1)-th code bit is interleaved at the position of the (K+Py+x+1)-th code bit when the information length K is 60, the number P of unit columns of the cyclic structure is 5, and the divisor q (=M/P) of the parity length M (here, 30) is 6.

When the parity check matrix (hereinafter, referred to as a transformed parity check matrix, as is appropriate) H' illustrated in FIG. 136 is multiplied by an LDPC code of the parity check matrix (hereinafter, referred to as the original parity check matrix) H illustrated in FIG. 135 for which the same replacement as Equation (12) has been performed, a zero vector is output. In other words, when a row vector acquired by performing the column replacement of Equation (12) for the row vector c as an LDPC code (one code word) of the original parity check matrix H is denoted by c', based on the property of the parity check matrix, $Hc^T$ becomes a zero vector, and accordingly, it is apparent that $H'c'^T$ becomes a zero vector as well.

As above, the transformed parity check matrix H' illustrated in FIG. 136 is a parity check matrix of an LDPC code c' acquired by performing the column replacement of Equation (12) for the LDPC code c of the original parity check matrix H.

Accordingly, by performing the column replacement of Equation (12) for the LDPC code c of the original parity check matrix H, decoding (LDPC decoding) the LDPC code c' after the column replacement using the transformed parity check matrix H' illustrated in FIG. 136, and performing reverse replacement of the column replacement of Equation (12) for the decoding result, a decoding result that is the same as that of a case where the LDPC code of the original parity check matrix H is decoded using the parity check matrix H can be acquired.

FIG. 137 illustrates the transformed parity check matrix H' illustrated in FIG. 136 with being spaced in units of 5×5 matrixes.

In FIG. 137, the transformed parity check matrix H' is represented as a combination of a 5×5 unit matrix, a matrix (hereinafter, referred to as a quasi unit matrix, as is appropriate) acquired by setting one or more 1's of the unit matrix to zero, a matrix (hereinafter, referred to as a shifted matrix, as is appropriate) acquired by cyclically shifting the unit matrix or the quasi unit matrix, a sum (hereinafter, referred to as a sum matrix, as is appropriate) of two or more of the unit matrix, the quasi unit matrix, and the shifted matrix, and a 5×5 0 matrix.

The transformed parity check matrix H' illustrated in FIG. 137 may be regarded as being configured by 5×5 unit matrixes, quasi unit matrixes, shifted matrixes, sum matrixes, and 0 matrixes. Thus, hereinafter, such 5×5 matrixes constituting the transformed parity check matrix H' are referred to as constitutive matrixes, as is appropriate.

For decoding an LDPC code of a parity check matrix represented as a P×P constitutive matrix, an architecture may be used in which P check node calculations and variable node calculations are performed at the same time.

FIG. 138 is a block diagram that illustrates a configuration example of a decoding device that performs such a decoding process.

In other word, FIG. 138 illustrates a configuration example of a decoding device decoding an LDPC code by using the transformed parity check matrix H' illustrated in FIG. 137 acquired by performing at least the column replacement of Equation (12) for the original parity check matrix H illustrated in FIG. 135.

The decoding device illustrated in FIG. 138 is configured by a branch data storage memory 300 that is formed by six FIFOs $300_1$ to $300_6$, a selector 301 that selects one of the FIFOs $300_1$ to $300_6$, a check node calculating unit 302, two cyclic shift circuits 303 and 308, a branch data storage memory 304 configured by 18 FIFOs $304_1$ to $304_{18}$, a selector 305 that selects one of the FIFOs $304_1$ to $304_{18}$, a reception data memory 306 storing received data, a variable node calculating unit 307, a decoded word calculating unit 309, a reception data rearranging unit 310, and a decoding data rearranging unit 311.

First, a method of storing data into the branch data storage memories 300 and 304 will be described.

The branch data storage memory 300 is configured by six FIFOs $300_1$ to $300_6$ corresponding to a number acquired by dividing the number 30 of rows of the transformed parity check matrix H' illustrated in FIG. 137 by the number 5 of rows of the constitutive matrix. The FIFO $300_y$, (y=1, 2, ..., 6) is configured by storage areas of a plurality of stages, and messages corresponding to five branches, which corresponds to the number of rows and the number of columns of the constitutive matrix, can be read or written at the same time from/into the storage area of each stage. In addition, the number of stages of the storage area of the FIFO $300_y$ is set to 9 that is a maximum value of the number of 1's (Hamming weight) of the transformed parity check matrix illustrated in FIG. 137 in the row direction.

In the FIFO $300_1$, data (message $v_i$ supplied from the variable nodes) corresponding to the positions of 1's in the first row to the fifth row of the transformed parity check matrix H' illustrated in FIG. 137 is stored in the form filling each row in the horizontal direction (0 is ignored). In other words, when the j-th row and the i-th column is denoted by (j, i), in the storage area of the first stage of the FIFO $300_1$, data corresponding to the positions of 1's in the 5×5 unit matrix from (1, 1) to (5, 5) of the transformed parity check matrix H' is stored. In the storage area of the second stage, data corresponding to the positions of 1's in a shifted matrix (a shifted matrix acquired by cyclically shifting the 5×5 unit matrix to the right side by three) of (1, 21) to (5, 25) of the transformed parity check matrix H' is stored. Also in the storage areas of the third to eighth stages, similarly, data is stored in correspondence with the transformed parity check matrix H'. In the storage areas of the ninth stage, data corresponding to the positions of 1's in a shifted matrix (a shifted matrix acquired by replacing 1's in the first row in the 5×5 unit matrix with 0's and cyclically shifting a resultant matrix to the left side by one) of (1, 86) to (5, 90) of the transformed parity check matrix H' is stored.

In the FIFO $300_2$, data corresponding to the positions of 1's in the sixth row to the tenth row of the transformed parity check matrix H' illustrated in FIG. 137 is stored. In other words, in the storage area of the first stage of the FIFO $300_2$, data corresponding to the positions of 1's in a first shifted matrix configuring a sum matrix (a sum matrix that is a sum of a first shifted matrix acquired by cyclically shifting a 5×5 unit matrix to the right side by one and a second shifted matrix acquired by cyclically shifting the unit matrix to the right side by two) of (6, 1) to (10, 5) of the transformed parity check matrix H' is stored. In addition, in the storage area of the second stage, data corresponding to the positions of 1' in the second shifted matrix configuring a sum matrix of (6, 1) to (10, 5) of the transformed parity check matrix H' is stored.

In other words, for a constitutive matrix of which the weight is two or more, when the constitutive matrix is represented as a sum of multiple parts of a P×P unit matrix of which the weight is 1, a quasi unit matrix in which one or more elements of 1's in the unit matrix is set to 0, or a shifted matrix acquired by cyclically shifting the unit matrix or the quasi unit matrix, data (messages corresponding to branches belonging to the unit matrix, the quasi unit matrix, or the shifted matrix) corresponding to the positions of 1's in the unit matrix of a weight of 1, the quasi unit matrix, or the shifted matrix are stored at the same address (a same FIFO out of the FIFOs $300_1$ to $300_6$).

Subsequently, also in the storage areas of the third to ninth stages, data is stored in association with the transformed parity check matrix H'.

Further, in FIFOs $300_3$ to $300_6$, data is similarly stored in association with the transformed parity check matrix H'.

The branch data storage memory 304 is configured by 18 FIFOs $304_1$ to $304_{18}$, which correspond to a number acquired by dividing the number of columns of the transformed parity matrix H', which is 90, by 5 that is the number of columns of the constitutive matrix. The FIFO $304_x$ (x=1, 2, . . . , 18) is configured by storage areas of a plurality of stages, and messages corresponding to five branches, which corresponds to the number of rows and the number of columns of the transformed constitutive matrix H', can be read or written from/into the storage area of each stage at the same time.

In the FIFO $304_1$, data (messages $u_j$ from the check nodes) corresponding to the positions of 1's in the first row to the fifth row of the transformed parity check matrix H' illustrated in FIG. 137 is stored in the form filling each row in the vertical direction (0 is ignored).

In other words, in the storage area of the first stage of the FIFO $304_1$, data corresponding to the positions of 1's in the 5×5 unit matrix from (1, 1) to (5, 5) of the transformed parity check matrix H' is stored. In the storage area of the second stage, data corresponding to the positions of 1's in a first shifted matrix configuring a sum matrix (a sum matrix that is a sum of the first shifted matrix acquired by cyclically shifting the 5×5 unit matrix to the right side by one and a second shifted matrix acquired by cyclically shifting the unit matrix to the right side by two) of (6, 1) to (10, 5) of the transformed parity check matrix H' is stored. In addition, in the storage area of the third stage, data corresponding to the positions of 1's in the second shifted matrix configuring the sum matrix of (6, 1) to (10, 5) of the transformed parity check matrix H' is stored.

In other words, for a constitutive matrix of which the weight is two or more, when the constitutive matrix is represented as a sum of multiple parts of a P×P unit matrix of which the weight is 1, a quasi unit matrix in which one or more elements of 1's in the unit matrix is set to 0, or a shifted matrix acquired by cyclically shifting the unit matrix or the quasi unit matrix, data (messages corresponding to branches belonging to the unit matrix, the quasi unit matrix, or the shifted matrix) corresponding to the positions of 1's in the unit matrix of a weight of 1, the quasi unit matrix, or the shifted matrix are stored at the same address (a same FIFO out of the FIFOs $304_1$ to $304_{18}$).

Subsequently, also in the storage areas of the fourth and fifth stages, data is stored in association with the transformed parity check matrix H'. The number of stages of the storage area of the FIFO $304_1$ is set to 5 that is a maximum value of the number of 1's (Hamming weight) in the first column to the fifth column of the transformed parity check matrix H'.

Also in the FIFOs $304_2$ and $304_3$, data is similarly stored in association with the transformed parity check matrix H', and each length (the number of stages) is 5. In the FIFOs $304_4$ to $304_{12}$, data is similarly stored in association with the transformed parity check matrix H', and each length is 3. In the FIFOs $304_{13}$ to $304_{18}$, data is similarly stored in association with the transformed parity check matrix H', and each length is 2.

Next, the operation of the decoding device illustrated in FIG. 138 will be described.

The branch data storage memory 300 is configured by 6 FIFOs $300_1$ to $300_6$ and selects a FIFO to store data from among the FIFOs $300_1$ to $300_6$ based on information (matrix data) D312 on a row of the transformed parity check matrix H' to which five messages D311 supplied from the cyclic shift circuit 308 of the previous stage belong and sequentially stores the five messages D311 in the selected FIFO altogether. In addition, in order to read data, the branch data storage memory 300 sequentially reads five messages $D300_1$ from the FIFO $300_1$ and supplies the read messages to the selector 301 of the next stage. After the reading of the messages from the FIFO $300_1$ is completed, the branch data storage memory 300 sequentially reads messages also from the FIFOs $300_2$ to $300_6$ and supplies the read messages to the selector 301.

The selector 301 selects five messages from the FIFO from which the current data is read out of the FIFOs $300_1$ to $300_6$ in accordance with a selection signal D301 and supplies the selected messages to the check node calculating unit 302 as messages D302.

The check node calculating unit 302 is configured by five check node calculators $302_1$ to $302_5$ and performs check node calculations based on Equation (7) by using messages D302 ($D302_1$ to $D302_5$) (message $v_i$ represented in Equation (7)) supplied through the selector 301 and supplies five messages D303 ($D303_1$ to $D303_5$) (message $u_j$ represented in Equation (7)) acquired as results of the check node calculations to the cyclic shift circuit 303.

The cyclic shift circuit 303 cyclically shifts the five messages $D303_1$ to $D303_5$ acquired by the check node calculating unit 302 based on the information (matrix data) D305 on the number of cyclic shifts made for the unit matrix that is the origin of the transformed parity check matrix H' for a corresponding branch and supplies a result thereof to the branch data storage memory 304 as messages D304.

The branch data storage memory 304 is configured by 18 FIFOs $304_1$ to $304_{18}$ and selects a FIFO to store data from among the FIFOs $304_1$ to $304_{18}$ based on the information D305 on the row of the transformed parity check matrix H' to which the five messages D304 supplied from the cyclic shift circuit 303 of the previous stage belong and sequentially stores the five messages D304 in the selected FIFO altogether. In addition, in order to read data, the branch data storage memory 304 sequentially reads five messages D306$_1$ from the FIFO 304$_1$ and supplies the read messages to the selector 305 of the next stage. After the reading of data from the FIFO 304$_1$ is completed, the branch data storage memory 304 sequentially reads messages also from the FIFOs 304$_2$ to 304$_{18}$ and supplies the read messages to the selector 305.

The selector 305 selects five messages from the FIFO from which the current data is read out of the FIFOs 304$_1$ to 304$_{18}$ in accordance with a selection signal D307 and supplies the selected messages to the variable node calculating unit 307 and the decoded word calculating unit 309 as a message D308.

Meanwhile, the reception data rearranging unit 310 rearranges the LDPC code D313 received through a communication channel by performing the column replacement of Equation (12) and supplies resultant data to the reception data memory 306 as reception data D314. The reception data memory 306 calculates a reception LLR (log likelihood ratio) based on the reception data D314 supplied from the reception data rearranging unit 310, stores the reception LLR, and supplies reception LLRs altogether for every five receptions to the variable node calculating unit 307 and the decoded word calculating unit 309 as a reception value D309.

The variable node calculating unit 307 is configured by five variable node calculators 307$_1$ to 307$_5$ and performs variable node calculations based on Equation (1) by using the messages D308 (D308$_1$ to D308$_5$) (message $u_j$ represented in Equation (1)) supplied through the selector 305 and five reception values D309 (reception value $u_{0i}$ represented in Equation (1)) supplied from the reception data memory 306 and supplies messages D310 (D310$_1$ to D310$_5$) (message $v_i$ represented in Equation (1)) acquired as results of the calculations to the cyclic shift circuit 308.

The cyclic shift circuit 308 cyclically shifts the messages D310$_1$ to D310$_5$ calculated by the variable node calculating unit 307 based on the information on the number of cyclic shifts made for the unit matrix that is the origin of the transformed parity check matrix H' for a corresponding branch and supplies a result thereof to the branch data storage memory 300 as a message D311.

By performing the above-described operations in one cycle, decoding of an LDPC code can be performed once. After the LDPC code is decoded for a predetermined number of times, the decoding device illustrated in FIG. 138 acquires a final decoding result by using the decoded word calculating unit 309 and the decoding data rearranging unit 311 and outputs the result.

In other words, the decoded word calculating unit 309 is configured by five decoded word calculators 309$_1$ to 309$_5$ and calculates a decoding result (decoded word) based on Equation (5) as a final stage of a plurality of times of decoding by using the five messages D308 (D308$_1$ to D308$_5$) (message $u_j$ represented in Equation (5)) output by the selector 305 and five reception values D309 (reception value $u_{0i}$ represented in Equation (5)) supplied from the reception data memory 306 and supplies decoded data D315 that is acquired as a result thereof to the decoding data rearranging unit 311.

The decoding data rearranging unit 311 rearranges the sequence of the decoded data D315 supplied from the decoded word calculating unit 309 as a target by performing reverse replacement of the column replacement illustrated in Equation (12) for the decoded data and outputs resultant data as a final decoding result D316.

As above, by performing one or both of the row replacement and the column replacement for the parity check matrix (original parity check matrix), the parity check matrix is transformed into a combination of a P×P unit matrix, a quasi unit matrix in which one or more elements of 1's in the unit matrix is set to 0's, a shifted matrix acquired by cyclically shifting the unit matrix or the quasi unit matrix, a sum matrix that is a sum of a plurality of matrixes of the unit matrix, the quasi unit matrix or the shifted matrix, and a P×P 0 matrix, in other words, a parity check matrix (transformed parity check matrix) that can be represented as a combination of constitutive matrixes, and accordingly, an architecture can be employed in which P check node calculations and variable node calculations can be simultaneously performed in the decoding of an LDPC code. Accordingly, by simultaneously performing P node calculations, the operating frequency can be suppressed within an implementable range, and accordingly, many repetitive decoding processes can be performed.

The LDPC decoder 166 that configures the reception device 12 illustrated in FIG. 132, similarly to the decoding device illustrated in FIG. 138, simultaneously performs P check node calculations and variable node calculations, whereby performing LDPC decoding.

For the simplification of description, when the parity check matrix of an LDPC code output by the LDPC encoder 115 configuring the transmission device 11 illustrated in FIG. 8 is, for example, the parity check matrix H illustrated in FIG. 135 in which the parity matrix has a staircase structure, in the parity interleaver 23 of the transmission device 11, parity interleaving in which the (K+qx+y+1)-th code bit is interleaved at the position of the (K+Py+x+1)-th code bit is performed with the information length K set to 60, the number P of unit columns of the cyclic structure set to 5, and the divisor q (=M/P) of the parity length M set to 6.

Since this parity interleaving, as described above, corresponds to the column replacement of Equation (12), the LDPC decoder 166 does not need to perform the column replacement of Equation (12).

Accordingly, the reception device 12 illustrated in FIG. 132, as described above, performs a process that is similar to that of the decoding device illustrated in FIG. 138 except that an LDPC code for which parity deinterleaving is not performed, that is, an LDPC code in the state in which the row replacement of Equation (12) has been performed is supplied to the LDPC decoder 166 from the column twist deinterleaver 55, and the LDPC decoder 166 does not perform the column replacement of Equation (12).

In other words, FIG. 139 illustrates a configuration example of the LDPC decoder 166 illustrated in FIG. 132.

As illustrated in FIG. 139, the LDPC decoder 166 is configured similarly to the decoding device illustrated in FIG. 138 except that the reception data rearranging unit 310 illustrated in FIG. 138 is not disposed and performs the same process as that of the decoding device illustrated in FIG. 138 except that the column replacement of Equation (12) is not performed, and thus, the description thereof will not be presented.

As above, since the LDPC decoder 166 can be configured without arranging the reception data rearranging unit 310, the scale can be smaller than that of the decoding device illustrated in FIG. 138.

For the convenience of description, in FIGS. 135 to 139, while the code length N of the LDPC code is set to 90, the information length K is set to 60, the number P (the number of rows and the number of columns of the constitutive matrix) of unit columns of the cyclic structure is set to 5, and the divisor q (=M/P) of the parity length M is set to 6, the code length N, the information length K, the number P of unit columns of the cyclic structure, and the divisor q (=M/P) are not limited to the values described above.

In other words, in the transmission device 11 illustrated in FIG. 8, while the LDPC encoder 115 outputs, for example, an LDPC code having a code length N of 64800, 16200, or 4320, an information length K of N−Pq (=N−M), the number P of unit columns of the cyclic structure of 360, 72, or 60, a divisor q of M/P, the LDPC decoder 166 illustrated in FIG. 139 can be applied also to a case where LDPC decoding is performed for such an LDPC code as a target by simultaneously performing P check node calculations and variable node calculations.

FIG. 140 is a diagram that illustrates the process of the multiplexer 54 configuring the bit deinterleaver 165 illustrated in FIG. 133.

In other words, A of FIG. 140 illustrates a functional configuration example of the multiplexer 54.

The multiplexer 54 is configured by a reverse interchange unit 1001 and a memory 1002.

The multiplexer 54, for symbol bits of the symbol supplied from the QAM decoder 164 of the previous stage, performs a reverse interchange process (a reverse process of the interchange process) corresponding to the interchange process performed by the demultiplexer 25 of the transmission device 11, that is, a reverse interchange process in which the positions of the code bits (symbol bits) of an LDPC code that have been interchanged by the interchange process are returned to the original positions and supplies an LDPC code acquired as a result thereof to the column twist deinterleaver 55 of the next stage.

In other words, in the multiplexer 54, symbol bits $y_0$, $y_1, \ldots, y_{mb-1}$ of mb bits of b symbols are supplied to the reverse interchange unit 1001 in units of (consecutive) b symbols.

The reverse interchange unit 1001 performs reverse interchange in which symbol bits $y_0$ to $y_{mb-1}$ of mb bits are returned to the original arrangement of the code bits $b_0$, $b_1, \ldots, b_{mb-1}$ (the arrangement of the code bits $b_0$ to $b_{mb-1}$ before interchange performed by the interchange unit 32 configuring the demultiplexer 25 disposed on the transmission device 11 side) of the original mb bits and outputs the code bits $b_0$ to $b_{mb-1}$ of mb bits acquired as a result thereof.

The memory 1002, similarly to the memory 31 configuring the demultiplexer 25 of the transmission device 11 side, has a storage capacity for storing mb bits in the row (horizontal) direction and N/(mb) bits in the column (vertical) direction. In other words, the memory 1002 is configured by mb columns storing N/(mb) bits.

However, in the memory 1002, code bits of an LDPC code output by the reverse interchange unit 1001 are written in a direction in which code bits supplied from the memory 31 of the demultiplexer 25 of the transmission device 11 are read, and the code bits written into the memory 1002 are read in a direction in which code bits are written into the memory 31.

In other words, in the multiplexer 54 of the reception device 12, as illustrated in A of FIG. 140, writing of code bits of an LDPC code output by the reverse interchange unit 1001 in units of mb bits in the row direction is sequentially performed from the first row of the memory 1002 to the lower rows.

Then, when the writing of code bits corresponding to one code length is completed, the multiplexer 54 reads code bits from the memory 1002 in the column direction and supplies the read code bits to the column twist deinterleaver 55 of the next stage.

Here, B of FIG. 140 is a diagram illustrating reading code bits from the memory 1002.

In the multiplexer 54, the reading code bits of an LDPC code from the upper side of the column configuring the memory 1002 to the downward direction (column direction) is performed from the left side toward the column located on the right side.

FIG. 141 is a diagram that illustrates the process of the column twist deinterleaver 55 configuring the bit deinterleaver 165 illustrated in FIG. 133.

In other words, FIG. 141 illustrates a configuration example of the memory 1002 of the multiplexer 54.

The memory 1002 has a memory capacity for storing mb bits in the column (vertical) direction and N/(mb) bits in the row (horizontal) direction and is configured by mb columns.

The column twist deinterleaver 55 performs column twist deinterleaving by writing code bits of an LDPC code into the memory 1002 in the row direction and controlling the write starting position for reading the code bits in the column direction.

In other words, in the column twist deinterleaver 55, by appropriately changing the write starting position at which reading of code bits is started for each one of a plurality of columns, a reverse sorting process is performed in which the arrangement of code bits rearranged through the column twist interleaving is returned to the original arrangement.

Here, FIG. 141 illustrates a configuration example of the memory 1002 in a case where the modulation mode is 16 QAM and the multiple b is 1, described with reference to FIG. 24. Accordingly, the number m of bits of one symbol is four bits, and the memory 1002 is configured by 4 (=mb) columns.

The column twist deinterleaver 55, instead of the multiplexer 54, sequentially performs writing of code bits of an LDPC code output by the interchange unit 1001 in the row direction from the first row of the memory 1002 to the lower rows.

Then, when the writing of code bits corresponding to one code length is completed, the column twist deinterleaver 55 performs reading of code bits from the upper side of the memory 1002 to the downward direction (column direction) from the left side toward the column located on the right side.

Here, the column twist deinterleaver 55 reads code bits from the memory 1002 with the write starting position at which the column twist interleaver 24 located on the transmission device 11 side writes code bits set as the read starting position of the code bits.

In other words, when the address of the position of the lead (uppermost) of each column is 0, and the address of each position in the column direction is represented as an integer in the ascending order, in a case where the modulation mode is 16 QAM, and the multiple b is 1, in the column twist deinterleaver 55, the read starting position is set to a position of address 0 for the leftmost column, the read starting position is set to a position of address 2 for the second column (from the left side), the read starting position is set to a position of address 4 for the third column, and the read starting position is set to a position of address 7 for the fourth column.

For each column having the read starting position other than the position of address 0, after the reading of code bits is performed up to the lowermost position, the reading position is returned to the lead (the position of address 0), and reading is performed up to a position immediately prior to the read starting position. Thereafter, reading is performed from the next column (the right side).

By performing the column twist interleaving as above, the arrangement of the code bits rearranged through the column twist interleaving is returned to the original arrangement.

FIG. 142 is a block diagram that illustrates another configuration example of the bit deinterleaver 165 illustrated in FIG. 132.

In the figure, the same reference numeral is assigned to a portion corresponding to the case of FIG. 133, and, hereinafter, the description thereof will not be presented, as is appropriate.

The configuration of the bit deinterleaver 165 illustrated in FIG. 142 is the same as that of the case illustrated in FIG. 133 except that a parity deinterleaver 1011 is newly disposed.

As illustrated in FIG. 142, the bit deinterleaver 165 is configured by a multiplexer (MUX) 54, a column twist deinterleaver 55, and a parity deinterleaver 1011 and performs bit interleaving of code bits of an LDPC code supplied from the QAM decoder 164.

In other words, the multiplexer 54, for an LDPC code supplied from the QAM decoder 164, performs a reverse interchange process (a reverse process of the interchange process) corresponding to the interchange process performed by the demultiplexer 25 of the transmission device 11, that is, a reverse interchange process in which the positions of the code bits that have been interchanged by the interchange process are returned to the original positions and supplies an LDPC code acquired as a result thereof to the column twist deinterleaver 55.

The column twist deinterleaver 55, for the LDPC code supplied from the multiplexer 54, performs column twist deinterleaving corresponding to the column twist interleaving as a rearranging process performed by the column twist interleaver 24 of the transmission device 11.

An LDPC code acquired as a result of the column twist deinterleaving is supplied from the column twist deinterleaver 55 to the parity deinterleaver 1011.

The parity deinterleaver 1011, for code bits after the column twist deinterleaving performed by the column twist deinterleaver 55, performs parity deinterleaving (a reverse process of the parity interleaving) corresponding to the parity interleaving performed by the parity interleaver 23 of the transmission device 11, in other words, parity deinterleaving in which code bits of the LDPC code rearranged through parity interleaving are returned to the original arrangement.

An LDPC code acquired as a result of the parity deinterleaving is supplied from the parity deinterleaver 1011 to the LDPC decoder 166.

Accordingly, in the bit deinterleaver 165 illustrated in FIG. 142 supplies, an LDPC code for which the reverse interchange process, the column twist deinterleaving, and the parity deinterleaving have been performed, that is, an LDPC code acquired by LDPC encoding according to the parity check matrix H to the LDPC decoder 166

The LDPC decoder 166 performs LDPC decoding of the LDPC code supplied form the bit deinterleaver 165 using the parity check matrix H used by the LDPC encoder 115 of the transmission device 11 in the LDPC encoding process or a transformed parity check matrix acquired by performing at least the column replacement corresponding to parity interleaving for the parity check matrix H and outputs data acquired as a result thereof as a result of decoding the LDPC target data.

Here, in FIG. 142, since the LDPC code acquired by performing LDPC encoding according to the parity check matrix H is supplied from the bit deinterleaver 165 (the parity deinterleaver 1011 thereof) to the LDPC decoder 166, in a case where the LDPC decoding of the LDPC code is performed by using the parity check matrix H used by the LDPC encoder 115 of the transmission device 11 in the LDPC encoding process, the LDPC decoder 166, for example, may be configured by a decoding device that performs LDPC decoding according to a full serial decoding mode in which the calculation of messages (check node messages and variable node messages) is sequentially performed for each node or a decoding device that performs the LDPC decoding according to a full parallel decoding mode in which the calculation of messages is simultaneously (in a parallel manner) performed for all the nodes.

In addition, in the LDPC decoder 166, in a case where the LDPC decoding of an LDPC code is performed by using the transformed parity check matrix acquired by performing at least column replacement corresponding to the parity interleaving for the parity check matrix H used by the LDPC encoder 115 of the transmission device 11 in the LDPC encoding process, the LDPC decoder 166 may be configured by a decoding device that has an architecture in which P (or a divisor of P other than one) check node calculations and variable node calculations are simultaneously performed and the decoding device (FIG. 138) that includes a reception data rearranging unit 310 rearranging code bits of the LDPC code by performing column replacement such as column replacement used for acquiring the transformed parity check matrix for the LDPC code.

In FIG. 142, for the convenience of description, while the multiplexer 54 performing the reverse interchange process, the column twist deinterleaver 55 performing column twist deinterleaving, and the parity deinterleaver 1011 performing parity deinterleaving are separately configured, two or more of the multiplexer 54, the column twist deinterleaver 55, and the parity deinterleaver 1011, similarly to the parity interleaver 23, the column twist interleaver 24, and the demultiplexer 25 of the transmission device 11, may be integrally configured.

Configuration Example of Reception System

FIG. 143 is a block diagram that illustrates a first configuration example of a reception system to which the reception device 12 can be applied.

As illustrated in FIG. 143, the reception system is configured by an acquisition unit 1101, a transmission channel decoding processing unit 1102, and an information source decoding processing unit 1103.

The acquisition unit 1101 acquires a signal including an LDPC code that can be acquired by performing at least LDPC encoding LDPC target data such as video data and audio data of a program through a transmission channel not illustrated in the figure such as terrestrial digital broadcasting, satellite digital broadcasting, a CATV network, the Internet, or the other networks and supplies the signal to the transmission channel decoding processing unit 1102.

Here, in a case where the signal acquired by the acquisition unit 1101 is broadcasted, for example, through a terrestrial wave, a satellite wave, a CATV (Cable Television) network, or the like from a broadcast station, the acquisition unit 1101 is configured by a tuner, a STB (Set Top Box), and the like. On the other hand, in a case where the signal acquired by the acquisition unit 1101 is, for example, transmitted through multicasting from a web server like IPTV (Internet Protocol Television), the acquisition unit 11, for example, is configured by a network I/F (Interface) such as an NIC (Network Interface Card).

The transmission channel decoding processing unit 1102 corresponds to the reception device 12. The transmission channel decoding processing unit 1102 performs a transmission channel decoding process including at least a process for correcting an error occurring in the transmission channel for the signal acquired by the acquisition unit 1101 through the transmission channel and supplies a signal acquired as a result thereof to the information source decoding processing unit 1103.

In other words, the signal acquired by the acquisition unit 1101 through the transmission channel is a signal that is acquired by performing at least error correction coding for correcting an error occurring in the transmission channel, and the transmission channel decoding processing unit 1102 performs a transmission channel decoding process such as error correction process for the signal.

Here, as the error correction coding, for example, there are LDPC encoding and the BCH encoding. Here, as the error correction coding, at least the LDPC encoding is performed.

In addition, in the transmission channel decoding process, demodulation of a modulated signal or the like may be included.

The information source decoding processing unit 1103 performs an information source decoding process including at least a process of decompressing compressed information into the original information for the signal for which the transmission channel decoding process has been performed.

In other word, compressed encoding compressing information may be performed for the signal acquired by the acquisition unit 1101 through the transmission channel so as to decrease the amount of data such as a video or an audio as information, and, in such a case, the information source decoding processing unit 1103 performs an information source decoding process such as a process of decompressing compressed information into the original information (decompressing process) for the signal for which the transmission channel decoding process has been performed.

In addition, in a case where compression coding has not been performed for the signal acquired by the acquisition unit 1101 through the transmission channel, the information source decoding processing unit 1103 does not perform the process of decompressing compressed information into the original information.

Here, as the decompressing process, for example, there is MPEG decoding or the like. In addition, in the transmission channel decoding process, descrambling or the like other than the decompressing process may be included.

In the reception system configured as above, compression coding such as MPEG coding is performed for data such as a video or an audio, and a signal for which error correction coding such as LDPC encoding has been performed is acquired by the acquisition unit 1101 through the transmission channel and is supplied to the transmission channel decoding processing unit 1102.

In the transmission channel decoding processing unit 1102, for the signal supplied from the acquisition unit 1101, for example, a process similar to that of the orthogonal demodulation unit 51, the QAM decoder 164, the bit deinterleaver 165, and the LDPC decoder 166 (or the LDPC decoder 166) is performed as a transmission channel decoding process, and a signal acquired as a result thereof is supplied to the information source decoding processing unit 1103.

The information source decoding processing unit 1103 performs an information source decoding process such as MPEG decoding for the signal supplied from the transmission channel decoding processing unit 1102 and outputs a video or an audio acquired as a result thereof.

The reception system illustrated in FIG. 143 as above, for example, may be applied to a television tuner receiving television broadcasting as digital broadcasting or the like.

In addition, the acquisition unit 1101, the transmission channel decoding processing unit 1102, and the information source decoding processing unit 1103 may be respectively configured as one independent device (hardware (IC (Integrated Circuit) or the like) or a software module).

Furthermore, regarding the acquisition unit 1101, the transmission channel decoding processing unit 1102, and the information source decoding processing unit 1103, a set of the acquisition unit 1101 and the transmission channel decoding processing unit 1102, a set of the transmission channel decoding processing unit 1102 and the information source decoding processing unit 1103, or a set of the acquisition unit 1101, the transmission channel decoding processing unit 1102, and the information source decoding processing unit 1103 may be configured as one independent device.

FIG. 144 is a block diagram that illustrates a second configuration example of a reception system to which the reception device 12 can be applied.

In the figure, the same reference numeral is assigned to a portion corresponding to that of the case illustrated in FIG. 143, and the description thereof will not be presented, as is appropriate.

The reception system illustrated in FIG. 144 includes an acquisition unit 1101, a transmission channel decoding processing unit 1102, and an information source decoding processing unit 1103, which is the same as the case illustrated in FIG. 143, and an output unit 1111 is newly disposed therein, which is different from the case illustrated in FIG. 143.

The output unit 1111, for example, is a display device displaying a video or a speaker outputting an audio and outputs a video, an audio, or the like as a signal output from the information source decoding processing unit 1103. In other words, the output unit 1111 displays an image or outputs an audio.

The reception system illustrated in FIG. 144 as above, for example, may be applied to a TV (television receiver) receiving television broadcasting as digital broadcasting or a radio receiver receiving radio broadcasting, or the like.

In addition, in a case where compression coding has not been performed for the signal acquired by the acquisition unit 1101, the signal output by the transmission channel decoding processing unit 1102 is supplied to the output unit 1111.

FIG. 145 is a block diagram that illustrates a third configuration example of a reception system to which the reception device 12 can be applied.

In the figure, the same reference numeral is assigned to a portion corresponding to that of the case illustrated in FIG. 143, and the description thereof will not be presented, as is appropriate.

The reception system illustrated in FIG. 145 includes an acquisition unit 1101 and a transmission channel decoding processing unit 1102, which is the same as the case illustrated in FIG. 143.

However, in the reception system illustrated in FIG. 145, the information source decoding processing unit 1103 is not disposed, but a recording unit 1121 is newly disposed, which is different from the case illustrated in FIG. 143.

The recording unit 1121 records (stores) a signal (for example, a TS packet of TS of MPEG) output by the transmission channel decoding processing unit 1102 on a recoding (storage) medium such as an optical disc, a hard disk (magnetic disk), or a flash memory.

The reception system illustrated in FIG. 145 as above may be applied to a recorder recording television broadcasting or the like.

In addition, in FIG. 145, the reception system may be configured so as to include an information source decoding processing unit 1103, and a signal for which the information source decoding process has been performed by the information source decoding processing unit 1103, in other words, an image or an audio acquired through decoding may be recorded in the recording unit 1121.

Computer According to Embodiment

Next, the above-described series of processes may be performed either by hardware or by software. In a case where the series of processes is performed by software, a program configuring the software is installed to a general-purpose computer or the like.

FIG. 146 illustrates a configuration example of a computer according to an embodiment to which a program executing the above-described series of processes is installed.

The program may be recorded in a hard disk 705 or a ROM 703 as a recording medium built in the computer in advance.

Alternatively, the program may be stored (recorded) temporarily or permanently on a removable recording medium 711 such as a flexible disk, a CD-ROM (Compact Disc Read Only Memory), an MO (Magneto Optical) disk, a DVD (Digital Versatile Disc), a magnetic disk, or a semiconductor memory. Such a removable recording medium 711 may be provided as so-called package software.

In addition, instead of installing the program to the computer from a removable recording medium 711 as described above, the program may be transmitted to the computer in a wireless manner from a download site through a satellite used for digital satellite broadcasting or be transmitted to the computer in a wired manner through a network such as a local area network (LAN) or the Internet, and, in the computer, the program transmitted as described above may be received by a communication unit 708 and installed to a built-in hard disk 705.

The computer includes a CPU (central processing unit) 702 therein. An input/output interface 710 is connected to the CPU 702 through a bus 701, and when an instruction is input from a user through the input/output interface 710 by operating an input unit 707 that is configured by a keyboard, a mouse, a microphone, or the like, the CPU 702 executes a program that is stored in the ROM (Read Only Memory) 703 in accordance with the instruction. Alternatively, the CPU 702 loads a program stored in the hard disk 705, a program that is transmitted from a satellite or a network, is received by the communication unit 708, and is installed to the hard disk 705, or a program read from a removable recording medium 711 loaded into a drive 709 and installed to the hard disk 705 into a RAM (random access memory) 704 and executes the program. In this way, the CPU 702 performs a process according to the above-described flowchart or a process performed based on the above-described configuration of the block diagrams. Then, as is necessary, the CPU 702 outputs the processing result, for example, from an output unit 706 configured by an LCD (Liquid Crystal Display), a speaker, or the like through the input/output interface 710, transmits the processing result from the communication unit 708, or records the processing result in a hard disk 705.

Here, in this specification, processing steps describing a program used for causing a computer to perform various processes does not need to be performed necessarily in a time series in accordance with the sequence described in the flowchart, and a process (for example, a parallel process or a process using an object) that is performed in a parallel manner or in an individual manner is included therein.

In addition, the program may be processed by one computer or may be processed by a plurality of computers in a distributed manner. Furthermore, the program may be transmitted to a remote computer and be executed.

In addition, an embodiment of the present invention is not limited to the above-described embodiments, and various changes can be made therein in a range not departing from the concept of the present invention.

In other words, an LDPC code (the parity check matrix initial value table thereof) employed in digital broadcasting dedicatedly used for mobile terminals or the like as described above may be used for digital broadcasting dedicatedly used for fixed terminals or the like.

REFERENCE SIGNS LIST

11 Transmission device
12 Reception device
23 Parity interleaver
24 Column twist interleaver
25 Demultiplexer
31 Memory
32 Interchange unit
54 Multiplexer
55 Column twist interleaver
111 Mode adaptation/multiplexer
112 Padder
113 BB scrambler
114 BCH encoder
115 LDPC encoder
116 Bit interleaver
117 QAM encoder
118 Time interleaver
119 MISO/MIMO encoder
120 Frequency interleaver
121 BCH encoder
122 LDPC encoder
123 QAM encoder
124 Frequency interleaver
131 Frame builder/resource allocation unit
132 OFDM generating unit
151 OFDM processing unit
152 Frame managing unit
153 Frequency deinterleaver
154 QAM decoder
155 LDPC decoder
156 BCH decoder
161 Frequency deinterleaver
162 MISO/MIMO decoder
163 Time deinterleaver
164 QAM decoder
165 Bit deinterleaver
166 LDPC decoder
167 BCH decoder
168 BB descrambler
169 Null deletion unit
170 Demultiplexer
300 Branch data storage memory
301 Selector
302 Check node calculating unit
303 Cyclic shift circuit
304 Branch data storage memory
305 Selector
306 Reception data memory
307 Variable node calculating unit
308 Cyclic shift circuit
309 Decoded word calculating unit
310 Reception data rearranging unit
311 Decoded data rearranging unit
601 Encoding processing unit
602 Storage unit 611 Coded rate setting unit
612 Initial value table reading unit
613 Parity check matrix generating unit
614 Information bit reading unit
615 Encoding parity calculating unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse interchange unit
1002 Memory
1011 Parity deinterleaver
1101 Acquisition unit
1101 Transmission channel decoding processing unit
1103 Information source decoding processing unit
1111 Output unit
1121 Recording unit

The invention claimed is:

1. A data processing device that performs encoding of information bits, comprising:
circuitry configured to perform encoding of the information bits into LDPC (Low Density Parity Check) code having a code length of 4320 bits in a coded rate of ½ based on a parity check matrix,
wherein the parity check matrix includes an information matrix and a parity matrix,
wherein the information matrix is represented by a parity check matrix initial value table which represent positions of elements of 1's of the information matrix, and
wherein the parity check matrix initial value table includes a following table:

---

142 150 213 247 507 538 578 828 969 1042 1107 1315 1509 1584 1612 1781 1934 2106 2117
3 17 20 31 97 466 571 580 842 983 1152 1226 1261 1392 1413 1465 1480 2047 2125
49 169 258 548 582 839 873 881 931 995 1145 1209 1639 1654 1776 1826 1865 1906 1956
148 393 396 486 568 806 909 965 1203 1256 1306 1371 1402 1534 1664 1736 1844 1947 2055
185 191 263 290 384 769 981 1071 1202 1357 1554 1723 1769 1815 1842 1880 1910 1926 1991
424 444 923 1679
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928
101 238 964 1393
304 460 1497 1588
151 192 1075 1614
297 313 677 1303
329 447 1348 1832
582 831 984 1900.

---

2. A method of encoding information bits, comprising:
encoding, by circuitry of an data processing device, the information bits into LDPC (Low Density Parity Check) code having a code length of 4320 bits in a coded rate of ½, wherein the parity check matrix includes an information matrix and a parity matrix, wherein the information matrix is represented by a parity check matrix initial value table which represent positions of elements of 1's of the information matrix, and
wherein the parity check matrix initial value table includes a following table:

---

142 150 213 247 507 538 578 828 969 1042 1107 1315 1509 1584 1612 1781 1934 2106 2117
3 17 20 31 97 466 571 580 842 983 1152 1226 1261 1392 1413 1465 1480 2047 2125
49 169 258 548 582 839 873 881 931 995 1145 1209 1639 1654 1776 1826 1865 1906 1956
148 393 396 486 568 806 909 965 1203 1256 1306 1371 1402 1534 1664 1736 1844 1947 2055
185 191 263 290 384 769 981 1071 1202 1357 1554 1723 1769 1815 1842 1880 1910 1926 1991
424 444 923 1679
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928
101 238 964 1393
304 460 1497 1588
151 192 1075 1614
297 313 677 1303
329 447 1348 1832
582 831 984 1900.

---

3. A data processing device for decoding an LDPC (Low Density Parity Check) code, the data processing device comprising:
circuitry configured to decode the LDPC code having a code length of 4320 bits in a coded rate of ½ based on a parity check matrix into information bits,
wherein the parity check matrix includes an information matrix and a parity matrix,
wherein the information matrix is represented by a parity check matrix initial value table which represent positions of elements of 1's of the information matrix, and
wherein the parity check matrix initial value table includes a following table:

---

142 150 213 247 507 538 578 828 969 1042 1107 1315 1509 1584 1612 1781 1934 2106 2117

-continued

```
3 17 20 31 97 466 571 580 842 983 1152 1226 1261 1392 1413
1465 1480 2047 2125
49 169 258 548 582 839 873 881 931 995 1145 1209 1639 1654 1776
1826 1865 1906 1956
148 393 396 486 568 806 909 965 1203 1256 1306 1371 1402 1534
1664 1736 1844 1947 2055
185 191 263 290 384 769 981 1071 1202 1357 1554 1723 1769 1815
1842 1880 1910 1926 1991
424 444 923 1679
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928
101 238 964 1393
304 460 1497 1588
151 192 1075 1614
297 313 677 1303
329 447 1348 1832
582 831 984 1900.
```

4. The data processing device according to claim 3, wherein the circuitry is further configured to:
deinterleave only parity bits of the LDPC code.

5. The data processing device according to claim 3, further comprising:
a memory configured to store the LDPC code in a plurality of columns, wherein the circuitry is further configured to deinterleave the stored data in the plurality of columns in the column direction.

6. The data processing device according to claim 3, wherein a 2+360×(i−1) column of the parity check matrix is a cyclically shifted 1+360×(i−1) column by M/360(=q) (i is the number of column in the parity check matrix M is parity length).

7. A data processing method for decoding an LDPC (Low Density Parity Check) code, comprising:
decoding, by circuitry of a data processing device, the LDPC code having a code length of 4320 bits in a coded rate of ½ based on a parity check matrix,
wherein the parity check matrix includes an information matrix and a parity matrix,
wherein the information matrix is represented by a parity check matrix initial value table which represent positions of elements of 1's of the information matrix, and
wherein the parity check matrix initial value table includes a following table:

```
142 150 213 247 507 538 578 828 969 1042 1107 1315 1509 1584
1612 1781 1934 2106 2117
3 17 20 31 97 466 571 580 842 983 1152 1226 1261 1392 1413
1465 1480 2047 2125
49 169 258 548 582 839 873 881 931 995 1145 1209 1639 1654 1776
1826 1865 1906 1956
148 393 396 486 568 806 909 965 1203 1256 1306 1371 1402 1534
1664 1736 1844 1947 2055
185 191 263 290 384 769 981 1071 1202 1357 1554 1723 1769 1815
1842 1880 1910 1926 1991
424 444 923 1679
91 436 535 978
362 677 821 1695
1117 1392 1454 2030
35 840 1477 2152
1061 1202 1836 1879
242 286 1140 1538
111 240 481 760
59 1268 1899 2144
737 1299 1395 2072
34 288 810 1903
232 1013 1365 1729
410 783 1066 1187
113 885 1423 1560
760 909 1475 2048
68 254 420 1867
283 325 334 970
168 321 479 554
378 836 1913 1928
101 238 964 1393
304 460 1497 1588
151 192 1075 1614
297 313 677 1303
329 447 1348 1832
582 831 984 1900.
```

8. The data processing method according to claim 7, further comprising:
deinterleaving, by the circuitry, only parity bits of the LDPC code.

9. The data processing method according to claim 7, further comprising:
deinterleaving, by the circuitry, the LDPC data, which is stored by a memory in a plurality of columns, in the column direction.

10. The data processing method according to claim 7,
wherein a 2+360×(i−1) column of the parity check matrix is a cyclically shifted 1+360×(i−1) column by M/360 (=q) (i is the number of column in the parity check matrix M is parity length).

* * * * *